United States Patent [19]
Hidaka et al.

[11] Patent Number: 5,933,048
[45] Date of Patent: Aug. 3, 1999

[54] DATA OUTPUT CIRCUIT WITH REDUCED OUTPUT NOISE

[75] Inventors: Hideto Hidaka; Masakazu Hirose, both of Hyogo, Japan

[73] Assignee: Mitsubishi Denki Kabushiki Kaisha, Tokyo, Japan

[21] Appl. No.: 08/891,212

[22] Filed: Jul. 10, 1997

Related U.S. Application Data

[62] Division of application No. 08/559,746, Nov. 15, 1995, Pat. No. 5,701,090.

[30] Foreign Application Priority Data

Nov. 15, 1994 [JP] Japan .................................. 6-280958

[51] Int. Cl.⁶ .................................................. H03K 17/16
[52] U.S. Cl. ......................... 327/534; 327/535; 327/379; 326/33
[58] Field of Search ...................... 327/534, 535, 327/379, 387, 388, 389, 391, 108, 112, 109; 326/33, 26, 27

[56] References Cited

U.S. PATENT DOCUMENTS

| | | | |
|---|---|---|---|
| 4,877,978 | 10/1989 | Platt et al. ........................... | 326/58 |
| 4,894,561 | 1/1990 | Nogami ................................ | 326/83 |
| 5,017,807 | 5/1991 | Kriz et al. .......................... | 326/83 |
| 5,138,194 | 8/1992 | Yoeli .................................. | 326/33 |
| 5,153,450 | 10/1992 | Ruetz ................................. | 326/87 |
| 5,570,038 | 10/1996 | Makino et al. ..................... | 326/33 |

*Primary Examiner*—Tuan T. Lam
*Attorney, Agent, or Firm*—McDermott, Will & Emery

[57] ABSTRACT

A data output drive transistor is rendered conductive when the potential of an internal node attains an H level, whereby an output node is discharged to the level of ground potential. When the drive transistor is turned on, the output node is discharged to the level of ground potential at high speed. This drive transistor is turned on for a predetermined time period when output of a high level data is completed, whereby the output node is discharged to the level of the ground potential for a predetermined time period. As a result, the potential of the output node is lowered from a high level to an intermediate level, so that the amplitude of a subsequent output signal is reduced. An output circuit that can effectively prevent generation of ringing with no increase in the access time is provided. A countermeasure is provided to suppress a ringing at output node which drives the output node at high speed when the output node potential attains a potential at which no ringing is caused. A stable output signal is provided at high speed.

15 Claims, 71 Drawing Sheets

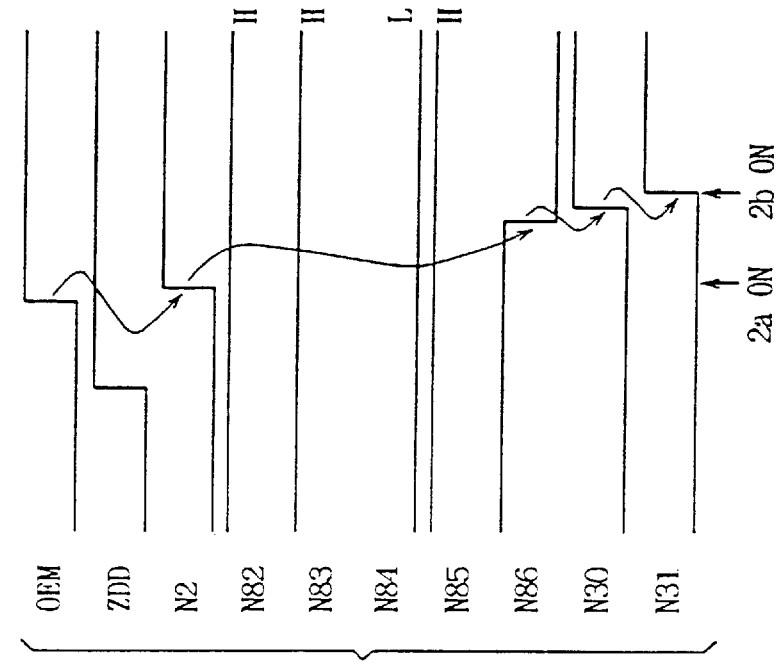
FIG. 28B ABSENCE OF INVALID OUTPUT
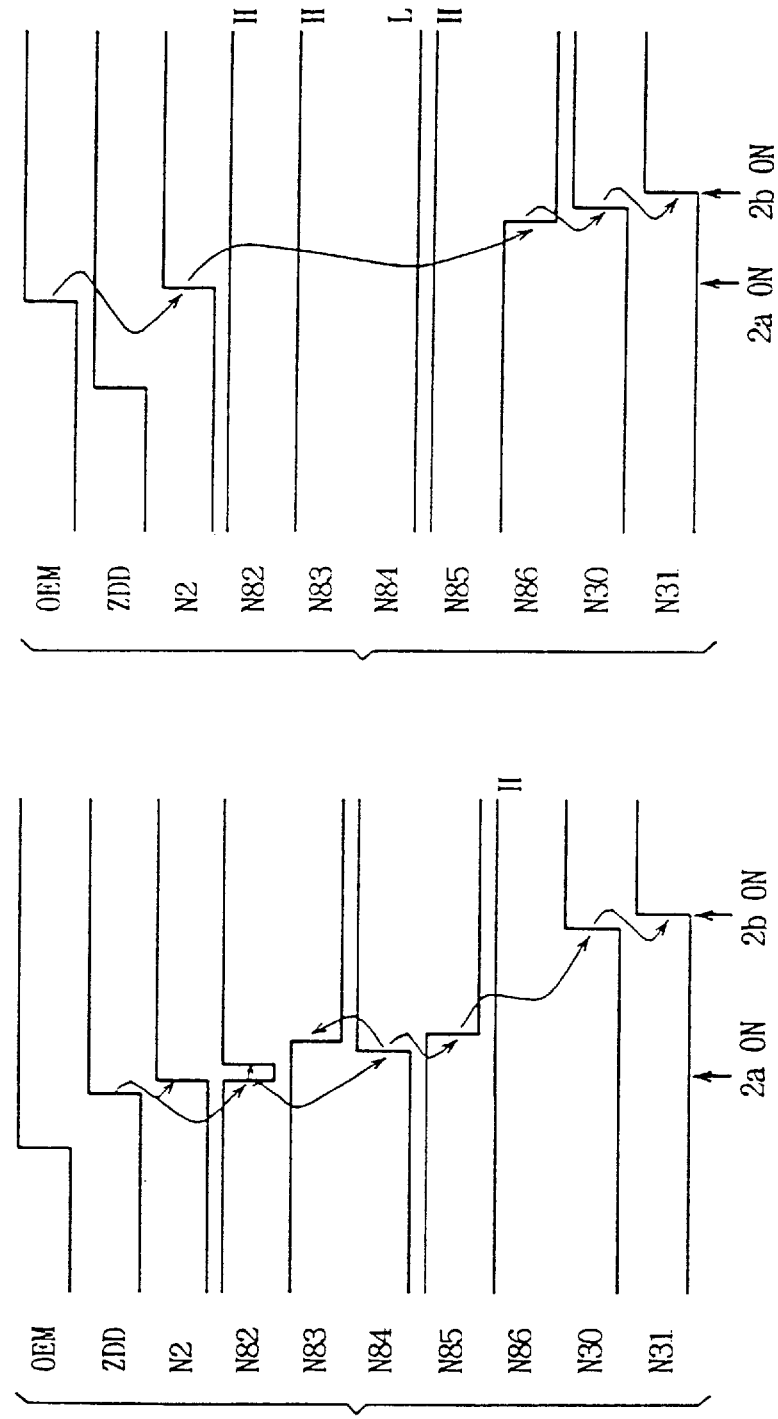
FIG. 28A PRESENCE OF INVALID OUTPUT

ABSENCE OF INVALID OUTPUT

PRESENCE OF INVALID OUTPUT

Ta < Tb

PRESENCE OF INVALID DATA OUTPUT

ABSENCE OF INVALID DATA OUTPUT (REFER TO FIG.5)

(REFER TO FIG. 34)

(REFER TO FIG.36)

(FROM ext.Vcc)
(BY CIRCUIT OF FIG.56C)

INCREASE TIME CONSTANT OF Q OR TIME DIFFERENCE
OF ON-TIMING OF PLURALITY OF DRIVE TRANSISTORS AS
ld + lf IS LOWER

DATA OUTPUT CIRCUIT WITH REDUCED OUTPUT NOISE

This application is a division of application Ser. No. 08/559,746 filed Nov. 15, 1995, allowed Apr. 10, 1997 now U.S. Pat. No. 5,701,090.

BACKGROUND OF THE INVENTION

1. Field of the Invention

The present invention relates to output circuits, and more particularly, to improvement of a data output circuit used in a semiconductor memory device.

2. Description of the Background Art

FIG. 86 is a block diagram schematically showing an entire structure of a general dynamic semiconductor memory device. Referring to FIG. 86, the dynamic semiconductor memory device includes a memory cell array 900 in which dynamic type memory cells MC are arranged in a matrix of rows and columns. In memory cell array 900, a word line WL is provided corresponding to each row of memory cells. A pair of bit lines BL and ZBL are provided corresponding to each column of memory cells MC. A memory cell MC is provided corresponding to the crossing of one word line WL and a pair of bit lines BL and ZBL. FIG. 86 representatively shows one word line WL and a pair of bit lines BL and ZBL. Data complementary to each other appear on bit line BL and complementary bit line ZBL.

The dynamic semiconductor memory device further includes an address buffer 902 for generating internal row and column address signals RA and CA according to an externally applied address signal Ad, a row decoder 904 for decoding an internal row address signal RA from address buffer 902 to select a corresponding word line in memory cell array 900, and a column decoder 906 for decoding an internal column address signal CA from address buffer 902 to generate a column select signal for selecting a corresponding column (bit line pair) in memory cell array 900.

Address buffer 902 includes a row latch 905 activated in response to an internal row address strobe signal ZRAS for latching an applied address signal Ad and generating an internal row address signal RA, and a column latch 907 responsive to an internal column address strobe signal ZCAS for latching an applied address signal Ad and generating an internal column address signal CA.

A row address signal and a column address signal are provided to address buffer 902 in a time-division multiplexed manner. Internal row address strobe signal ZRAS is generated from RAS buffer 910 receiving an external row address strobe signal /RAS. Internal column address strobe signal ZCAS is generated from CAS buffer 912 activated in response to activation of internal row address strobe signal ZRAS and receiving an external column address strobe signal /CAS.

The dynamic semiconductor memory device further includes a sense amplifier 914 for detecting and amplifying data of a memory cell connected to a word line selected in memory cell array 900, and an IO gate 916 responsive to the column select signal from column decoder 906 for connecting a corresponding column (a bit line pair) in memory cell array 900 to an internal data bus 915. Sense amplifier 914 has its operation controlled by a clock control circuit 918 responsive to internal row address strobe signal ZRAS for generating a sense amplifier activation signal (not shown explicitly) at a predetermined timing. Clock control circuit 918 also controls the activation/inactivation of row decoder 904.

The semiconductor memory device further includes an ATD circuit 920 for detecting a change in internal column address signal CA from column latch 907 for generating an address transition detection signal φATD when the change is detected, an input/output control circuit 922 for generating a timing control signal determining data input/output timing according to internal column address strobe signal ZCAS from CAS buffer 912, an external write/read designating signal (write enable signal) /WE, and address transition detection signal φATD, an input circuit 924 responsive to a data write designating signal (not explicitly shown) from input/output control circuit 922 for transmitting internal write data according to external data D to internal data bus 915, and an output circuit 926 responsive to a data output permission signal from input/output control circuit 922 for generating and providing external readout data Q from the internal readout data appearing on internal data bus 915.

Write enable signal /WE specifies a data writing operation when attaining an L level (logical low), and a data readout operation when attaining an H level (logical high). The operation will now be described briefly.

When external row address strobe signal /RAS is pulled down to an L level, which in turn causes internal row address strobe signal ZRAS from RAS buffer 910 to attain an L level, a memory cycle is initiated. In response to internal row address strobe signal ZRAS attaining an L level, row latch 904 in address buffer 902 latches a currently applied address signal Ad to generate and provide to row decoder 904 an internal address signal RA. Clock control circuit 918 provides an activation signal to row decoder 904 according to this internal row address strobe signal ZRAS at L level. Row decoder 904 decodes internal row address signal RA to select a corresponding word line in memory cell array 900. As a result, data in a memory cell connected to the selected word line is read out on a corresponding bit line BL (or ZBL). Then, sense amplifier 914 is activated according to a sense amplifier activation signal (not explicitly shown) from clock control circuit 918, whereby the potentials on bit lines BL and ZBL are amplified differentially.

Following the fall of external row address strobe signal /RAS, external column address strobe signal /CAS attains an L level, and internal column address strobe signal ZCAS of an L level is generated from CAS buffer 912 attaining an enable state by internal row address strobe signal ZRAS of an L level. In response to internal column address strobe signal ZCAS, column latch 907 latches an applied address signal Ad to generate an internal column address signal CA. Column decoder 906 decodes this internal column address signal CA to generate a signal for selecting a column (a bit line pair) in memory cell array 900. Following the sensing and amplification of memory cell data on each bit line pair by sense amplifier 914, IO gate 916 responds to a column select signal from column decoder 906 to conduct, whereby a corresponding bit line pair is connected to internal data bus 915. Then, data writing or reading is carried out via input circuit 924 or output circuit 926.

FIG. 87 shows a structure of a 1-bit data output unit of output circuit 926. When the semiconductor memory device of FIG. 86 has a structure where multibit data such as 4 bits and 8 bits are input/output, a plurality of the input/output units of FIG. 87 are provided according to the number of bits of data.

Referring to FIG. 87, output circuit 926 includes an inverter 5 for inverting data ZDD appearing on an internal data bus line 915b, a 2-input AND gate 3 receiving an output permission signal OEM and an output of inverter 5, a 2-input AND circuit 4 receiving output permission signal OEM and internal readout data ZDD, a first output drive transistor 1 responsive to an output of AND circuit 3 for driving an output node 6 to a level of a power supply potential Vcc, and a second drive transistor 2 responsive to an output of AND circuit 4 for discharging output node 6 to the level of a ground potential GND. Drive transistors 1 and 2 are both formed of an n channel MOS (insulated gate type) transistor. Output permission signal OEM is generated according to internal column address strobe signal ZCAS from input/output control circuit 922 shown in FIG. 86 and address transition detection signal φATD. The operation of the output circuit shown in FIG. 87 will now be described with reference to the operation waveform diagram of FIG. 88.

At an elapse of a predetermined time period from the attaining of internal column address strobe signal ZCAS to L level, a signal of a logic opposite to that of data in the selected memory cell is transmitted on internal data bus line 915b. Internal data bus line 915b is precharged to the level of an intermediate potential during the standby state. FIG. 88 shows the state where a data signal of an L level appears on internal data bus line 915b.

During the period when output permission signal OEM attains an L level, both outputs of AND circuits 3 and 4 attain an L level, and drive transistors 1 and 2 are both OFF. Thus, the high impedance state (Hi-Z) of output node 6 is maintained.

When output permission signal OEM attains an H level, AND circuits 3 and 4 are enabled. Data signal ZDD on internal data bus line 915b attains an H level and the output of inverter 5 attains an L level. Therefore, according to output permission signal OEM of an H level, the output of AND circuit 4, i.e., the potential of node N2 is pulled up to an H level, and second drive transistor 2 is turned on. Output node 6 is discharged to the level of ground potential GND via second drive transistor 2, whereby output data Q of an L level is provided.

When data signal ZDD attains an L level, the output of AND circuit 3, i.e., the potential of node N1 is pulled up to an H level in response to the rise of output permission signal OEM, whereby first drive transistor 1 is turned on. This causes output node 6 to be charged to a potential level lower than power supply potential Vcc by the threshold voltage of transistor 1. As a result, output data Q attains an H level. In general, a booster is provided to compensate for the threshold voltage loss of the output data.

Drive transistors 1 and 2 have their current driving capability set to drive a great current flow such as several mA in order to charge/discharge an external load at high speed to provide data speedily. A semiconductor memory device is sealed in a package. In this case, output node 6 is connected to a frame lead forming an output terminal via a bonding wire, as shown in FIG. 89. In FIG. 89, this bonding wire and frame lead are shown as output terminal 930. Not only parasitic capacitance C, but also parasitic inductance L are present in such a bonding wire and frame lead. A current change in parasitic inductance L generates a voltage represented by the equation of:

$$V = -L \cdot di/dt$$

where di/dt is the time differential of a current i flowing through inductance L.

When drive transistors 1 and 2 are both turned off, output node 6 attains an high impedance state where the potential level of the previous output data Q is maintained. Therefore, when data Q of an L level is to be output after output data Q of an H level is provided, ringing occurs in output node 6 since output node 6 is discharged via drive transistor 2 having a great current driving capability, as shown in FIG. 90A.

When data Q of an H level is to be output after output data Q of an L level is provided, output node 6 is charged via drive transistor 1 having a great current driving capability. Therefore, overshooting occurs as shown in FIG. 90B since there is a great change in current in parasitic inductance L.

Also in the structure of maintaining output node 6 at an intermediate potential differing from the structure of maintaining output node 6 at a high impedance state, the output node precharged to the intermediate potential is charged/discharged according to the logic of the data to be output via drive transistor 1 having a great current driving capability. Therefore, the similar occurrence of ringing at the output node is encountered.

When ringing such as the above-described overshooting or undershooting occurs, there is a problem that data cannot be read out until the output data is stabilized, so that the access time is increased. When the amplitude of generated undershooting is great, a great voltage is applied across the gate and drain (node terminal connected to output node 6) of output drive transistor 1, resulting in the problem that the breakdown voltage characteristic of transistor 1 is degraded. The same problem is encountered in drive transistor 2.

An approach of carrying out the drive of an output node in two stages is considered to prevent the above-described problem of ringing, as shown in FIG. 91. FIG. 91 shows the structure of only the portion associated with discharging the output node in two stages.

Referring to FIG. 91, the output circuit includes drive transistors 2a and 2b connected in parallel between output node 6 and a ground potential node. Drive transistors 2a and 2b are formed of n channel MOS transistors. The current driving capability of drive transistor 2a is set smaller than that of drive transistor 2b. This is realized by adjusting the channel length or the channel width of the transistor. The output of AND circuit 4 receiving output permission signal OEM and internal readout data signal ZDD is provided to the gate of drive transistor 2a. A delay stage 7 for delaying the signal potential on node N2 for a predetermined time and an AND circuit 8 for-receiving an output of delay stage 7 and the signal potential on node N2 are provided to control the on/off of drive transistor 2b. The output of AND circuit 8 is provided to the gate of drive transistor 2b. Delay stage 7 includes an even number of inverters (four inverters in FIG. 91) to delay an applied signal for a predetermined time. The operation of the output circuit of FIG. 91 will now be described with reference to the operation waveform diagram of FIG. 92.

When internal column address strobe signal ZCAS attains an L level of an active state, a column select operation is initiated, and data of a selected memory cell is transmitted on internal data bus line 915b. When output permission signal OEM is pulled up to an H level, the potential of node N2 attains an H level, whereby drive transistor 2a is turned on. As a result, output node 6 is discharged mildly. The output of delay stage 7 still attains a low level, and the potential of node N3 is at an L level. Drive transistor 2b is still turned off.

When the output of the delay stage 7 attains an H level at an elapse of a predetermined time period, the output of AND circuit 8 is pulled up to an H level, whereby drive transistor 2b is turned on. As a result, output node 6 is discharged at a high speed. The potential of output node 6 is sufficiently lowered when drive transistor 2b is turned on. Therefore, there is almost no ringing even when output node 6 is discharged at high speed. This is because the maximum amplitude in a RLC circuit at the occurrence of damping oscillation is proportional to the voltage value where that rapid discharging is carried out.

A static column mode is a well known operation mode in a dynamic semiconductor memory device. As shown by the operation waveform diagram of FIG. 93, data is input/output in random by entering only an address signal with respect to one row of memory cells specified by a row address signal X in the static column mode.

More specifically, row address strobe signal ZRAS is first pulled down to an L level, whereby a row address signal is entered to select a word line. The data of memory cells connected to the selected word line are sensed and amplified by the sense amplifiers to be latched. Data of a corresponding column address is output by entering a column address signal Y asynchronously and maintaining the same for a predetermined time. In this static column mode, column address strobe signal ZCAS has the function of output enable, not the function of designating a column address latch, and is maintained at L level. In this static column mode, data can be output at high speed without toggling of column address strobe signal /CAS to enter a column address signal.

It is to be noted that output permission signal OEM is maintained at an H level as shown in FIG. 93 in a static column mode. Therefore, one of drive transistors 1 and 2a is turned on, and output node 6 is maintained at an H or L level. When data of an L level is to be provided following a data output of an H level, the potential amplitude of output node 6 is increased to generate ringing if the delay time of delay stage 7 is too short in such a static column mode operation. If the delay time of delay stage 7 is increased to prevent such generation of ringing, the access time will be lengthened to degrade the advantage of high speed access of the static column mode.

A delay stage is formed of an inverter. In general, a CMOS inverter of low power consumption is used as such an inverter. An MOS transistor has its driving capability determined depending upon the gate voltage. More specifically, the operating speed of the inverter is increased as the operating power supply voltage of the inverter forming the delay stage becomes higher, to result in a shorter delay time of the delay stage. Furthermore, an increase in the operating temperature causes reduction in the operating speed of the MOS transistor (due to increase in the threshold voltage and the channel resistance by generation of hot carriers). Therefore, as the operating temperature increases, the operating speed of the inverter forming the delay stage is reduced to increase the delay time of the delay stage. Such a variation in the delay time of the delay stage makes different the on-timing of drive transistor 2b shown in FIG. 91. In this case, a shorter delay time may cause drive transistor 2b to be turned on when the potential of the output node is not lowered sufficiently. Therefore, output node 6 will be discharged at high speed to result in generation of ringing. The driving capability of the output drive transistor is increased when the power supply voltage is increased or at a low operating temperature. Therefore, there is a problem that ringing occurs more easily.

SUMMARY OF THE INVENTION

An object of the present invention is to provide an output circuit that can output a signal stably at high speed without generation of ringing.

Another object of the present invention is to provide an output circuit in a semiconductor memory device that can output a data signal stably without increase in the access time.

An output circuit according to an aspect of the present invention includes an adjustment unit coupled to a data output node for adjusting the charging/discharging speed of the data output node when a data output permission signal is activated, or for driving the data output node to the level of a predetermined potential when the data output permission signal is inactivated so as to reduce ringing at the data output node at the time of data output. The adjustment unit can be realized in various manners.

An output circuit according to another aspect of the present invention includes a first drive element coupled between an output node and a reference voltage node and responsive to an internal signal for driving the output node and an output pad to the level of the voltage on the reference voltage node with a first current driving capability, a second drive element connected between the output node and the reference voltage node, having a current driving capability greater than that of the first drive element, and rendered conductive at a timing behind that of the first drive element for driving the output node and the output pad to the voltage level on the reference voltage node, and a noise absorbing unit provided between the first drive element and the output pad for absorbing a noise voltage appearing on the output pad.

According to the one aspect, the charging/discharging speed or the potential of the data output node is adjusted by the adjustment unit to reduce the |di/dt| of the data output node to suppress generating of ringing.

In the output circuit of the another aspect, a protection circuit for absorbing excessive noise such as a surge voltage is provided between the output pad and the drive transistor of a small current driving capability. Therefore, the drive transistor with a small current driving capability and a low breakdown voltage can be prevented from being damaged by excessive noise such as a surge voltage. Therefore, an output circuit with high immunity to noise can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 28A and 28B are signal waveform diagrams representing an operation of the output control circuit of FIG. 27.

DESCRIPTION OF THE PREFERRED EMBODIMENTS

Embodiment 1

Figure 1:
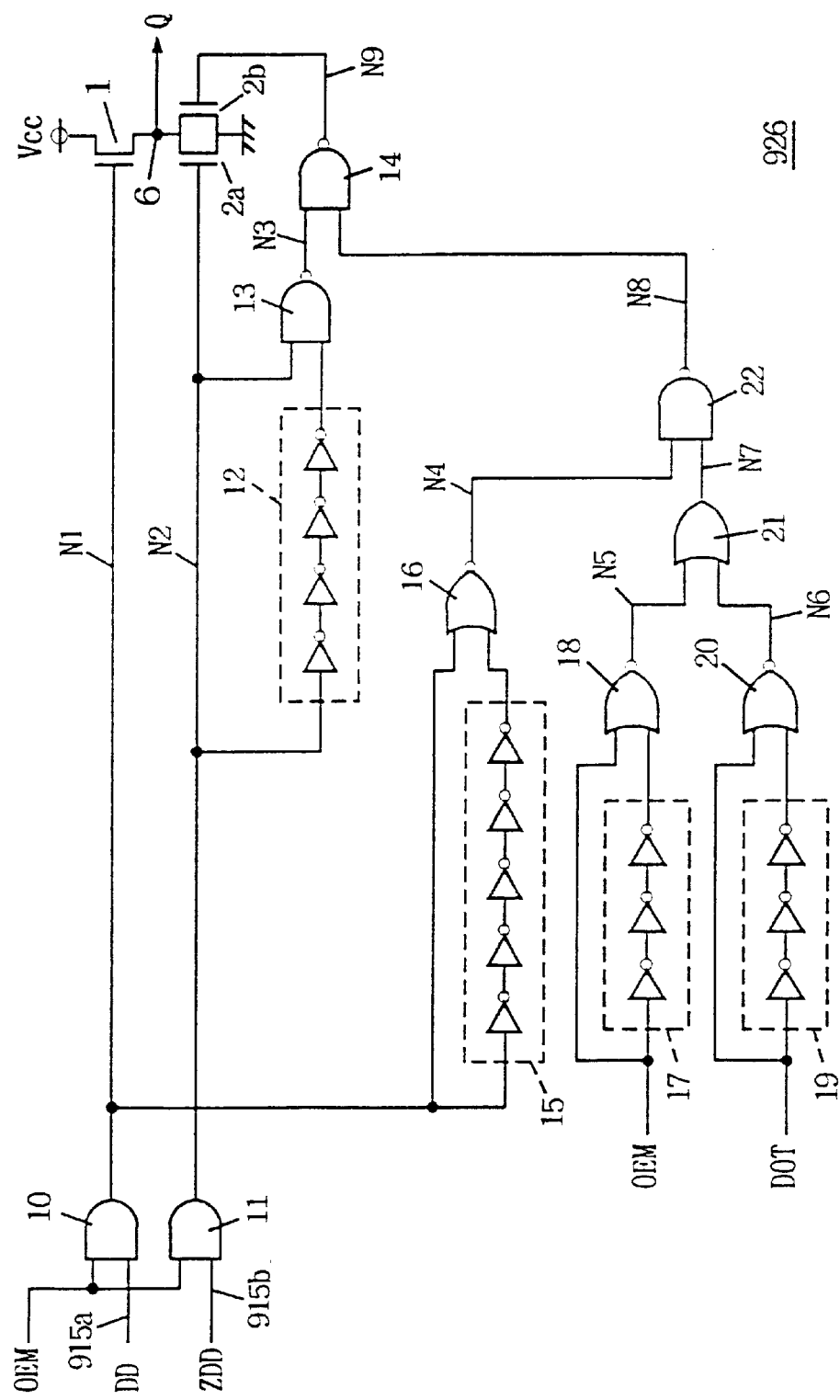
FIG. 1 shows a structure of an output control circuit according to a first embodiment of the present invention.

FIG. 1 shows a structure of an output circuit according to a first embodiment of the present invention. The portion for driving output node 6 to the level of ground potential is shown in FIG. 1. Overshooting at the output node can be prevented by applying a structure similar to that shown in FIG. 1 to the portion driving output node 6 to the level of power supply potential Vcc.

Referring to FIG. 1, the output circuit 926 includes a 2-input AND circuit 10 for receiving an output permission signal OEM and a readout data signal DD on an internal data bus line 915a, an AND circuit 11 for receiving output permission signal OEM and a complementary internal readout data signal ZDD on an internal data bus line 915b, a first drive transistor 1 responsive to an output of AND circuit 10 for driving output node 6 to the level of power supply potential Vcc, a drive transistor 2a responsive to an output of AND circuit 11 for driving output node 6 to the level of a ground potential, and a drive transistor 2b provided in parallel to drive transistor 2a. The current driving capability of drive transistor 2a is set smaller than that of drive transistor 2b. Drive transistors 1, 2a, 2b are formed of n channel MOS transistors. The difference in the current driving capability of drive transistors 2a and 2b are implemented by appropriately selecting the size or gate (channel) width, or the ratio of the gate width to the gate length thereof.

Output circuit 926 further includes an invert delay circuit 15 for delaying and inverting the logic of an output of AND circuit 10 i.e., a signal potential of node N1, a 2-input NOR circuit 16 for receiving a signal on node N1 and an output of delay circuit 15, an invert delay circuit 17 for delaying output permission signal OEM for a predetermined time and inverting the logic thereof, a 2-input NOR circuit 18 for receiving an output of invert delay circuit 17 and output permission signal OEM, an invert delay circuit 19 for delaying a data output designating signal DOT generated at a change of a column address signal for a predetermined time and inverting the logic thereof, a NOR circuit 20 for receiving output designating signal DOT and an output of invert delay circuit 19, a 2-input OR circuit 21 for receiving outputs of NOR circuits 18 and 20, and a 2-input NAND circuit 22 for receiving outputs of NOR circuit 16 and an OR circuit 21.

2-input NOR circuit 16 generates a one shot pulse signal of a positive polarity having a time width determined by the delay time of invert delay circuit 15 when the potential of node N1 is pulled down to an L level from an H level.

2-input NOR circuit 18 generates a one shot pulse signal of a positive polarity having a time width determined by the delay time of invert delay circuit 17 when output permission signal OEM is pulled down to an L level from an H level.

2-input NOR circuit 20 generates a one shot pulse signal of a positive polarity having a time width determined by a delay time of delay circuit 19 when output designating signal DOT is pulled down to an L level from an H level. Output designating signal DOT is generated in a form of a one shot pulse that attains an L level for a predetermined time when the column address signal changes.

Output circuit 926 further includes a delay circuit 12 for delaying an output of AND circuit 11, i.e. a signal on node N2 for a predetermined time period, a 2-input NAND circuit 13 for receiving a signal on node N2 and an output of delay circuit 12, and a 2-input NAND circuit 14 for receiving outputs of NAND circuits 13 and 22. Drive transistor 2b is turned on when NAND circuit 14 provides an output of an H level. The operation of the output circuit shown in FIG. 1 will now be described with reference to the operational waveform diagram of FIG. 2.

A data readout operation in which a selected memory cell stores data "L" will be described. When internal column address strobe signal ZCAS is pulled down to an L level, an internal column address signal Y1 is generated. This generation of internal column address signal Y1 from an address buffer causes an address transition detection circuit to generate an address transition detection signal φATD in a one shot pulse form. Output designating signal DOT attains an L level for a predetermined time according to this address transition detection signal. Internal data bus lines 915a and 915b are precharged to an L level according to output designation signal DOT. In a standby state, output permission signal OEM and the potential of nodes N1 and N2 attain an L level, and all drive transistors 1, 2a, 2b are turned off.

A pulse having a time width of the delay time of invert delay circuit 19 is generated from NOR circuit 20 according to one shot output designating signal DOT, whereby OR circuit 21 provides an output of an H level. The potential of nodes N1 and N4 are still at the L level and H level, respectively. Output permission signal OEM attains an L level, and the potential of node N5 attains an H level. Therefore, NAND circuit 22 (potential of node N8) does not change its H level output even when output designating signal DOT attains an L level for a predetermined time.

Also, the potential of node N2 attains an L level, the output of NAND circuit 13 attains an H level, and the output of NAND circuit 14 (potential of node N9) attains an L level.

In response to output permission signal OEM attaining an active state of an H level, the potential of node N1 is driven to an L level, and the potential of node N2 is driven to an H level. Thus, transistor 1 maintains its off state. In contrast, drive transistor 2a is turned on, and the potential of output node 6 is gently discharged to the level of a ground potential. At an elapse of the delay time of delay circuit 12, the output of delay circuit 12 attains an H level, and the output of the NAND circuit 13 attains an L level. As a result, the output of NAND circuit 14 attains an H level to turn on drive transistor 2b. Therefore, drive transistor 2b discharge output node 6 to the level of ground potential at high speed.

In response to a change of external column address signal Ad, output designating signal DOT attains an L level for a predetermined time. This operation mode is called a static column mode. When output designating signal DOT attains an L level, it indicates that the data Q appearing on output node 6 is invalid to prepare for the next cycle. More specifically, it can be said that output designating signal DOT indicates that the current data appearing on output node 6 should be made invalid. In response to the transition of output designating signal DOT to an L level, internal data lines 915a and 915b are both precharged to the level of a ground potential again. As a result, the potential of both nodes N1 and N2 are pulled down to an L level, and transistors 1, 2a and 2b are turned off. At an elapse of a predetermined time period (the time required for data of a bit line pair selected according to a column address signal to be read out to an internal data bus) from the fall of output designating signal DOT to an L level, the potential of internal data bus lines 915a and 915b attain an H level and an L level, respectively, according to the read out data. As a result, drive transistor 1 is turned on, and output node 6 is charged to the level of power supply potential Vcc.

When internal column address strobe signal ZCAS attains an inactive state of an H level, output permission signal OEM is also driven to an L level. In response, a one shot pulse is generated from NOR circuit 18, and the potential of node N1 is driven to an L level from an H level, and drive transistor 1 is turned off. In response to the fall of the potential of node N1, a one shot pulse signal is generated on node N4 from NOR circuit 16. Invert delay circuit 15 is formed of five stages, for example, of inverters. Invert delay circuit 17 is formed of three stages, for example, of inverter circuits. The delay time of invert delay circuit 15 is set longer than that of invert delay circuit 17. Therefore, when the potential of node N4 attains an H level, the potential of node N7 (output of OR circuit 21) is driven to an H level, whereby a one shot pulse signal of an L level having a time width determined by the delay time of invert delay circuit 17 is generated from NAND circuit 22 onto node N8. In response, a one shot pulse signal of an H level is generated from NAND circuit 14 on node N9, and drive transistor 2b is turned on. As a result, output node 6 is discharged from the level of power supply potential Vcc to the ground potential for a predetermined time, and the potential of output node 6 attains an intermediate potential level between power supply potential Vcc and ground potential GND. The intermediate potential level of output node 6 is determined by the driving capability of drive transistor 2b, external load, and the delay time of invert delay circuit 17.

As described above, the potential of output node 6 attains the level of an intermediate potential even when a structure for maintaining output node 6 at an intermediate potential level is not provided since drive transistor 2b discharging output node 6 to the level of ground potential is turned on for a predetermined time after data of an H level is read out. This means that output node 6 is driven from the level of an intermediate potential regardless of whether the data read out at the next cycle attains an H level or an L level. Therefore, the output amplitude is small and no ringing is generated. Thus, a stable output signal Q can be obtained at high speed. Even in the case where data "L" is output after an outputting of data "H" in a static column mode, ringing does not occur in output node 6, so that a stable output signal Q can be provided.

Figure 2:
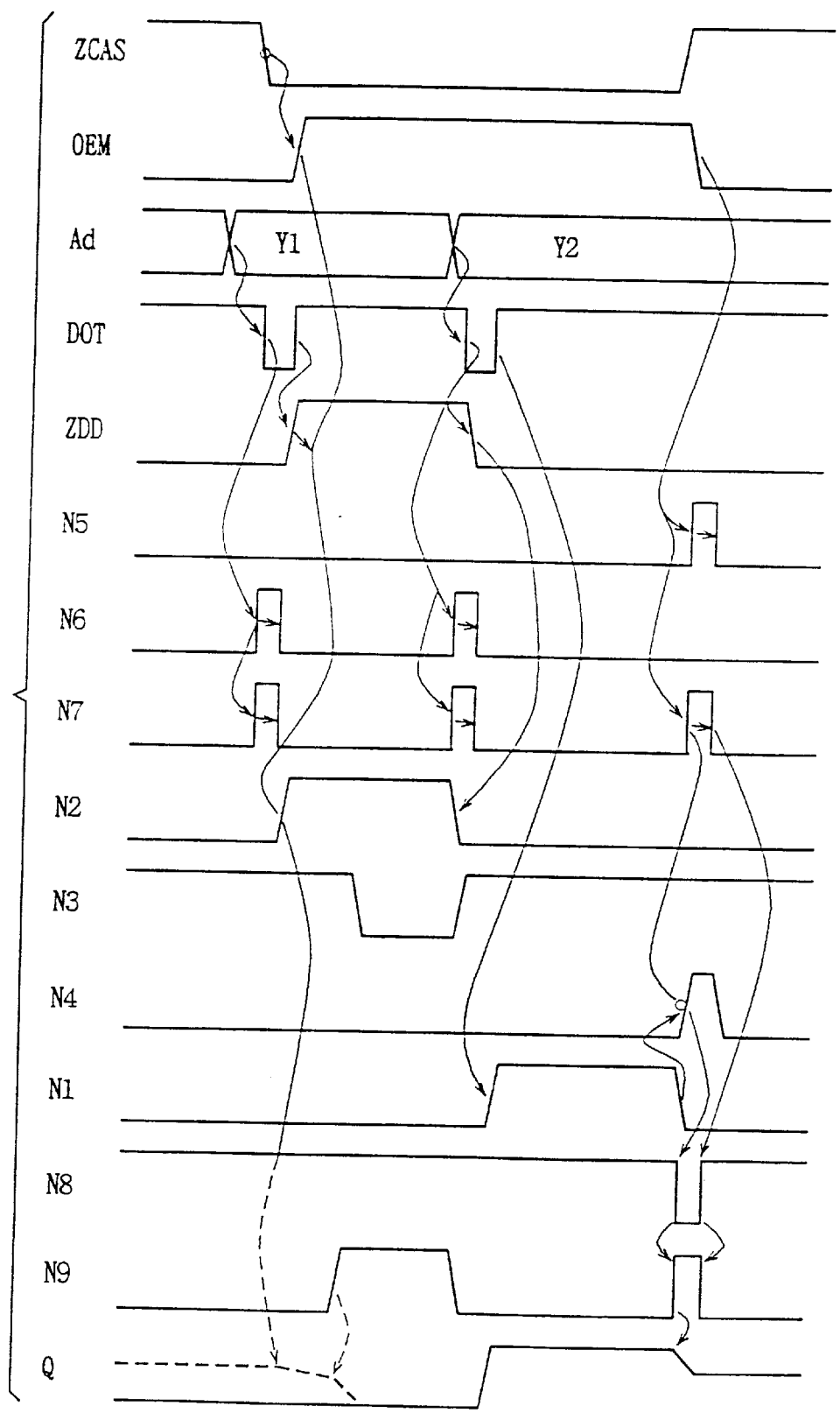
FIG. 2 is a signal waveform diagram showing an operation of the output control circuit of FIG. 1.

By providing the structure shown in FIG. 1 to drive transistor 1, output node 6 can be pulled up after reading out of data "L", to be set to the level of an intermediate potential, as shown in the broken line in FIG. 2.

Figure 3:
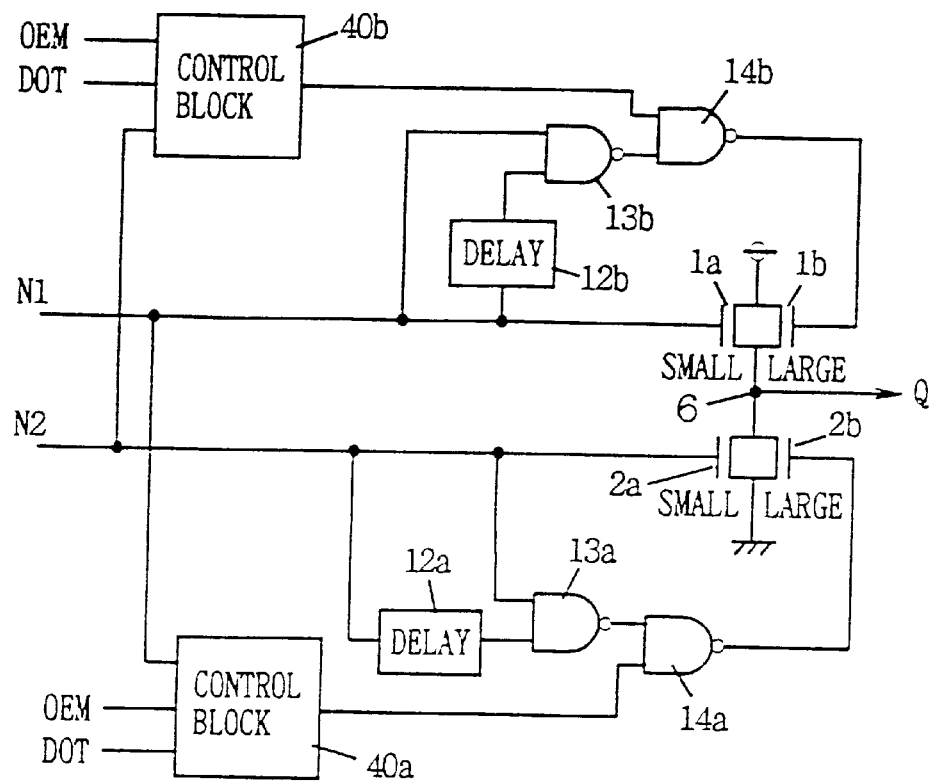
FIG. 3 shows a first modification of the first embodiment of the present invention.

FIG. 3 shows a structure of an output circuit where a control system is provided for reading out data of both "H" and "L". Referring to FIGS. 1 and 3, each of control blocks 40a and 40b includes NOR circuits 16, 18, 20, OR circuit 21, NAND circuit 22, and invert delay circuits 15, 17, 19 shown in FIG. 1. Delay circuits 12a and 12b correspond to delay circuit 12, NAND circuits 13a and 13b correspond to NAND circuit 13, and NAND circuits 14a and 14b correspond to NAND circuit 14.

Figure 4:
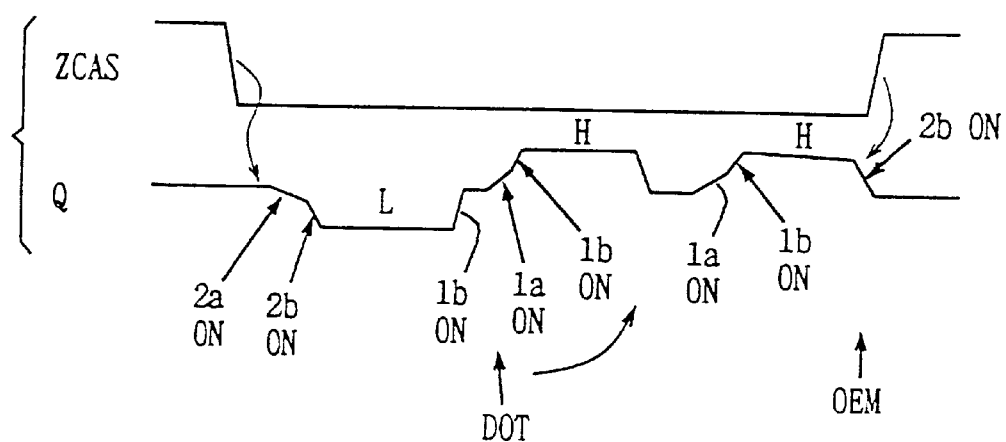
FIG. 4 is a diagram used for explaining the operation of the output control circuit of FIG. 3.

By employing the circuit configuration shown in FIG. 3, the output node is driven to an intermediate potential according to output designating signal DOT in a static column mode operation, and output node 6 is driven to an intermediate potential according to output permission signal OEM at the completion of a memory cycle, as shown in FIG. 4.

Therefore, a stable output signal can be generated with no ringing since output node 6 is driven to an H or n L level from the intermediate potential level in either case.

Figure 5:
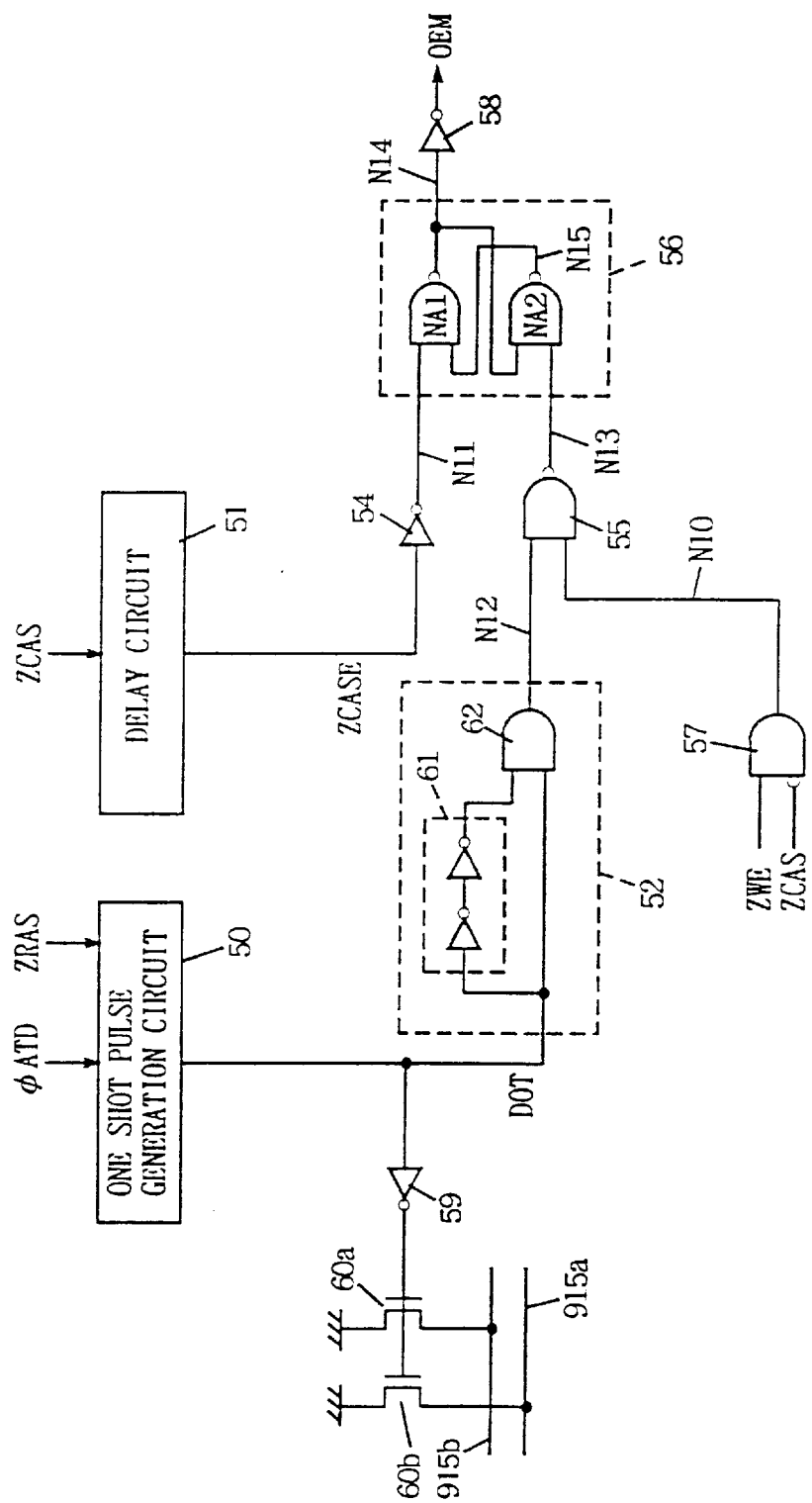
FIG. 5 shows a structure of an output permission signal generation circuit of FIG. 1.
Figure 86:
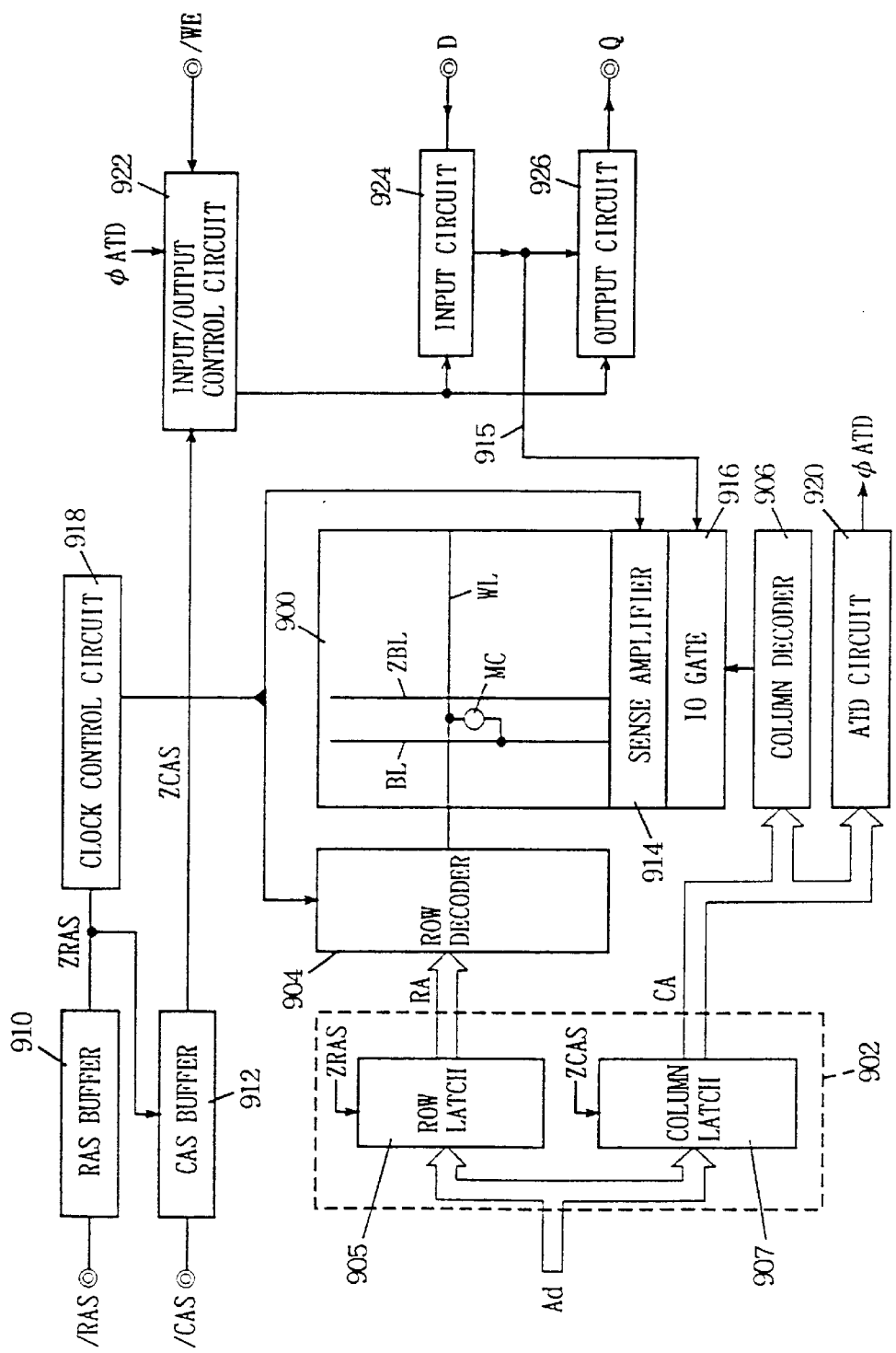
FIG. 86 schematically shows an entire structure of a conventional dynamic semiconductor memory device.
Figure 87:
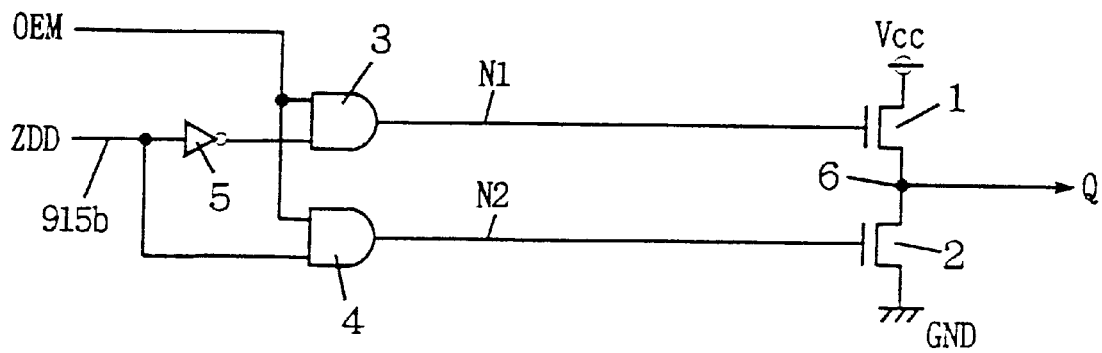
FIG. 87 shows a structure of a conventional output circuit.
Figure 88:
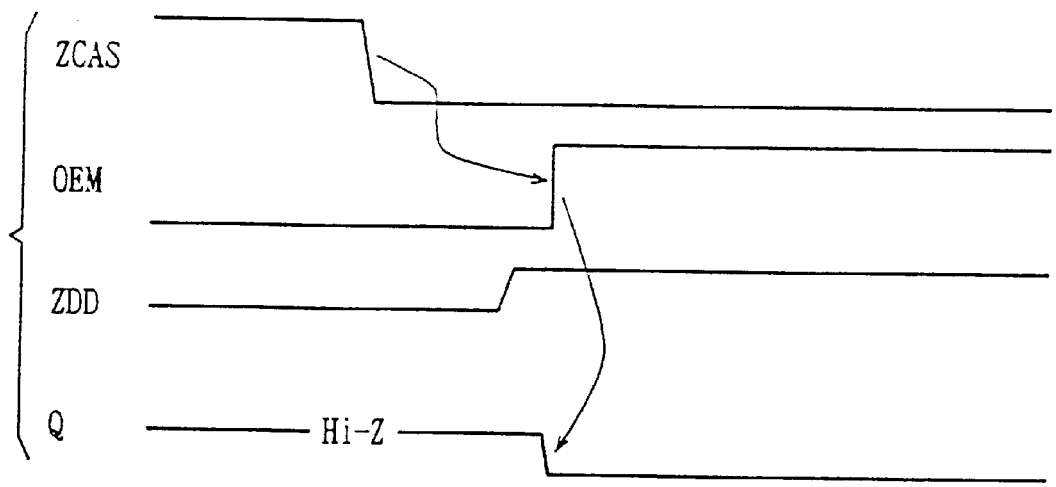
FIG. 88 is a signal waveform diagram representing an operation of the output circuit shown in FIG. 87.
Figure 89:
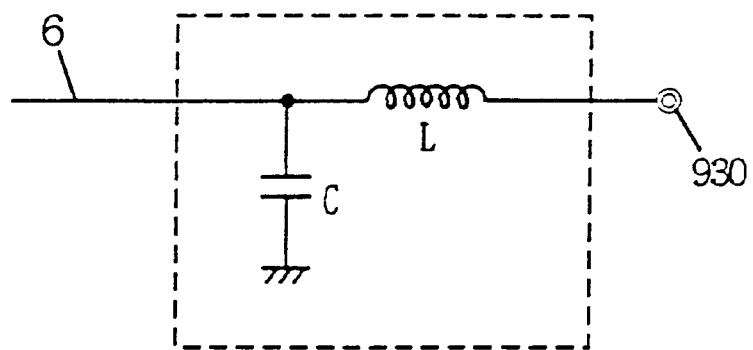
FIG. 89 shows a parasitic capacitance and a parasitic inductance at an output node.
Figure 90A:
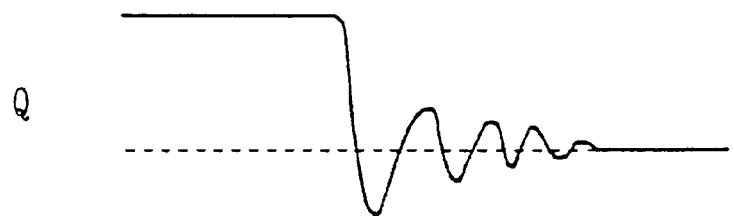
FIGS. 90A and 90B are diagrams for explaining ringing generated by the parasitic inductance shown in FIG. 89.
Figure 90B:
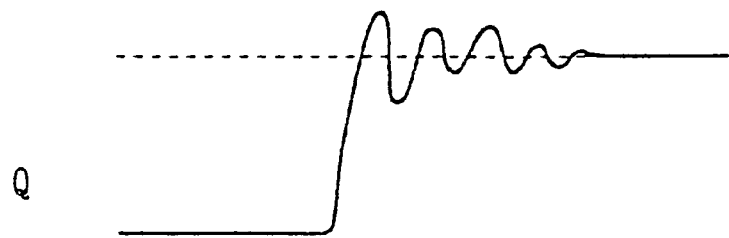
Figure 91:
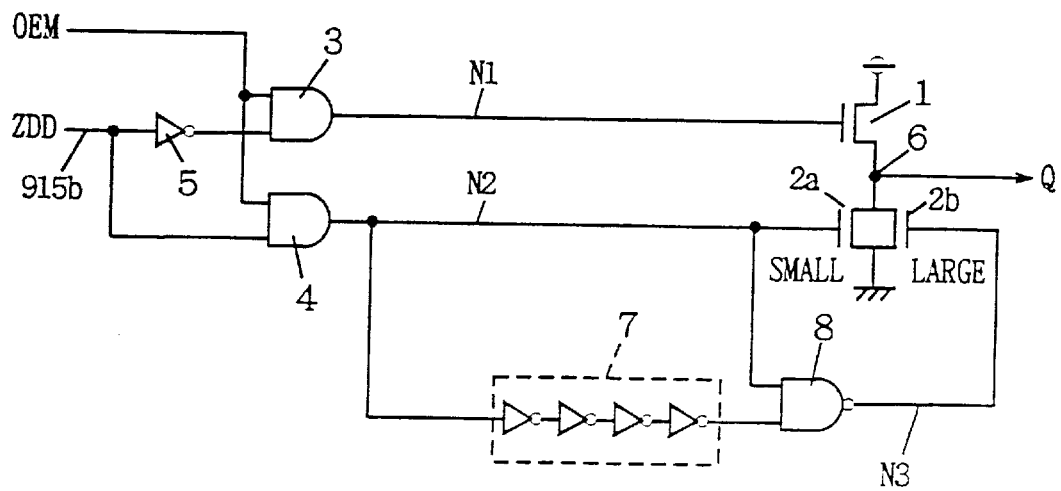
FIG. 91 shows a possible modification of an output control circuit.
Figure 92:
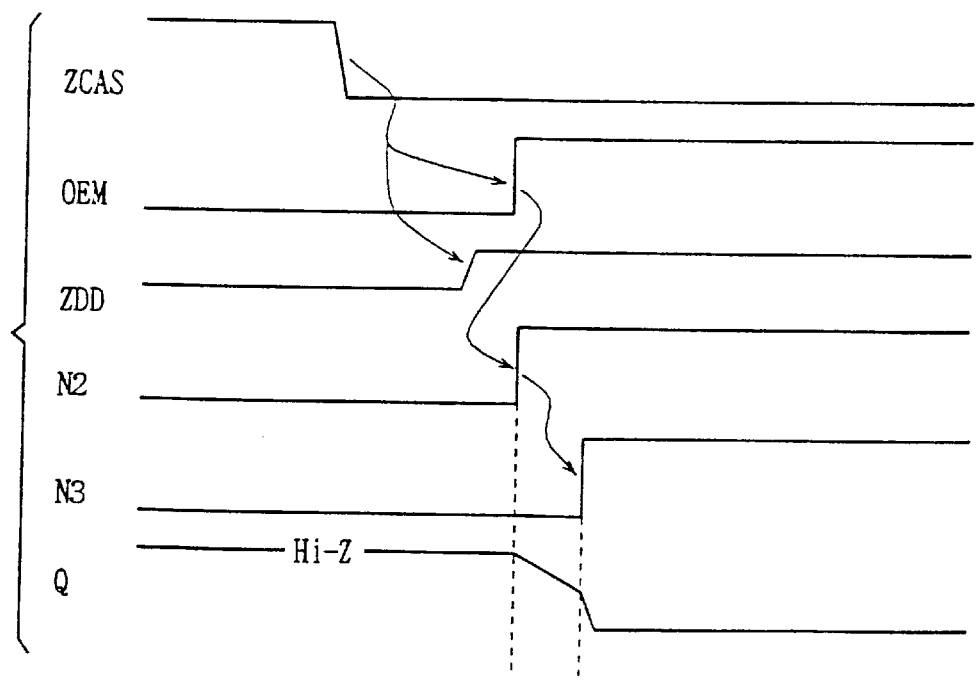
FIG. 92 is a signal waveform diagram showing an operation of the output control circuit of FIG. 91.
Figure 93:
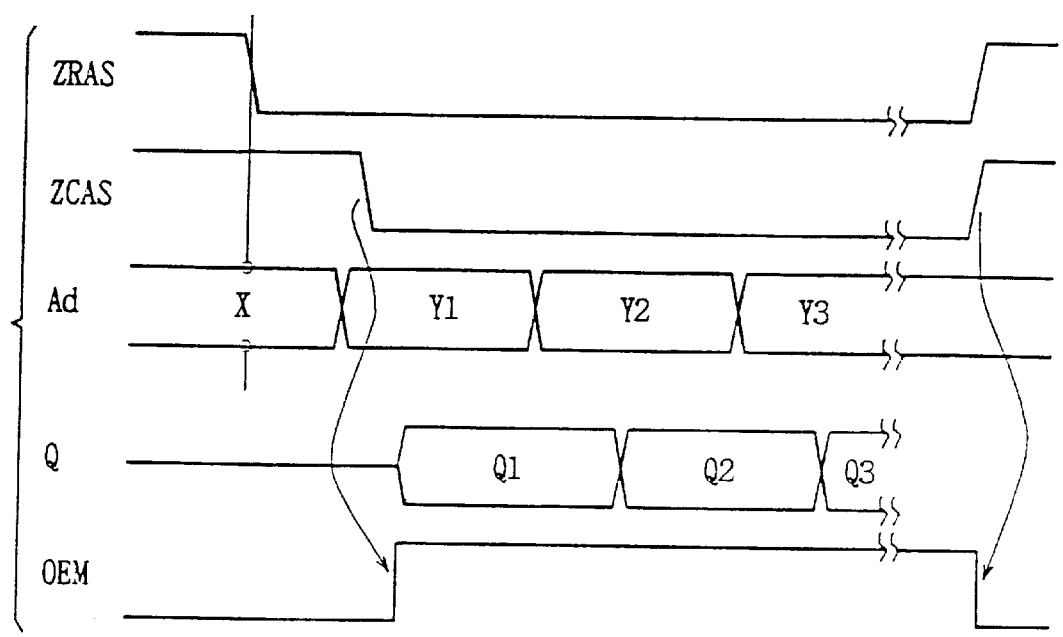
FIG. 93 shows the relationship between an output permission signal and a column address strobe signal of FIG. 91.

FIG. 5 shows a structure of a generation system of an output designating signal and an output permission signal. The control signal generation system of FIG. 5 is included in the input/output control circuit shown in FIG. 86.

Referring to FIG. 5, an output control signal generation circuit includes a one shot pulse generation circuit 50 activated in response to an internal row address strobe signal ZRAS for generating a one shot pulse signal of an L level in response to address transition detection signal φATD, a delay circuit 51 for delaying internal column address strobe signal ZCAS for a predetermined time period, a one shot pulse generation circuit 52 responsive to the rise of output designating signal DOT from one shot pulse generation circuit 50 for generating a one shot pulse signal, a gate circuit 57 receiving an internal write enable signal ZWE and internal column address strobe signal ZCAS for providing a signal of an H level when a data readout operation is designated, a 2-input NAND circuit 55 for receiving outputs of one shot pulse generation circuit 52 and gate circuit 57, an inverter circuit 54 for inverting a delayed column address strobe signal ZCASE from delay circuit 51, a flipflop 56 set in response to a signal of an L level from inverter circuit 54, and reset in response to a signal of an L level from NAND circuit 55, and an inverter circuit 58 for inverting the output of flipflop 56. Output permission signal OEM is generated from inverter circuit 58.

One shot pulse generation circuit 52 includes a delay circuit 61 for delaying output designating signal DOT for a predetermined time period, and a 2-input AND circuit 62 for receiving an output of delay circuit 61 and output designating signal DOT. Delay circuit 61 is formed of an even number of inverters (two inverter circuits in the structure shown in FIG. 5).

Flipflop 56 includes two cross-coupled NAND circuits NA1 and NA2. NAND circuit NA1 has one input receiving an output of inverter circuit 54, and the other input receiving an output of NAND circuit NA2. NAND circuit NA2 has one input receiving an output of NAND circuit 55, and the other input receiving an output of NAND circuit NA1. The output of NAND circuit NA1 is applied to inverter circuit 58.

Gate circuit 57 provides a signal of an H level when internal column address strobe signal ZCAS attains L level and write enable signal ZWE attains an H level. When the employed dynamic semiconductor memory device has a structure in which an output enable signal ZOE is used, gate circuit 57 may be replaced with an inverter that inverts this output enable signal ZOE. Any structure may be used as long as a signal of an H level is output at node N10 in a data readout operation.

Figure 6:
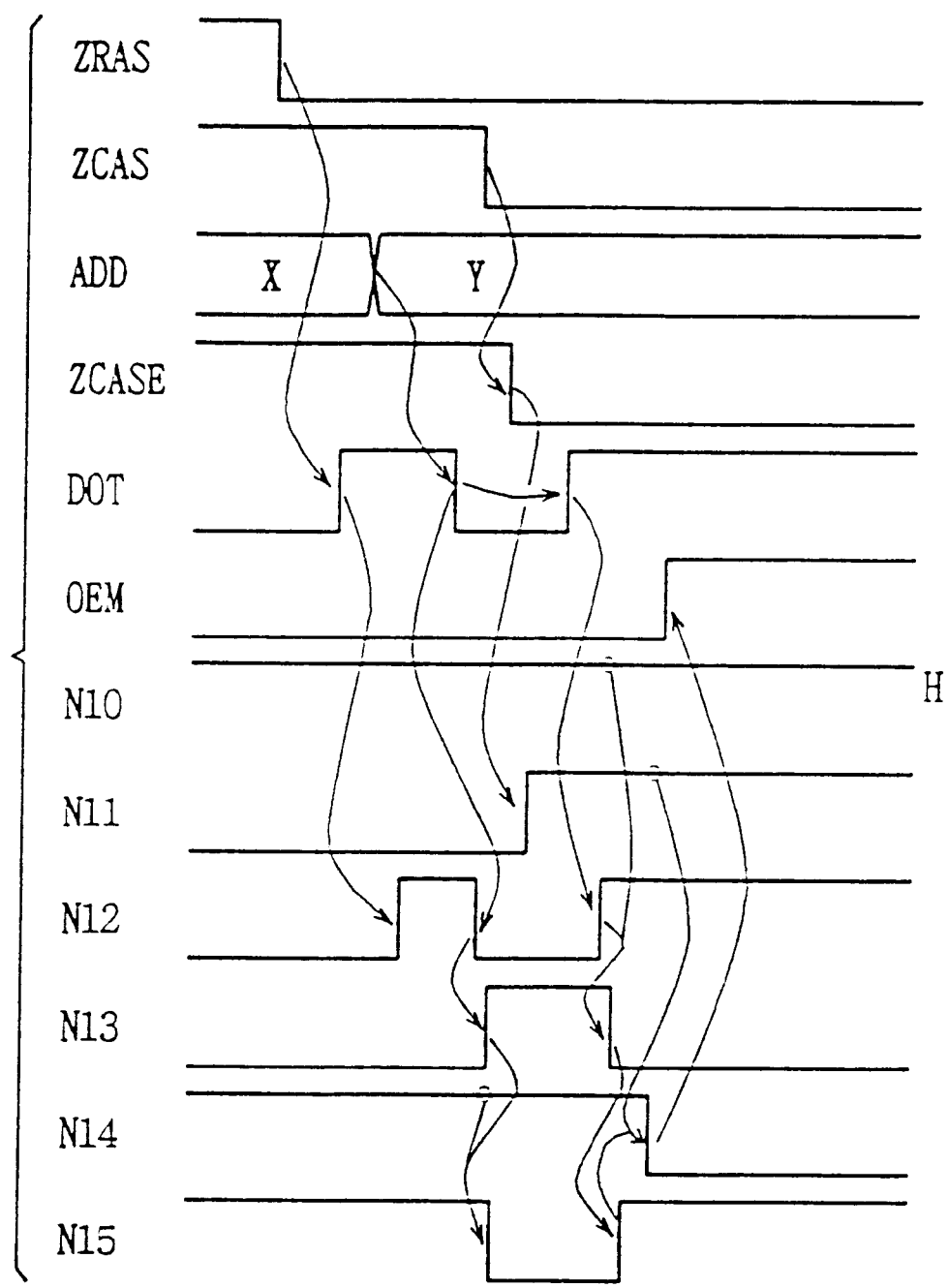
FIG. 6 is a signal waveform diagram representing an operation of the output permission signal generation circuit of FIG. 5.

The control signal generation circuit further includes an inverter circuit 59 for inverting output designating signal DOT from one shot pulse generation circuit 50, and precharge transistors 60a and 60b responsive to an output of inverter circuit 59 for precharging internal data bus lines 915a and 915b to the level of ground potential. Precharge transistors 60a and 60b are both formed of an n channel MOS transistor. The operation of the control signal generation system of FIG. 5 will now be described with reference to the operation waveform diagram of FIG. 6.

When row address strobe signal ZRAS attains an inactive state of an H level, output designating signal DOT attains an L level, and column address strobe signal ZCAS attains an inactive state of an H level. Thus, the potentials of nodes N11, N12 and N13 attain an L level, and the potentials of nodes N10, N14 and N15 attain an H level.

A memory cycle is initiated when row address strobe signal ZRAS attains an active state of an L level. In response to internal row address strobe signal ZRAS attaining an L level, one shot pulse generation circuit 50 is activated to pull up output designating signal DOT which is an output thereof to an H level. At an elapse of a predetermined time from transition of output designating signal DOT to H level, a signal of an H level is provided from one shot pulse generation circuit 52. When the column address signal changes, an address transition detection signal φATD is responsively generated. It is to be noted that in a semiconductor memory device where a static column mode of operation is possible, the column address strobe signal has only the function of an output enable signal, and not the function of instructing an address latch. In response to address transition detection signal φATD, output designating signal DOT attains an L level for a predetermined time. The fall of output designating signal DOT to an L level causes the output of one shot pulse generation circuit 52 (output at node N12) to attain an L level. A signal of an L level having a pulse width longer than output designating signal DOT by the delay time of delay circuit 61 is output from one shot pulse generation circuit 52.

When a signal of an L level is provided on node 12 from one shot pulse generation circuit 52, NAND circuit 55 provides a signal of an H level on node N13.

Then, when column address strobe signal ZCAS attains an L level, delayed column address strobe signal ZCASE which attains an L level at an elapse of a predetermined time is generated from delay circuit 51. A signal of an H level is provided from inverter circuit 54 on node N11 by this delayed column address strobe signal ZCASE attaining an L level.

The potential of node N14 attains an H level, and node N15 attains an L level in response to the rise of the potential of node N13. When the potential of node 15 attains an L level in response to the rise of the potential of node N13, the potential of node N15 is pulled up to an H level, whereby a signal of an L level is provided from NAND circuit N1 to node N14. In response to the fall of the potential of node N14, an output signal of inverter circuit 58, i.e. output permission signal OEM attains an H level.

The potential of node N14 is fixed at the L level output permission signal OEM attains an H level during the period in which internal column address strobe signal ZCAS (ZCASE) is at an L level and the potential of node N15 is at an H level.

Even when output designating signal DOT is driven to an L level and the potential of node N13 is driven to an H level when delayed internal column strobe signal ZCASE attains an L level, the potential of node N14 is at an L level, and the potential of node N15 does not change. More specifically, output permission signal OEM maintains an H level even when output designating signal DOT is generated during the period of delay column address strobe signal ZCASE being at an L level.

When output designating signal DOT attains an L level, the output of inverter circuit 59 is brought to an H level, and precharge transistors 60a and 60b are both turned on. Internal data bus lines 915a and 915b are discharged to the level of ground potential for a predetermined time. Thus, when data is newly read out in the static column mode or a normal mode, internal data bus lines 915a and 915b can be precharged to a predetermined potential of the ground potential level.

If the precharge operation on internal data bus lines 915a and 915b to the level of the ground potential is to be carried out only in data readout, a structure may be provided in which inverter circuit 59 attains an operable state when an output from gate circuit 57 attains an H level. This structure can easily be realized by an AND circuit receiving an output of gate circuit 57 and output designating signal DOT and by providing the output of this AND circuit to precharge transistors 60a and 60b.

According to the above-described structure of the control circuit, output node 6 can be reliably precharged to the level of an intermediate potential when data is to be newly read out regardless of whether data H or L is previously read out.

The number of inverter circuits in delay circuits 15, 17, 19 and 12 shown in FIG. 1 and delay circuit 61 shown in FIG. 5 are not limited to those illustrated, and an appropriate number of stages providing an appropriate delay time can be used.

Modification 1

Figure 7:
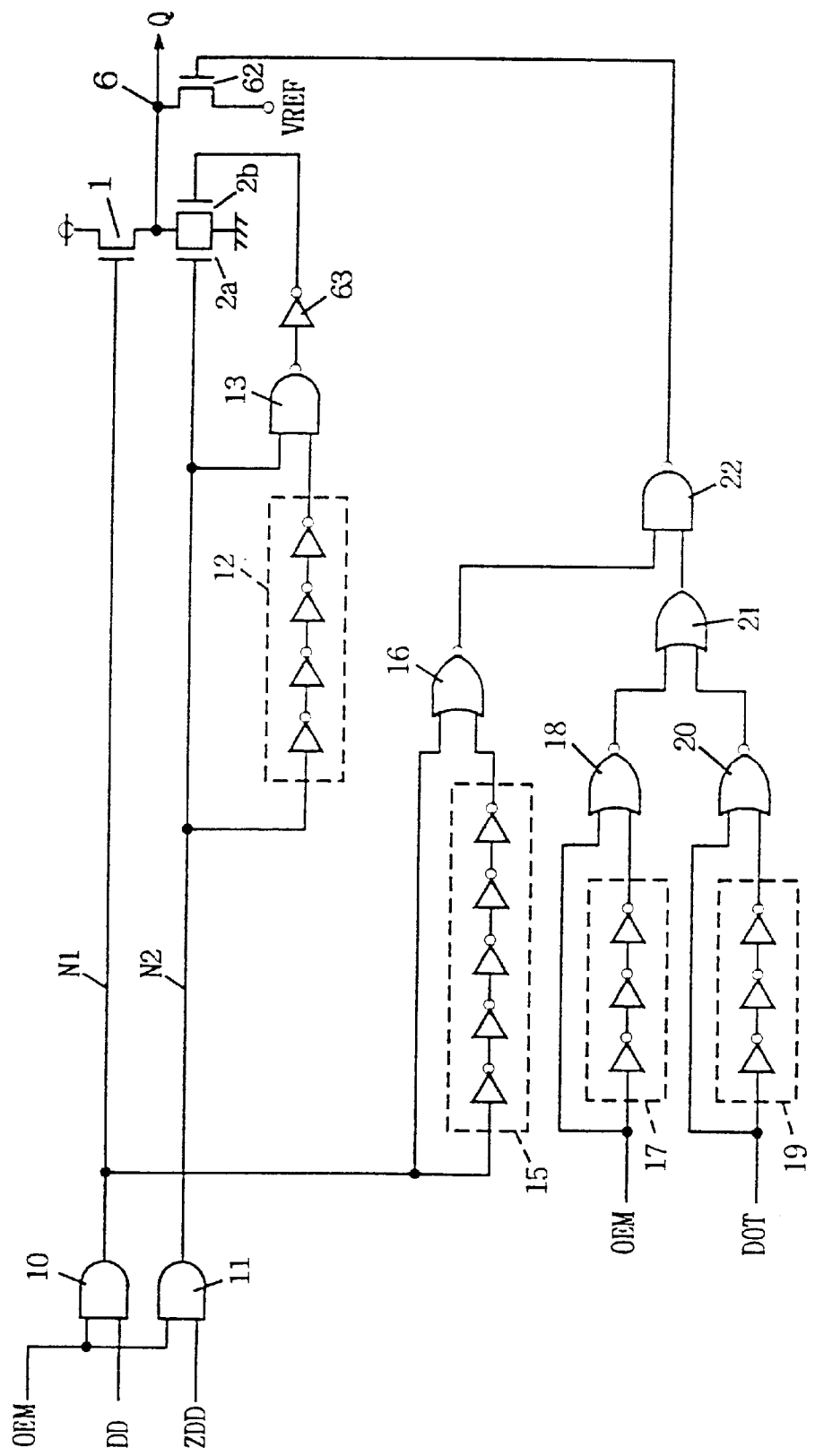
FIGS. 7 and 8 show second and third modifications, respectively, of the first embodiment of the present invention.

FIG. 7 shows a modification of the output circuit of the first embodiment. In the structure shown in FIG. 7, an n channel MOS transistor 62 rendered conductive in response to an output of NAND circuit 22 for driving output node 6 to the level of a reference potential VREF of Vcc/2, for example, for a predetermined time is provided. The output of NAND circuit 13 is provided to drive transistor 2b of a large driving capability via an inverter 63. In a discharging operation of output node 6 in the present structure, drive transistor 2a operates to gently discharge output node 6. Then, drive transistor 2b is turned on at an elapse of a predetermined time period, whereby output node 6 is rapidly discharged to the level of a ground potential. When one readout operation is completed, or in the case where a signal of an L level is output following the output of an H level in static column mode, transistor 62 conducts in response to an output of NAND circuit 22 to drive output node 6 to the level of reference potential VREF. Output node 6 can be reliably driven to the intermediate potential of Vcc/2 by using the potential level of Vcc/2 used in a dynamic semiconductor memory device as this reference potential VREF. In reading out data of an H level and an L level, the data ascertain timing can be made to coincide with each other without generating ringing, and high speed access can be realized. This is because the access time is determined by the longer one of data ascertaining times of read out data H and L.

Modification 2

Figure 8:
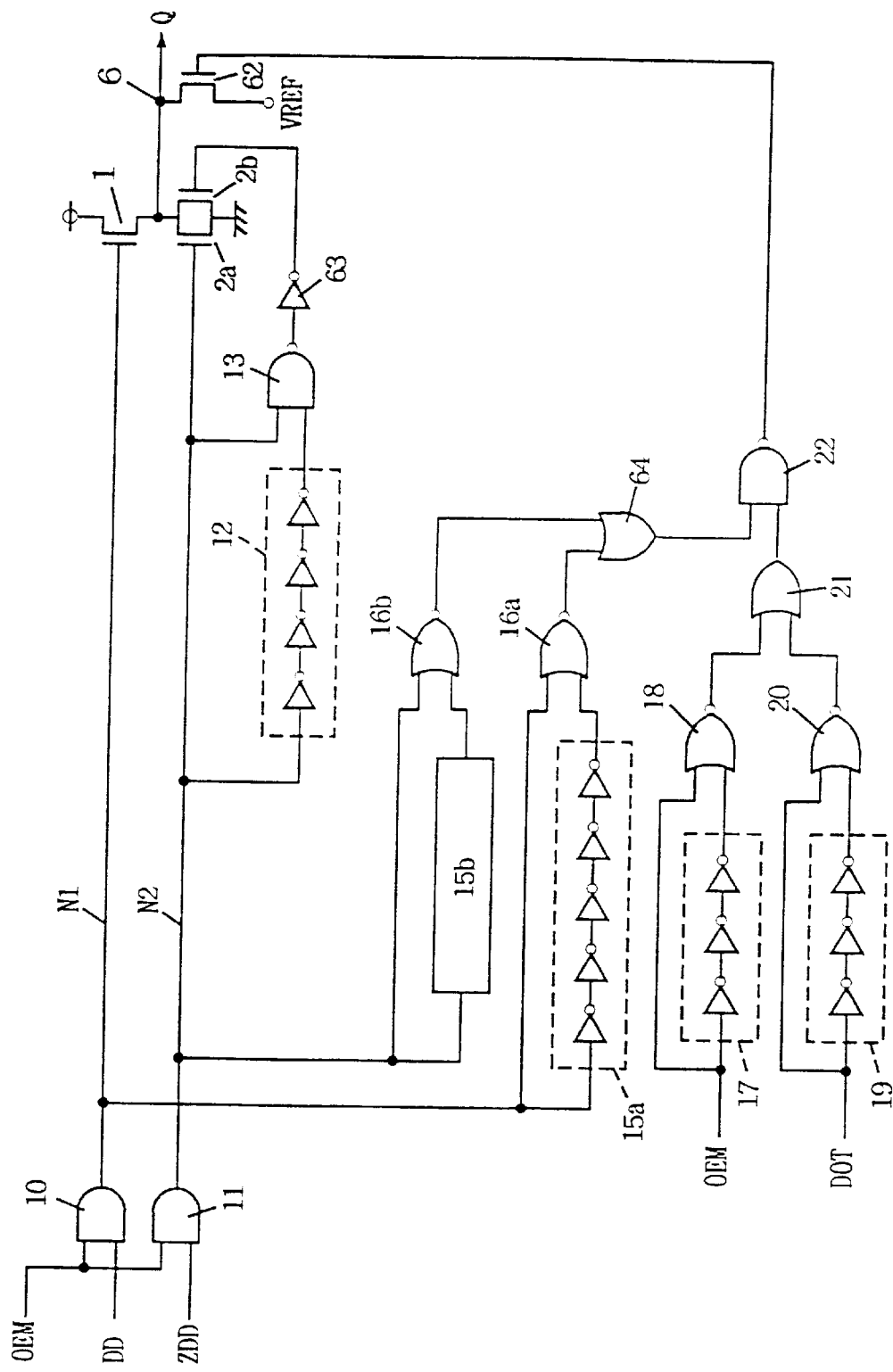

FIG. 8 shows another modification of the first embodiment. In FIG. 8, a delay circuit 15b and an NOR 16b are provided in order to generate a signal of an H level for a predetermined time in response to the fall of the potential of node N2. Delay circuit 15b has a structure similar to that of invert delay circuit 15a for generating a one shot pulse in response to a fall of the potential of node N1. The outputs of NOR circuits 16a and 16b are provided to OR circuit 64. The output of OR circuit 64 is provided to NAND circuit 22.

According to the structure shown in FIG. 8, a one shot pulse signal can be generated at the fall of the potential of node N1 or N2 to turn on precharge transistor 62 for a predetermined time. Therefore, regardless of whether the data signal appearing on output node 6 attains an H level or an L level, precharge transistor 62 is turned on to precharge the output node 6 to the level of intermediate potential VREF at the completion of one data readout cycle or when data is newly to be read out.

According to the first embodiment, an output node is driven to an intermediate potential at the completion of a data signal readout operation or when data is to be newly read out. Therefore, output node 6 will be driven from the level of an intermediate potential to the level of a corresponding logic level in newly providing a signal of an H or an L state, so that the potential amplitude of the output node can be reduced. Therefore, generation of ringing can be prevented, and a data signal can be output stably and speedily. The time required to ascertain the potential of the H and L levels can be reduced to allow high speed access since the output node is maintained at an intermediate potential.

Furthermore, power consumption in a data signal output operation can be reduced since the output node is driven to the potential level of H or L from an intermediate potential level.

Embodiment 2

Figure 9:
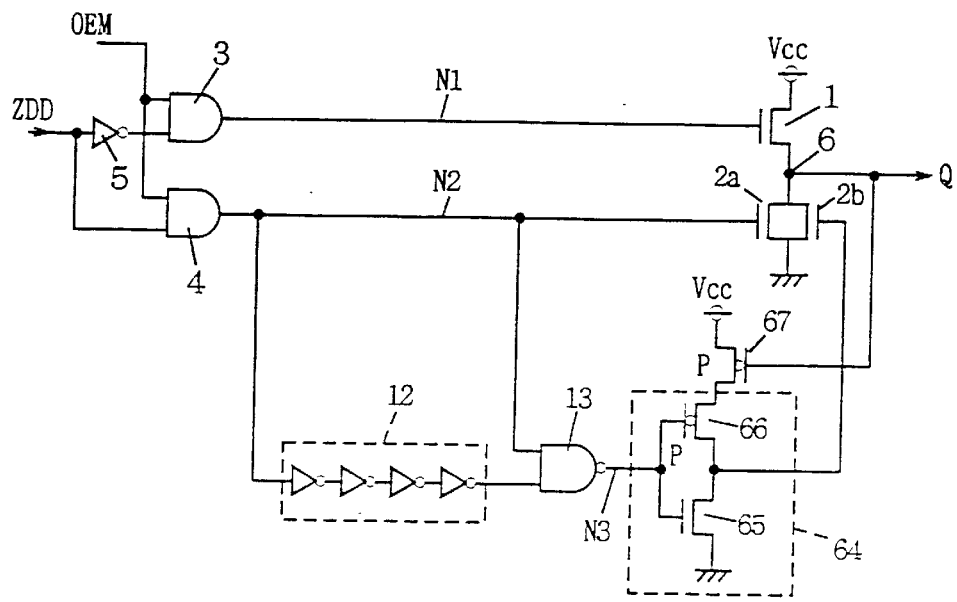
FIG. 9 shows a structure of an output control circuit according to a second embodiment of the present invention.

FIG. 9 shows a structure of an output circuit according to a second embodiment of the present invention for discharging output node 6 to the level of ground potential.

Referring to FIG. 9, an output circuit includes an inverter circuit 5 for inverting an internal readout data signal ZDD, an AND circuit 3 for receiving output permission signal OEM and an output of inverter circuit 5, and an AND circuit 4 for receiving output permission signal OEM and an internal readout data signal ZDD. Internal readout data signal ZDD has a logic opposite to that of data DD.

The output circuit further includes a delay circuit 12 for delaying an output of AND circuit 4, i.e. a signal on node N2 for a predetermined time, a NAND circuit 13 for receiving the signal on node N2 and an output of delay circuit 12, an inverter circuit 64 for receiving an output of NAND circuit 13, and a p channel MOS transistor 67 responsive to the signal potential on output node 6 for adjusting the "H" driving capability of inverter 64. Inverter circuit 64 includes a p channel MOS transistor 66 and an n channel MOS transistor 65 connected in a complementary manner between transistor 67 and ground node. Transistor 67 is provided between p channel MOS transistor 66 and the power potential node supplying a power supply potential Vcc, and receives at its gate a signal on output node 6.

The output circuit further includes an n channel MOS transistor 1 responsive to an output of AND circuit 3 for charging output node 6 to the level of power supply potential Vcc, an n channel MOS transistor (drive transistor) 2a responsive to an output of AND circuit 4 for discharging the potential of output node 6 in a relatively gentle manner, and an n channel MOS transistor (drive transistor) 2b responsive to an output of inverter circuit 64 for discharging the potential of output node 6 to the level of the ground potential. The current driving capability of transistor 2a is set smaller than that of transistor 2b. The operation of the output circuit of FIG. 9 will now be described with reference to the operation waveform diagram of FIG. 10.

The operation in a case where internal readout data signal ZDD is an H level will be described. When output permission signal OEM attains an L level, the outputs of AND circuits 3 and 4 are both pulled down to an L level, and drive transistors 1, 2a, and 2b are turned off.

When output permission signal OEM is pulled up to an H level, the output of AND circuit 4 is driven to an H level. As a result, drive transistor 2a is turned on, and output node 6 is discharged in a relatively gentle manner. The signal potential on output node 6 is provided to the gate of transistor 67. Transistor 67 has its current driving capability increased (a greater conductance) as the gate potential thereof is reduced. At an elapse of a predetermined time, the output of NAND circuit 13 (the signal potential on node N3) attains an L level. In response to the fall of the signal potential on node N3, the output of inverter circuit 64 attains an H level. The potential level of the signal output of an H level from inverter 64 varies according to the potential level of output node 6.

The voltage transmitted to p channel MOS transistor 66 of inverter circuit 64 by transistor 67 is Vcc-V (6) -Vth, where V (6) is the potential of output node 6 and Vth is the absolute value of the threshold voltage of p channel MOS transistor 67. According to reduction in the potential of output node 6, the potential level of the H output of inverter circuit 64 increases, whereby drive transistor 2b is turned on more deeply to discharge the potential of output node 6 to the level of the ground potential at high speed. More specifically, the potential level of the H output of inverter circuit 64 increases as the potential of output node 6 is lowered, which causes drive transistor 2b to be turned on more deeply. When the potential of output node 6 is reduced to a sufficient low level, drive transistor 2b discharges output node 6 to the level of ground potential more speedily. Since driver transistor 2b discharges output node 6 towards the level of the ground potential at high speed when the potential of output node 6 arrives at a level where no ringing occurs, an output signal can be generated stably with no ringing.

A normally-on-transistor can be used for p channel MOS transistor 67, which serves as a resistance element having a resistance (conductance) reduced (increased) in proportion to reduction of the potential of output node 6. In this case, when the output of inverter 64 is driven to an H level, the rise of the output potential of inverter 64 becomes faster according to the fall of the potential of output node 6, so that drive transistor 2b is turned on deeply according to the fall of the potential of output node 6.

Figure 10:
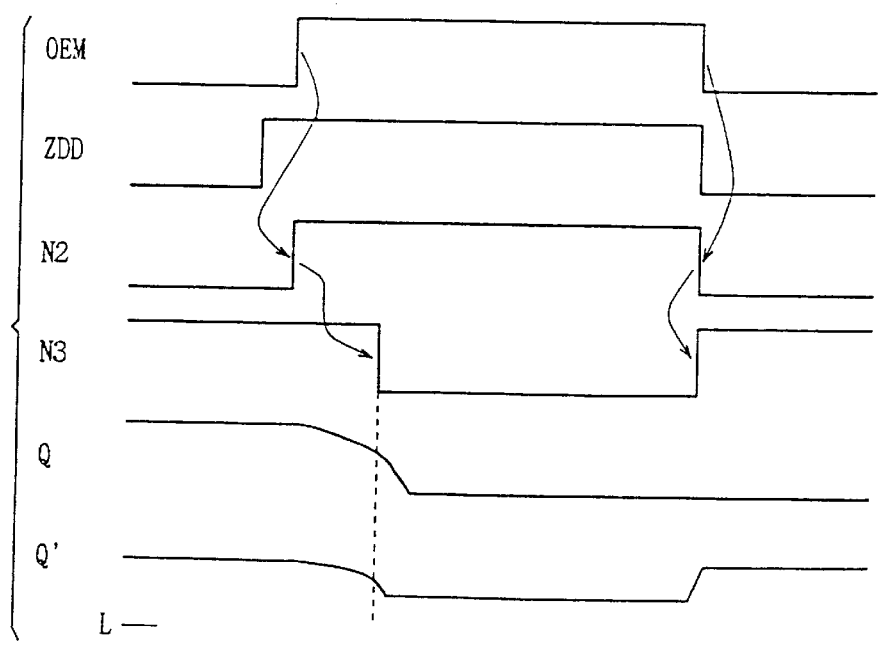
FIGS. 10 and 11 are signal waveform diagrams representing the operation of the output control circuit of FIG. 9.

The operation waveform diagram of FIG. 10 represents the state where all driver transistors 1, 2a and 2b are turned off when output node 6 is discharged to the level of ground potential and output permission signal OEM attains an L level. It is to be noted that this output node 6 driving circuitry of FIG. 9 may be used in a combination with the structure as in the first embodiment where the potential at output node 6 is maintained at the level of an intermediate potential. In FIG. 10, the potential change to the intermediate potential in output node 6 is shown as Q'. The advantages set forth in the foregoing can be obtained by increasing the discharging force in proportion to reduction in the potential when output node 6 is maintained at the intermediate level.

Figure 11:
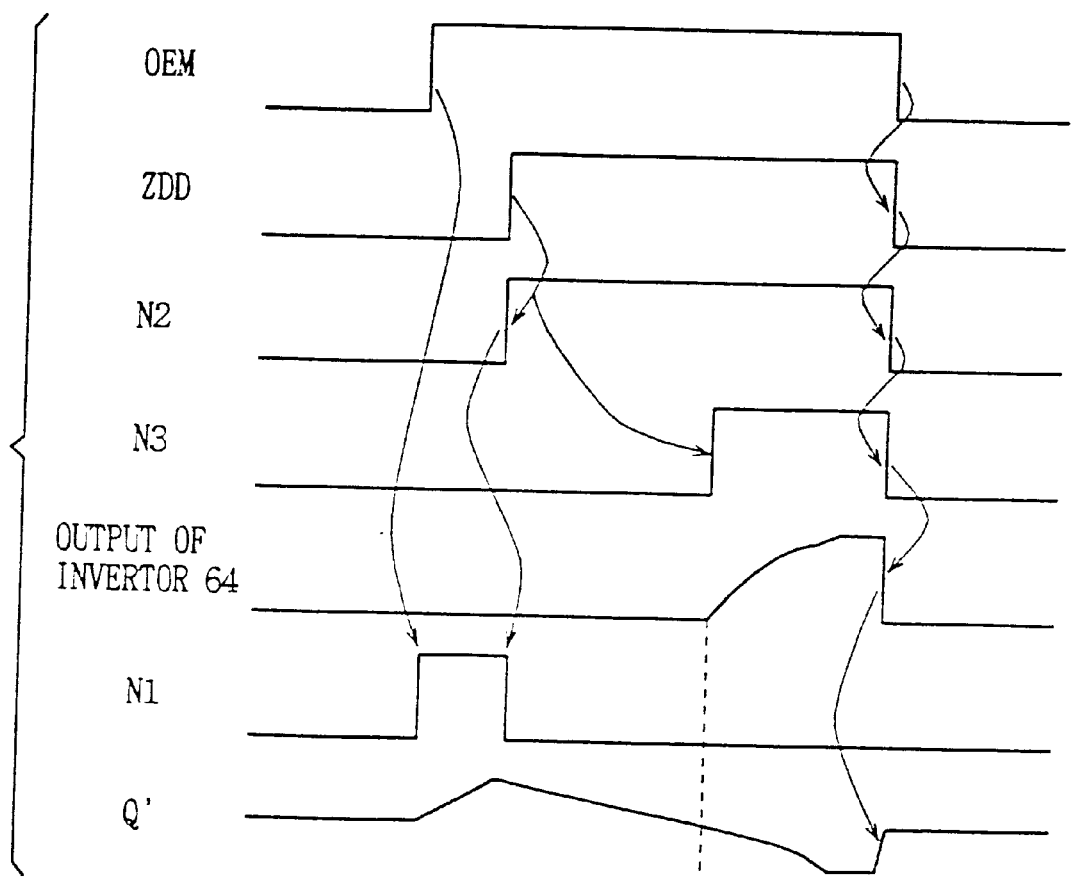

FIG. 11 shows an operation waveform where a valid readout data is transmitted after output permission signal OEM is rendered active. In FIG. 11, output node 6 is precharged to the level of intermediate potential. Output node 6 is precharged to the intermediate potential when output permission signal OEM attains an L level. When output permission signal OEM is driven to an H level and internal readout data signal ZDD attains an L level, the potential of node N1 is driven to an H level, whereby the potential of output node 6 increases to result in output data Q' of an H level. When valid data appears at an elapse of a predetermined time and internal readout data signal ZDD attains an H level, the potential of node N2 is pulled up to an H level, and the potential of node N1 is pulled down to an L level. As a result, drive transistor 2a is turned on, whereby output node 6 is gently discharged toward the level of ground potential. Accordingly, the potential of output signal Q' is gradually lowered.

When node N3 (output of NAND circuit 13) attains an L level at an elapse of a predetermined time, the output of inverter circuit 64 increases gradually. The rising speed of the output of inverter circuit 64 depends upon the potential of output nodes. When the potential of output signal Q' is high, the output of inverter circuit 64 rises gently. When the potential of output signal Q' attains a sufficiently low level, the output of inverter circuit 60 rapidly rises to the level of power supply potential Vcc. The driving capability of drive transistor 2b is set to a great level when the potential of output node 6, i.e. the potential of output signal Q' attains a sufficiently low level, whereby output node 6 is discharged speedily towards the level of ground potential. Therefore, in an operation where invalid data and then valid data are output, an output signal can be generated stably with no generation of ringing by adjusting the current driving capability of drive transistor 2b according to the potential level of output node 6 even when the logic of the valid data and the invalid data differ from each other.

The operation mode where invalid data appears on output node 6 will be described in detail afterwards.

Figure 12:
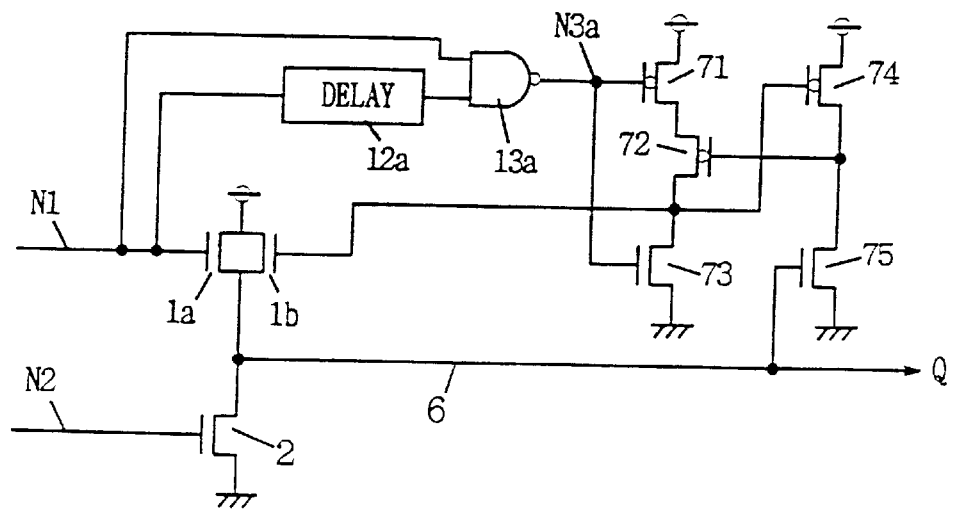
FIG. 12 shows a modification of the second embodiment of the present invention.

FIG. 12 shows a structure of the portion for driving output node 6 to an H level. In FIG. 12, drive transistor 1a formed of an n channel MOS transistor conducting in response to a signal potential on node N1 and a drive transistor 1b in parallel to drive transistor 1a are provided to drive (charge) output node 6 to the level of power supply voltage Vcc in FIG. 12.

The control unit of the output circuit further includes a delay circuit 12a for delaying the signal potential on node N1 for a predetermined time, a NAND circuit 13a for receiving a signal on node N1 and an output of delay circuit 12a, a p channel MOS transistor 71 and an n channel MOS transistor 73 having gates receiving the output of NAND circuit 13a, a p channel MOS transistor 72 provided between transistors 71 and 73, an n channel MOS transistor 75 receiving a signal on output node 6 at its gate, and a p channel MOS transistor 74 provided between transistor 75 and a power potential supply node. The gate of transistor 74 is connected to the node of transistors 72 and 73 and to the gate of drive transistor 1b. The gate of transistor 72 is connected to the node of transistors 74 and 75. The operation of the circuit shown in FIG. 12 will be now described with reference to the operation waveform diagram of FIG. 13.

It is assumed that internal readout data signal ZDD attains an L level. When output permission signal OEM attains an,L level, the potential of nodes N1 and N2 both attain an L level, and drive transistors 1a and 2 are both turned off. The output of NAND circuit 13a attains an H level since the potential of node N1 attains an L level, and a signal of an L level is provided to drive transistor 1b since transistor 73 is on. Therefore, drive transistor 1b is also off.

When output permission signal OEM is driven to an H level, the potential of node N1 is pulled up to an H level, and drive transistor 1a is turned on. The current driving capability of drive transistor 1a is set relatively small, and the potential of output node 6 is increased gently. The output of NAND circuit 13a (output potential of node N3a) is brought to an L level at an elapse of a predetermined time, whereby transistor 73 is turned off and transistor 71 is turned on. The potential of output node 6 is provided to the gate of transistor 75. When the potential of output node 6 attains the level of an intermediate potential, the current driving capability of transistor 5 is low (small conductance), and the current driving capability of transistor 74 is high. Therefore, the gate potential of transistor 72 is relatively high, and the conductance of transistor 72 is low. Under this state, the potential of drive transistor 1b rises gently, and drive transistor 1b has its current driving capability restricted and charges output node 6 in a relatively mild manner.

Figure 13:
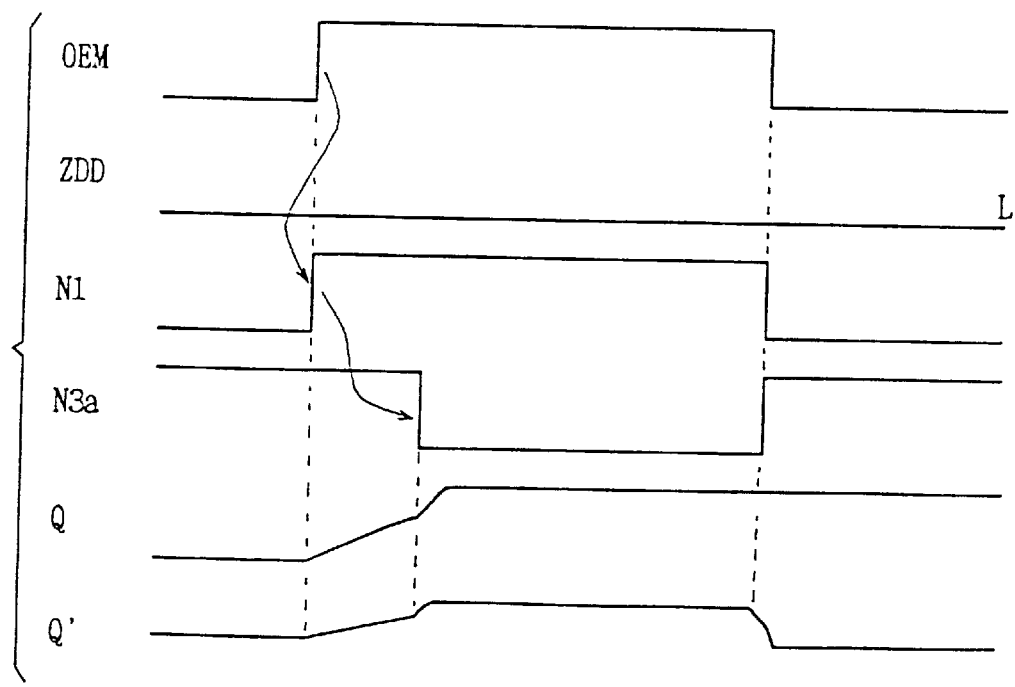
FIG. 13 is a signal waveform diagram representing an operation of the output control circuit of FIG. 12.

When the potential of output node 6 rises to a sufficiently high level, the current driving capability of drive transistor 75 is increased, which causes the gate potential of transistor 72 to be lowered to a sufficient low level. The current driving capability of transistor 72 becomes greater, whereby the potential of transistor 1b increases at high speed. The current driving capability thereof is increased to charge output node at high speed. Here, the current driving capability of transistor 74 is set small according to increase of the gate potential of transistor 1b. The gate potential of transistor 72 is discharged at high speed according to the increase in the potential of output node 6. Transistor 72 is turned on deeply, which causes the current driving capability of drive transistor 1b to be increased at high speed. Therefore, when the potential of output node 6 rises to a level where no ringing is generated, the potential further increases speedily to generate an output signal stably with no ringing. In FIG. 13, the operation waveform in the case where output node 6 is charged to the level of intermediate potential is also indicated as output signal Q'.

As described above, the driving capability of an output node is adjusted according to the potential level thereof in accordance with the structure of the output circuit of the second embodiment, so that the potential of the output node attaining a potential level where ringing is not generated is driven speedily. Therefore, a stable output signal can be generated with no generation of ringing.

Embodiment 3

In a dynamic semiconductor memory device with a static column mode function, a column select operation is carried out according to an address transition detection signal φATD generated in response to a change in a column address signal. Column address strobe signal ZCAS is used only for the purpose of determining the timing of data output. In this case, there is a possibility that invalid data is generated at an output node according to the relationship of RAS-CAS delay time TRCD, i.e. the time required from activation of row address strobe signal ZRAS to activation of column address strobe signal ZCAS, and column address-CAS delay time TASC, i.e. the time required from a change in column address signal Ad to a change in column address strobe signal ZCAS. Prior to description of the present third embodiment, the operation where invalid data is output and invalid data is not output will be described with reference to the control signal generation circuit of FIG. 5.

Figure 14:
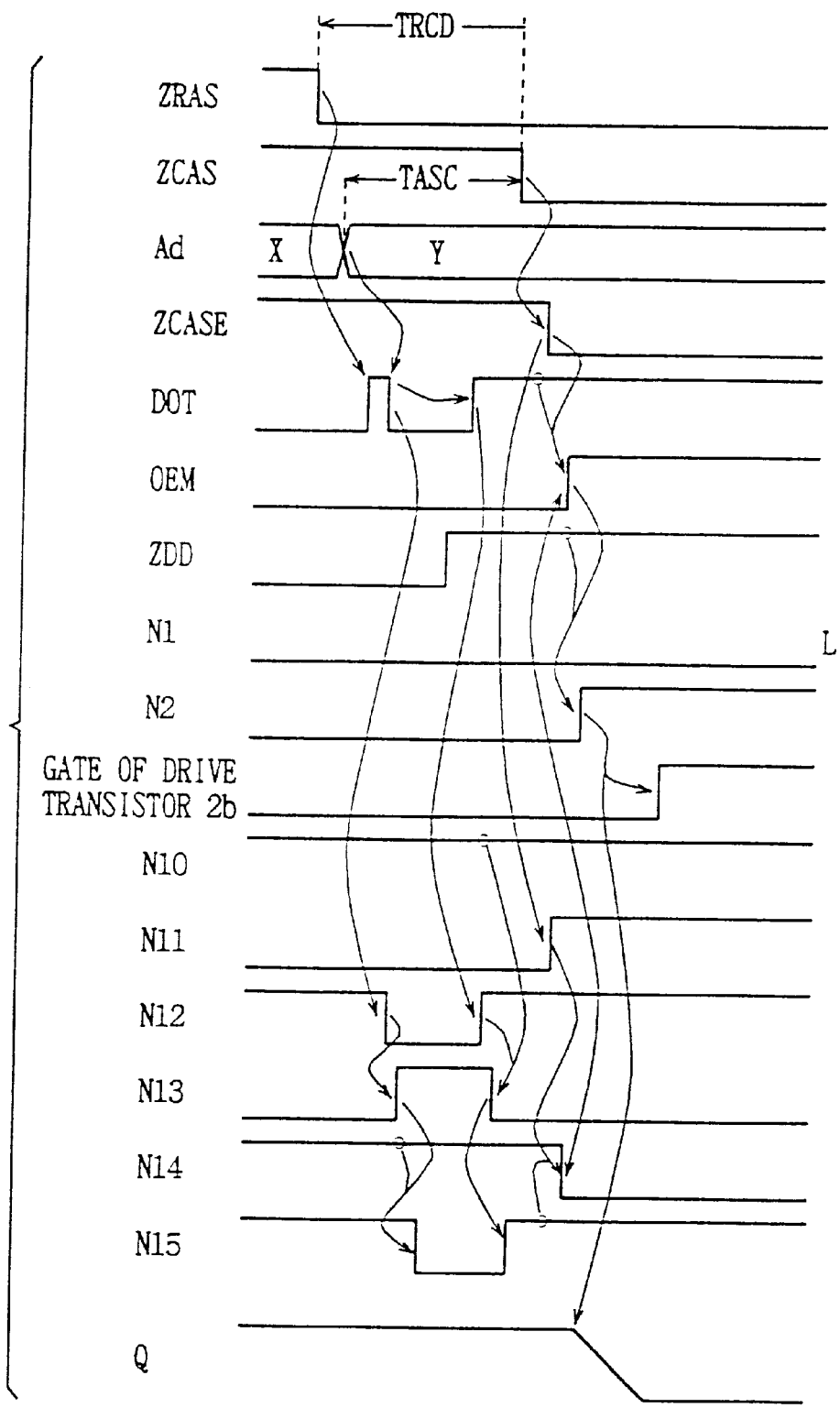
FIG. 14 is a diagram for showing the timing relationship of an output designating signal and an output permission signal, and the relationship of resulting output signals and these signals.

First, the operation in a case where invalid data is not output will be described with reference to FIGS. 5 and 14.

When row address strobe signal ZRAS is activated to attain an L level, a memory cycle is initiated. The currently applied address signal Ad is entered as a row address signal X and row select operation is made. In this state, the control-circuit of FIG. 5 attains an initial state, and output permission signal OEM attains an L level.

When row address strobe signal ZRAS is activated to attain an L level, one shot pulse generation circuit 50 is enabled to provide an H level output. Since column address buffer 907 is enabled in response to row address strobe signal ZRAS in static column mode, the output of column buffer 907 does not change when row address signal X changes, so that one shot address transition detection signal φATD is not generated (refer to FIG. 86). Alternatively, pulse transition detection circuit (ATD circuit) 920 may be adapted to attain an operable state when row address strobe signal ZRAS attains an L level.

At an elapse of a row address hold time period, address signal Ad changes, and a column address signal Y is generated. In response to change in address signal Ad, address transition detection signal φATD is activated, whereby output designating signal DOT generated from one shot pulse generation circuit 50 attains an L level for a predetermined time. In response to the transition of output designating signal DOT to an L level, a pulse signal of an L level greater in period than that of output designating signal DOT is applied to node N12 from one shot pulse generating circuit 52. The pulse width of the L level one shot pulse signal applied on node N12 is greater than the L period of output designating signal DOT by the delay time provided by delay circuit 61.

When the potential of node N12 attains an L level, a signal of an H level is provided from NAND circuit 55 to node 13.

In a data reading operation, the output of gate circuit 57 attains an H level.

In the initial state, the potential of node N14 attains an H level. When the potential of node N13 attains an H level, the potential of node N15 is pulled down to an L level. Thus, the potential at node of N14 is reliably set at the H level. Under this state, output permission signal OEM is still inactive at the L level.

When the address-CAS delay time TASC is long enough, delay column address strobe signal ZCASE still attains an H level even when output designating signal DOT is brought to an H level. Under this state, the potential of node N14 is still at an H level. Therefore, when output designating node DOT attains an H level, the potential of node N13 is pulled down to an L level, whereby the potential of node N15 is pulled up to an H level.

At an elapse of address-CAS delay time TACD, column address strobe signal ZCAS is activated to attain an L level, whereby delayed column address strobe signal ZCASE attains an L level. In-response to delayed column address strobe signal ZCASE attaining an L level, a signal of an H level is provided from inverter circuit 54 onto node N11. Since the potential of N15 is at an H level, the potential of node N14 is pulled down to an L level in response to a rise of the potential of node N11, and output permission signal OEM attains an H level.

Valid data ZDD is already produced when output permission signal OEM attains an H level. In response to data signal ZDD, the potentials of nodes N1 and N2 are driven to an L level and an H level, respectively. In response to the potential of node N2 attaining an H level, drive transistor 2a is turned on, whereby output Q is lowered gently. Then, drive transistor 2b is turned on, and the potential of output Q is lowered at high speed.

As described above invalid data is not output if time TAC is long enough. Output signal Q can change stably from the level of an intermediate potential, for example, to the level of ground potential or power supply potential with no generation of ringing.

Figure 15:
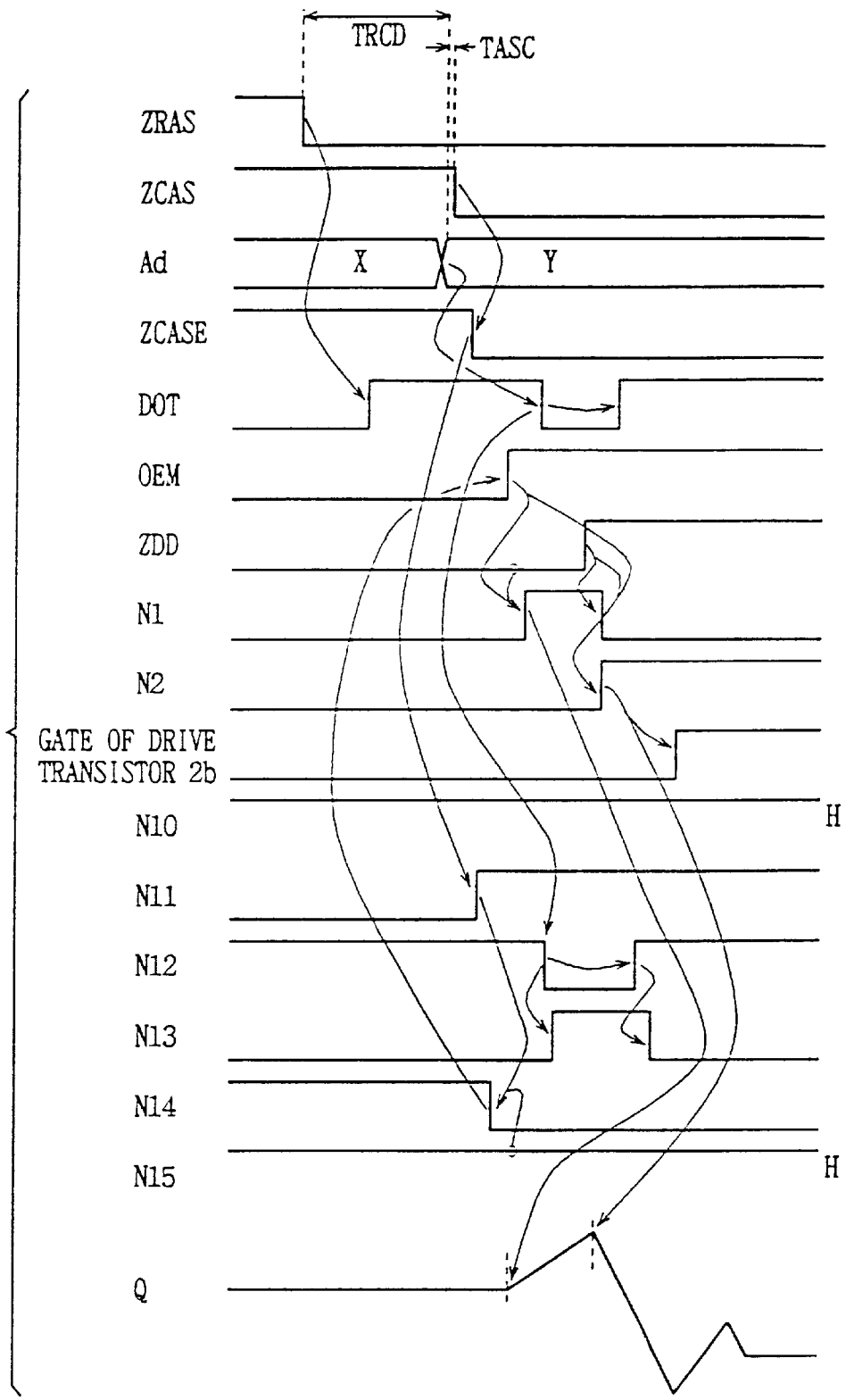
FIG. 15 is a diagram used for explaining the timing relationship of an output designating signal and an output permission signal, and the relationship of output data signals and these signals.

FIG. 15 shows an operation waveform in the case where invalid data is output. An output operation of invalid data will now be described with reference to FIGS. 15 and 5.

Row address strobe signal ZRAS is activated to attain an L level. In response, output designating signal DOT is pulled to an H level. In response to activation of internal row address strobe signal ZRAS, the currently applied address Ad is entered as a row address signal (X address), and a row corresponding to this X address is selected.

At a change of address signal Ad, address transition detection signal φATD is generated. In response to address transition detection signal φATD, one shot pulse generation circuit 50 generates output designating signal DOT of one shot pulse signal of an L level at an elapse of a predetermined time period.

When a column address signal is generated, column address strobe signal ZCAS is immediately pulled down to an L level. More specifically, the address-CAS delay time TASC is extremely short in this case. Delayed column address strobe signal ZCASE attains an L level before output designating signal DOT is driven to an L level. In response, node N11 attains an H level. Since the potential of node N15 is at an H level, the output of NAND circuit NA1 (potential of node N14) is driven to an L level, and output permission signal OEM is driven to an H level. Valid data is output at an elapse of a predetermined time period from the drive of output designating signal DOT to an L level, and internal readout data ZDD is pulled up to an H level. Therefore, when output permission signal OEM attains an H level, invalid data is output already. The potential of output signal Q rises according to this "L" invalid data signal ZDD. Then, valid data appears, and output signal Q is lowered according to an "H" internal readout signal ZDD.

Thus, when data DD of an L level is provided as valid data following provision of data DD at "H" as invalid data, the potential amplitude is great even in the case where output signal Q is set at the intermediate potential. It is considered that the potential of output node 6 is not lowered enough when drive transistor 2b is turned on, resulting in the possibility of generation of ringing in output signal Q. A structure with which when there is no ringing even in the case where such invalid data is output will be described. It is assumed that output signal Q is precharged to an intermediate potential level in the following description. Although the drive of output signal Q to an L level is described, the same applies for output signal Q driven to an H level.

Figure 16:
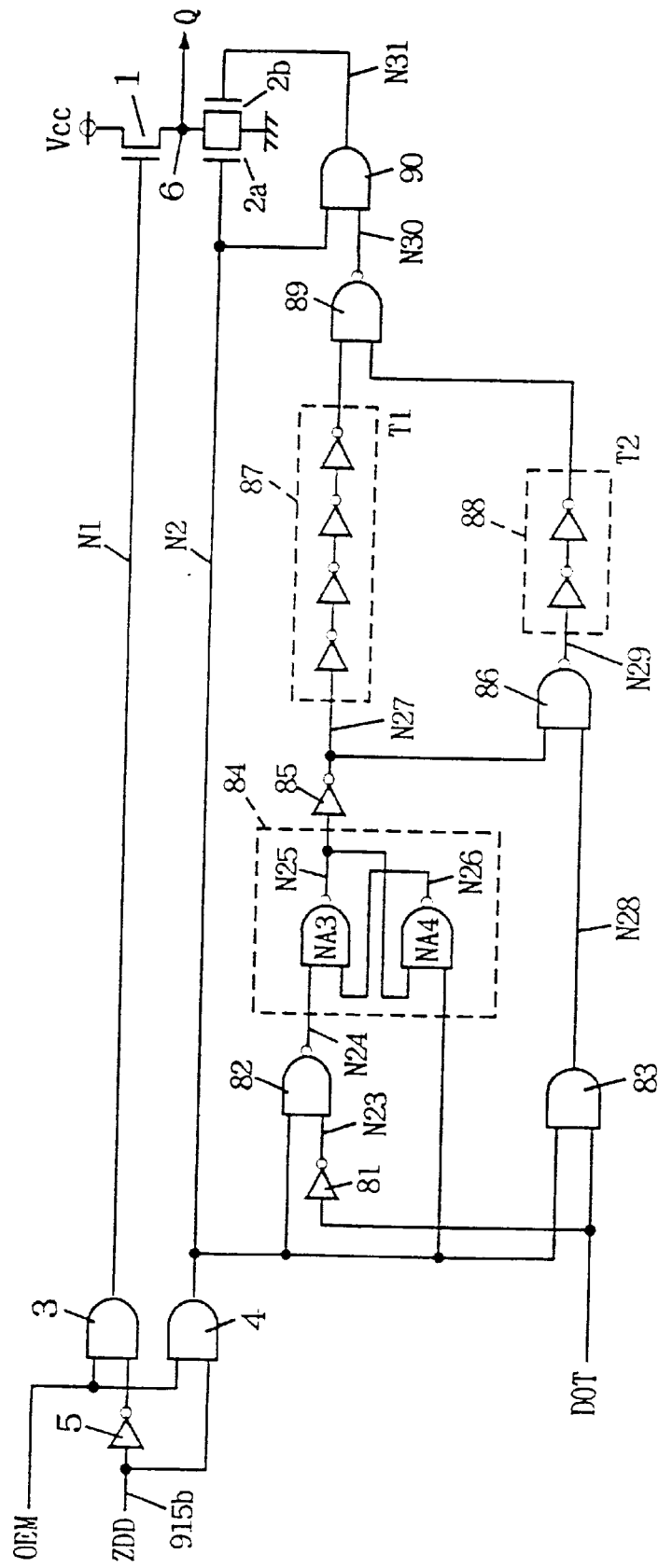
FIG. 16 shows a structure of an output control circuit according to a third embodiment of the present invention.

FIG. 16 shows a structure of an input circuit according to a third embodiment of the present invention. In FIG. 16, a structure is shown for preventing generation of ringing when a data signal of an L level is output to output node 6. By providing a similar structure with respect to node N1 (output of NAND circuit 3), a structure of preventing generation of ringing in providing a data output signal of an H level can be realized.

Referring to FIG. 16, the output circuit includes, as basic components, an AND circuit 4 for receiving an output permission signal OEM and internal readout data signal ZDD, an inverter circuit 5 for inverting internal readout data signal ZDD, an AND circuit 3 for receiving an output of inverter circuit 5 and output permission signal OEM, a drive transistor 1 responsive to an output of AND circuit 3 for charging output node 6 to the level of power supply voltage Vcc, a drive transistor 2a of low current driving capability responsive to an output of AND circuit 4 for gently discharging output node 6 to the level of ground potential, and a drive transistor 2b provided in parallel to drive transistor 2a for discharging output node 6 with a current driving capability greater than that of drive transistor 2a.

The control system for controlling the operation of drive transistor 2b includes an inverter circuit 81 for inverting output designating signal DOT, an NAND circuit 82 for receiving a signal on node N2 (output of AND circuit 4) and an output of inverter circuit 81, and a flipflop 84 for receiving an output of NAND circuit 82 and a signal on output node N2. Flipflop 84 includes cross-coupled NAND circuits NA3 and NA4. NAND circuit NA3 has one input receiving an output of NAND circuit 82, and the other input receiving an output of the NAND circuit NA4. NAND circuit NA4 has one input receiving an output of NAND circuit NA3, and the other input receiving a signal on node N2. Flipflop 84 has a function to determine whether or not valid data appears on node N2.

The control system further includes an inverter circuit 85 for receiving an output of NAND circuit NA3 (signal on node N25) in flipflop 84, a NAND circuit 86 for receiving outputs of inverter circuit 85 and AND circuit 83, a delay circuit 87 for delaying an output of inverter circuit 85 for a predetermined time period, a delay circuit 84 for delaying an output of NAND circuit 86, a NAND circuit 89 for receiving outputs of delay circuits 87 and 88, and an AND circuit 90 for receiving a signal on node N2 and an output of NAND circuit 89. The output of AND circuit 90 is provided to the gate of transistor 2b.

The delay time T1 of delay circuit 87 is set longer than delay time T2 of delay circuit 88. The operation of the output circuit of FIG. 16 will be is described with reference to the waveform diagram of FIG. 17.

The operation in a case where invalid data signal is provided will be described with reference to FIG. 17A. Here, it is assumed that an invalid data signal is data signal ZDD of an L level, and an valid data signal is data signal ZDD of an H level.

When an invalid data signal is output, output permission signal OEM attains an H level, followed by output designating signal DOT attaining an inactive state of an L level. When output permission signal OEM is pulled up to an H level, the potential of node N2 attains an L level according to invalid data signal ZDD. Under this state, drive transistor 1 is turned on and drive transistor 2a is turned off. Output node 6 is charged to have the potential thereof increased via drive transistor 1. When output designating signal DOT is pulled down to an L level, a signal of an H level is provided from inverter 81 to node N23. When output designating signal DOT attains an L level, valid data appears, and internal readout data signal ZDD is pulled up to an H level. As a result, the potential of node N2 is pulled to an H level, whereby drive transistor 2a is turned on and drive transistor 1 is turned off. Output node 6 is discharged gently.

When the potential of node N2 is pulled up to an H level, a signal of an L level is provided from NAND circuit 82 to node N24 since the potential of node N23 is at an H level. When the potential of node N24 attains an L level, flipflop 84 is set, and the potential of node N25 attains an H level (the potential of node N26 is at an H level). When node N25 rises to an H level, NAND circuit NA4 in flipflop 84 receives a signal of an H level at both inputs, whereby the potential of node N26 is driven to an L level, and the potential of node N25 is fixed at an H level.

When the potential of node N25 is pulled up to an H level, the potential of node N27 is pulled down to an L level. The output of AND circuit 83 is at an L level since output designating signal DOT attains an L level. Therefore, when the potential of node N25 attains an H level, the output of NAND circuit 86 is fixed at an H level.

At an elapse of a delay time T1 of delay circuit 87, NAND circuit 89 receives a signal of an L level from delay circuit 87, and a signal of an H level is provided on node N30. The potential of node N2 already attains an H level, and therefore AND circuit 90 provides a signal of an H level on node N31, whereby drive transistor 2b is turned on. As a result, output node 6 is discharged at high speed via transistor 2b.

As described above, output permission signal OEM is rendered active prior to a change of output designating signal DOT when invalid data is present. In this case, the ON transition timing of output drive transistor 2b is determined by delay circuit 87 having a great delay time. Thus, output node 6 is discharged at high speed via drive transistor 2b when the potential of output node 6 is low enough. Generation of a ringing can be reliably prevented even when invalid data and valid data of different logics are output.

The operation in a case where an invalid data signal is not output will be described with reference to FIG. 17B.

When invalid data is not output, output permission signal OEM attains an H level after output designating signal DOT is activated. As appreciated from the circuit configuration of FIG. 5, output permission signal OEM is generated according to delayed column address strobe signal ZCASE when output designating signal DOT attains an H level.

Under this condition, when output permission signal OEM is brought to an H level, a readout data signal ZDD of an H level is already output, and the potential of node N2 attains an H level in response to the rise of the potential of output permission signal OEM. When the potential of node N2 is pulled to an H level, output designating signal DOT is already restored to an H level, and AND circuit 83 provides a signal of an H level to node N28. In flipflop 84, node N26 is set to the initial state of an H level, and node N25 is set to an initial state of an L level. Therefore, when the potential of node N2 attains an L level, the latch state of flipflop 84 does not change even when output designating signal DOT is brought to an L level. Similarly, the output of NAND circuit 82 attains an H level (the output of inverter circuit 81 is already driven to an L level) when the potential of node N2 is pulled up to an H level from L level, so that the latch state of flipflop 84 does not change. Therefore, the potential of node N27 is fixed at an H level.

Under this state, when the potential of node N2 is pulled up to an H level to cause the potential of node N28 to rise to an H level, the potential of node N29 is pulled down to an L level by NAND circuit 86. At an elapse of a delay time of T2 of delay circuit 88, NAND circuit 89 provide a signal of an H level to node N30. As a result, AND circuit 90 provides a signal of an H level on node N31, and drive transistor 2b is turned on.

Invalid data is not output when address access time TASC is relatively long. In this case, activation of output enable signal OEM causes output node 6 to be gently discharged by drive transistor 2a to result in reduction of the potential thereof since an invalid data signal is not output. At an elapse of delay time T2 of delay circuit 88, drive transistor 2b is turned on, whereby output node 6 is discharged to the level of ground potential at high speed. Since invalid data is not output here, drive transistor 2b of a great current driving capability is activated after the potential of output node 6 is low enough. Therefore, a stable output signal with no ringing can be obtained.

Figure 17B:
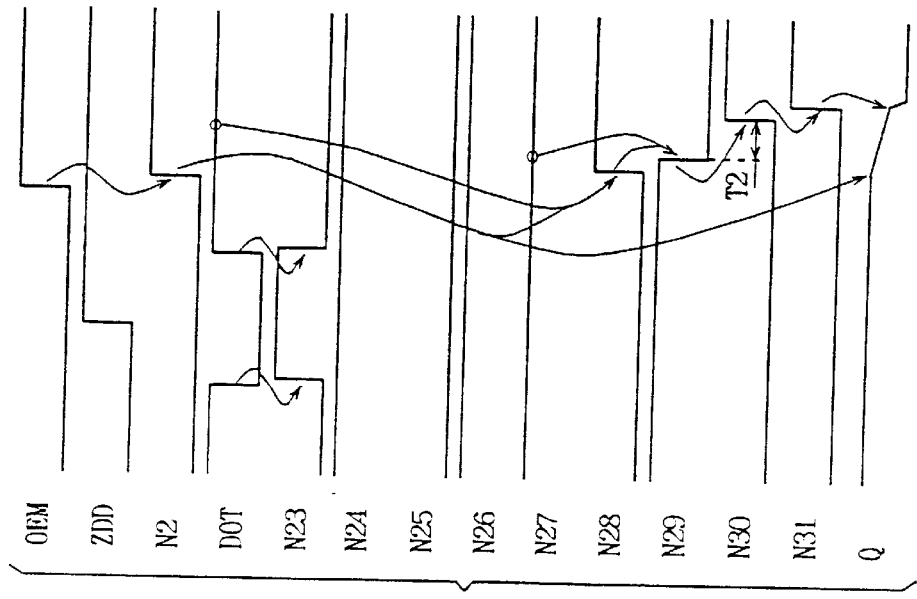
FIGS. 17A and 17B are signal waveform diagrams representing an operation of the output control circuit of FIG. 16.
Figure 17A:
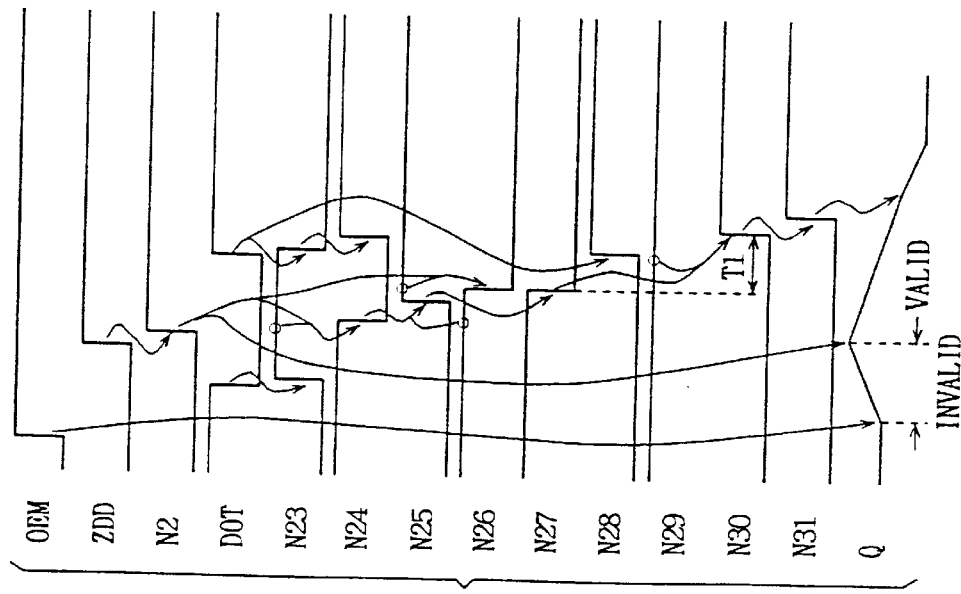

In the operation waveform diagrams of FIGS. 17A and 17B, internal readout data signal ZDD is set to an L level in a standby state. Similar to the first embodiment, a structure is employed where internal data lines 915a and 915b are both precharged to the level of ground potential when the output node is maintained at the level of the intermediate potential.

The current driving capability of drive transistors 2a and 2b can be selected by differentiating the size of drive transistors 2a and 2b, i.e. the ratio of the gate width W to gate length L, and β (the constant proportional to W/L) of drive transistors 2a and 2b are to be differentiated.

It is not particularly necessary to differ the current driving capability of drive transistor 2a from that of drive transistor 2b. Since drive transistor 2a is on when drive transistor 2b is turned on, output node 6 is discharged via the two transistors, so that the capability of discharging output node 6 is set to a great level equivalently. A similar effect can be obtained even when the current driving capabilities of drive transistors 2a and 2b are the same.

Also, an effect similar to that of the above-described embodiment can be obtained even when three or more transistors for discharging output node 6 are provided and the discharging operation of output node 6 is carried out in several stages. Such a structure can easily be realized by providing an additional delay circuit at the output of AND circuit 90 in the structure of FIG. 16 and providing a transistor rendered conductive in response to an output of this delay circuit between output node 6 and the ground potential node.

The number of stages of inverters in the delay circuit is arbitrary as long as the condition that the delay time of delay circuit 88 is set shorter than that of delay circuit 87 is met. Furthermore, a delay element different from an inverter (for example, a RC delay element) may be used.

Modification 1

Figure 18A:
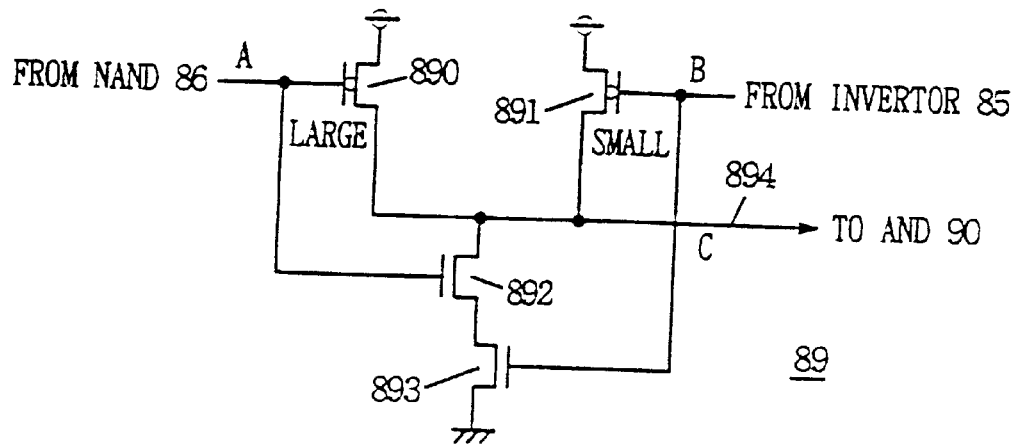
FIGS. 18A and 18B show a structure and a signal waveforms, respectively, of a first modification of the third embodiment of the present invention.

In FIG. 18A, delay circuits 87 and 88 shown in FIG. 16 are not provided in the output control unit of the present modification. NAND circuit 89 receives signals from NAND circuit 86 and inverter circuit 85 shown in FIG. 16. The output of NAND circuit 89 is provided to AND circuit 90 of FIG. 16.

Referring to FIG. 18A, NAND circuit 89 includes a p channel MOS transistor 890 provided between a power potential supply node and an output node 894 and receiving an output signal A from NAND circuit 86 at its gate, and a p channel MOS transistor 891 provided between the supply node of the power supply potential and output node 894 and receiving an output signal B from inverter circuit 85 at its gate. The current driving capability of transistor 890 is set greater than that of transistor 891.

NAND circuit 89 further includes an n channel MOS transistor 892 receiving output signal A from NAND circuit 86 at its gate, and an n channel MOS transistor 890 receiving output signal B from inverter circuit 85 at its gate. Transistors 892 and 893 are connected in series between output node 894 and the ground potential node. The signal C on output node 894 is provided to the next stage, or AND circuit 90. The current driving capability of transistors 892 and 893 are set to the same level. The operation of the NAND circuit shown in FIG. 18A will now be described with reference to the operation waveform diagram of FIG. 18B.

When output signal A from NAND circuit 86 attains an L level, p channel MOS transistor 890 is turned on. As a result, the potential of output node 894 is driven with a current driving capability relatively greater than that of transistor 890 to be pulled up to an H level at a relatively high speed.

Figure 18B:
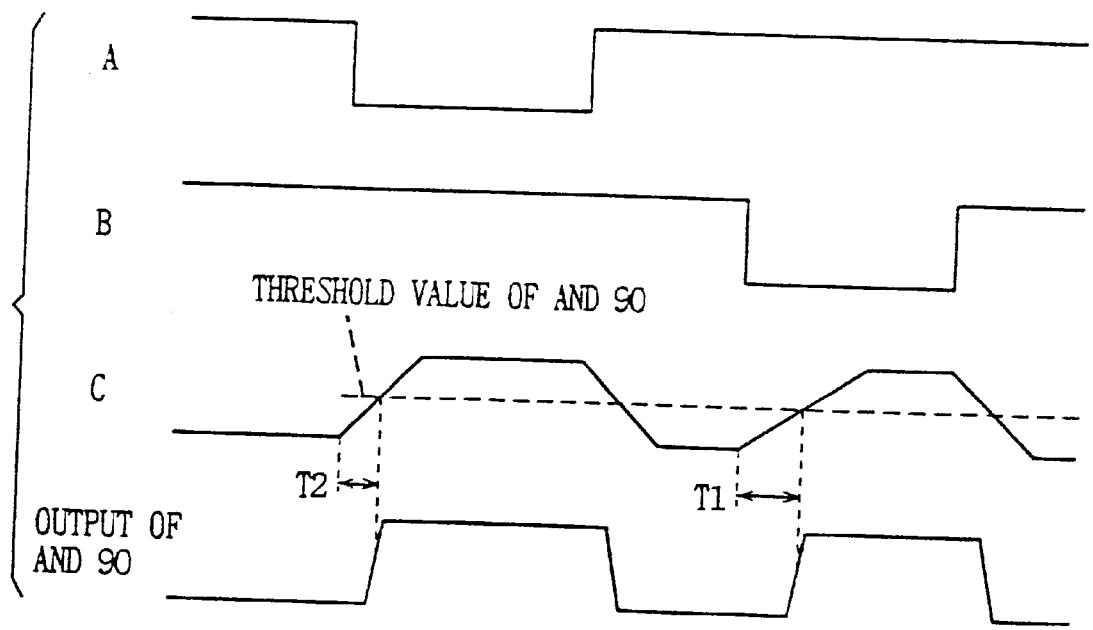

When output signal B from inverter circuit 85 attains an L level, p channel MOS transistor 891 is turned on. Output node 894 is charged at a relatively slow rate via transistor 891. The signal on output node 894 AND circuit 90 at the next stage. When the signal potential on output node 894 exceeds the input logic threshold value of AND circuit 90, a signal of an H level is provided from AND circuit 90. Therefore, by setting the current driving capability of transistors 890 and 891 at appropriate levels, the time required for the output of AND circuit 90 to be pulled up to an H level can be set identical to the delay time provided by delay circuits 87 and 88 of FIG. 16, as shown in FIG. 18B.

Modification 2

Figure 19:
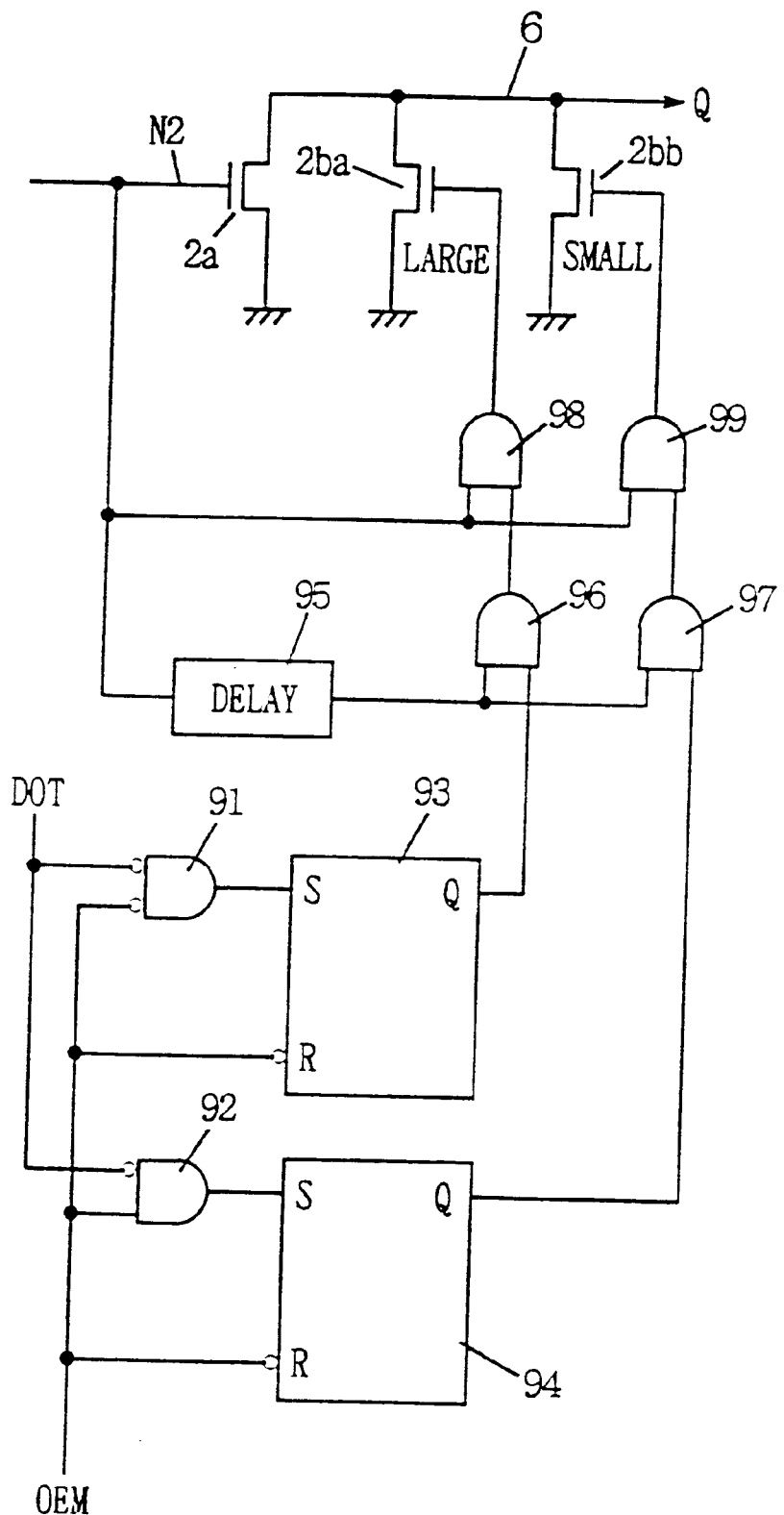
FIGS. 19 and 20 show a structure of a second modification and a third modification, respectively, of the third embodiment of the present invention.

FIG. 19 shows a structure of a control unit of an output circuit according to a second modification of the third embodiment. Referring to FIG. 19, a control unit includes gate circuits 91 and 92 each receiving output permission signal DOT and output designating signal OEM, a flipflop 93 set in response to a rise of the output of gate circuit 91, a flipflop 94 sets in response to a rise of the output of gate circuit 92, a delay circuit 95 for delaying a signal on node N2 for a predetermined time, an AND circuit 96 receiving outputs of delay circuit 95 and flipflop 93, an AND circuit 97 receiving an Q output of flipflop 94 and an output of delay circuit 95, an AND circuit 98 receiving a signal on node N2 and an output of AND circuit 96, an AND circuit 99 receiving a signal on node N2 and an output of AND circuit 97, a drive transistor 2ba responsive to an output of AND circuit 98 for discharging output node 6 to the level of ground potential, and a drive transistor 2bb responsive to an output of AND circuit 99 for discharging output node 6 to the level of ground potential.

Gate circuit 91 provides a signal of an H level when signals DOT and OEM both attain an L level. The case where output designating signal DOT is driven to an L level when output permission signal OEM is at an L level is the case where invalid data is not output as shown in FIG. 17B. Under such a condition, gate circuit 91 provides a signal of an H level to set flipflop 93, and a signal of an H level is output from the Q output of flipflop 93.

Gate circuit 92 provides a signal of an H level when output designating signal DOT attains an L level during the period of output permission signal OEM being at an H level. Output designating signal DOT attains an L level when output permission signal OEM is high in the case where an invalid data signal is output. In this case, gate circuit 92 provides a signal of an H level, and flipflop 94 is set. A signal of an H level is provided from the Q output of flipflop 94.

The operation will be described briefly. When the potential on output node N2 attains an H level, drive transistor 2a is turned on, whereby output node 6 is discharged gently. At an elapse of a predetermined time, the output of delay circuit 95 is driven to an H level. When there is a possibility of an invalid data output, flipflop 94 is set by gate circuit 92, to provide a signal of an H level from the Q output thereof. When there is no possibility of an invalid data output, flipflop 93 is set by gate circuit 91, whereby a signal of an H level is provided from the Q output thereof.

When the output of delay circuit 95 attains an H level, one output of AND circuits 96 and 97 attains an H level. In response, one output of AND circuits 98 and 99 attains an H level.

The current driving capability of drive transistor 2ba is set greater than that of drive transistor 2bb. Therefore, when no invalid data is output, drive transistor 2ba is turned on by flipflop 93 and AND circuits 96 and 98, whereby the potential of output node 6 is discharged at a high speed. When invalid data is not output, the potential of output node 6 is already discharged by drive transistor 2a, so that an output signal can be generated stably without ringing even when output node 6 is discharged with a great current driving capability.

When there is a possibility of invalid data being output, drive transistor 2bb is turned on via flipflop 94, and AND circuits 97 and 99. In this case, it can be considered that the potential of output node 6 is not low enough. Therefore, output node 6 is discharged gently by drive transistor 2bb having a relatively small driving capability. Since drive transistors 2a and 2bb both are turned on, output node 6 is discharged at a rate higher than that of driving output node 6 with one drive transistor. Therefore, an output signal can be generated stably with no generation of ringing.

In a static column operation mode, output designating signal DOT attains an L level when signal OEM is high. When there is a possibility that invalid data is output first, flipflop 93 is set continuously during this static column operation mode. Flipflops 93 and 94 are reset in response to a fall of output permission signal OEM. In a static column mode, it can be considered that flipflops 93 and 94 are both set and drive transistors 2ba and 2bb are both turned on. However, as shown in the first embodiment, output node 6 is temporarily set at an intermediate potential after completion of a data signal output in a static column mode. Therefore, there is no possibility of generation of ringing even when all drive transistors 2a, 2ba and 2bb are turned on.

Here, flipflops 93 and 94 may be formed so as to be reset by address transition detection signal φATD. In this case, an inverted signal of output signal OEM and address transition detection signal φATD are ORed, and the ORed output is supplied to the reset inputs of flipflops 93 and 94. When flipflops 93 and 94 are reset according to column address transition detection signal φATD, flipflop 94 is set to effect discharging of output node 6 by drive transistors 2a and 2bb in a static column mode operation.

Since output node 6 is discharged from the level of intermediate potential to the ground potential, output node 6 can be discharged to the level of ground potential at a sufficient high speed even when driven only by two drive transistors 2 and 2bb.

According to the structure shown in FIG. 19, a similar effect can be obtained by a structure in which AND circuit 96 receives output signals of delay circuits 95 and NAND circuit 86, and AND circuit 97 receives output signals of delay circuit 95 and inverter 85 (refer to FIG. 16).

Modification 3

Figure 20:
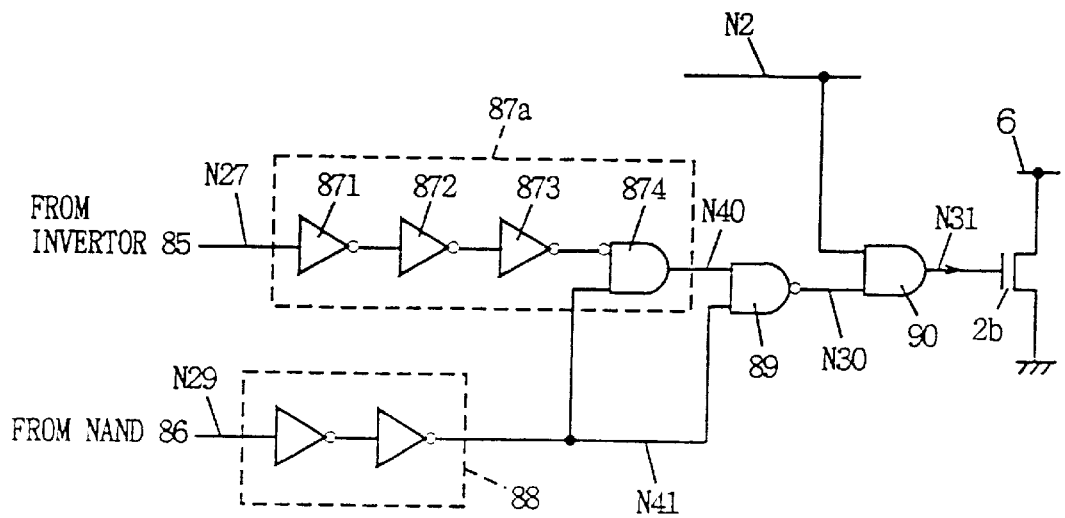

As for a third modification of an output circuit according to the third embodiment, the portion of NAND circuit 89 and delay circuits 87a and 88 of FIG. 16 are shown in FIG. 20. Referring to FIG. 20, delay circuit 87a includes a delay circuit 87a for delaying a signal received from inverter 85 at node N27, and a delay circuit 88 for delaying a signal at node N29 (output of NAND circuit 86) for a predetermined time. Delay circuit 87a includes cascaded three stages of inverter circuits 871–873, and a gate circuit 874 having one input receiving an output of delay circuit 88 and the other input receiving an output of inverter circuit 873. Gate circuit 874 provides a signal of an H level when the output of inverter circuit 873 attains an L level and the output of delay circuit 88 attains an H level. The outputs of delay circuits 87a and 88 are provided to NAND circuit 89. The output of NAND circuit 89 is applied to AND circuit 90. AND circuit 90 turns on drive transistor 2b when the potential on node N2 attains an H level and the output of NAND circuit 89 attains an H level.

Figure 21:
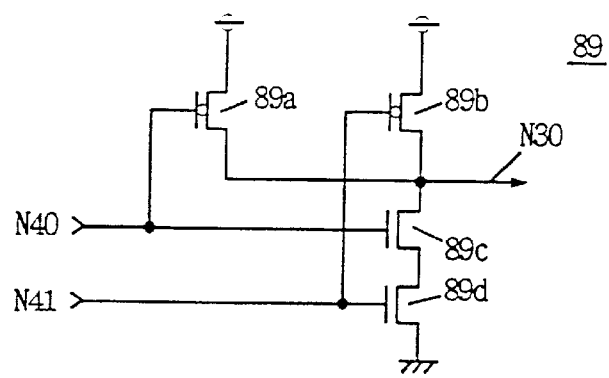
FIG. 21 shows a modification of the NAND circuit shown in FIG. 20.
Figure 22:
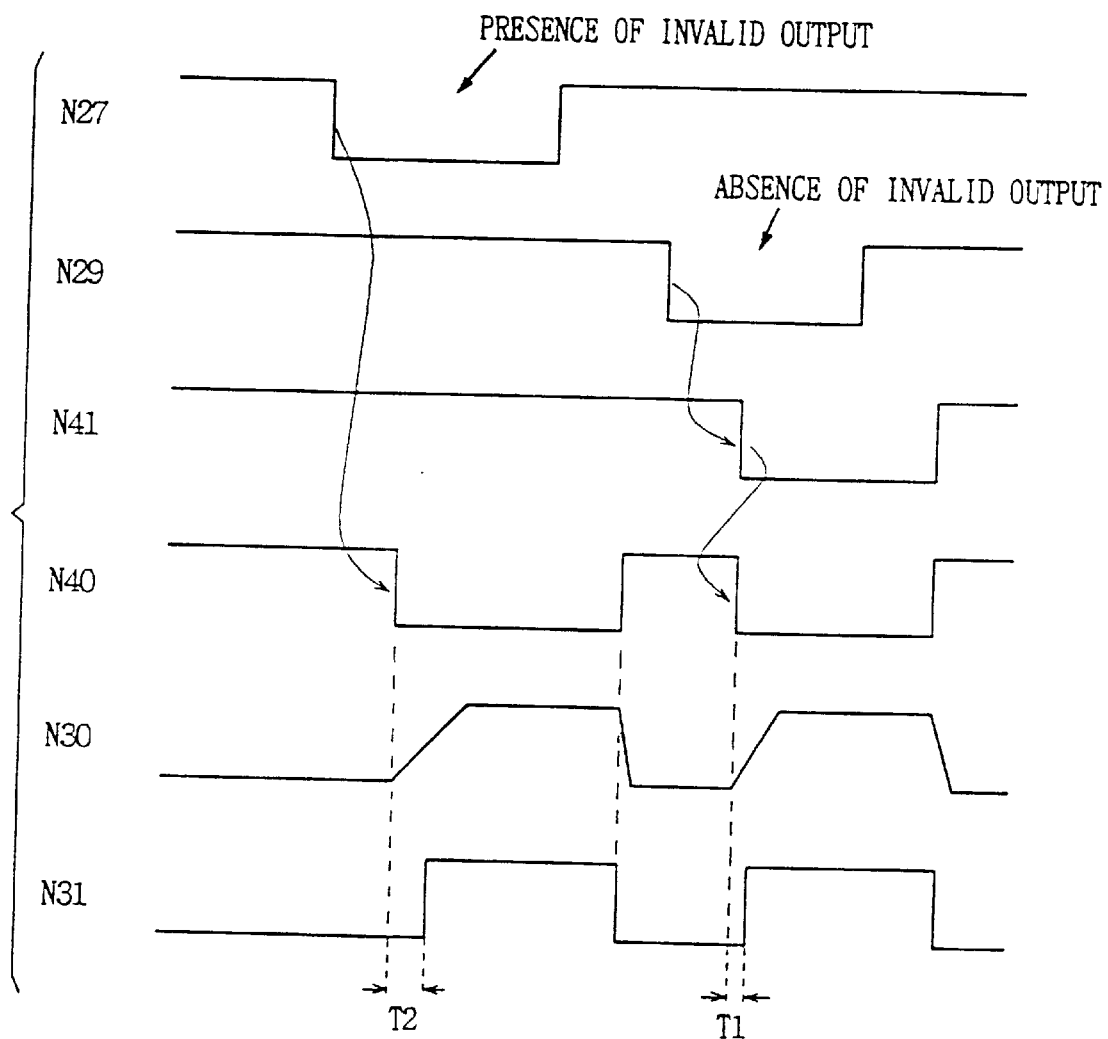
FIG. 22 is a signal waveform diagram representing an operation of the circuit of FIG. 21.

FIG. 21 shows a structure of NAND circuit 89 of FIG. 20. Referring to FIG. 21, NAND circuit 89 includes p channel MOS transistors 89a and 89c for receiving a signal potential on node N40 at their gates, and a p channel MOS transistor 89b and an n channel MOS transistor 89d for receiving a signal potential on node N41 at their gates. Transistors 89a and 89b are connected in parallel between the power supply potential node and output node N30. Transistors 89c and 89d are connected in series between output node N30 and the ground potential node. Transistors 89a and 89b may have the same size. Alternatively, the size (channel width) of transistor 89b may be set greater than that of transistor 89a. The operation of the circuit shown in FIGS. 20 and 21 will now be described with reference to the operation waveform diagram of FIG. 22.

When an invalid output is present, the potential level of node N29 attains an H level, which causes the signal potential on node N41 to be driven to an H level. In this case, gate circuit 874 in delay circuit 87a functions as an inverter circuit. Therefore, when the signal potential on node N27 attains an L level, the potential of node N40 attains an L level at an elapse of a predetermined time. NAND circuit 89 has only to turn on p channel MOS transistor 89a, whereby output node N30 is charged via transistor 89a only as shown in FIG. 21. Therefore, the potential rise of node N30 is relatively gentle. When the potential level of node N30 exceeds the input logic threshold voltage of AND circuit 90, the output of (potential of node N31) AND circuit 90 attains an H level since the potential of node N2 attains an H level.

When an invalid output is absent, the potential on node N27 attains an H level, and gate circuit 874 functions as a buffer circuit. When the potential of node N29 attains an L level, the potential on node N21 is driven to an L level at an elapse of a predetermined time period by delay circuit 88, whereby the output of gate circuit 874 attains an L level. In NAND circuit 89, p channel MOS transistors 89a and 89b are both turned on to charge output node N30. When the potential of node N30 exceeds the input logic threshold AND circuit 90, a signal of an H level is provided on node N31 by AND circuit 90.

The rise of the signal potential on node N30 is relatively gentle when there is an invalid output, and relatively speeded up when there is no invalid output. As a result, the rising time of the signal potential on node N31 can be differentiated, and the ON-timing of output drive transistor 2b can be made different between when there is an invalid output and when there is not an invalid input. If the input/output response characteristic of AND circuit 90 is relatively gentle, the rise of the signal potential on node N31 follows that of node N30. Output drive transistor 2b is increased gradually in driving capability when there is an invalid output, and increased rapidly when there is no invalid output. Thus, output node 6 can be discharged at high speed when there is no possibility of generation of ringing.

Embodiment 4

Figure 23:
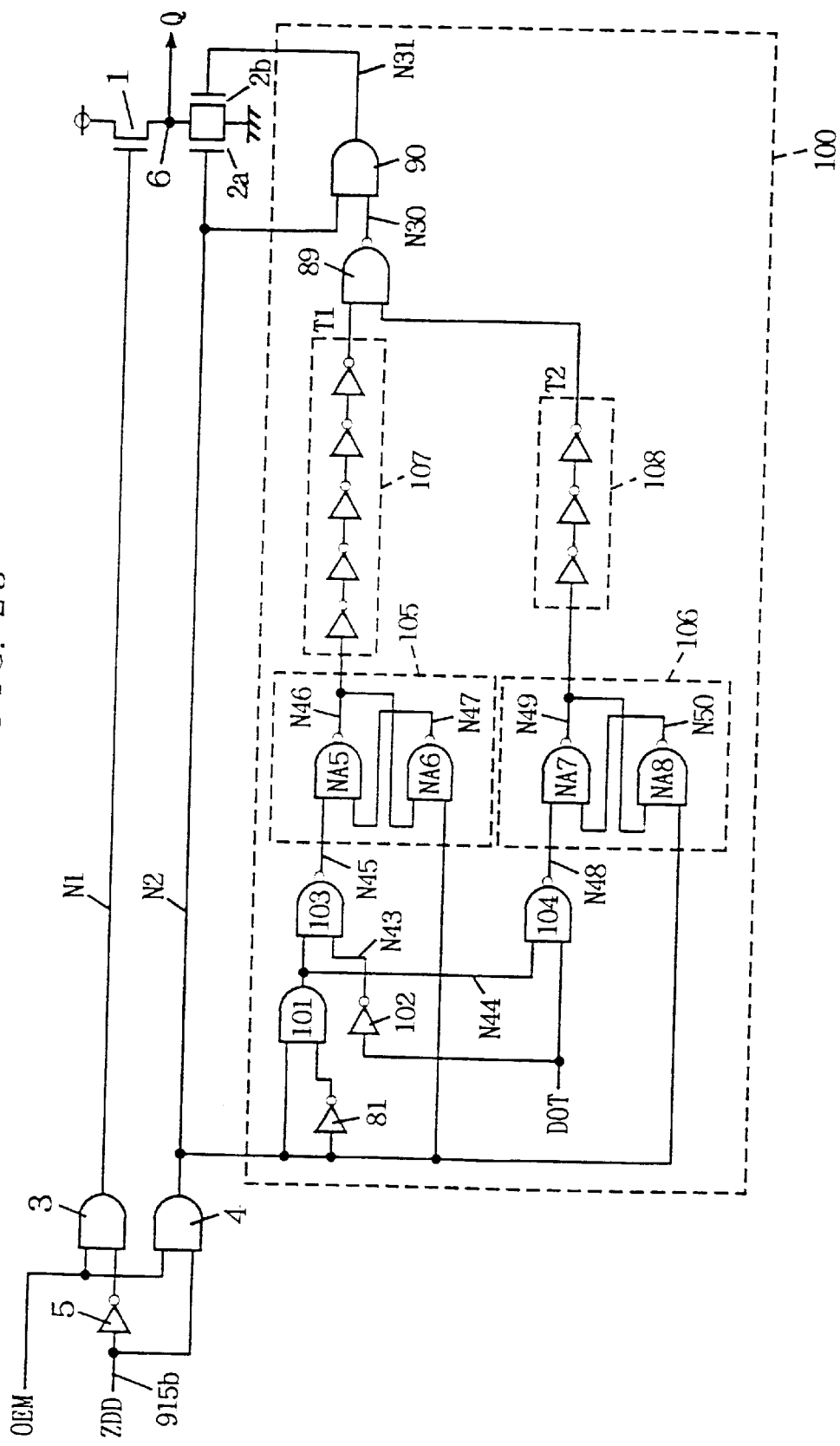
FIG. 23 shows a structure of an output control circuit according to a fourth embodiment of the present invention.

FIG. 23 shows a structure of a control unit of an output circuit according to a fourth embodiment for discharging an output signal Q to the level of ground potential.

Referring to FIG. 23, an output circuit includes an AND circuit 3 receiving output permission signal OEM and an output of inverter circuit 5 that receives internal readout data signal ZDD, an AND circuit 4 receiving internal readout data signal ZDD and output permission signal OEM, a drive transistor 1 rendered conductive in response to an output of AND circuit 3 for driving output node 6 to the level of power supply potential Vcc, a drive transistor 2a responsive to an output of AND circuit 4 for discharging output node 6 to the level of ground potential, and a drive transistor 2b provided in parallel to drive transistor 2a, and responsive to a control signal from control circuit 100 for discharging output node 6 to the level of ground potential.

Control circuit 100 includes an inverter circuit 81 for inverting the logic of a signal on node N2 (output of AND circuit 4), an AND circuit 101 for receiving a signal potential on node N2 and an output of inverter circuit 81, an inverter circuit 102 for inverting the logic of output designating signal DOT, an NAND circuit 103 for receiving outputs of AND circuit 101 and inverter circuit 102, an NAND circuit 104 for receiving an output of AND circuit 101 and output designating signal DOT, a latch circuit 105 for receiving an output of NAND circuit 103 and signal on node N2, and a latch circuit 106 for receiving an output of NAND circuit 104 and a signal on node N2.

Latch circuit 105 includes an NAND circuit NA5 for receiving an output of NAND circuit 103 at one input, and an NAND circuit NA6 for receiving a signal on node N2 at one input. The output of NAND circuit NA6 is provided to the other output of NAND circuit NA5. The output of NAND circuit NA5 is provided to the other input of NAND circuit NA6. Latch circuit 106 similarly includes cross-coupled NAND circuits NA7 and NA8. NAND circuit NA7 receives the output of NAND circuit 104 at one input and the output of NAND circuit NA8 at the other input. NAND circuit NA8 receives a signal on node N2 at one input and an output of NAND circuit NA7 at the other input.

Output control circuit 100 further includes a delay stage 107 for delaying an output of NAND circuit NA5 of flipflop 105 (signal on node N46) for a predetermined time and inverting a logic thereof, a delay circuit 108 for delaying an output of NAND circuit NA7 of flipflop 106 for a predetermined time and inverting the logic thereof, an NAND circuit 89 for receiving outputs of delay circuits 107 and 108, and an AND circuit 90 for receiving a signal on node N2 and an output of NAND circuit 89. The output of AND circuit 90 is applied to the gate of drive transistor 2b.

The delay time of delay circuit 107 is set longer than that of delay circuit 108. The operation of the circuit of FIG. 23 will now be described with reference to the operation waveform diagrams of the FIGS. 24A and 24B.

Figure 24A:
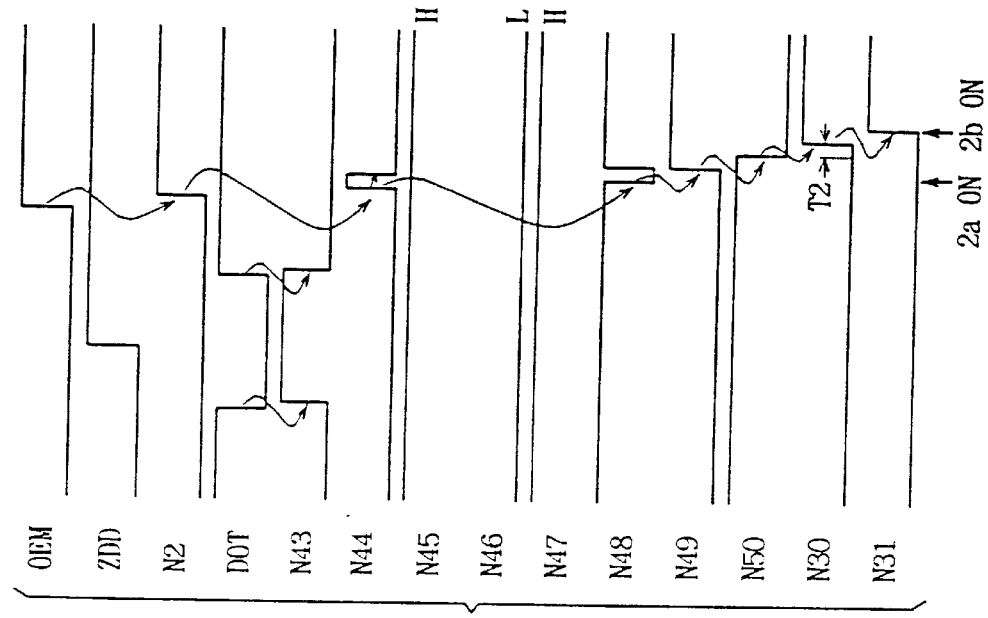
FIGS. 24A and 24B are signal waveform diagrams representing an operation of the output control circuit of FIG. 23.

The operation in a case where an invalid data signal is output will be described with reference to FIG. 24A. Here, an invalid data signal is at an L level and a valid data signal is at an H level. At the initial state, output permission signal OEM is at an L level, and output designating signal DOT is at an H level. Internal readout data signal ZDD maintains an L level even when output permission signal OEM is pulled up to an H level, and node N2 maintains an L level.

In this state, in response to output designating signal DOT driven to an L level, inverter circuit 102 drives potential of node N43 to an H level, and NAND circuit 103 functions as an inverter during this period. The output of NAND circuit 104 maintains the state of an H level since the output of AND circuit 101 is at an L level.

When a valid data signal ZDD is applied to internal data bus line 915b, the potential of node N2 is driven to an H level. This causes the output of inverter circuit 81 to be pulled down to an L level, whereby a pulse signal of an H level having a time width of the delay time of inverter circuit 81 is generated from AND circuit 101.

In response to a one shot pulse signal from AND circuit 101, NAND circuit 103 generates a one shot pulse signal of an L level on node N45. As a result, the output of NAND circuit NA5 is driven to an H level, and the potential of node N46 is set to an H level in latch circuit 105.

Output designating signal DOT attains an L level and the latching state of latch circuit 106 does not change (output of NAND circuit 104 maintains an H level) even when a one shot pulse signal of an H level is generated on node N44. More specifically, node N49 (output of NAND circuit NA7 of latch circuit 106) is fixed at an L level. The output of delay circuit 108 attains an H level, and NAND circuit 89 functions as an inverter circuit.

At an elapse of the delay time of delay circuit 107, a signal of an L level is provided from delay circuit 107 to drive the output of NAND circuit 89 to an H level. Then, the output of AND circuit (signal potential on node N31) attains an H level since the potential of node N2 already attains an H level. Therefore, drive transistor 2b is turned on.

More specifically, when an invalid data signal is output, drive transistor 2b is turned on at an elapse of a delay time T1 of delay circuit 107 from the time of drive transistor 2a being turned on. As a result, when the invalid data signal and the valid data signal differ in logic, drive transistor 2b is turned on when the potential of output node 6 reaches a sufficient low level where no ringing is generated.

Figure 24B:
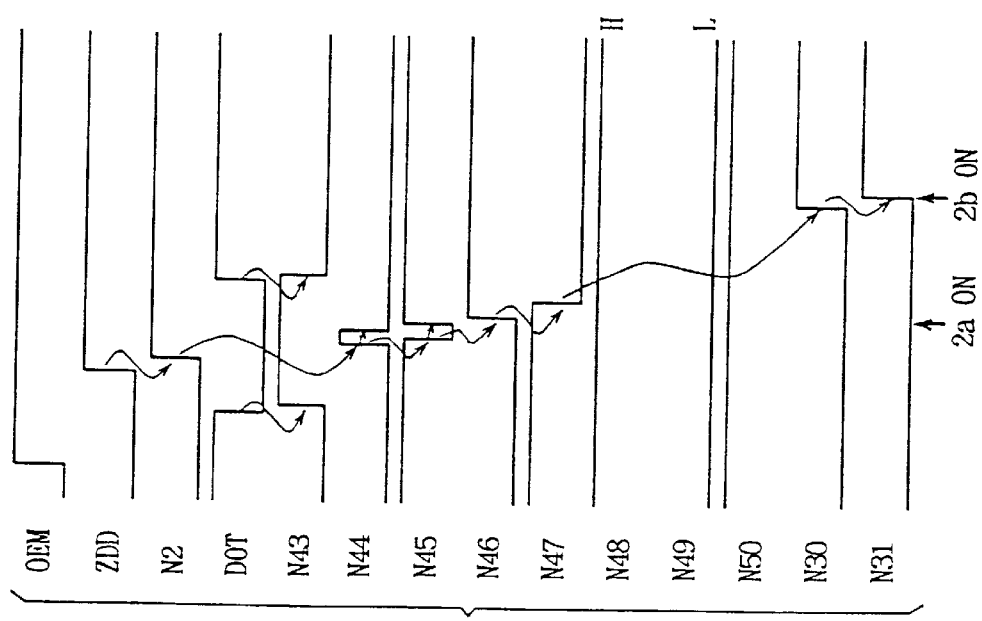

The operation in the case where an invalid data signal is not output will be described with reference to FIG. 24B. In this state, output designating signal DOT first attains an L level for a predetermined time period. In response to this output designating signal DOT, the output of inverter circuit 102 is pulled up to an H level for a predetermined time period. However, the potential of node N2 is at an L level, and the output of AND circuit 101 is at L level yet. Therefore, the outputs of NAND circuits 103 and 104 maintain a level of the H level.

During the period of output designating signal DOT being at an L level, valid data is provided on internal data bus line 915b, and internal data signal ZDD attains an H level. Output permission signal OEM attains an H level after output designating signal DOT is pulled up to an H level, and the potential of node N2 attains an H level.

In response to a rise of the potential of node N2, a one shot pulse signal of an H level is generated from AND circuit 101 on node N44. Output designating signal DOT is already restored to an H level, and the output of inverter circuit 102 attains an L level. Therefore, the output of NAND circuit 103 maintains an H level.

NAND circuit 104 responds to a one shot pulse signal of an H level from AND circuit 101 to generate a pulse signal of an L level. As a result, output of NAND circuit NA7 of latch circuit 106 is pulled up to an H level from an L level. In response to the transition of the output of NAND circuit NA7 (signal potential on node N49) to an H level, the output of NAND circuit NA8 is driven to an L level, and the potential of node N49 is latched to L level.

At an elapse of a delay time T2 of delay circuit 108, the output of delay circuit 108 is pulled up to an H level.

The potential of node N46 attains an L level, and the output of delay circuit 107 attains an H level. Therefore, in response to an output of delay circuit 108, the output of NAND circuit 89 is pulled to an H level. Then, the output of AND circuit 90 is pulled up to an H level. Drive transistor 2b is rendered conductive in response to an output of AND circuit 90, whereby output node 6 is discharged to the level of ground potential.

As described above, when no invalid data signal is output, drive transistor 2b is turned on at an elapse of a delay time of delay circuit 108. The delay time of delay circuit 108 is shorter than that of delay circuit 107. Therefore, when an invalid data signal is not output, drive transistor 2b can be turned on at an advanced timing.

By adjusting the on-timing of drive transistor 2b, generating of ringing can be reliably prevented.

It is to be noted that various modifications similar to those of the prior Embodiment 1 can be carried out under the structure shown in FIG. 23. In the modification set forth in the following, a circuit configuration for pulling up the potential of output node 6 may be employed, and the number of stages of inverters in a delay circuit may be set to an arbitrary number.

Modification 1

Figure 25:
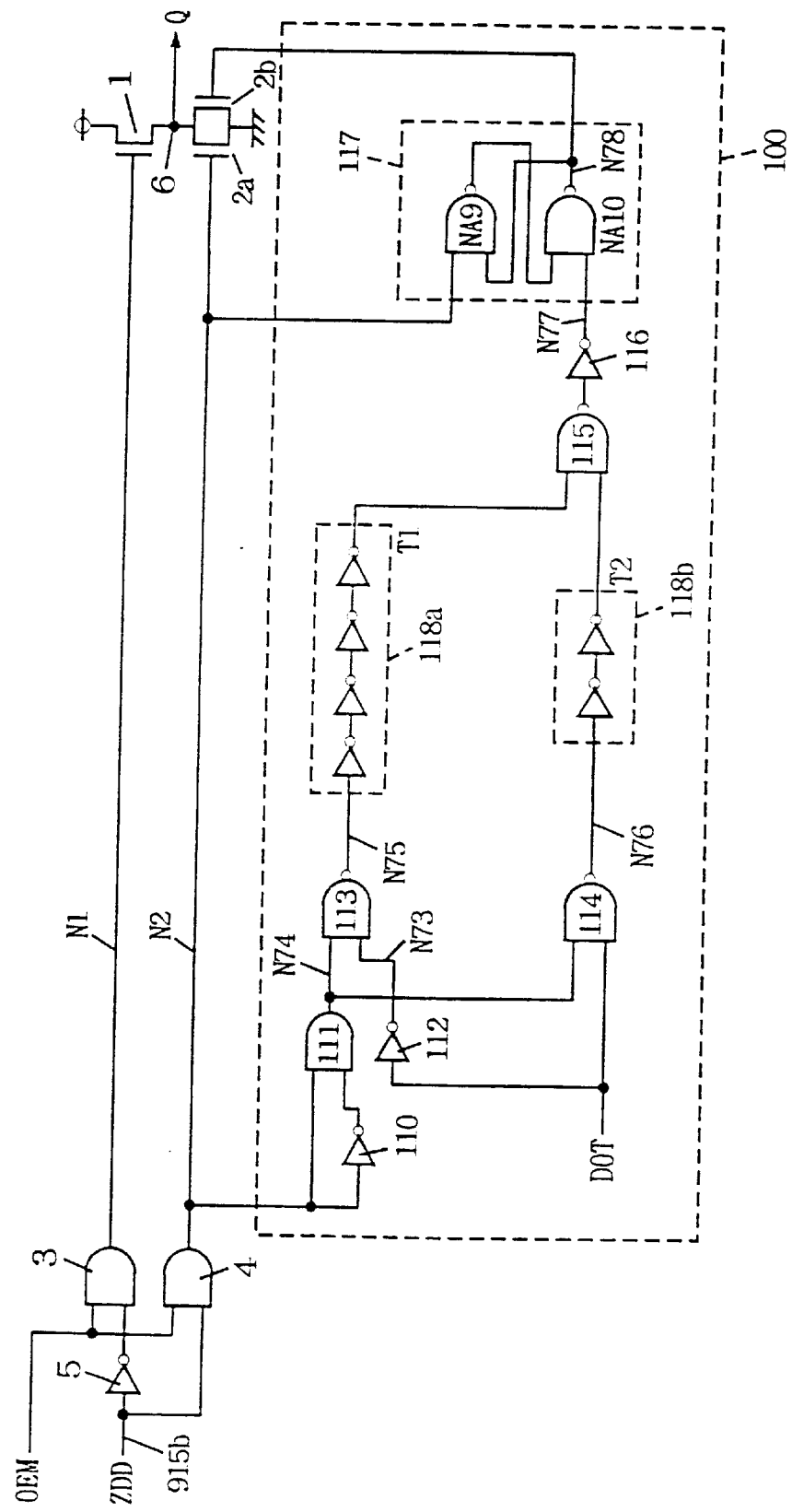
FIG. 25 is a first modification of the output control circuit of the fourth embodiment of the present invention.

FIG. 25 shows a circuit configuration for preventing generating of ringing during discharging of output node 6. Referring to FIG. 25, a control circuit 100 includes an inverter circuit 110 for inverting a signal potential on node N2, an AND circuit 111 for receiving a signal on node N2 and an output of inverter circuit 110, an inverter circuit 112 for receiving output designating signal DOT, an NAND circuit 113 for receiving outputs of AND circuit 111 and inverter circuit 112, a delay circuit 118a for delaying an output of NAND circuit 113 for a predetermined time period of T1, an NAND circuit 114 for receiving an output of AND circuit 111 and output designating signal DOT, a delay circuit 118b for delaying an output of NAND circuit 114 for a predetermined time period T2 (T2<T1), an NAND circuit 115 for receiving outputs of delay circuits 118a and 118b, an inverter circuit 116 for inverting an output of NAND circuit 115, and a latch circuit 117 for receiving an output of inverter circuit 116 and a signal on node N2.

Latch circuit 117 includes cross-coupled NAND circuits NA9 and NA10. NAND circuit NA10 provides a signal for driving drive transistor 2b. NAND circuit NA9 receives a signal potential on node N2 at one input. NAND circuit N10 receives an-output of inverter circuit 116 at one input. NAND circuits NA9 and NA10 have their outputs and the other inputs cross-coupled. The operation of the circuit of FIG. 25 will be described with reference to the operation waveform diagrams of FIGS. 26A and 26B.

Figure 26B:
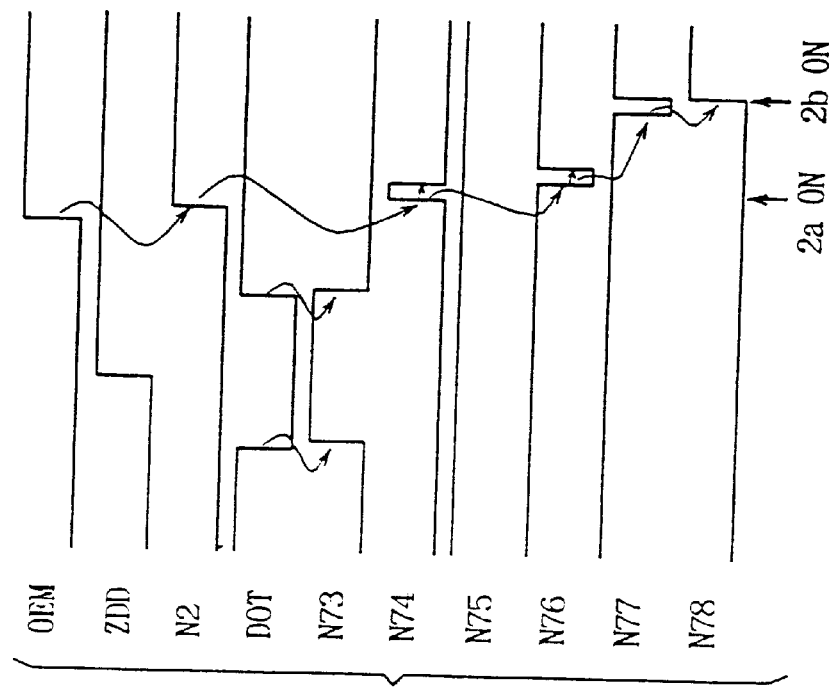
FIGS. 26A and 26B are signal waveform diagrams representing an operation of the output control circuit of FIG. 25.
Figure 26A:
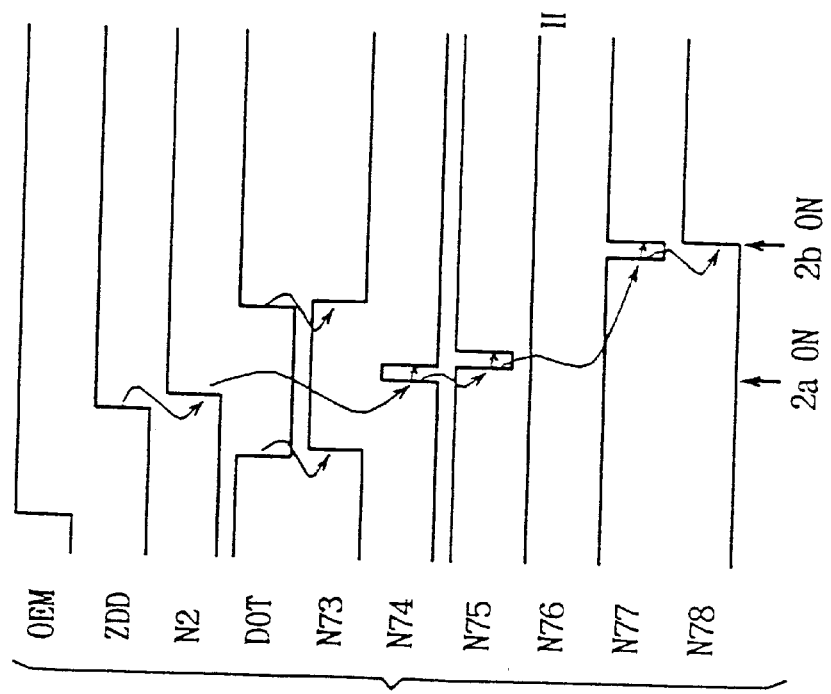

An operation in a case where an invalid data signal is output will be described with reference to FIG. 26A. First, output designating signal OEM is pulled up to an H level. Here, readout data signal ZDD is at an L level which is an invalid data signal. The potential of node N2 and the output of AND circuit 111 are both at an L level, and the outputs of NAND circuits 113 and 114 are at an H level. NAND circuit 115 provides a signal of an L level according to the outputs of delay circuits 118a and 118b, and inverter circuit 116 provides a signal of an H level. The signal potential of node N2 is at an L level, and the outputs of NAND circuits NA9 and NA10 in latch circuit 117 are at an H level and an L level, respectively.

In response to output designating signal DOT at an L level for a predetermined time, the output of inverter circuit 112 is pulled to an H level. During this period of output designating signal DOT being at an L level, a valid data signal is read out, and internal readout data signal ZDD is driven to an H level. In response, the potential of node N2 is pulled to an H level. In response to a rise of the potential of node N2, a one shot pulse signal of an H level is generated on node N74 by a one shot pulse signal generation circuit formed of AND circuit 111 and inverter circuit 110. NAND circuit 113 receives a signal of an H level at one input via inverter circuit 112. Therefore, a signal of an L level is transmitted onto node N75 in response to a rise of an output of AND circuit 111.

Since output designating signal DOT is at an L level, NAND circuit 114 does not respond to a one shot pulse signal from AND circuit 111, and provides a signal of an H level.

At an elapse of a predetermined time period T1 of delay circuit 118a, the output of delay circuit 118a is pulled down to an L level, and the output of NAND circuit 115 is pulled up to an H level (output of delay circuit 118b is high). In response to an output of NAND circuit 115, a one shot pulse signal of an L level is provided from inverter circuit 116 on node N77. Thus, NAND circuit NA10 provides a signal of an H level, whereby drive transistor 2b is turned on.

NAND circuit NA9 responds to the signal of an H level generated from NAND circuit NA10 in response to the one shot pulse signal to provide a signal of an L level even when the output of inverter circuit 116 is restored to an H level. Therefore, NAND circuit NA10 maintains its output at H level even when the output of inverter circuit 116 is restored to an H level.

In response to the potential of node N2 attaining an L level, the output of NAND circuit NA9 provides an output of an H level and NAND circuit NA10 receives a signal of an H level at both inputs, so that latch circuit 117 supplies a signal of an L level. Therefore, drive transistor 2b is turned off. As described above, when an invalid data signal is output, the ON-timing of drive transistor 2b is determined by delay circuit 114 with a longer delay time.

A discharge operation of output node 6 when an invalid data is not output will be described with reference to FIG. 26B.

First, output designating signal DOT attains an L level, and inverter circuit 116 provides an output of an H level. The signal potential of node N2 is still at an L level and the output of AND circuit 111 is at an L level. The output of NAND circuit 114 maintains the H level regardless of a change in output designating signal DOT. Under this state, delay circuits 118a and 118b both provide outputs of an H level. The outputs of NAND circuit 115, inverter circuit 116 and NAND circuit NA10 are at an L level, an H level, and an L level, respectively.

A valid data signal is provided on internal data bus line 915b, whereby internal data bus ZDD is pulled up to an H level. Then, output permission signal OEM is driven to an H level, and the potential of node N2 is pulled up to an H level. In response to the rise of the signal potential on node N2, a one shot pulse signal of an H level is provided from AND circuit 111. Here, output designating signal DOT attains an H level, and the output of inverter circuit 112 attains an L level. Therefore, the output of NAND circuit 113 exhibits no change and is held at an H level. A one shot signal of an L level is provided from NAND circuit 114 onto node N76. At an elapse of a delay time T2 of delay circuit 118b, the outputs of delay circuit 118b and NAND circuit 115 attain an L level and an H level, respectively. In response, the output of inverter circuit 116 attains an L level, and NAND circuit NA10 provides a signal of an H level on node N78. In response to a signal of an H level on node N78, drive transistor 2b is turned on.

Therefore, in the case where an invalid data signal is not output, the timing at which drive transistor 2b is turned on is determined by the delay time of delay circuit 118b. When an invalid data signal is not output, the potential of the output node is already low enough when drive transistor 2b is turned on. Therefore, a signal of an L level can be output stably with no ringing.

Different variations can be applied to the modification of FIG. 25.

Modification 2

Figure 27:
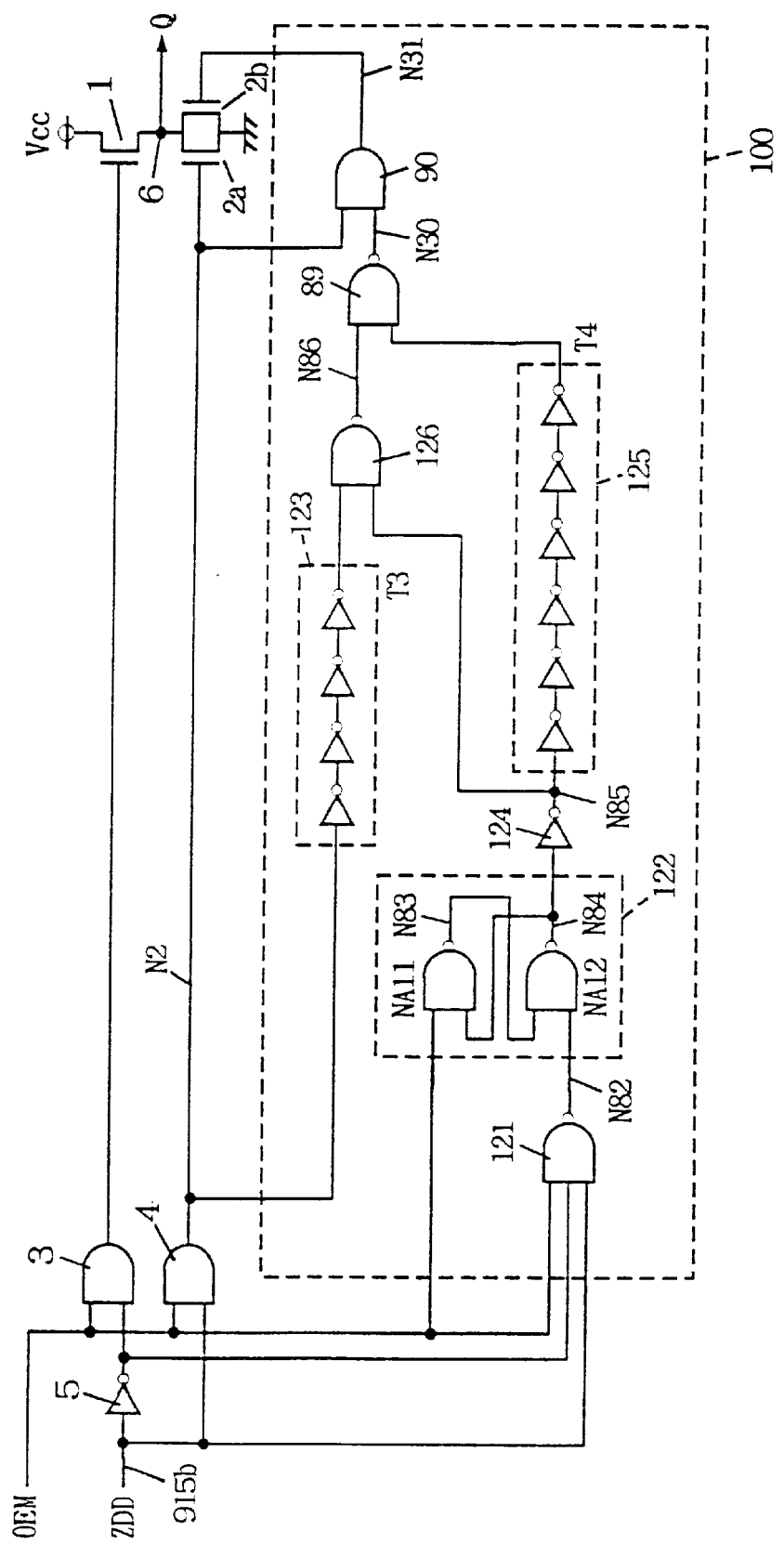
FIG. 27 shows a second modification of the output control circuit of the fourth embodiment of the present invention.

FIG. 27 shows a structure of an output circuit control unit according to a second modification of the fourth embodiment. Referring to FIG. 27, output control circuit 100 includes an NAND circuit 121 for receiving internal readout data signal ZDD, an output of inverter circuit 5, and output permission signal OEM, and a latch circuit 122 for receiving output permission signal OEM and an output of NAND circuit 121. Latch circuit 122 includes NAND circuits NA11 and NA12. NAND circuit NA11 receives output permission signal OEM at one input and an output of NAND circuit NA12 at the other input. NAND circuit NA12 receives an output of NAND circuit 121 at one input and an output of NAND circuit NA11 at the other input.

Output control circuit 100 further includes an inverter circuit 124 for receiving an output of NAND circuit NA12 of latch circuit 122, a delay circuit 123 for delaying a signal on node N2 for a predetermined time, an NAND circuit 126 for receiving outputs of inverter circuit 124 and delay circuit 123, a delay circuit 125 for delaying an output of inverter circuit 124 for a predetermined time period T4, an NAND circuit 89 for receiving outputs of NAND circuit 126 and delay circuit 125, an AND circuit 90 for receiving an output of NAND circuit 89 and a signal on node N2. A drive control signal is provided from AND circuit 90 to drive transistor 2b. An operation of the output control unit of FIG. 27 will be described with reference to the operation waveform diagrams of FIGS. 28A and 28B. In the output control circuit of FIG. 27, output designating signal DOT is not used.

The operation in a case where an invalid output is present will be described with reference to FIG. 28A. When an invalid data signal is output, output permission signal OEM is pulled up to an H level prior to internal readout data signal ZDD. When internal readout data signal ZDD attains an H level during the H period of output permission signal OEM, the potential of node N2 is pulled up to an H level via AND circuit 4.

The output of inverter circuit 5 is at an H level according to the delay time thereof even when internal readout data signal ZDD is pulled up to an H level. Therefore, all the three inputs of NAND circuit 121 attains an H level, whereby a signal of an L level is output during the delay time period of inverter circuit 5.

When a signal of an L level is provided to node N82 from NAND circuit 121, the output of NAND circuit NA12 in latch circuit 122 attains an H level. In response to a signal of an H level provided from NAND circuit NA12 to node 84, the output of NAND circuit NA11 attains an L level. Output node N84 of latch circuit 122 maintains an H level during the time period of output permission signal OEM being at an H level.

When the potential on node N84 is pulled to an H level, the potential of node N85 is pulled down to an L level by inverter circuit 124. The output of delay circuit 123 attains an L level prior to pull down of the output of inverter circuit 124 to an L level. When the output of delay circuit 123 attains an H level in response to a rise of node N2, the potential of node N85 already attains an H level. Therefore, the output of NAND circuit 126 is fixed to an H level.

When the signal of an L level on node N85 is transmitted to one input of NAND circuit 89 via delay circuit 125, a signal of an H level is provided on node N30 from NAND circuit 89. In response, a signal of an H level is provided from AND circuit 90 to node N31, whereby drive transistor 2b is turned on. More specifically, in the case where an invalid data signal is output, drive transistor 2b is turned on at a timing determined by delay time T4 of delay circuit 125. The delay time of delay circuit 125 is set longer than delay time T3 of delay circuit 123. Therefore, drive transistor 2b is turned on after the potential of output node 6 is pulled down to a sufficient low level, so that generation of ringing can be prevented effectively.

The operation in a case where an invalid data signal is not output will be described with reference to FIGS. 28A and 28B. In this case, output permission signal OEM attains an H level after internal readout data ZDD is pulled up to an H level. The output of inverter circuit 5 already attains an L level, and therefore the output of NAND circuit 121 attains an H level, when output permission signal OEM is pulled up to an H level. Even when internal readout data signal ZDD is driven to an H level from an L level, output permission signal OEM attains an L level at that timing. Therefore, a signal of an H level is normally provided from NAND circuit 121.

A rise in output permission signal OEM causes the potential of node N2 to be driven to an H level. When NAND circuit 121 provides an output of an H level and output permission signal OEM attains an L level, NAND circuit NA11 provides a signal of an L level and NAND circuit NA12 provides a signal of an H level in latch circuit 122. Therefore, even when output permission signal OEM is pulled up to an H level, the potential of node N84 maintains an L level, and the output of NAND circuit NA11 is fixed at an H level. More specifically, the potential of node N84 is fixed at an L level, and the potential of node N85 is fixed at an H level.

At an elapse of delay time T3 of delay circuit 123 following the rise of the potential of node N2 to an H level from an L level, the output of delay circuit 123 attains an H level and the output of NAND circuit 126 attains an L level. Although the output of delay circuit 125 is fixed at an H level, the output of NAND circuit 89 is pulled up to an H level in response to a signal of an L level provided to node N86 from NAND circuit 126. In response, the output of AND circuit 90 is pulled up to an H level. More specifically, in the case where an invalid data signal is not output, the ON-timing of drive transistor 2b is determined according to delay time T3 of delay circuit 123. Although drive transistor 2b is turned on in a relatively short period from an output of a valid data signal, output node 6 is discharged from an intermediate potential, for example, so that the potential level thereof is sufficiently low. Therefore, a stable output signal is provided with no ringing even when drive transistor 2b is turned on.

Similar to the first modification, a structure for pulling up an output signal may be employed in the output control circuit of the second modification shown in FIG. 27. Furthermore, other similar changes may be employed.

Modification 3

Figure 29:
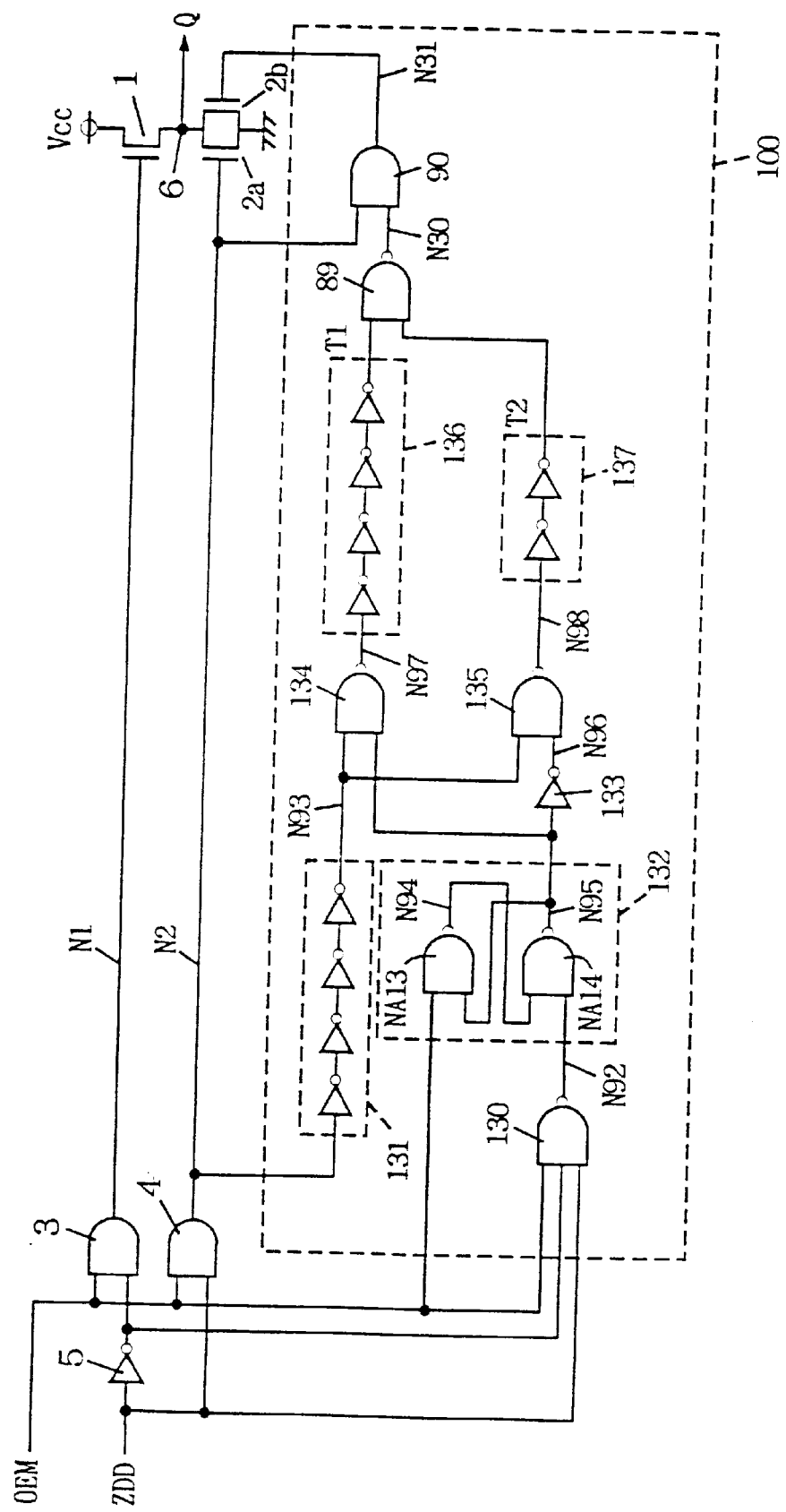
FIG. 29 shows a third modification of the output control circuit according to a fourth embodiment of the present invention.

FIG. 29 shows a structure of a third modification of the fourth embodiment. In FIG. 29, a structure of an output control circuit for discharging output node 6 to the level of ground potential is shown.

Referring to FIG. 29, output control circuit 100 includes an NAND circuit 130 for receiving output permission signal OEM, internal readout data signal ZDD, and an output of inverter circuit 5, a delay circuit 131 for delaying a signal potential on node N2 for a predetermined time, and a latch circuit 132 for receiving output permission signal OEM and an output of NAND circuit 130. Latch circuit 132 includes cross-coupled NAND circuits NA13 and NA14. NAND circuit NA13 has one input receiving output permission signal OEM and the other input receiving an output of NAND circuit N14. NAND circuit NA14 has one input receiving an output of NAND circuit 130 and the other input receiving an output of NAND circuit N13.

Output control circuit 100 further includes an NAND circuit 134 for receiving an output of delay circuit 131 and an output of NAND circuit NA14 in latch circuit 132, an inverter circuit 133 for receiving an output from latch circuit 132 to node N95, an NAND circuit 135 for receiving outputs of inverter circuit 133 and delay circuit 131, a delay circuit 136 for delaying an output of NAND circuit 134 for a predetermined time period T1, a delay circuit 137 for delaying an output of NAND circuit 135 for a predetermined time period T2, an NAND circuit 136 for receiving outputs of delay circuits 136 and 137, and an AND circuit 90 for receiving an output of NAND circuit 89 and a signal potential on node N2. A signal is provided from AND circuit 90 to the gate of drive transistor 2b. The operation of the output control circuit of FIG. 29 will be described with reference to the operation waveform diagrams of FIGS. 30A and 30B.

Figure 30B:
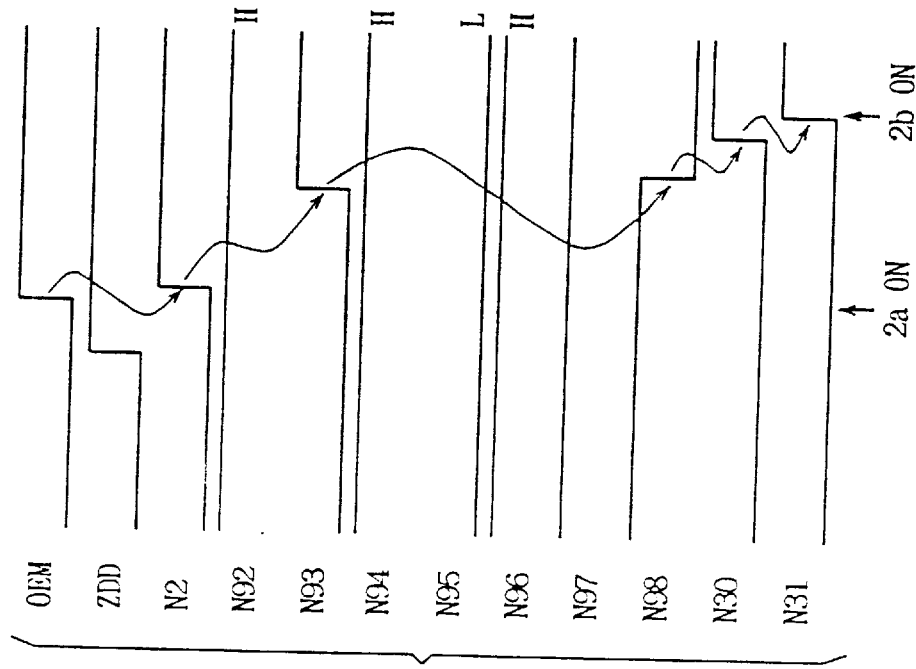
FIGS. 30A and 30B are signal waveform diagrams showing an operation of the output control circuit of FIG. 29.
Figure 30A:
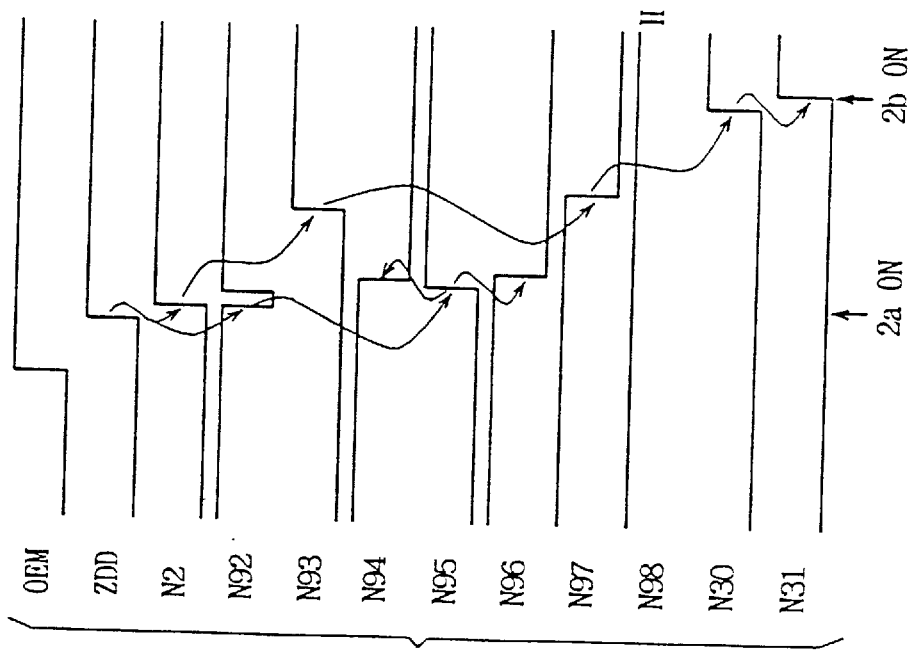

An operation in the case where there is an invalid data signal output will first be described with reference to FIG. 30A. When internal readout data signal ZDD is at an L level, output permission signal OEM is pulled to an H level. In this state, the output of NAND circuit 130 (signal potential on node N92) attains an H level.

When a valid data signal is transmitted and internal readout data signal ZDD is pulled up to an H level, the potential of node N2 is driven to an H level. Responsively, NAND circuit 130 provides a one shot signal of an L level according to the delay time of inverter circuit 5. As a result, the output of NAND circuit NA14 is pulled up to an H level, and the signals of both inputs of NAND circuit NA13 attain an H level in latch circuit 132. Therefore, the potential of node N94 is pulled down to an L level. The latch state of latch circuit 132 is maintained during the time period of output permission signal OEM being at an H level.

At an elapse of a delay time of delay circuit 131 following the rise of the potential of node N2 to an H level, the potential of node N93 is pulled up to an H level. The potential of node N95 attains an H level, and a signal of an L level is provided on node N97 from NAND circuit 134.

In contrast, NAND circuit 135 maintains the output at the H level since the potential of node N96 is set to an L level by inverter circuit 133. Therefore, the output of delay circuit 137 demonstrates no change and is maintained at the state of H.

At an elapse of a delay time T1 of delay circuit 136, the output of delay circuit 136 is pulled up to an L level, and a signal of an H level is provided from NAND circuit 89 to node N30. As a result, the output of AND circuit 90 attains an H level (the potential of node N2 already attains an H level). In response to a signal of an H level on node N31, drive transistor 2b is turned on to discharge output node 6 at high speed.

An operation in the case where an invalid data signal is not output will be described with reference to FIG. 30B. In this case, output permission signal OEM is driven to an H level after internal readout data signal ZDD attains an H level. Therefore, the output of NAND circuit 130 is fixed at an H level, whereby latch circuit 130 maintains the initial state. Since latch circuit 132 has reset by an output permission signal OEM of an L level at the initial state, NAND circuit NA14 provides a signal of an L level to node N95. Therefore, a signal of an H level is constantly provided from inverter circuit 133 onto node N96.

At an elapse of a delay time of delay circuit 131 from the rise of the potential of node N92 to an H level, the potential of node N93 is pulled to an H level. The potential of node N95 attains an L level, and the potential of node N96 attains an H level. Therefore, when the potential of node N93 is pulled up to an H level, a signal of an L level is provided from NAND circuit 135 to node N98. At an elapse of delay time T2 of delay circuit 137, the output of delay circuit 137 is pulled up to an H level. As a result, a signal of an H level is provided from NAND circuit 89 to node N30, and a signal of an H level is provided on node N31 by AND circuit 90, and drive transistor 2b is turned on.

When there is a possibility of an output of an invalid data signal, the ON-timing of drive transistor 2b is determined by the delay time of delay circuits 131 and 136. In the case where no invalid data signal is output, the on-timing of drive transistor 2b is determined by the delay time of delay circuits 131 and 137. Therefore, drive transistor 2b can be turned on at an appropriate timing according to the absence/presence of an invalid data signal.

Similar to the first modification, various changes can be made on the output control circuit of FIG. 29.

Modification 4

Figure 31:
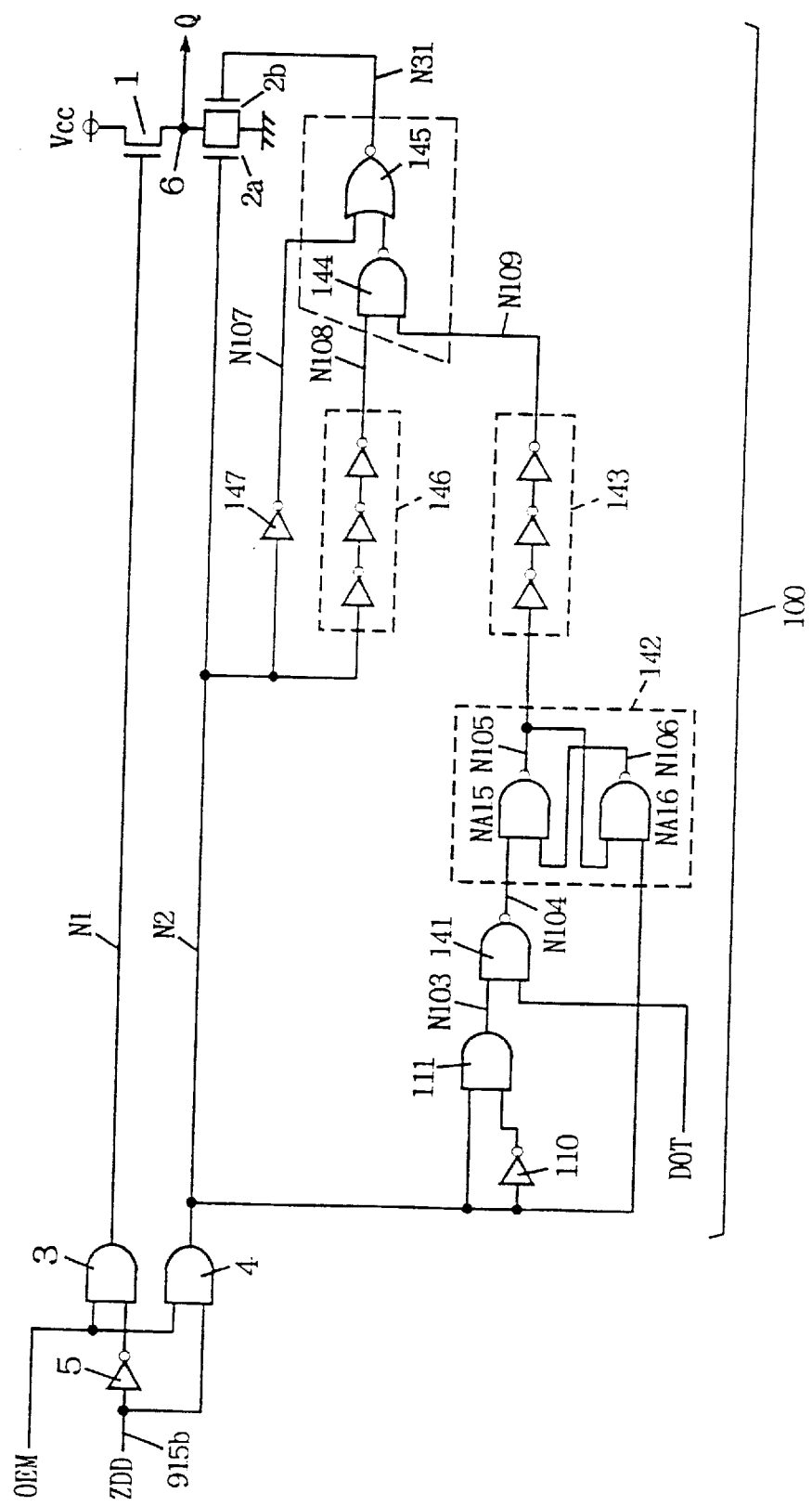
FIG. 31 shows a fourth modification of the output control circuit of the fourth embodiment of the present invention.

Referring to FIG. 31, an output control circuit 100 includes an inverter circuit 110 and an AND circuit 111 responsive to a rise of the signal potential on node N2 for generating a one shot pulse signal of an H level, an NAND circuit 141 for receiving output designating signal DOT and an output of AND circuit 111, and a latch circuit 142 for receiving a signal on node N2 and an output of NAND circuit 141. Latch circuit 142 includes NAND circuits NA15 and NA16. NAND circuit NA15 has one input receiving an output of NAND circuit 141 and the other input receiving an output signal of NAND circuit NA16. NAND circuit NA16 has one input receiving a signal potential on node N2 and the other input receiving an output of NAND circuit N25.

Output control circuit 100 further includes a delay circuit 143 for receiving an output of NAND circuit NA15 of latch circuit 142, a delay circuit 146 for receiving a signal on node N2, an AND circuit 144 for receiving outputs of delay circuits 146 and 143, an inverter 147 for inverting a signal on node N2, and an NOR circuit 145 for receiving an output of inverter 147. A drive control signal is provided from NOR circuit 145 to the gate of drive transistor 2b via node N31.

Delay circuits 143 and 146 delay an applied signal for a predetermined-time and invert the logic thereof. Inverter circuit 144 also functions as a delay circuit.

Figure 32B:
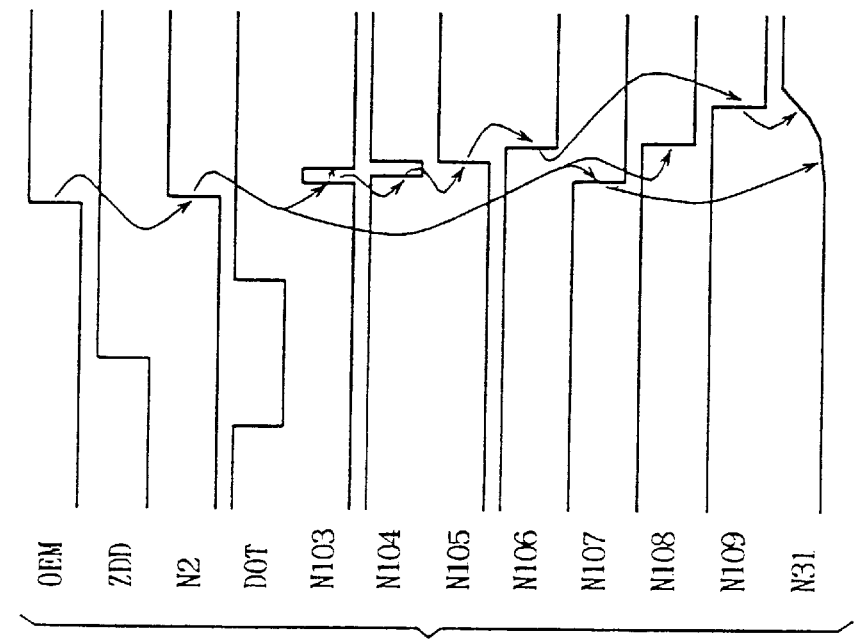
FIGS. 32A and 32B are signal waveform diagrams representing the operation of the output control circuit of FIG. 31.
Figure 32A:
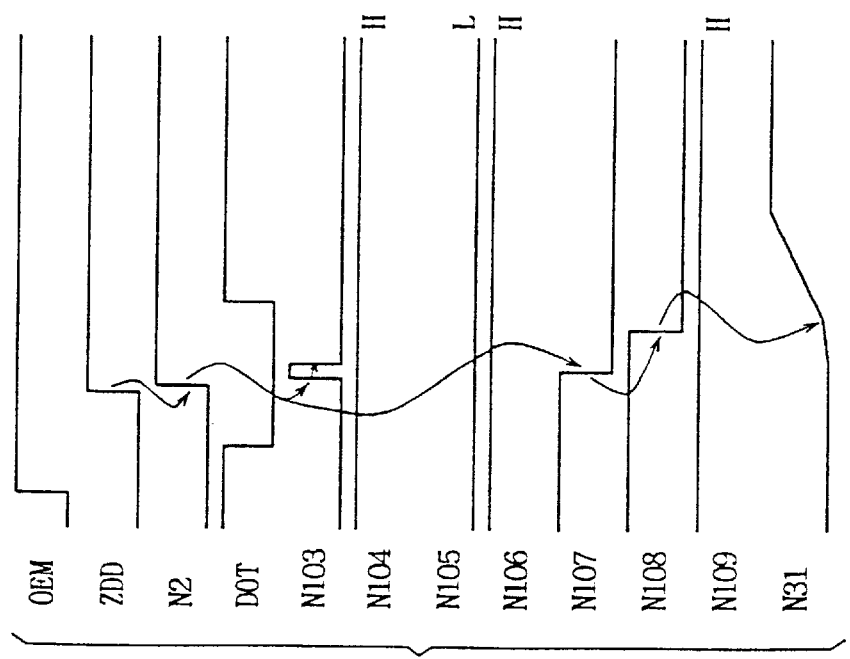

The operation of the output control circuit of FIG. 31 will be described with reference to the operation waveform diagrams of FIGS. 32A and 32B.

An operation in the case where an invalid data signal is output will be described hereinafter with reference to FIG. 32A.

First, output permission signal OEM is pulled up to an H level, but the potential of node N2 is maintained at an L level since internal readout data signal ZDD is at an L level.

When output designation signal DOT is pulled down to an L level, a valid data signal of an H level is transmitted on internal readout data line 915b at an elapse of a predetermined time period. According to internal readout data signal ZDD of an H level, the potential of node N2 is pulled up to an H level. In response to rise of the potential of node N2, a one shot signal of an H level is provided from AND circuit 111. The pulse width of the one shot pulse signal from AND circuit 111 is determined by the delay time of inverter circuit 110.

When this one shot pulse signal is generated from AND circuit 111, output designating signal DOT still remains at an L level, and the output of NAND circuit 141 is fixed to an H level. In latch circuit 142, when node N2 maintains an L level at the initial state, a signal of an H level is provided from NAND circuit NA16, and the signal of an L level is provided from NAND circuit NA15. Therefore, the signal from NAND circuit NA16 to node N106 is maintained at the H level even when the potential of node N2 is driven to an H level. In other words, the latch state of latch circuit 142 exhibits no change, and the potential of node N105 is fixed at an L level.

At an elapse of a delay time of inverter 147 following the rise of the potential of node N2 to an H level, the signal from inverter circuit 147 to node N107 attains an L level. AND circuit 144 receives a signal of an H level from delay circuit 143. Therefore, at an elapse of a delay time of delay circuit 146 from the rise of the potential of node N2 to an H level, the potential of node N108 is driven to an L level, and the output of AND circuit 144 attains an L level. NOR circuit 145 receives signals of an L level at both inputs, whereby the potential of node N31 is increased. As will be described afterwards, NOR circuit 145 and AND circuit 144 form a composite gate, in which only one p channel MOS transistor is turned on at the output portion. As a result, the potential of node N31 rises gently, and the driving capability of drive transistor 2b is gradually increased. Therefore, the fall of the potential of output node 6 is gentle. Even in the case where an invalid signal is output, the driving capability of drive transistor 2b is increased at an elapse of a sufficient time period. Thus, a signal of an L level can be provided stably with no generation of ringing.

An operation in the case where an invalid data is not output will be described hereinafter with reference to FIG. 32B.

First, output designating signal DOT is generated. In response, valid data signal ZDD is pulled up to an H level. In this state, the potential of node N2 is at an L level yet.

Following the rise (generation) of output designating signal DOT to an H level, output permission signal OEM is pulled up to the H level, and the potential of node N2 is driven to an H level. In response, AND circuit 111 provides a one shot pulse signal of an H level according to the delay function of inverter circuit 110. In response to the one shot pulse of an H level from AND circuit 111, a one shot pulse signal of an L level is generated from NAND circuit 141 onto node N104 (signal DOT already attains an H level). In response to a signal of an L level on node N104, the output of NAND circuit NA15 of latch circuit 142 is pulled up to an H level. According to a signal of an H level provided to node N105 from NAND circuit NA15, a signal of an L level is provided from NAND circuit NA16 to node N106. This state is maintained during the period of H level of node N2.

In response to a rise of the potential of node N2, the output of inverter circuit 147 is pulled down to an L level, whereby the output of NOR circuit 145 is gradually increased. Then, the output of delay circuit 146 is pulled down to an L level at an elapse of a delay time in response to a rise of the signal on node N2, and the output of AND circuit 144 attains an L level. Furthermore, the output of delay circuit 143 is pulled down to an L level. In the composite gate formed of AND circuit 144 and NOR circuit 145, at least two p channel MOS transistors are turned on to increase the potential of node N31 by a greater driving capability differently from the case where an invalid data signal is output. Drive transistor 2b is turned on at a relatively advanced timing after a valid data signal appears on node N2. Thus, the potential of output node 6 is reduced at a high speed.

As described above, output node 6 can be discharged to the level of ground potential at an optimum timing according to a structure where the logic gate of controlling the potential of drive transistor 2b is formed of a composite gate, and the number of charging transistors which are turned on out of the transistors of the composite gate is changed according to the absence/presence of an invalid data output.

Figure 33:
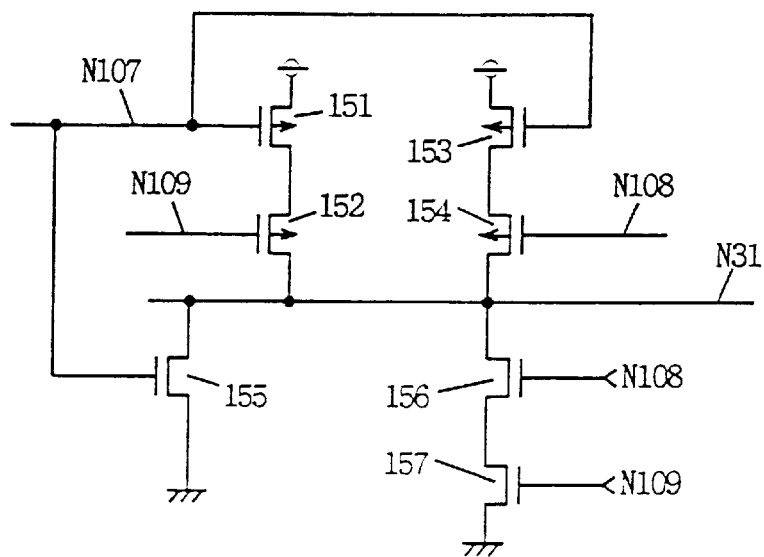
FIGS. 33 and 34 show a fifth modification and a sixth modification, respectively, of the output control circuit of the fourth embodiment of the present invention.

FIG. 33 shows a specific structure of the composite gate of the AND circuit and NOR gate of FIG. 31. Referring to FIG. 33, NAND circuit 144 and NOR circuit 145 include p channel MOS transistors 151 and 152 connected in series between a power potential supply node and node N31, and having the gates connected to nodes N107 and N102, p channel MOS transistors 153 and 154 connected in series between the supply node of power supply potential and node N31, and having their gates connected to nodes N107 and N108, respectively, an n channel MOS transistor 155 connected between output node N31 and the ground potential node, and having its gate connected to node N107, and n channel MOS transistors 156 and 157 connected in series between node N31 and the ground potential node for receiving the potentials of nodes N108 and N109 at their respective gates.

According to the composite gate structure of FIG. 33, NOR circuit 145 functions as an inverter circuit when the potential of node N107 attains an L level. When the potential of node N107 attains an L level, transistors 151 and 153 are turned on and transistor 155 is turned off. When the potential of node N108 attains an L level, transistor 154 is turned on. Therefore, when there is a possibility of an invalid data signal output, output node N31 is charged only via transistors 153 and 154. In this operation, transistor 156 is turned off, so that a discharging path does not exist, and the potential of node N31 rises gently.

When the potentials of nodes 108 and N109 attain an L level, the potential of node N107 already attains an L level. Therefore, node N31 is charged via transistors 151 and 152, and further by transistors 153 and 154, while all the discharging transistors 155, 156 and 157 are turned off. Therefore, node N31 is charged at a relative high speed, and the potential is pulled up speedily.

When the potential of node N107 is pulled up to an H level, transistor 155 is turned on, and node N31 is discharged via transistor 155 to attain an L level. In this operation, transistors 151 and 153 are off.

By using the composite gate as shown in FIG. 33, the gate of drive transistor 2b, i.e. the rising speed of the potential of node N31 can be switched according to absence/presence of an output of an invalid data signal. Therefore, the driving capability of drive transistor 2b can be increased at an optimum timing.

In the structure of the composite gate of FIG. 33, p channel MOS transistors 151 and 153 may be combined together into one p channel MOS transistor. Similar to the previous embodiments, various modifications can be applied to the output control circuit of FIG. 31.

Modification 5

Figure 34:
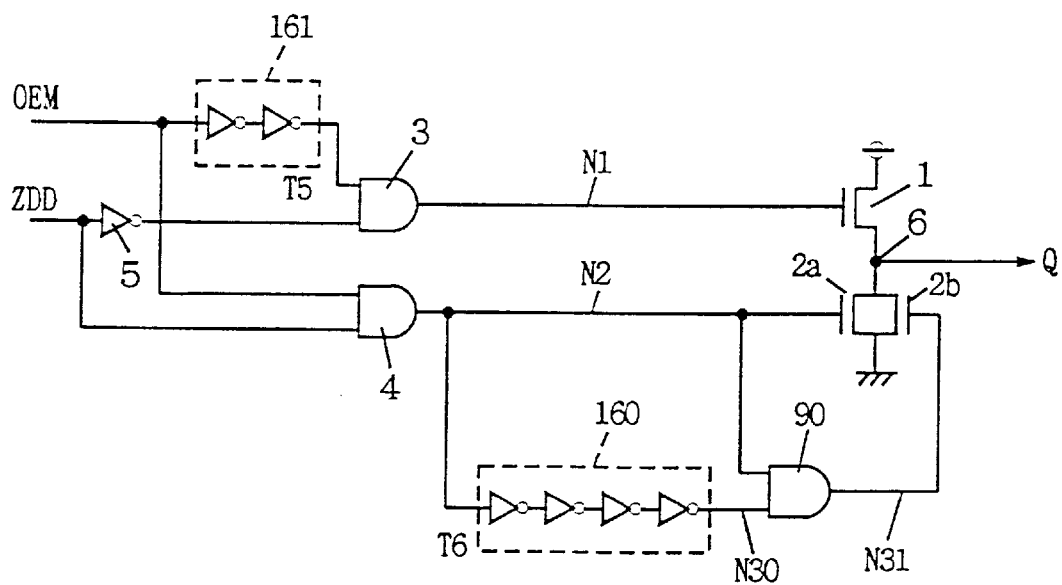

Referring to FIG. 34 showing an output circuit of a fifth modification of the fourth embodiment, an output circuit includes a delay circuit 161 for delaying output permission signal OEM for a predetermined time T5, an inverter circuit 5 for inverting internal readout data ZDD, an AND circuit 3 for receiving outputs of delay circuit 161 and inverter circuit 5, an AND circuit 4 for receiving output permission signal OEM and internal readout data signal ZDD, a drive transistor 1 formed of an n channel MOS transistor and rendered conductive in response to an output of AND circuit 3 for charging output node 6 to the level of power supply potential Vcc, and a drive transistor 2a of an n channel MOS transistor and rendered conductive in response to an output of AND circuit 4 for discharging output node 6 to the level of ground potential.

The output circuit further includes a delay circuit 160 for delaying an output of AND circuit 4 for a predetermined time T6, and an AND circuit 90 for receiving a signal of node N2 (output of AND circuit 4) and an output of delay circuit 160. The output of AND circuit 90 is applied to the gate of drive transistor 2b. The current driving capability of drive transistor 2b is set greater than that of drive transistor 2a. The operation of the output circuit of FIG. 34 will be described with reference to the operation waveform diagrams of FIGS. 35A and 35B.

Figure 35A:
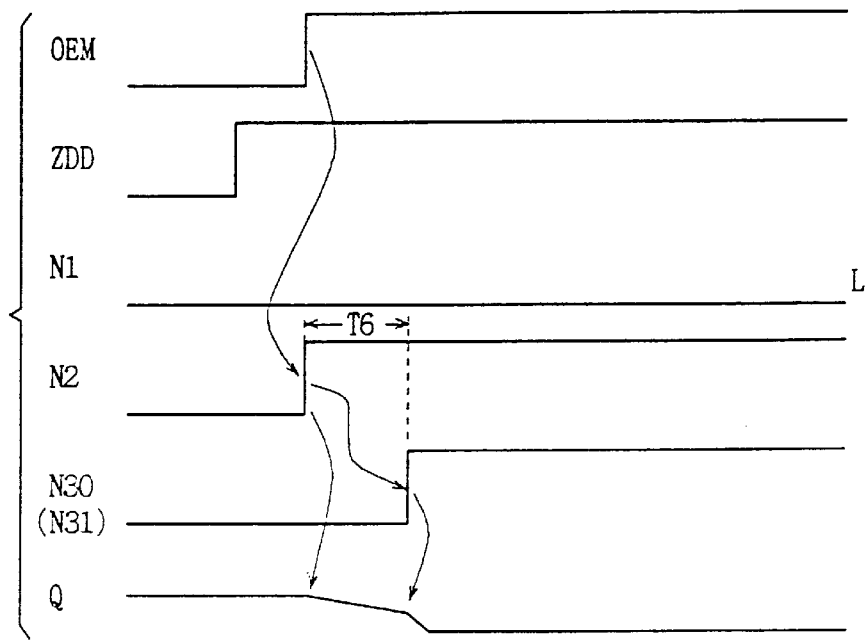
FIGS. 35A and 35B are signal waveform diagrams representing an operation of the output control circuit of FIG. 34.

An operation in a case where an invalid data signal is not output will be described with reference to FIG. 35A. In the case where an invalid data signal is not output, output permission signal OEM is pulled up to an H level after the rise of internal readout data signal ZDD to an H level. In response to a rise of output permission signal OEM, AND circuit 4 provides a signal of an H level to node N2. In response to a rise of the potential of node N2, drive transistor 2a is turned on, whereby the potential of output node 6 is discharged gently towards the level of the ground potential.

At an elapse of a predetermined time period T6 of delay circuit 160, the output of delay circuit 160 attains an H level, and the output of AND circuit 90 attains an H level. As a result, drive transistor 2b is turned on, whereby the potential of output node 6 is discharged to the level of ground potential at high speed. The potential of output node 6 is low enough when drive transistor 2b is turned on, so that an output signal can be provided stably with no ringing even when the potential of output node is discharged at high speed.

Node N1 maintains the potential of an L level since internal readout data signal ZDD already attains an H level when output permission signal OEM is pulled up to an H level. Therefore, drive transistor 1 is kept turned off.

Figure 35B:
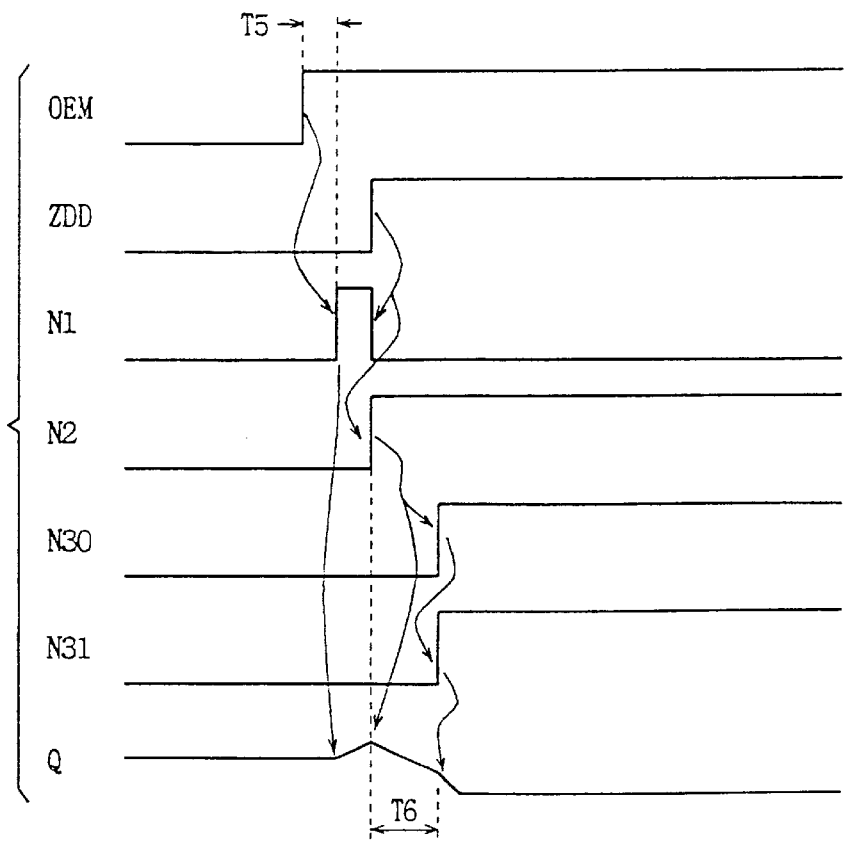

An operation in the case where an invalid data signal is output will be described with reference to FIG. 35B. When an invalid data signal is output, output permission signal OEM is pulled up to an H level, while internal readout data signal ZDD still maintains an L level. The output of inverter circuit 5 is at an H level. At an elapse of a delay time of T5 of delay circuit 161 from the rise of output permission signal OEM to an H level, the output of AND circuit 3 (potential of node N1) is pulled up to an H level, whereby drive transistor 1 is turned on to charge output node 6.

Then, when a valid data signal is transmitted and internal readout data signal ZDD is pulled up to an H level, the output of inverter circuit 5 is pulled down to an L level. As a result, the output of AND circuit 3 (potential of node N1) is driven to an L level, and drive transistor 1 is turned off. In response to the transition of internal readout data signal ZDD to an H level, the output of AND circuit 4 (potential of node N2) is pulled up to an H level, and drive transistor 2a is turned on. As a result, the potential of output node 6 is discharged gently to the level of ground potential.

At the elapse of a delay time T6 of delay circuit 160, delay circuit 160 is pulled up to an H level, and the output of AND circuit 90 is driven to an H level. As a result, drive transistor 2b is turned on, and the potential of output node 6 is discharged to the level of ground potential at a high speed.

In the case where this invalid data signal is output, the period during which the invalid data signal appears on output node 6 is reduced by delay time T5 of delay circuit 161. Therefore, the time duration of an invalid data signal appearing on output node 6 is shortened, so that the amount of a potential change due to the invalid data signal of output node 6 can be reduced. As a result, when drive transistor 2b is turned on following the turn on of drive transistor 2a to discharge potential output node 6, the potential of output node is sufficiently low that an output signal can be provided stably with generation of ringing effectively prevented.

The output of an invalid data signal can be prevented by setting the delay time T5 of delay circuit 161 such that a signal of an H level is not provided from AND circuit 3 to node N1 until internal readout data signal ZDD attains a valid state of an H level.

In the case where an invalid data signal is not output (refer to FIG. 35A) according to the structure of FIG. 34, the time required for the potential of node N1 to be driven to an H level from the rise of output permission signal OEM to an H level is delayed by delay time T5 of delay circuit 161. Therefore, in this case, only the access time of an H output is delayed. When the access time is determined by an output of an L level, and the H access time period is shorter than an L access time, degradation of the access time can be prevented.

FIG. 34 shows a structure of discharging output node 6 to the level of ground potential. In the structure shown in FIG. 34, generation of ringing at the rise of the potential of output node 6 can be prevented by providing a structure similar to that of delay circuit 161 for AND circuit 4, and by providing delay circuit 160 and AND circuit 90 to node N1, and providing a drive transistor having a driving capability greater than that of drive transistor 1 in parallel thereto.

Delay circuits 161 and 160 shown in FIG. 34 may have the number of stages of inverters set to an appropriate value. Furthermore, delay circuits 160 and 161 may be realized by a delay element different from an inverter.

Modification 6

Figure 36:
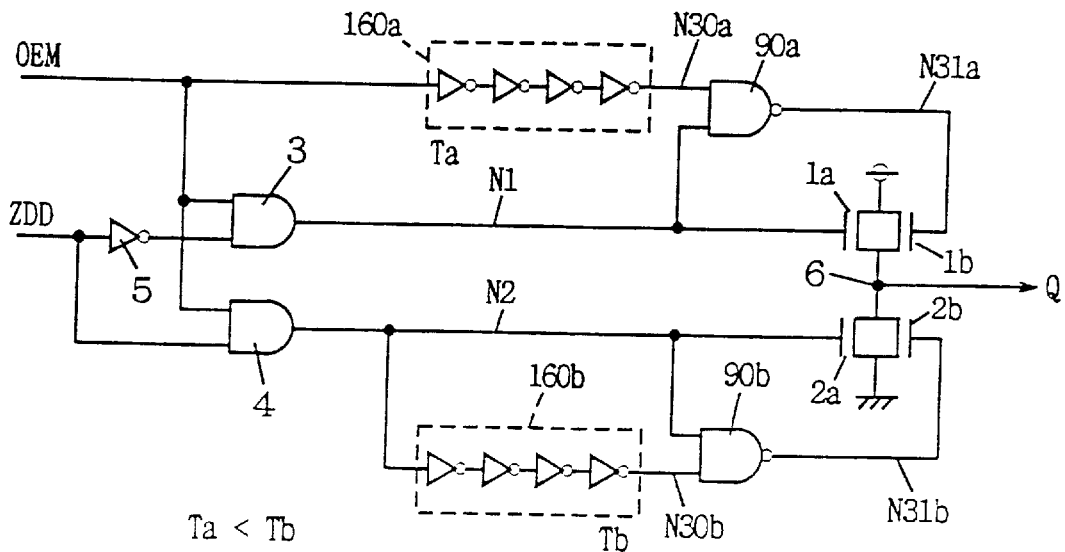
FIG. 36 shows a seventh modification of the output control circuit of the fourth embodiment of the present invention.
Figure 37:
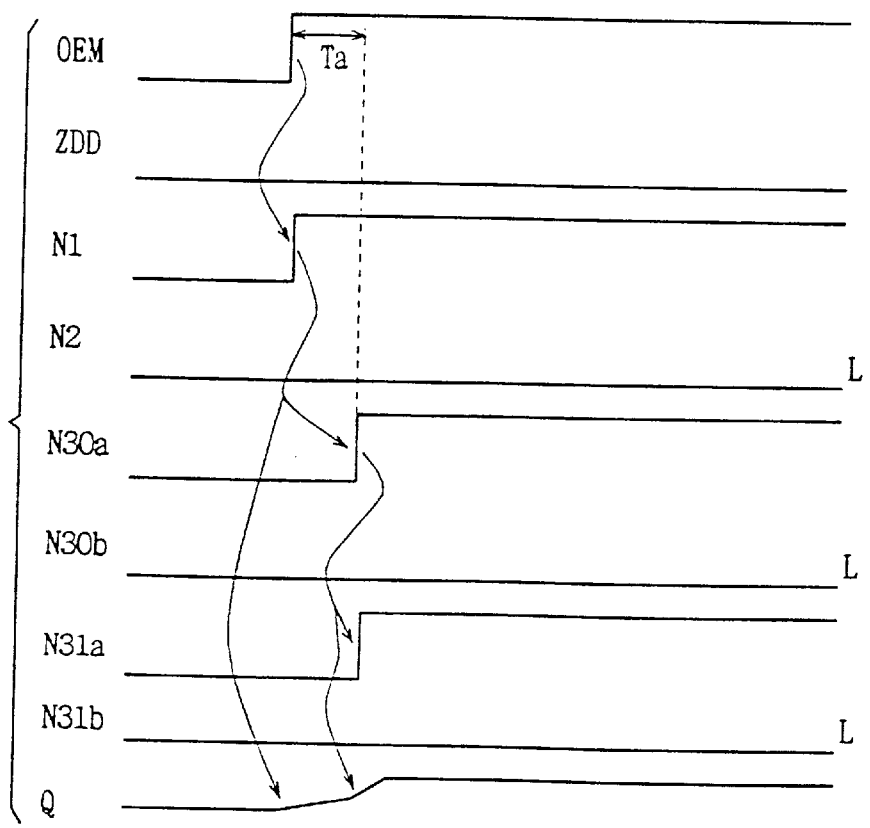
FIGS. 37, 38, and 39 are signal waveform diagrams representing an operation of the output control circuit of FIG. 36.

Referring to FIG. 36 showing a structure of an output circuit of a sixth modification, the output circuit includes an inverter circuit 5 for inverting internal readout data signal ZDD, an AND circuit 3 for receiving output permission signal OEM and an output of inverter circuit 5, an AND circuit 4 for receiving output permission signal OEM and internal readout data signal ZDD, a delay circuit 160a for delaying output permission signal OEM for a predetermined time Ta, and a delay circuit 160b for delaying an output of AND circuit 4 for a predetermined time period of Tb. Delay time Ta of delay circuit 160a is set shorter than delay time Tb of delay circuit 160b. Delay time Ta of delay circuit 160a is set to such a time width that an invalid data signal is prevented from appearing on node N2 in reading out a data signal of an L level. Delay time Ta of delay circuit 160a is set to a maximum value, for example, of a specification value of the time required from a change of a column address signal to a fall of column address strobe signal ZCAS to an L level. Therefore, transmission of an invalid data signal to node N2 can be prevented. The operation of the circuit of FIG. 36 will be described with reference to the operation waveform diagram of FIG. 37 for the case where a data output signal Q of an H level is provided.

In this case, internal readout data signal ZDD attains an L level (internal readout data signal ZDD is precharged to an L level during standby or prior to a data readout operation). Under this state, when output permission signal OEM rises to an H level, AND gate 3 provides a signal of an H level on node N1. In response to a rise of the potential of node N1, drive transistor 1a is turned on. The current driving capability of drive transistor 1a is set to a relatively low level. As a result, output node 6 is discharged gently via drive transistor 1a.

At an elapse of a delay time Ta of delay circuit 160a, the output of delay circuit 160a is pulled up to an H level, and the output of AND circuit 90a is driven to an H level. As a result, drive transistor 1a is turned on. Drive transistor 1b has its current driving capability set to a sufficient high level. Therefore, output node 6 is charged at high speed by drive transistor 1b, so that the potential thereof rises speedily.

Figure 38:
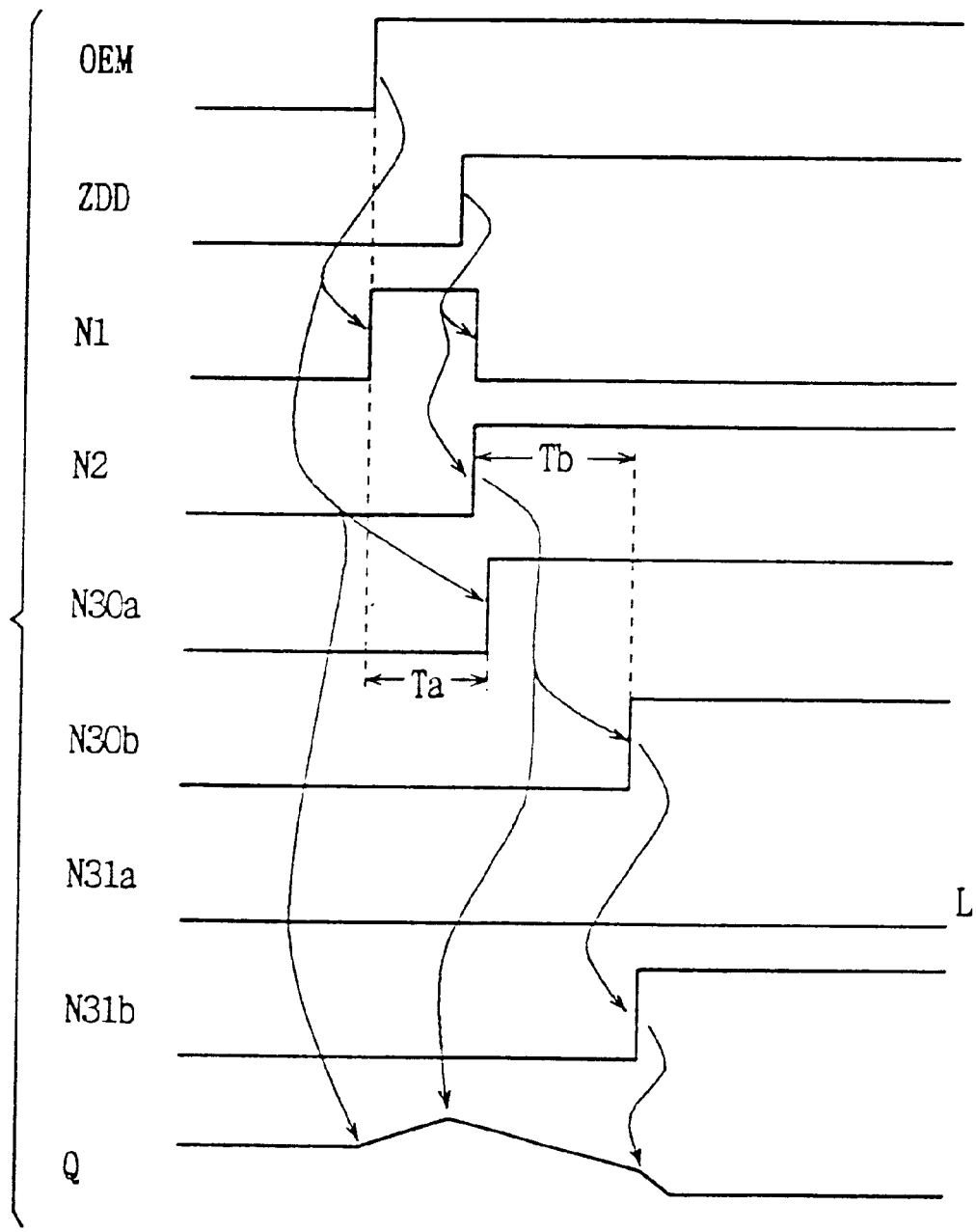

An operation in the case where an invalid data signal is output during an L data output will be described with reference to FIG. 38. First, output permission signal OEM is pulled up to an H level, while internal readout data signal ZDD is at an L level and the output of inverter circuit 5 is at an H level. In response to a rise of output permission signal OEM, AND circuit 3 provides a signal of an H level to node N1. In response to a rise of the signal potential on node N1, drive transistor 1a of a low current driving capability is turned on, whereby the potential of output node 6 is gently increased.

Then, a valid data signal is transmitted, and internal readout data signal ZDD is pulled up to an H level. AND circuit 3 provides an output of an L level, whereby drive transistor 1a is turned off. In response to internal readout data signal ZDD of an H level, AND circuit 4 provides a signal of an H level to node N2, whereby drive transistor 2a of a low current driving capability is turned on. As a result, the increased potential of output node 6 is gently discharged towards the level of the ground potential.

At an elapse of a delay time Tb of delay circuit 160b, the output of delay circuit 160b attains an H level (potential of node N30b), and AND circuit 90b provides a signal of an H level to node N31b. As a result, drive transistor 2b of a great current driving capability is turned on, whereby output node 6 is discharged to the level of ground potential at high speed.

Even in the case where an invalid data signal is output, drive transistor 1a of a low current driving capability is first turned on to charge output node 6. The potential increase of output node 6 is small since the current driving capability of drive transistor 1a is low. Therefore, the potential of output node 6 can be set to a sufficient low level to effectively prevent generation of ringing.

Drive transistor 1b of a great current driving capability maintains an off state since the potential level of node N31a is fixed to an L level. This is because the potential of node N1 already attains an L level at the transition of the output delay circuit 160a to an H level.

Figure 39:
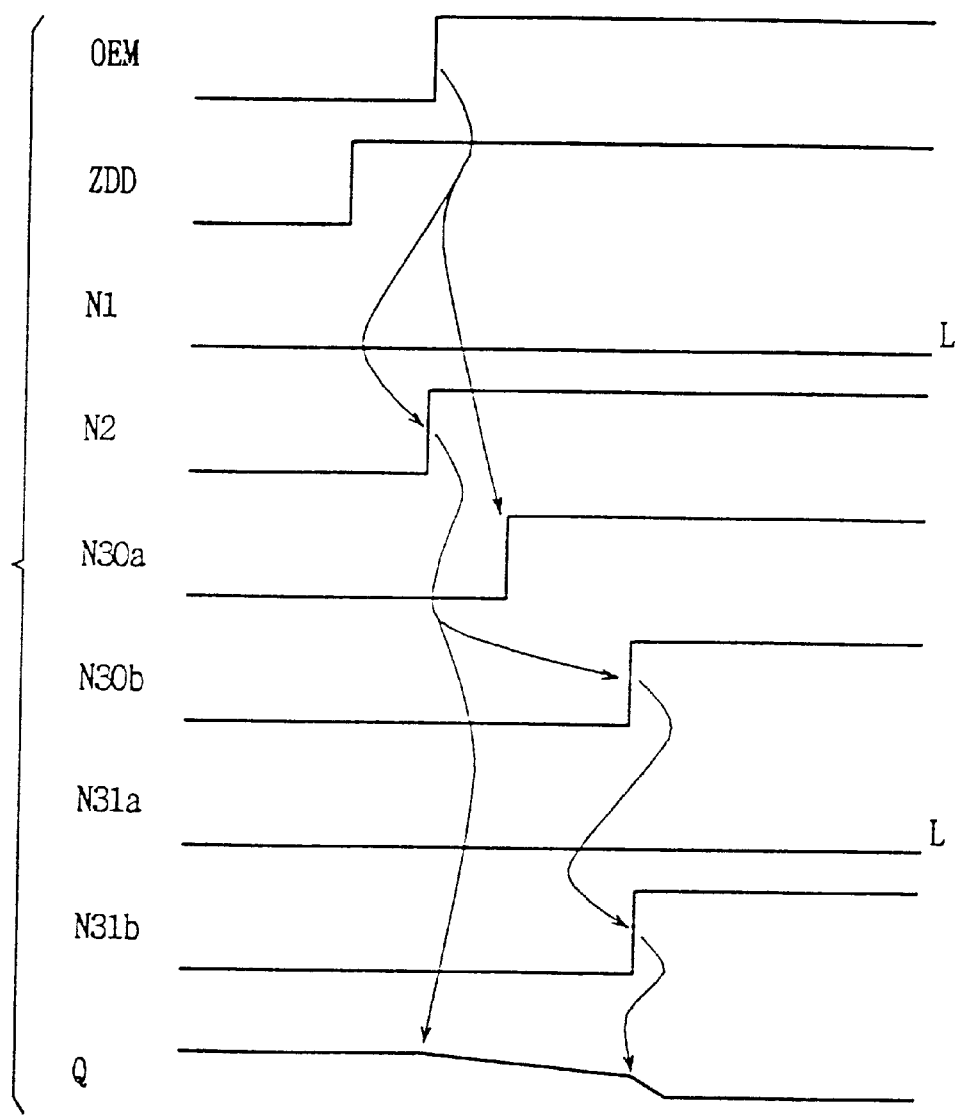

The operation in the case where an invalid data signal is not output will be described with reference to FIG. 39, wherein internal readout data signal ZDD rises to an H level, and therefore the potential of node N1 is fixed to an L level.

When output permission signal OEM rises to an H level, the potential of node N2 is pulled up to an H level via AND circuit 4. At an elapse of a predetermined time Ta, the output of delay circuit 160a is pulled up to an H level. However, since the potential of node N1 attains an L level, the output of AND circuit 90a is pulled down to an L level, and drive transistors 1b and 1a maintain an OFF state.

In response to a rise of the potential of node N2, drive transistor 2a is turned on, whereby output node 6 is discharged gently. Then, when the output of delay circuit 160b is pulled up to an H level, the potential of node N31b is driven to an H level via AND circuit 90b, whereby drive transistor 2b is turned on. As a result, output node 6 is discharged to the level of ground potential at high speed. When drive transistor 2b is turned on, the potential of output node 6 is already set to a sufficiently low level by drive transistor 2a. Therefore, an output signal can be generated stably with no generation of ringing.

In the structure shown in FIG. 36, the difference in the current driving capability of drive transistors 1a and 1b can be realized by selecting the size or the gate width, or the ratio of the gate width to the gate length of these transistors appropriately. Furthermore, a structure may be employed in which a voltage of the level of power supply voltage Vcc is applied to the gate of drive transistor 1a, and a boosted power supply voltage is applied to the gate of drive transistor 1b. The adjustment of the gate voltage of drive transistors 1a and 1b can be combined with the adjustment of the size. The structure of differentiating the gate voltages may be applied to drive transistors 2a and 2b discharging output node 6 to the level of the ground potential.

Similar to the prior modification 5, a structure may be employed in which output permission signal OEM is applied to AND circuit 3 via a delay circuit as in the output circuit of FIG. 36. In this case, the rising time of the potential of node N1 can be delayed, and the time period of an invalid data signal output can be reduced. Therefore, the potential amplitude of output node 6 can further be reduced.

By providing a circuit configuration similar to that shown in FIG. 36 for a drive transistor increasing the potential of output node 6, increase in the potential amplitude of output node 6 can be prevented when an invalid data signal attains an L level and a valid data signal attains an H level.

Modification 7

Figure 40:
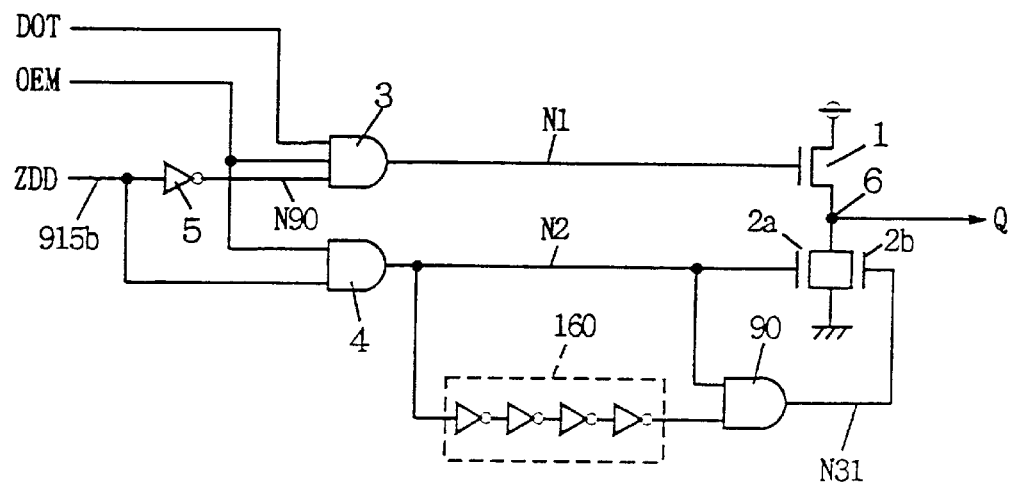
FIG. 40 shows an eighth modification of the output control circuit of the fourth embodiment of the present invention.

Referring to FIG. 40 showing a structure of an output circuit of a seventh modification, an output circuit includes an inverter circuit 5 for inverting readout internal data signal ZDD, an AND circuit 4 for receiving output designating signal DOT, output permission signal OEM and an output of inverter circuit 5, a drive transistor 1 rendered conductive in response to an output of AND circuit 3 for charging output node 6 to the level of power supply potential Vcc, an AND circuit 4 for receiving output permission signal OEM and internal readout data signal ZDD, and a drive transistor 2a of a relatively low current driving capability and rendered conductive in response to an output of AND circuit 4 for discharging output node 6 to the level of ground potential.

Figure 41:
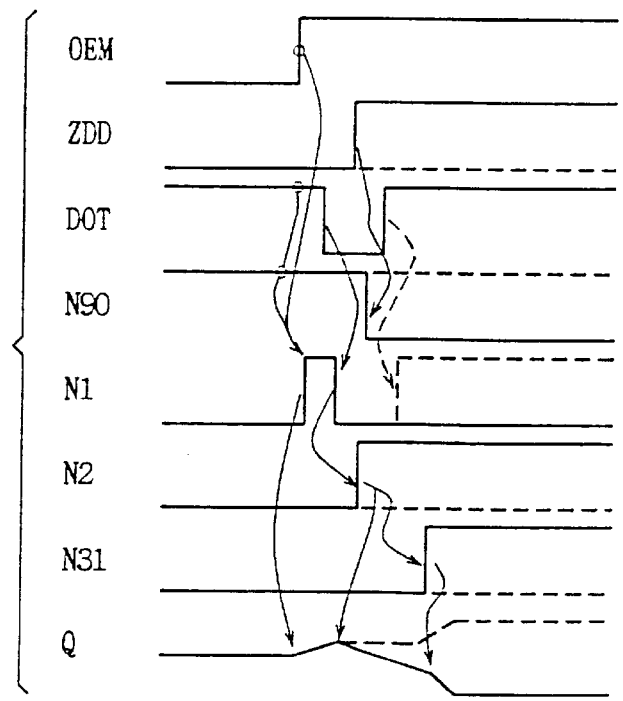
FIGS. 41 and 42 are signal waveform diagrams representing an operation of the output control circuit of FIG. 40.

The output circuit further includes a delay circuit 160 for delaying an output of AND circuit 4 (potential of node N2) for a predetermined time period, and an AND circuit 90 for receiving an output of delay circuit 160 and a signal of node N2. The output of AND circuit 90 is provided to the gate of drive transistor 2b of a great current driving capability. The operation of the output circuit of FIG. 40 will be described with reference to the operation waveform diagram of FIG. 41.

First, an operation in the case where an invalid output data signal attains an H level, and a valid data signal attains an L level will be described. In this case, prior to a fall of output designating signal DOT, output permission signal OEM is pulled up to an H level. Internal readout data signal ZDD on internal data bus line 915b attains an L level, and the output of inverter circuit 5 attains an H level. Therefore, in response to a rise of output permission signal OEM, AND circuit 3 provides a signal of an H level on node N1. In response to a rise of the potential on node N1, drive transistor 1 is turned on. The output of AND circuit 4 (potential of node N2) is at an L level, and drive transistors 2a and 2b are turned off. Therefore, output node 6 is charged via drive transistor 1 to have the potential thereof increased.

The fall of output designating signal DOT causes the potential of node N1 to be pulled down to an L level, whereby drive transistor 1 is turned off. Then, in response to a fall of output designating signal DOT, a valid data signal ZDD of an H level is transmitted on internal data bus line 915b, and a signal of an L level is provided from inverter circuit 5 to node N90. As a result, the output of AND circuit 3 currently providing data ZDD, i.e. the potential of node N1, is fixed at an L level.

When internal readout data signal ZDD attains an H level, AND circuit 4 provides a signal of an H signal on node N2, whereby drive transistor 2a is turned on. As a result, output node 6 is discharged gently, so that the potential thereof is gradually reduced.

At an elapse of a predetermined time, the output of delay 150 attains an H level, and a signal of an H level is provided by AND circuit 90 onto node N31. As a result, drive transistor 2b is turned on, whereby the potential of output node 6 is discharged to the level of ground potential at high speed.

According to the structure shown in FIG. 40, the ON time period of drive transistor 1 for discharging output node 6 is extremely short even when an invalid data signal is output. Therefore, the potential amplitude of output node 6 can be made small. Furthermore, output of invalid data can be completely prevented in the case where output permission signal OEM attains an H level following an L period of output designating signal DOT. When an invalid data signal of an H level is output, internal readout data signal ZDD is fixed at an L level as shown by the broken line in FIG. 41. In this case, the output of inverter circuit 5 is at an H level, and the potential of node N1 is driven to an H level in response to a rise of output designating signal DOT to an H level. In contrast, the output of AND circuit 4 maintains an L level, and drive transistors 2a and 2b maintain an off state. Therefore, output node 6 is charged to the level of power supply potential Vcc via drive transistor 1. In other words, when a valid output data signal attains an H level, drive transistor 1 is turned on in response to a rise of output permission signal OEM, and then turned off in response to a transition of output designating signal DOT to an L level. Then, when output designating signal DOT attains an H level again, drive transistor 1 is turned on again.

Figure 42:
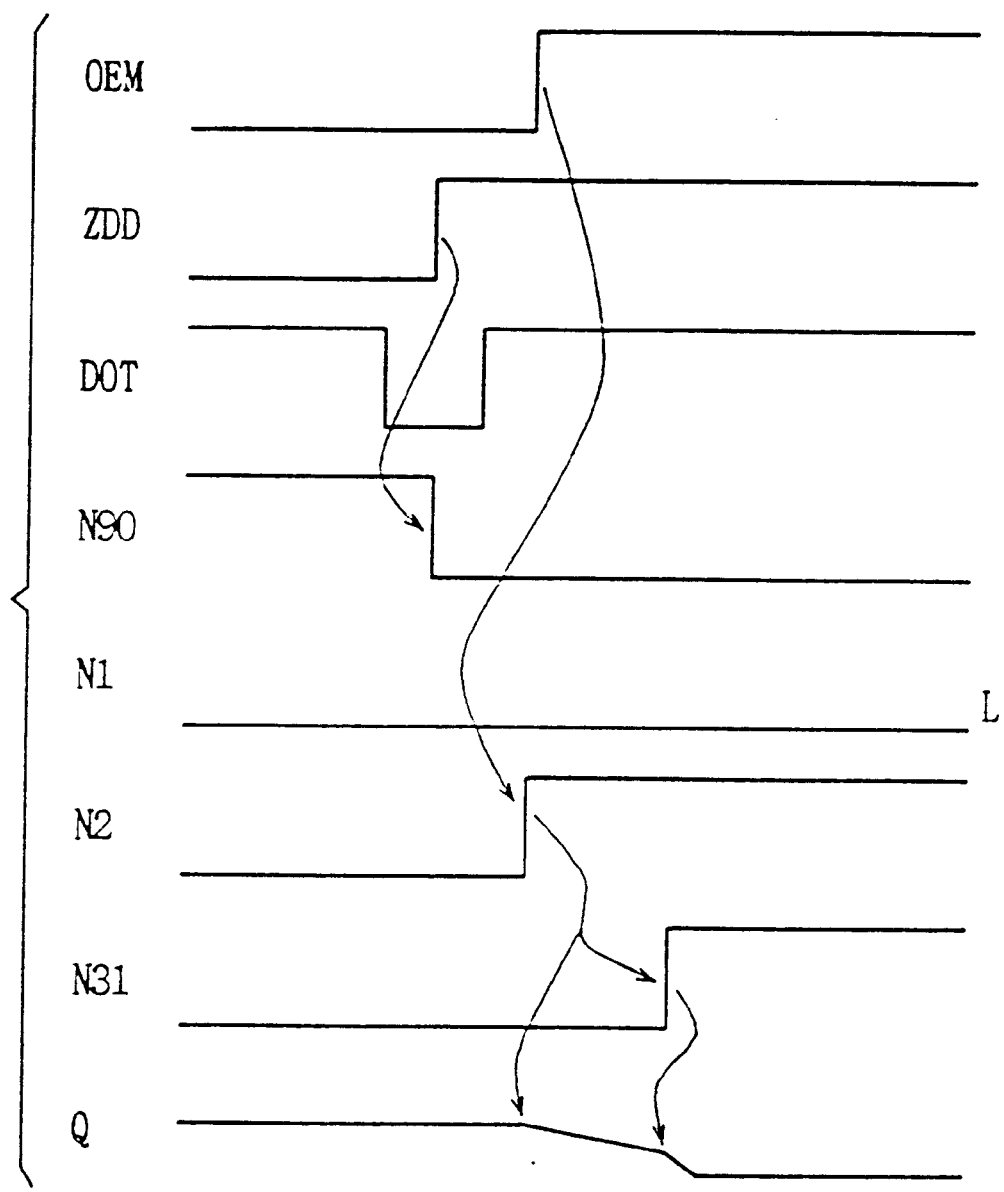

An operation in the case where an invalid data signal is not output in reading out an L output data will be described with reference to FIG. 42. Output designating signal DOT first falls to an L level. Under this state, internal readout data signal ZDD is at an L level, and the output of inverter circuit 5 (potential of node N90) is at an H level. The potential of node N1 is at an L level since output permission signal OEM is at an L level.

At an elapse of a predetermined time period from the fall of output designating signal DOT to an L level, a valid data signal is transmitted to internal data bus line 915b, whereby internal readout data signal ZDD is pulled up to an H level. As a result, the potential of node N90 is pulled down to an L level, and the potential of node N1 is fixed to an L level during the reading out time period of internal readout data signal ZDD. The potential of node N2 is still at an L level since output permission signal OEM is at an L level. In response to output permission signal OEM pulled up to an H level, the potential of node N2 is pulled up to an H level via AND circuit 4. As a result, drive transistor 2a is turned on, whereby output node 6 is driven to the level of ground potential gently. Then, at an elapse of a predetermined time period, the output of delay circuit 160 attains an H level, and the output of AND circuit 90 attains an H level. Responsively, drive transistor 2b is turned on, whereby output node 6 is discharged to the level of ground potential at high speed. The potential of output node 6 is already reduced to a sufficient low level when drive transistor 2b is turned, so that an output signal can be output stably with no generation of ringing.

In the structure of FIG. 40, a one shot pulse signal generated in response to column address transition detection signal φATD and attaining an L level at a timing earlier than that of output designating signal DOT may be used instead of output designating signal DOT. This can be realized by employing an appropriate delay circuit in one shot pulse generation circuit 50 of FIG. 5. By using such a signal, the pulse width of a one shot pulse signal generated in response to the rise of output permission signal OEM can further be reduced according to the operation waveform diagram of FIG. 41. Furthermore, the output time period of an invalid data signal output of an H level can be reduced. Also, the potential amplitude of output node 6 can further be reduced.

By providing a signal falling to an L level from an H level at a timing earlier than the transition of output permission signal OEM to an H level from an L level to AND circuit 3 in response to column address transition detection signal φATD, generation of an invalid data signal at node N1 can be prevented. This is implemented by using a circuit in which a one shot pulse signal of an L level of a predetermined time width is generated in response to a fall of the potential of output node N14 of a latch circuit in the structure of FIG. 5. Such a signal generation circuit may employ an AND circuit receiving a signal on node N14 and output designating signal DOT. By using such a structure, the output of an invalid data signal onto node N1 can be prevented.

In FIG. 40, a structure may be employed in which output permission signal OEM is applied to AND circuit 3 via a delay circuit. In this case, the potential amplitude of output node 6 can be reduced by reducing the time period of an invalid data signal output at node N1. By setting an appropriate delay time of this delay circuit, generation of an invalid data signal in node N1 can be reliably prevented.

Modification 8

Figure 43:
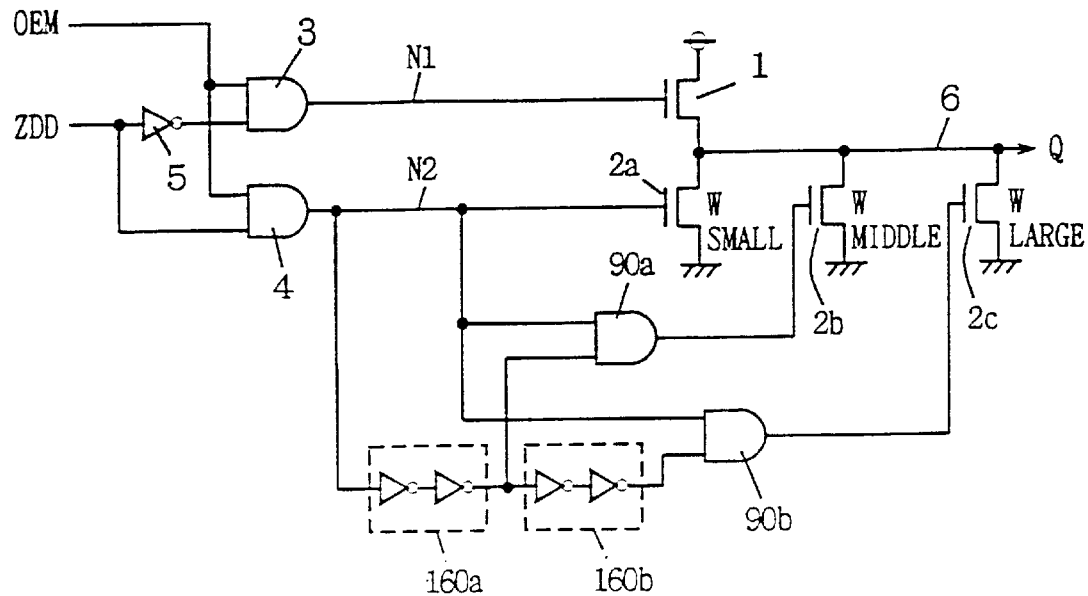
FIGS. 43 and 44 show a ninth modification and a tenth modification, respectively, of an output control circuit according to the fourth embodiment of the present invention.

FIG. 43 shows an eighth modification of the output circuit. Referring to FIG. 43, three drive transistors 2a, 2b and 2c are parallely provided for discharging output node 6. Drive transistors 2a, 2b and 2c have gate widths W made sequentially greater in this order. In other words, the current driving capabilities of drive transistors 2a, 2b and 2c are differentiated from each other. An output of AND circuit 90a is provided to the gate of drive transistor 2b. AND circuit 90a receives the potential on node N2 and an output of delay circuit 160a. Delay circuit 160a delays the potential signal of node N2 for a predetermined time period. The output of delay circuit 160a is further delayed by delay circuit 160b. An output of AND circuit 90b is provided to the gate of drive transistor 2c. AND circuit 90b receives a signal on node N2 and an output of delay circuit 160b.

According to the structure of the output circuit of FIG. 43, the drive of the potential of node N2 to an H level causes drive transistor 2a to be turned on, whereby output node 6 is discharged gently. At an elapse of a predetermined time period, the output of AND circuit 90a attains an H level, whereby drive transistor 2b is turned on. As a result, output node 6 is discharged to the level of ground potential.

At a further elapse of a predetermined time period, the output of delay circuit 160b is pulled up to an H level. In response to an output of AND circuit 90b, drive transistor 2c is turned on, whereby output node 6 is discharged to the level of ground potential at high speed. By providing three drive transistors for discharging output node 6 which are turned on at different timings, an output signal can be generated stably with no generation of ringing. The structure of the output circuit of FIG. 43 can be utilized in combination with any of the first to third embodiments.

Modification 9

Figure 44:
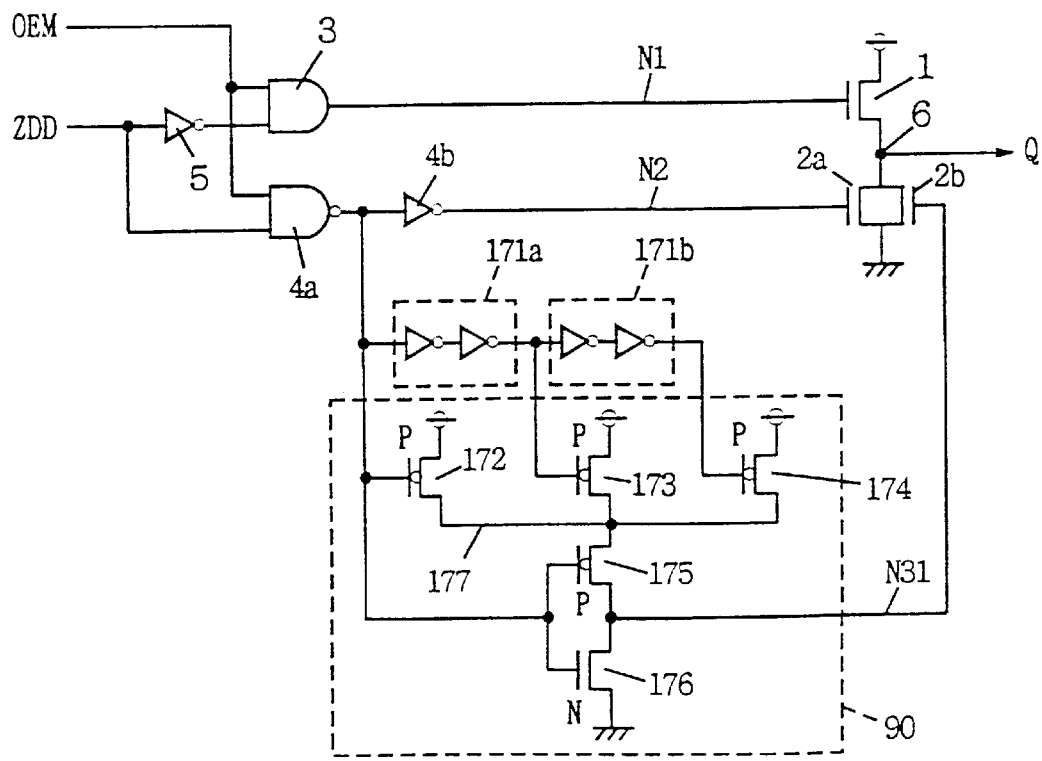

FIG. 44 shows a ninth modification of the fourth embodiment. Referring to FIG. 44, a structure of a gate circuit 90 is shown for directly driving drive transistor 2b for discharging output node 6 to the level of ground potential. Gate circuit 90 can be used in various embodiments and modifications. FIG. 44 shows a basic circuit configuration as an output circuit.

In FIG. 44, drive transistor 2a is driven by NAND circuit 4a and inverter circuit 4b. NAND circuit 4a receives output permission signal OEM and internal readout data signal ZDD. Inverter circuit 4b receives an output of NAND circuit 4a for transmitting a signal of a logic corresponding to internal readout data signal ZDD onto node N2.

The output circuit further includes a delay circuit 171a for delaying an output of NAND circuit 4a for a predetermined time period, a delay circuit 171b for delaying an output of delay circuit 171a, and a gate circuit 90 for driving drive transistor 2b according to an output of NAND circuit 4a and outputs of delay circuits 171a and 171b. Gate circuit 90 corresponds to AND circuits 90a and 90b of FIG. 43.

Gate circuit 90 includes p channel MOS transistors 172, 173 and 174 connected in parallel between a power supply potential node and internal node 177. Outputs of NAND circuit 4a, delay circuit 171a, and delay circuit 171b are provided to the gates of transistors 172, 173 and 174, respectively.

Gate circuit 90 further includes an inverter circuit provided between internal node 177 and a ground potential. This inverter circuit includes a p channel MOS transistor 175 provided between output node N31 and internal node 177, and receiving an output of NAND circuit 4a at its gate, and an n channel MOS transistor 176 provided between output node N31 and the ground potential node and receiving an output of NAND circuit 4a at its gate. The operation of gate circuit 90 will now be described.

When the potential of node N2 attains an L level, NAND circuit 4a provides a signal of an H level. Under this state, all transistors 172–175 attain an off state, and transistor 176 is ON. Therefore, output node N31 attains an L level.

When the output of NAND circuit 4a attains an L level, the potential of node N2 attains an H level, whereby drive transistor 2a is turned on. Therefore, output node 6 is discharged gently by drive transistor 2a. Under this state, a fall of the output of NAND circuit 4a to an L level turns on transistors 172 and 175, and turns off transistor 176b. Therefore, output node N31 is charged gently via transistors 172 and 175, to have the potential risen gently. As a result, the driving capability of drive transistor 2b increases slightly.

Then, when the output of delay circuit 171a attains an L level, transistor 173 is turned on, and node N31 is charged via transistors 172, 173 and 175 to have the potential thereof increased slightly. The driving capability of drive transistor 2b is further slightly increased.

At an elapse of a predetermined time period, the output of delay circuit 171b attains an L level, and transistor 174 is turned on. As a result, current flows to transistor 175 via transistors 172–174, whereby the potential of node N31 is driven at a high speed. The current driving capability of drive transistor 2b is increased rapidly.

An effect similar to that of the previous embodiments and modifications can be obtained without using a delay circuit by differentiating the rising speed of the output potential of gate circuit 90 over a time period to vary the current driving capability of drive transistor 2b over the time period. As shown in FIG. 44, the current changing rate with respect to time that generates ringing at output node 6, i.e. di/dt can be reduced even when the current driving capability of drive transistor 2b is increased over time. Therefore, generation of ringing can be reliably prevented.

Embodiment 5

In a semiconductor device, an upper limit value Vcmx and a lower limit value Vcmn are set for power supply voltage Vcc in order to guarantee a stable operation. In the case of an operating power supply voltage Vcc of 5 V, for example, the upper limit value Vcmx is set to 5.5 V, and the lower limit value Vcmn is set to 4.5 V in the specification. A variation of power supply voltage Vcc in the range of ±10% of the rated value of power supply voltage Vcc is allowed.

Similarly, an upper limit value Tamx and a lower limit value Tamn are set with respect to operating temperature Ta. The range of 0 to 70° C. is defined in the specification as a range of operating temperature Ta.

In a circuit with MOS transistors as the components, the operating speed is increased as power supply voltage Vcc is increased. The current driving capability of a MOS transistor is determined by the gate voltage (gate-source voltage difference). This is because the gate-source potential difference is determined by power supply voltage Vcc.

In a circuit with MOS transistors as the components, the operating speed is also increased as the operating temperature Ta is lowered. This is since a higher operating temperature causes a greater resistance in the diffusion region and the threshold voltage is increased due to influence of hot electrons, so that a current driving capability is reduced.

A typical example demonstrating such circuit characteristics can be found in a phenomenon that access time ta becomes shorter in proportion to power supply voltage Vcc and becomes longer in proportion to an operating temperature in a semiconductor memory device.

A structure reliably preventing generation of ringing independent of variation in power supply voltage Vcc and operating temperature Ta will be described.

Figure 45A:
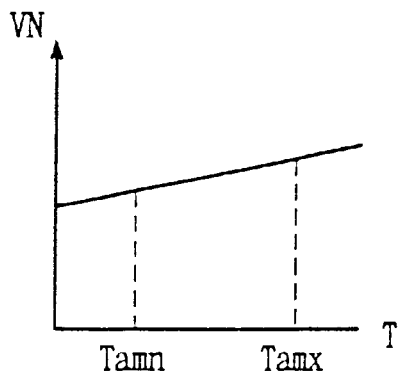
FIGS. 45A and 45B show the temperature and voltage dependent characteristics, respectively, of a first control voltage used in a fifth embodiment of the present invention.
Figure 45B:
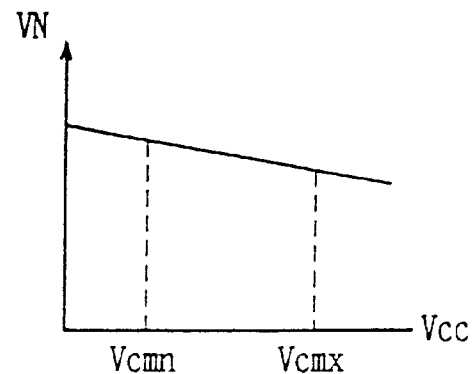

FIGS. 45A and 45B show the characteristics of a first control voltage used in the present fifth embodiment. A first control voltage VN increases in proportion to an ambient temperature T as shown in FIG. 45A. In other words, first control voltage VN has a positive temperature coefficient. Furthermore, first control voltage VN is reduced in proportion to a power supply voltage Vcc as shown in FIG. 45B. In other words, first control voltage VN has a negative dependency on power supply voltage Vcc.

Figure 46A:
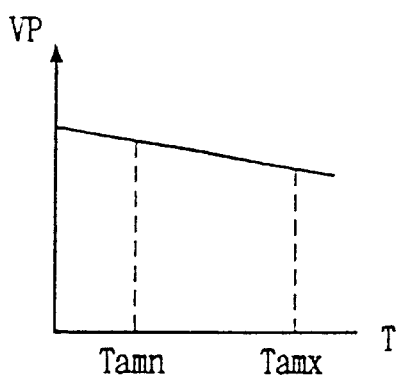
FIGS. 46A and 46B are diagrams representing the temperature and voltage dependent characteristics, respectively, of a second control voltage used in the fifth embodiment.
Figure 46B:
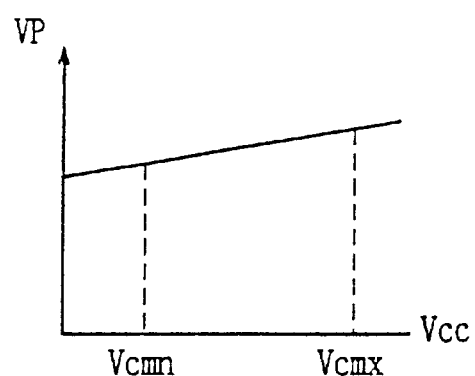

FIGS. 46A and 46B show the temperature and power supply voltage dependency characteristics of a second control voltage used in the present fifth embodiment. As shown in FIG. 46A, second control voltage VP is lowered in proportion to an ambient temperature T. In other words, second control voltage VP has a negative temperature coefficient. Furthermore, as shown in FIG. 46B, second control voltage VP increases in proportion to a power supply voltage Vcc. In other words, second control voltage VP has a positive dependency on power supply voltage Vcc. The delay time of a delay stage is adjusted using first and second control voltages VN and VP having opposing temperature and power supply voltage dependency characteristics.

Figure 47A:
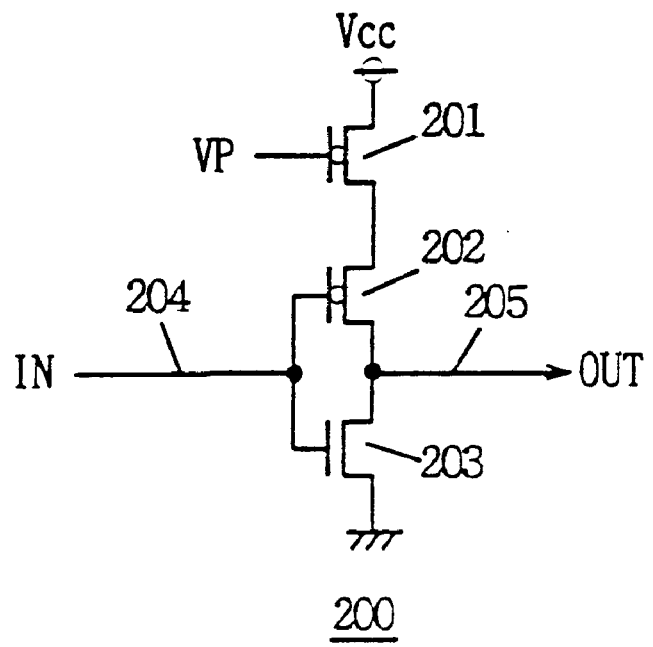
FIGS. 47A and 47B are diagrams showing the structure and the operation characteristics, respectively, of the components of a delay circuit used in the fifth embodiment of the present invention.

FIG. 47A shows a first structure of an inverter circuit forming a delay stage used in the present fifth embodiment. Referring to FIG. 47A, an inverter circuit forming a delay stage includes p channel MOS transistors 201 and 202 connected in series between a supply node of power supply voltage Vcc and output node 205, and an n channel MOS transistor 203 provided between output node 205 and the ground potential node. Second control voltage VP is applied to the gate of p channel MOS transistor 201. MOS transistors 202 and 203 both have their gates connected to input node 204. The operation characteristics of the inverter circuit of FIG. 47A will be described with reference to FIG. 47B.

When power supply voltage Vcc approaches the lower limit value Vcmn or when operating temperature T approaches the upper limit temperature Tamx, second control voltage VP is reduced. Therefore, the current driving capability of p channel MOS transistor 201 is made greater than the case under the condition of upper limit value Vcmx of power supply voltage Vcc and lower limit value Tamn of operating temperature T.

When an input signal IN applied to input node 204 attains a low level, MOS transistor 202 is turned on, and MOS transistor 203 is turned off. Output node 205 is charged to the level of power supply voltage Vcc via transistors 201 and 202. Second control voltage VP is set to a value sufficiently lower than power supply voltage Vcc, so that transistor 201 can pass through power supply voltage Vcc. An optimum value of second control voltage VP is determined according to the actual operating characteristics of the device.

Figure 47B:
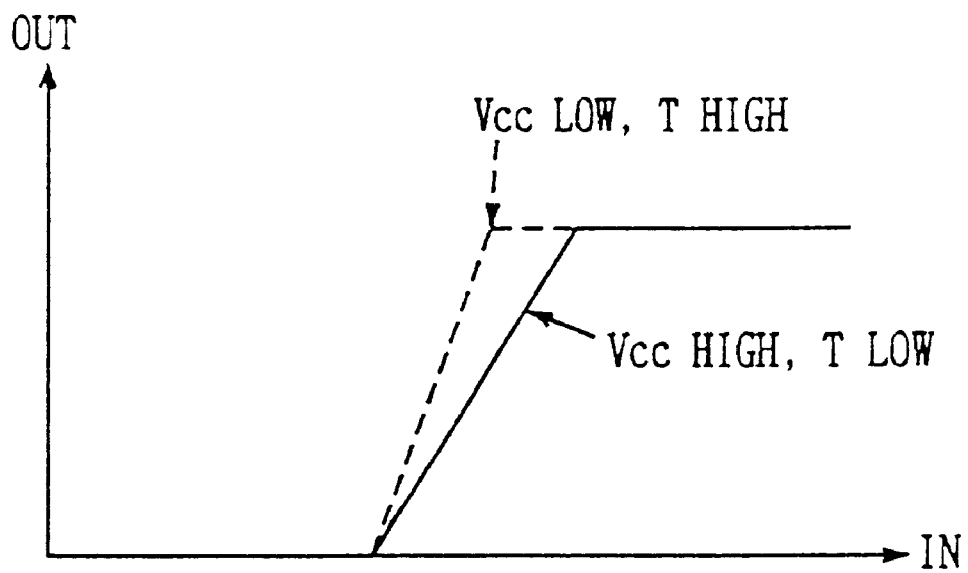

When power supply voltage Vcc is near the lower limit value Vcmn or operating temperature T is near the upper limit value Tamx, output node 205 is pulled up to a high level at a high speed (shown in a broken line in FIG. 47B).

When input signal IN attains a high level, MOS transistor 203 is turned on, whereby output node 205 is discharged to the level of the ground potential. The discharging rate of output node 205 is determined by the current driving capability of transistor 203. More specifically, when a delay stage is formed using an inverter circuit shown in FIG. 47A, the time required for transmitting a signal of a low level becomes longer with power supply voltage Vcc at the upper limit value and ambient temperature T at the lower value.

Figure 48A:
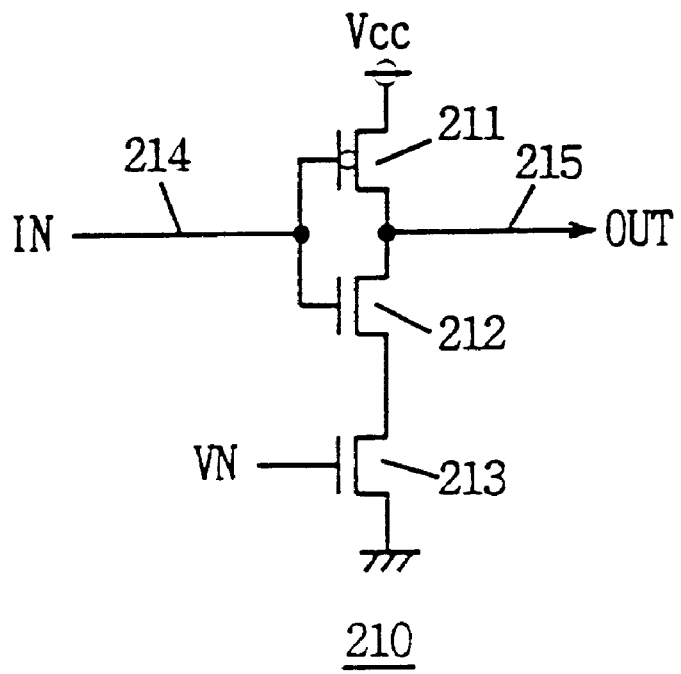
FIGS. 48A and 48B are diagrams showing the structure and the operation characteristics, respectively, of the components of a delay circuit used in the fifth embodiment of the present invention.

Another structure and operation characteristics thereof of an inverter circuit forming a delay stage will be described with reference to FIGS. 48A and 48B. Referring to FIG. 48A, an inverter circuit 210 includes a p channel MOS transistor 211 provided between a power supply potential node and output node 215, and n channel MOS transistors 212 and 213 provided in series between output node 215 and a ground potential node. Input signal IN is applied via input node 214 to the gates of MOS transistors 211 and 212. First control voltage VN is applied to the gate of MOS transistor 213. The operation characteristics of the inverter circuit shown in FIG. 48A will be described with reference to FIG. 48B.

First control voltage VN has a negative dependency on power supply potential Vcc and a positive temperature coefficient. When input signal IN attains a high level, MOS transistor 212 is turned on. When power supply potential Vcc is near an upper limit value Vmx or ambient temperature T is near a lower limit value Tamn, first control voltage VN is reduced. Therefore, in this state, the current driving capability of MOS transistor 213 is made low. First control voltage VN is set to a value sufficiently higher than the threshold voltage of MOS transistor 213. Therefore, output node 215 is discharged in a more gentle manner when power supply voltage Vcc takes a high value or when ambient temperature T takes a low value than the otherwise case. More specifically, when a signal of a high level is transmitted to a delay stage formed of an inverter circuit shown in FIG. 48A, the propagation time is increased when power supply potential Vcc takes a value close to upper limit value Vmx or when ambient temperature T takes a value close to lower limit value Tamn in comparison with the opposite case.

Figure 49A:
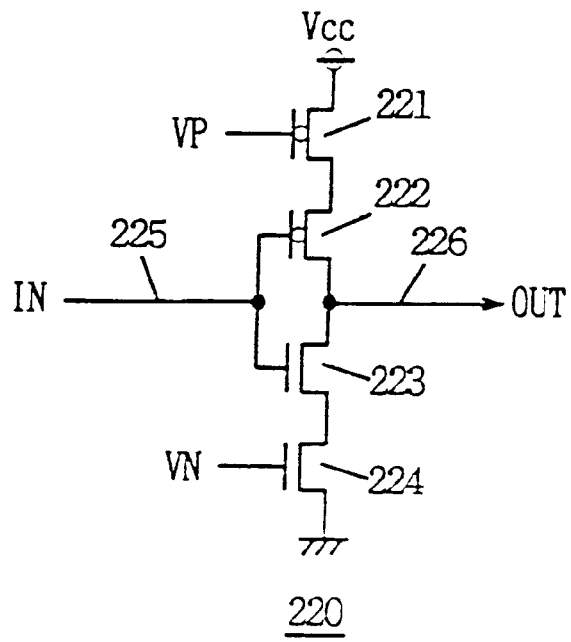
FIGS. 49A and 49B are diagrams showing the structure and the operation characteristics, respectively, of the components of a delay circuit used in the fifth embodiment of the present invention.
Figure 49B:
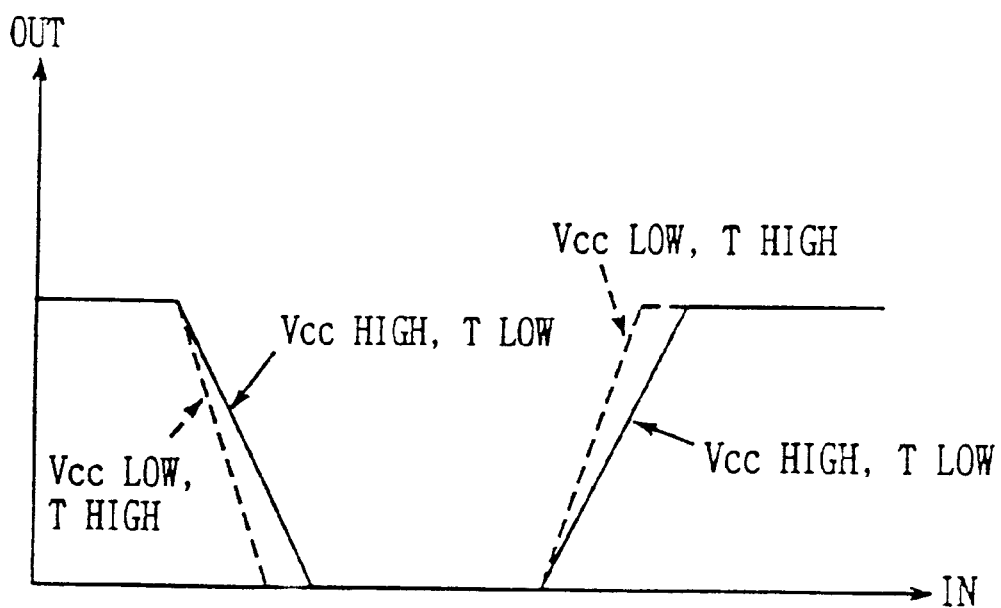

FIGS. 49A and 49B show a structure and the operating characteristics of an inverter circuit forming a delay stage according to another structure in the present fifth embodiment. Referring to FIG. 49A, an inverter circuit 220 includes p channel MOS transistors 221 and 222 connected in series between output node 226 and the power supply potential node, and n channel MOS transistors 223 and 224 connected in series between output node 226 and the ground potential node. MOS transistors 222 and 223 have their gates connected together to input node 225 to receive an input signal. Second control voltage VP is applied to the gate of MOS transistor 221. First control voltage VN is applied to the gate of MOS transistor 224. The operation of the inverter circuit of FIG. 49 will be described with reference to FIG. 49B.

Inverter circuit 220 of FIG. 49A has a structure of a combination of inverter circuits 200 and 210 shown in FIGS. 47A and 48A. Therefore, when a signal of a high level is applied to input node 225, output node 226 is discharged at a speed higher than that when power supply potential Vcc is low or when ambient temperature T is high in comparison with the opposite case. Therefore, when a delay stage is formed using an inverter circuit shown in FIG. 49A, the propagation delay time with respect to a signal of a high or low level is increased when power supply voltage Vcc approximates the upper limit value or when ambient temperature T approximates the lower limit value.

By forming a delay stage using the above-described inverter circuit, an output circuit Q can be generated stably with no variation in the access time and with no ringing independent of variation in power supply voltage Vcc and ambient temperature T.

Figure 50A:
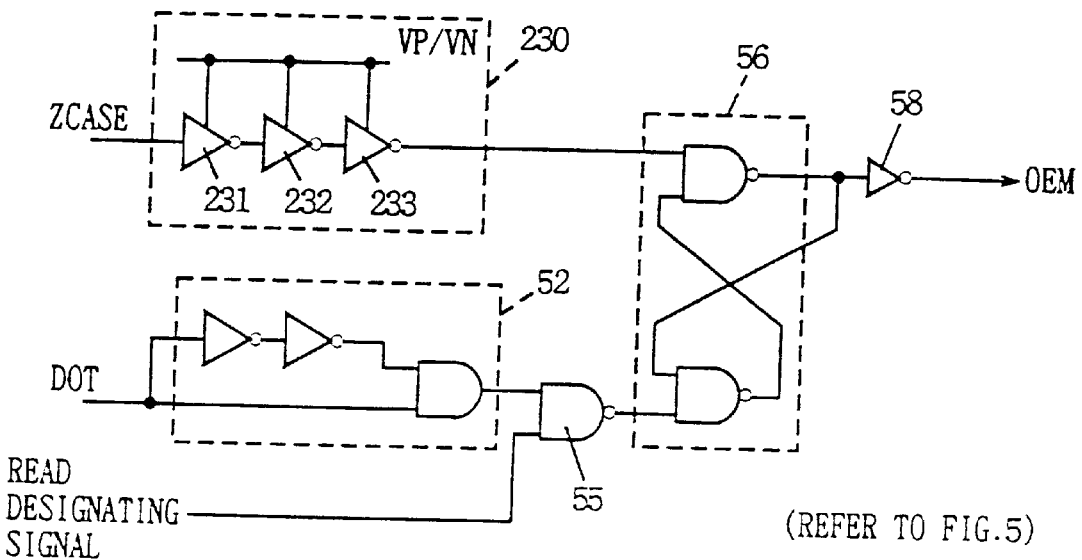
FIGS. 50A and 50B show a first application and an operation waveforms thereof, respectively, of the fifth embodiment of the present invention.

FIG. 50A shows an application of the delay stage of the fifth embodiment. In FIG. 50A, a delay stage is additionally provided in the circuit for generating output permission signal OEM shown in FIG. 5. Delay stage 230 includes cascaded inverters 231, 232, 233 of three stages for delaying and inverting a delayed signal ZCASE of an internal column address strobe signal. The output of delay stage 230 is provided to flipflop 56. When the output of delay stage 230 attains a high level, output permission signal OEM from inverter circuit 58 is pulled up to a high level. Delay stage 230 corresponds to inverter circuit 54 shown in FIG. 5. Delay stage 230 includes three cascaded inverter circuits 231, 232, and 233. As inverter circuits 231–233 in delay stage 230, inverter circuit 220 shown in FIG. 49A or inverter circuits 200 and 210 shown in FIGS. 47A and 48A are connected alternately. Generation of output permission signal OEM is triggered by a fall of signal ZCASE. Therefore, inverter circuits 200, 210 and 200 are provided in sequence as inverter circuits 231, 232 and 233 included in delay stage 230. When inverter circuit 220 shown in FIG. 49A is to be used, inverter circuits 231–233 are all formed of inverter circuit 220.

Figure 50B:
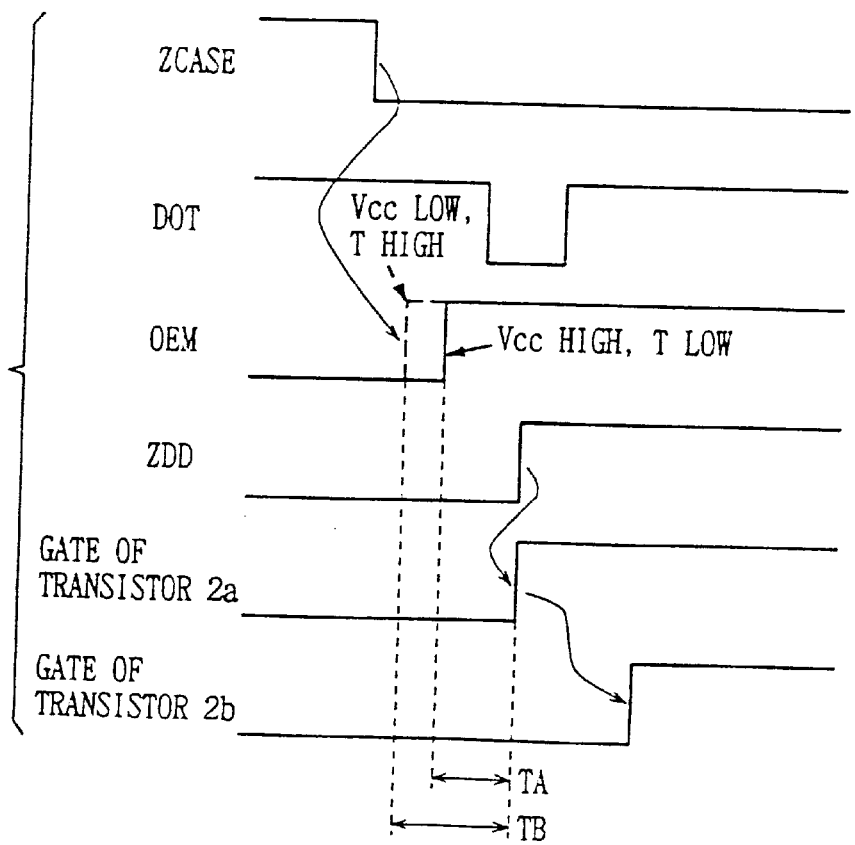

The operation of the circuit shown in FIG. 50A will be described with reference to FIG. 50B.

In response to output designating signal DOT attaining a low level, a valid data ZDD is provided. A case is considered where output permission signal OEM is pulled up to a high level prior to a fall of output designating signal DOT. This state corresponds to the state where an invalid data signal is output. When power supply voltage Vcc takes a value close to lower limit value Vcmn or ambient temperature T takes a high value in delay stage 230, the delay time thereof is reduced. Therefore, output permission signal OEM is brought up to a high level more speedily than the case where power supply voltage Vcc takes a value near the upper limit value Vcmx or ambient temperature T takes a value near lower limit value Tamn. Therefore, when power supply voltage Vcc is high or when ambient temperature T is low, the time period of an invalid data signal provided from the output node is "reduced". When power supply voltage Vcc takes a value near upper limit value Vmx or ambient temperature T takes a value near lower limit value Tamn, the driving capability of the MOS transistor is increased. Therefore, the swing width of a voltage at the output node can be reduced to a sufficient level by "delaying" the ON time of the MOS transistor driving the output node when the current driving capability of the MOS transistor is great at the time of output of this invalid data signal. Thus, generation of ringing can be reliably prevented.

Similarly, generation of ringing can be prevented to provide an output data signal stably even in the case where valid data ZDD is varied following the drive of output permission signal OEM to an H level after output designating signal DOT attains an L level.

When power supply voltage Vcc takes a value near the lower limit value V cmn or ambient temperature T takes a high temperature, the ON timing of the MOS transistor driving the output node is "advanced". However, since the current driving capability of the MOS transistor driving the output node is low, the swing width of the voltage at the output node is not so great, so that generation of ringing can be reliably prevented. Furthermore, when an invalid data signal is not output and a valid data signal is output (when signal OEM is pulled up to an H level after the transition of signal DOT to a high level), increase in the access time can be reliably prevented since the on timing of the MOS transistor driving the output node is "advanced" when the driving capability thereof is low. Since the delay time is adjusted according to the operating conditions, the charging/discharging rate of the output node can be set to a constant level independent of the operating conditions.

Figure 51A:
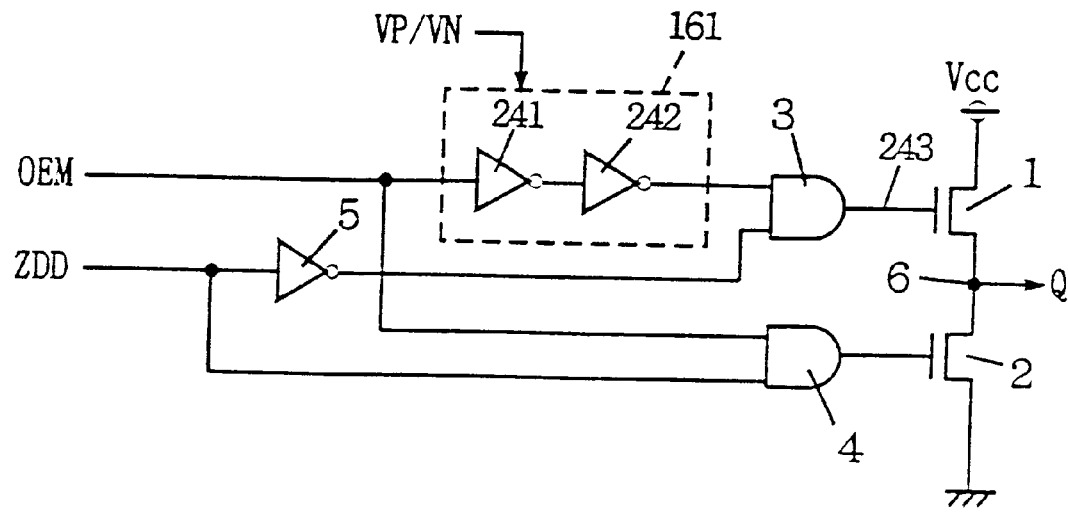
FIGS. 51A and 51B show a second application and an operation waveforms thereof, respectively, of the fifth embodiment of the present invention.
Figure 51B:
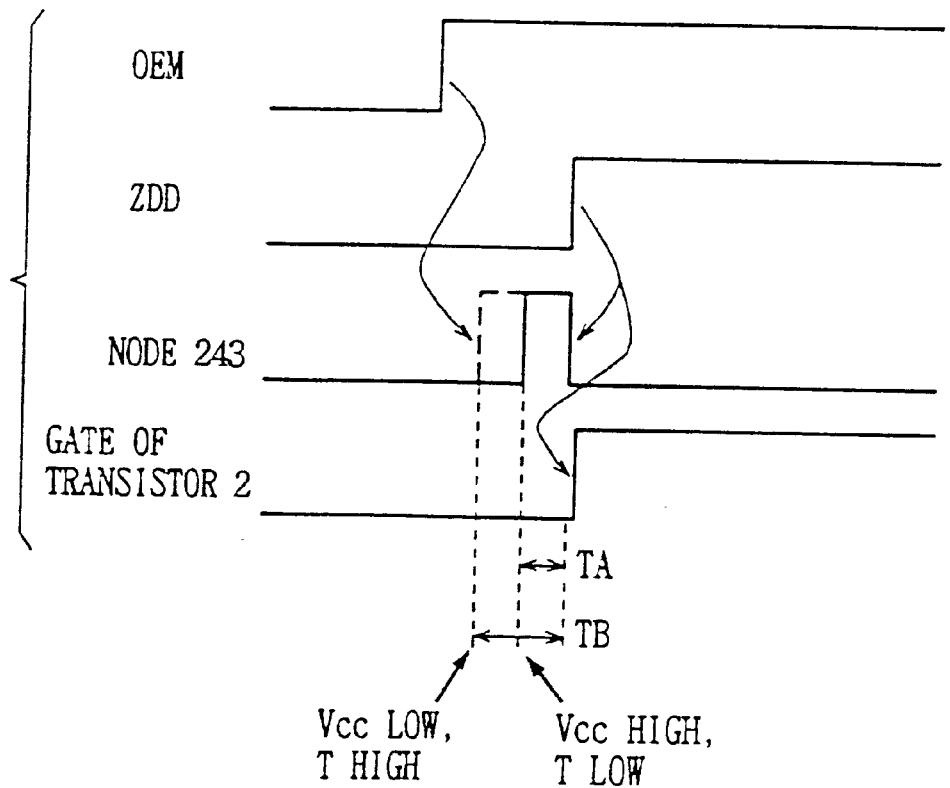

FIG. 51A shows another application of the delay stage according to the fifth embodiment of the present invention. As shown in FIG. 51A, inverter circuits 241 and 242 of the fifth embodiment of the present invention are provided for delay circuit 161 in the output driving circuit of FIG. 34. The remaining structure is similar to that shown in FIG. 34. Inverter circuits 241 and 242 utilize inverter circuit 240 shown in FIG. 49A or inverter circuits 200 and 210 shown in FIGS. 47A and 48A. In order to delay the rise of output permission signal OEM to a high level, inverter circuit 210 shown in FIG. 48A is used as inverter circuit 241 of the first stage, and inverter circuit 200 of FIG. 47A is used as inverter circuit 242 of the next stage. The operation of the output circuit in FIG. 51A will be described with reference to FIG. 51B.

The operation mode of valid data signal ZDD rising to an H level following the transition of output permission signal OEM to an H level is considered. This is a mode where an invalid data signal is output. In response to a rise of output permission signal OEM to an H level, the output of delay circuit 161 is pulled up, which in turn drives the potential of node 243 to a high level. The delay time of delay circuit 161 is reduced when power supply voltage Vcc takes a value near lower limit value Vcmn or when ambient temperature T takes a value near upper limit value Tamx. Therefore, the potential of node 243 is increased speedily when the driving capability of MOS transistor 2 is reduced. Since the current driving capability of MOS transistor 1 is set to a low value, output node 6 is increased gently according to an invalid data signal. Then, a valid data signal is transmitted, and internal readout data signal ZDD is pulled up to an H level to turn off MOS transistor 1. Although the time period TB of the output of this invalid data signal is appreciable, the increase of the potential amplitude of output node 6 is relatively low since the operating condition is such that the current driving capability of MOS transistor 1 is made low. Therefore, even when drive transistor 2 is turned on, an output data signal can be generated stably with no ringing.

In contrast, in the case of an operating condition where the current driving capability of each of MOS transistors 1 and 2 is increased, the delay time of delay circuit 161 is increased. More specifically, the delay time of delay circuit 161 is increased when power supply voltage Vcc takes a value approximate to upper limit value Vcmx or ambient temperature T takes a value approximate to lower limit value Tamx, so that MOS transistor 1 is turned on at a later timing. Therefore, even when the current driving capability of MOS transistor 1 is great, the time period of an on state thereof is short, so that the potential increase of output node 6 is small. Therefore, even when MOS transistor 2 is turned on in response to a transmission of a subsequent valid data signal, the potential of output node 6 is sufficiently low, so that generation of ringing can be prevented reliably.

When a valid data signal is output, the potential of node 243 is always at the low level, and MOS transistor 1 maintains the off state.

As described above, the potential amplitude of output node 6 can be set small regardless of the operating condition. Degradation in the access time can be prevented reliably regardless of the operating condition, with to ensured suppression of generation of ringing.

Figure 52A:
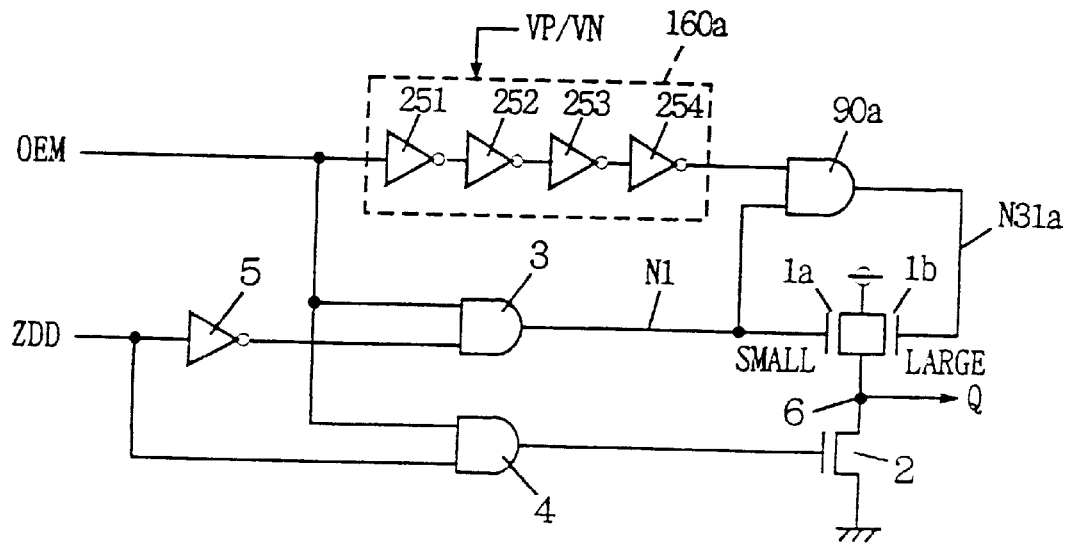
FIGS. 52A and 52B show a third application and an operation waveforms thereof, respectively, of the fifth embodiment of the present invention.
Figure 52B:
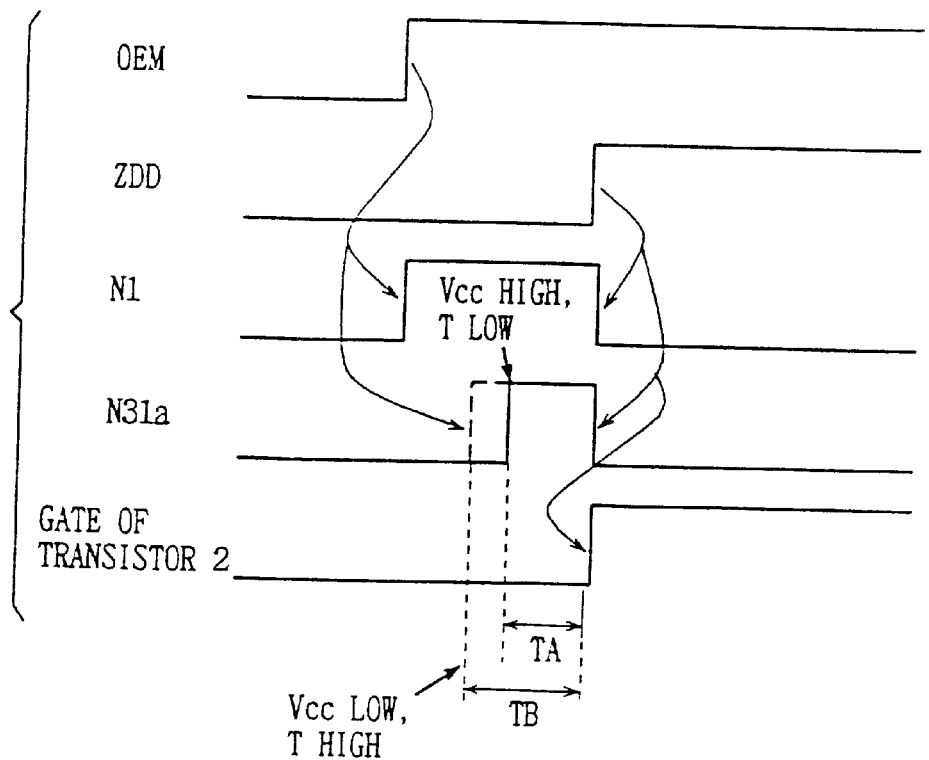

FIG. 52A shows another application of a delay circuit according to the fifth embodiment of the present invention. The output control circuit of FIG. 52A includes a structure similar to that of FIG. 36. In FIG. 52A, the inverter circuits shown in the previous FIGS. 47–49 are applied to inverter circuits 251–254 in delay circuit 160a. More specifically, in delay circuit 160a, the delay time is increased in an operation condition where the driving capability of the MOS transistor is great. The remaining structure is similar to that of the output control circuit of FIG. 36. Then, the output of the output control circuit of FIG. 52A will be described with reference to FIG. 52B.

First, output permission signal OEM is pulled to a high level. Here, internal readout data signal ZDD still remains at a low level. This is an operation mode in which an invalid data signal is output. In response to a rise of output permission signal OEM, the potential of node N1 is driven to a high level, whereby drive transistor 1a of a low current driving capability is turned on. Therefore, output node 6 is charged gently.

Then, the output of delay circuit 160a is pulled up to a high level. In response, the output of AND circuit 90a is driven to a high level, to turn on drive transistor 1b via node N31a. When the output of delay circuit 160a attains a high level, the on-timing is delayed when power supply voltage Vcc takes a value approximate to upper limit value Vcmx or when ambient temperature T takes a value approximate to lower limit value Tamn than in the opposite case. Therefore, the on timing of drive transistor 1b of a great current driving capability is delayed in an operating environment where the current driving capability of an MOS transistor is increased. Therefore, increase in the potential of output node 6 can be suppressed reliably, and the potential amplitude of output node 6 can be reduced to suppress generation of ringing. By setting the delay time of delay circuit 160a at an appropriate value, the time of drive transistor 1b turned on can be set to substantially 0 in an operating environment where the current driving capability of the MOS transistor is increased.

When only a valid data signal is output, the potential of node N1 attains a low level, and drive transistors 1a and 1b are not turned on. Therefore, generation of ringing can be reliably prevented regardless of the operating environment.

Figure 53A:
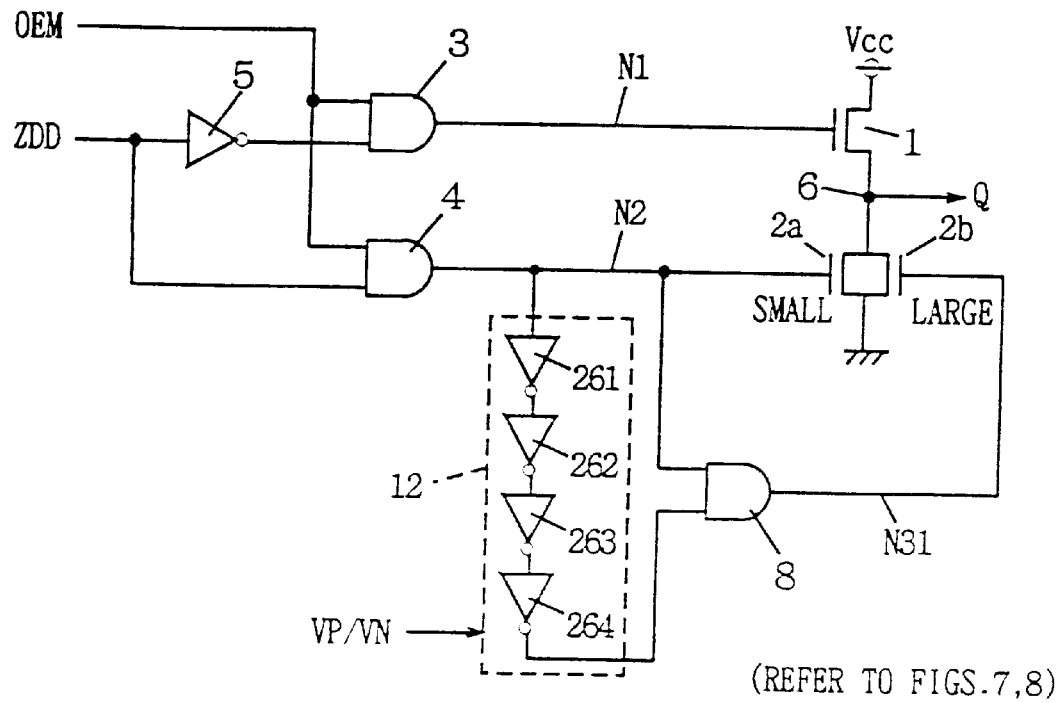
FIGS. 53A and 53B show a fourth application and an operation waveforms thereof, respectively, of the fifth embodiment of the present invention.
Figure 53B:
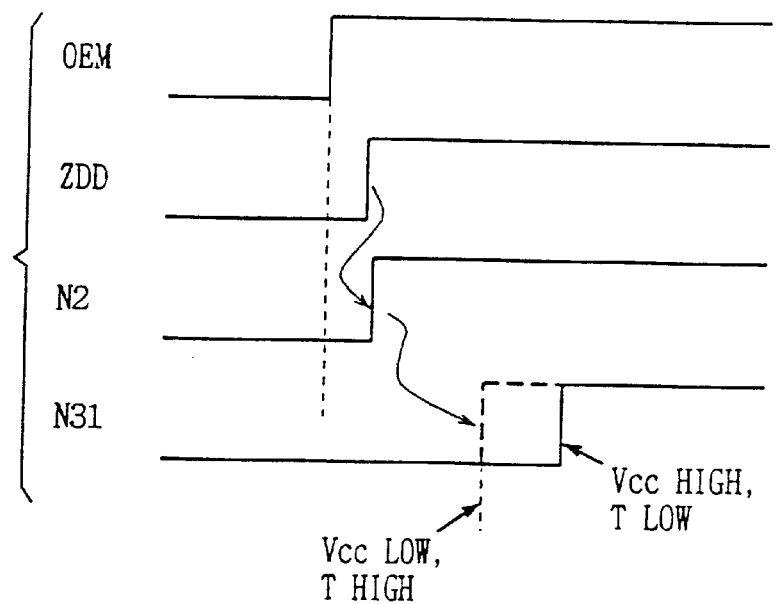

FIG. 53A shows an application of an inverter circuit of the fifth embodiment according to another structure. Referring to FIG. 53A, inverter circuits 261–264 of the fourth embodiment are used for delay circuit 12 to drive drive transistor 2b in order to discharge output node 6 to the level of the ground potential. The delay time of delay circuit 12 is reduced when power supply voltage Vcc takes a value approximate to lower limit value Vcmn or ambient temperature T takes a value approximate to upper limit value Tamx. The remaining structure is similar to the structure of the output control circuit shown in FIGS. 7 and 8. The operation of the output control circuit of FIG. 53A will be described with reference to FIG. 53B.

First, output permission signal OEM is pulled up to a high level. Then, internal readout data signal ZDD is pulled up to a high level. As a result, the potential of node N2 is driven to a high level, and then the output of delay circuit 12 is pulled up to a high level. In response to a rise of the output of delay circuit 12, drive transistor 2b of a great current driving capability is turned on via AND circuit 8. Delay circuit 12 has the delay time increased in an operating environment where the current driving capability of the MOS transistor is great. Therefore, in an operating environment where the current driving capability of drive transistor 2b is great, the on-timing of drive transistor 26 is delayed, so that it is turned on after the potential of output node 6 is reduced to a subsequent low level by drive transistor 2a. Therefore, even when output node 6 is discharged to the level of ground potential with a great current driving capability, no ringing is generated, and an output data signal Q is obtained.

In an operating environment where the current driving capability of the MOS transistor is small, the on timing of drive transistor 2b is increased. In this case, since the current driving capability of drive transistor 2b is made relatively low, the potential of output node 6 is not discharged so speedily, even when the transistor is turned on at a relatively early timing. Therefore, an output data signal Q can be obtained stably with no generation of ringing.

In an operating environment where the current driving capabilities of MOS transistors 2a and 2b are made low, the on timing of drive transistor 2b is advanced. Therefore, the potential of data signal Q of a low level provided from output node 6 is ascertained at a relatively high speed. Therefore, the access time will not be increased even when the operating environment (operating condition) is degraded. Therefore, an output data signal can be output stably at high speed.

When an invalid data signal is not output, internal readout data signal ZDD is pulled up to a high level prior to output permission signal OEM. In this case, only the potential of node N2 rises to high level in response to the rise of output permission signal OEM to a high level, and the change in the delay time of delay circuit 12 is similar to that described above. Therefore, an output data signal can be provided stably and speedily even when only this valid data signal is output.

A structure for generating first and second control voltages will be described hereinbelow.

Figure 54:
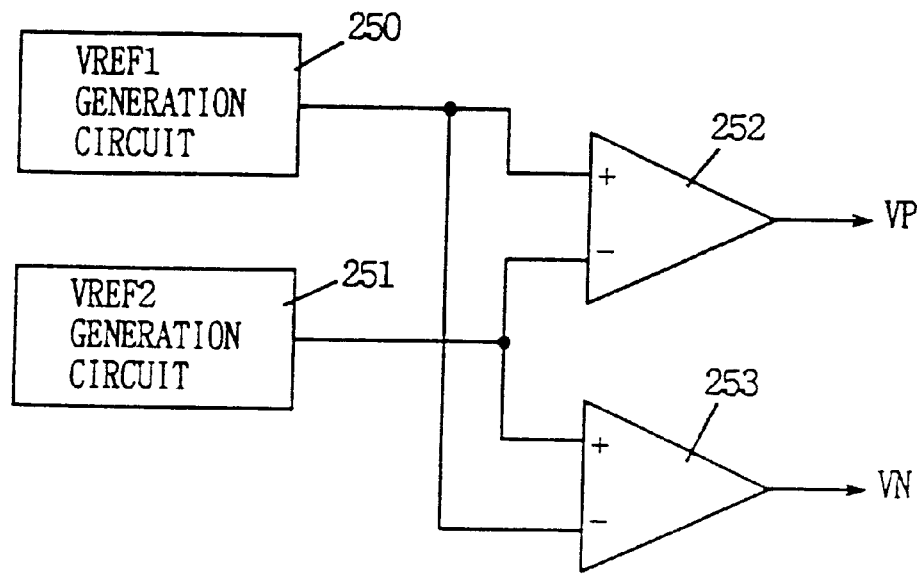
FIG. 54 schematically shows a circuit configuration for generating first and second control voltages.

FIG. 54 shows a structure of a control voltage generation unit. Referring to FIG. 54, a control voltage generation unit includes a VREF1 generation circuit 250 for generating a constant reference voltage VREF1 independent of the operating temperature and power supply voltage, a VREF2 generation circuit 251 for generating a reference voltage VREF2 depending upon power supply voltage and ambient temperature (operating temperature), and differential amplify circuits 252 and 253 for amplifying differentially first reference voltage VREF1 from VREF1 generation circuit 251 and second reference voltage REF2 from VFREF2 generation circuit 251. Second control voltage VP is generated from differential amplify circuit 252, and first control voltage VN is generated from differential amplify circuit 253. Differential amplify circuit 252 receives first reference voltage VREF1 at its positive input and second reference voltage VREF2 at its negative input. Differential amplify circuit 253 receives second reference voltage VREF2 at its positive input, and first reference voltage VREF1 at its negative input. First and second control voltages VP and VN having voltage and temperature dependent characteristics opposite to each other are generated by differential amplify circuits 252 and 253. The structure of each component will be described.

Figure 55A:
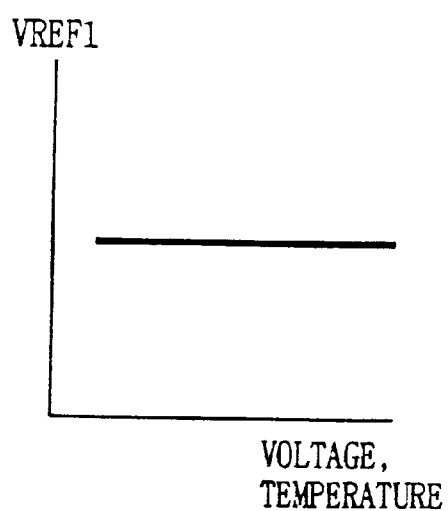
FIGS. 55A and 55B show the voltage/temperature dependent characteristics of a first reference voltage and a specific structure, respectively, of a VREF1 generation circuit shown in FIG. 54.
Figure 55B:
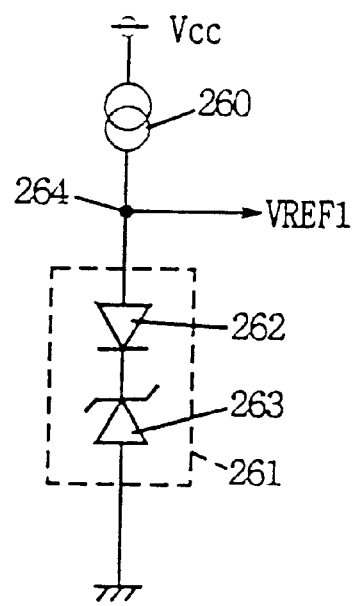

FIGS. 55A and 55B show characteristics of first reference voltage VREF1 and a specific structure of VREF1 generation circuit. As shown in FIG. 55A, first reference voltage VREF1 is a constant voltage independent of power supply voltage and operating temperature. Referring to FIG. 55B, VREF1 generation circuit 250 includes a constant current source 260 provided between a power supply potential node and output node 264, and temperature compensated constant voltage diode 261 provided between output node 264 and the ground potential node. Temperature compensated constant voltage diode 261 includes a PN diode 262 connected in a forward direction from output node 264, and a Zener diode 263 provided in a reverse direction between PN diode 262 and the ground potential node. Zener diode 263 has a positive temperature coefficient, and PN diode 262 has a negative temperature coefficient. By virtue of the opposing temperature coefficients of diodes 262 and 263, the temperature dependency on the Zener voltage generated by Zener diode 263 is compensated for to provide a constant voltage irrespective of the operating temperature.

Zener diode 263 exhibits a Zener breakdown to generate a constant Zener voltage when a voltage greater than the Zener voltage is applied in a backward direction. In this case, a voltage of the sum of the Zener voltage by Zener diode 263 and the forward voltage drop of PN diode 262 is generated at output node 264. Since the forward voltage drop of PN diode 262 and the Zener voltage of Zener diode 263 have negative and positive temperature coefficients, a constant voltage can be generated at output node 264 independent of the ambient temperature.

As to constant current source 260 shown in FIG. 55B, various circuit configurations of generating a constant current independent of a power supply voltage and operating temperature are known in the field of analog integrated circuits. Such circuits can be employed. A constant reference voltage VREF1 applied by temperature compensated Zener diode 260 can similarly be generated by connecting a resistor having a high resistance (so large that the temperature dependent characteristics can be neglected) between output node 264 and the power supply potential node instead of constant current source 260.

Figure 56A:
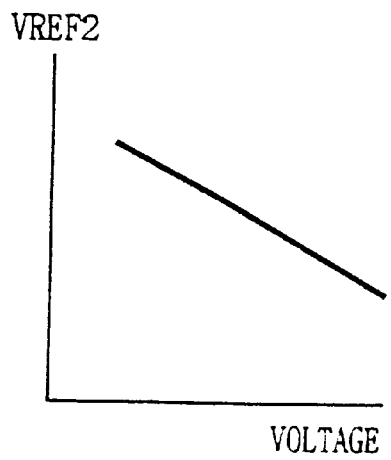
FIGS. 56A, 56B, and 56C show the voltage dependent characteristics, temperature dependent characteristics of the second reference voltage, and a specific structure, respectively of a VREF2 generation circuit of FIG. 54.
Figure 56B:
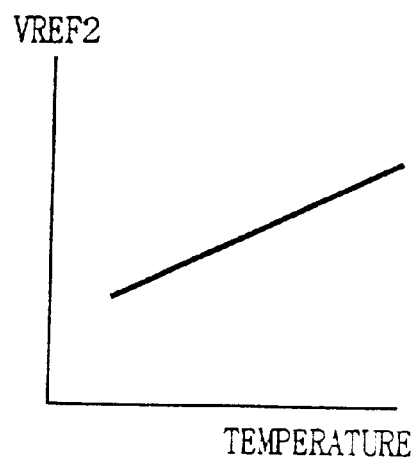

It is appreciated from FIGS. 56A and 56B that second reference voltage VREF2 has a negative dependent characteristic with respect to the power supply voltage and a positive dependent characteristic with respect to the operating temperature (ambient temperature).

Figure 56C:
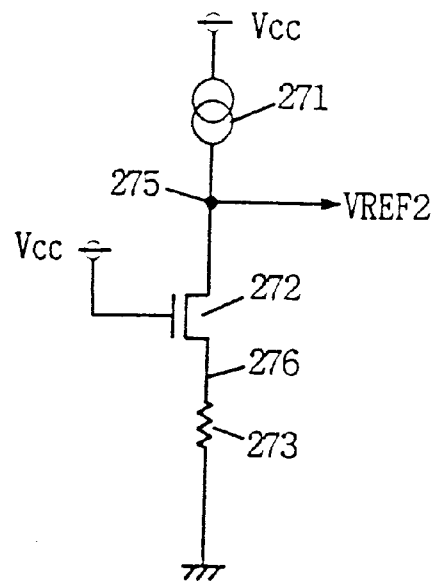

Referring to FIG. 56C, VREF2 generation circuit 251 includes a constant current source 271 provided between the power supply potential node and output node 275, an n channel MOS transistor 272 provided between output node 275 and node 276, and a resistor 273 provided between node 276 and the ground potential node. The temperature dependency of resistance value R of resistor 273 is set sufficiently greater than the temperature dependent characteristic of constant current source 271 and the temperature dependent characteristic of the ON resistance of MOS transistor 272. Resistance R of resistor 273 is set slightly greater than the ON resistance of MOS transistor 272. Resistor 273 is formed of polysilicon or a diffused resistor having ions of relatively high concentration implanted, and has a positive temperature coefficient. The operation of VREF2 generation circuit 251 will now be described.

A current independent of constant power supply voltage Vcc and ambient temperature is supplied from constant current source 271. By this constant current from constant source 271, reference voltage VREF2 determined by the sum of ON resistance R (272) of MOS transistor 272 and resistance R (273) of resistor 273 is generated at output node 275. When power supply voltage Vcc is increased to the level of upper limit value Vcmx, the conductance of MOS transistor 272 is increased, i.e. resistance R (272) is reduced. Therefore, reference voltage VREF2 appearing on output node 275 is lowered. More specifically, second reference voltage VREF2 includes a negative power supply voltage dependent characteristics.

An increase of ambient temperature T causes resistance R (273) of resistor 273 to be increased, and second reference voltage VREF2 rises from output node 275. Here, although the ON resistance R (273) of MOS transistor 272 changes depending upon ambient temperature T, the change is small enough to be neglected in comparison with the temperature dependent characteristics of resistor 273. Therefore, second reference voltage VREF2 has a positive dependent characteristics with respect to ambient temperature T.

A constant current source circuit independent of power supply voltage and ambient temperature well known in the field of analog integrated circuits can be used as constant current source 271 shown in FIG. 56C.

Instead of constant current source 271, a structure may be employed where a resistor having a positive temperature coefficient and a resistor having a negative temperature coefficient are provided in parallel between the power supply potential node and output node 275. As to the resistors having positive and negative temperature characteristics, a resistor called a thermistor can be used.

Figure 57A:
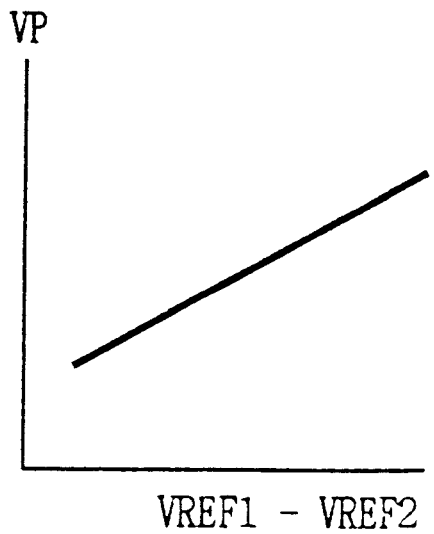
FIGS. 57A and 57B show input/output voltage of first and second differential amplify circuits, respectively, of FIG. 54.
Figure 57B:
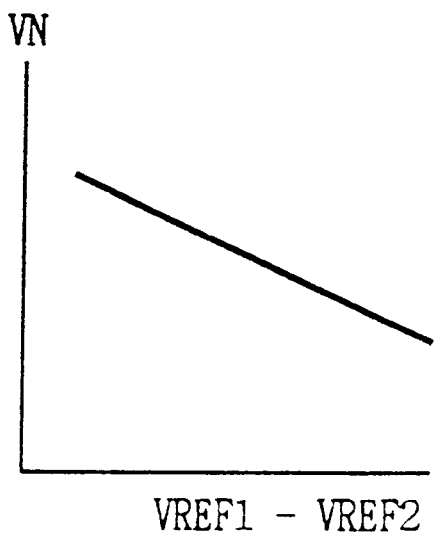

FIGS. 57A and 57B show the generation manner of first control voltage VN and second control voltage VP, respectively. As shown in FIG. 54, differential amplify circuit 251 receives first reference voltage VREF1 at its positive input and second reference voltage VREF2 at its negative input. First reference voltage VREF1 is constant. When the difference between first and second reference voltages VREF1 and VFRE2 becomes greater, second reference voltage VP is amplified by differential amplifier circuit 252 to have the potential increased (refer to FIG. 57A). More specifically, second reference voltage VREF2 is lowered when power supply voltage Vcc increases. Therefore, the difference (VREF1-VFRE2) is increased to result in the boosting of second control voltage VP. When operating temperature T increases, second reference voltage VREF2 is boosted. In this case, the difference (VREF1-VREF2) becomes smaller according to increase in the temperature. Therefore, the second control voltage VP is reduced. Therefore, second control voltage VP is generated having the power supply voltage and ambient temperature dependent characteristics shown in FIG. 57A.

Differential amplify circuit 253 shown in FIG. 54 receives second reference voltage VREF2 at its positive input and first reference voltage VREF1 at its negative input. Therefore, first control voltage VN having characteristics opposite to that of second control voltage VP can be generated as shown in FIG. 57B.

As to differential amplify circuits 252 and 253, a structure having constant amplify characteristics independent of the power supply voltage and ambient temperature well known in the field of analog integrated circuits can be used. Since the operation characteristics of differential amplify circuits 252 and 253 are independent of the power supply voltage and ambient temperature, first and second control voltages VN and VP can be adjusted according to the power supply voltage and ambient temperature.

Figure 48B:
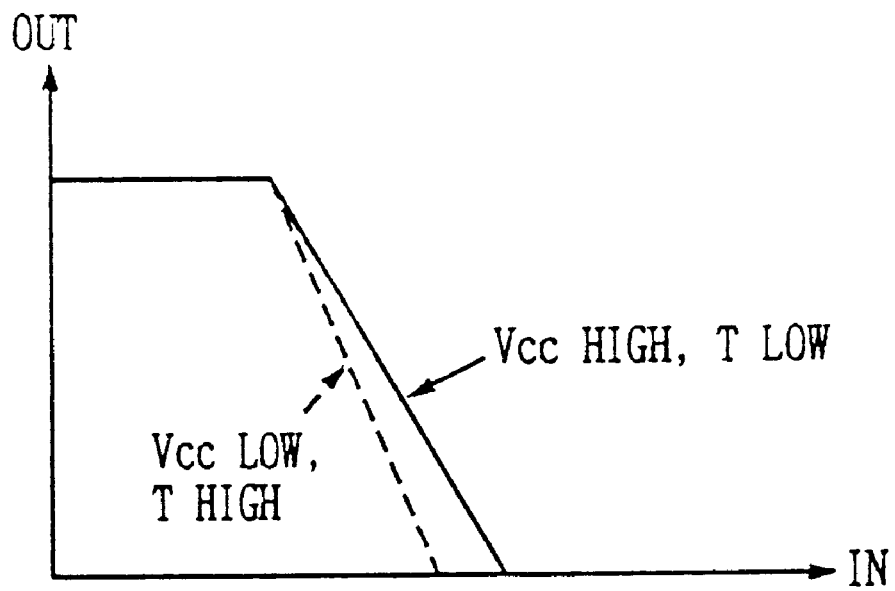

Although not particularly described, first and second control voltages VN and VP have the voltage level set to an appropriate value within a voltage region in which an MOS transistor is operated at a triplole tube (non-linear) region as shown in FIGS. 47B and 48B.

It can be considered that the Zener voltage of Zener diode 263 is higher than the normal operation power supply voltage (for example 5 volts) in the structure of FIG. 55B. In such a case, a boosting circuit for boosting a word line, for example, is provided if the device utilizing this circuit is a semiconductor memory device. By boosting operating power supply voltage Vcc by such a boosting circuit, a constant reference voltage VREF1 can be generated from the temperature compensated Zener diode.

When the Zener voltage of Zener diode 263 is low and has a negative temperature characteristic, a resistor having a positive temperature coefficient (for example a diffused resistance having a sufficiently high impurity concentration) may be used instead of PN diode 262.

Figure 58:
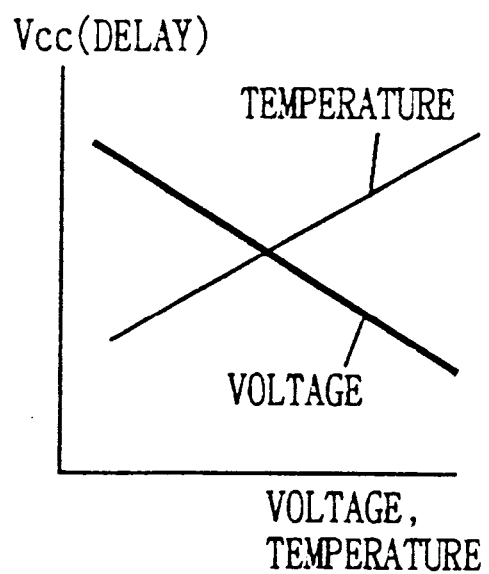
FIG. 58 shows the voltage/temperature dependent characteristics of an operating power supply voltage used in a modification of the fifth embodiment of the present invention.

FIG. 58 shows the operating power supply voltage and ambient temperature dependent characteristic of an inverter circuit according to a modification of the fifth embodiment. Referring to FIG. 58, the operating power supply voltage Vcc (DELAY) of the inverter circuit is lowered when an external power supply voltage is increased, and increased as ambient temperature is raised. The voltage and temperature dependent characteristics shown in FIG. 58 are similar to those of the control voltage VN shown in FIG. 45. The only difference is that operating power supply voltage Vcc (DELAY) is generated from an external power supply voltage. A structure for generating a power supply voltage Vcc (DELAY) of FIG. 58 is shown in FIG. 59A.

Figure 59A:
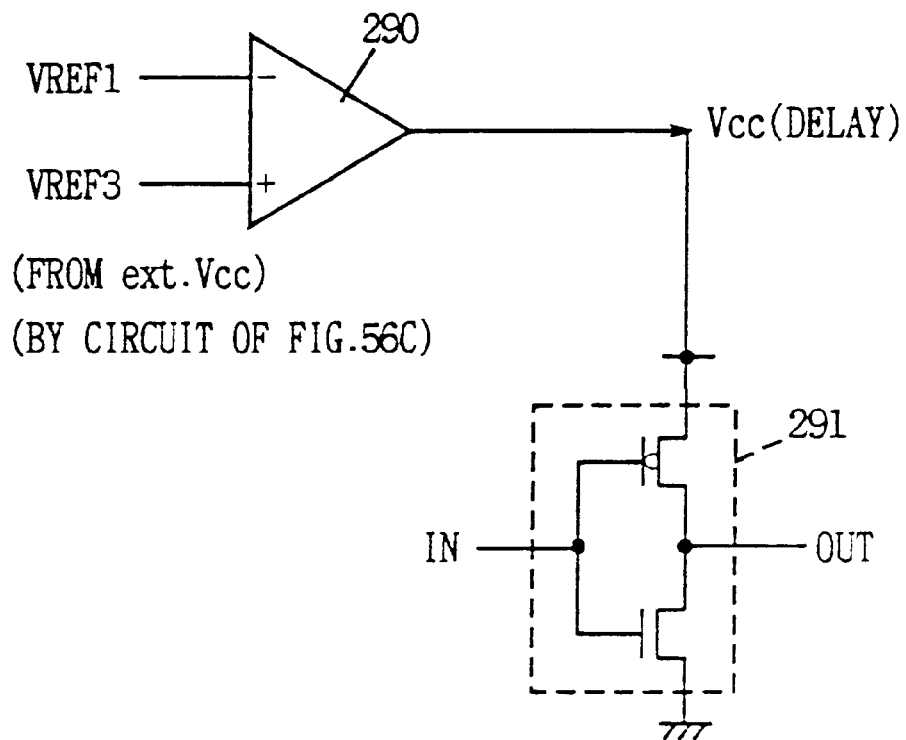
FIGS. 59A and 59B show a modification and an operating characteristics thereof, respectively, of the fifth embodiment of the present invention.

As shown in FIG. 59A, a structure for generating power supply voltage Vcc (DELAY) is formed by a differential amplify circuit 290 receiving first reference voltage VREF1 at its negative input and third reference voltage VREF3 at its positive input. Power supply voltage Vcc (DELAY) generated from differential amplify circuit 290 is applied to the power supply potential voltage node of inverter circuit 291.

Third reference voltage VREF3 is generated by a circuit configuration similar to that shown in FIG. 56C. The only difference is that power supply voltage Vcc is substituted with external power supply voltage ext.Vcc. In this case, power supply voltage Vcc (DELAY) has the voltage and ambient temperature dependent characteristics similar to those of first control voltage VN shown in FIG. 45. Operating power supply voltage Vcc (DELAY) is lowered as external power supply voltage ext.Vcc approaches the upper limit value, and increases as ambient temperature is increased. Therefore, the operating speed of inverter circuit 291 is degraded in a region near the upper limit value of the external power supply voltage or the lower limit value of the ambient temperature. (It is to be noted that the driving capability of the MOS transistor is reduced since the operating power supply voltage is lowered, and inverter circuit 291 is used in a cascade-connected manner, not in one stage.)

Figure 59B:
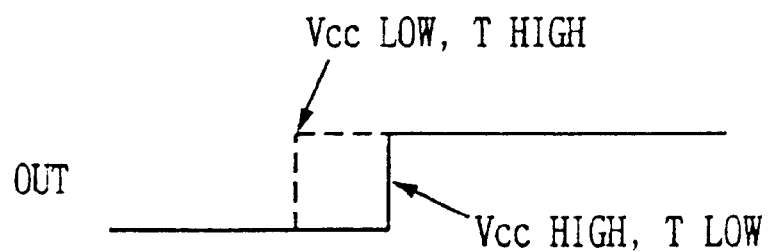

As shown in FIG. 59B, when external power supply voltage Vcc is high or ambient temperature T is low, the delay time is increased. Thus, an effect similar to the above-described embodiment can be obtained.

In the fifth embodiment, a structure of an output control circuit where output signal Q at a low level is output is described. However, the same applies for an output control circuit where output data signal Q is pulled up to a high level. Furthermore, it can be applied to various modifications of the delay circuits of the first to fourth embodiments.

In the fifth embodiment, the delay time of the delay circuit is changed appropriately according to a low level or a high level output data signal determining the access time.

Embodiment 6

Figure 60:
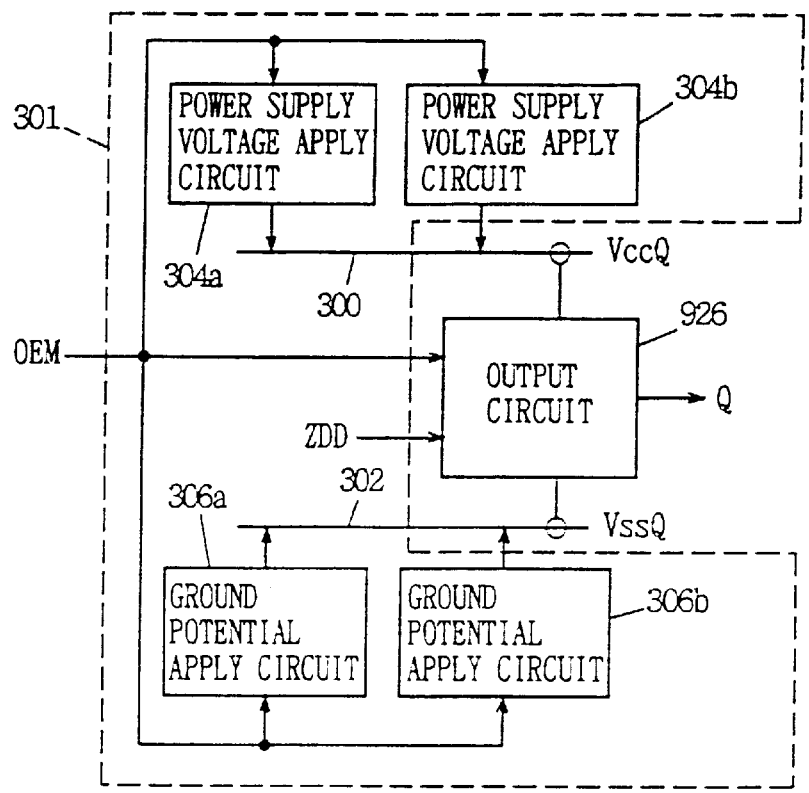
FIG. 60 schematically shows a structure of an output circuit according to a sixth embodiment of the present invention.

FIG. 60 schematically shows a structure of an output circuit according to a sixth embodiment of the present invention. Referring to FIG. 60, a voltage adjuster 301 including exclusive power supply circuits 304a, 304b, 306a, 306b are provided for an output circuit 926 generating an output signal Q according to output permission signal OEM and internal data signal ZDD. Power supply voltage apply circuit 304a charges power supply node 300 at a first rate in response to output permission signal OEM. Power supply voltage apply circuit 304b responds to output permission signal OEM to charge power supply node 300 at a second rate faster than that of the first rate. Ground voltage apply circuit 306a responds to output permission signal OEM to discharge ground node 302 at a third rate (may be equal to the first rate). Ground voltage apply circuit 306b responds to output permission signal OEM to discharge power supply node 302 to the level of ground potential at a fourth rate higher than the third rate. The arrangement will be described in detail afterwards. Power supply voltage apply circuit 304b is activated at a timing behind that of power supply voltage apply circuit 304a. Ground voltage apply circuit 306b is rendered active at a timing behind that of ground voltage apply circuit 306a. Power supply node 300 and ground node 302 form a reference power supply node. Power supply voltage apply circuit 304a, power supply voltage apply circuit 304b, ground voltage apply circuit 306a and ground voltage apply circuit 306a form a reference voltage source.

In activation (activation of output permission signal OEM), output circuit 926 operates with the voltages on power supply node 300 and ground node 302 as the operating power supply voltage to provide output signal Q.

Figure 61:
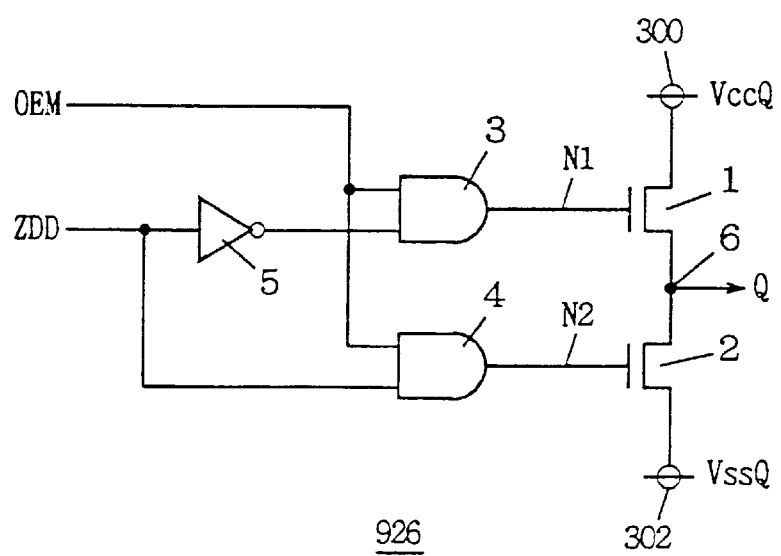
FIG. 61 schematically shows a structure of the output circuit of FIG. 60.

FIG. 61 shows a structure of the output circuit of FIG. 60. Referring to FIG. 61, output circuit 926 includes an inverter 5 for inverting internal data signal ZDD, a 2-input AND circuit 3 for receiving output permission signal OEM and an output signal of inverter circuit 5, a 2-input AND circuit 4 for receiving internal data signal ZDD and output permission signal OEM, an n channel MOS transistor 1 rendered conductive in response to an output signal of AND circuit 3 for transmitting voltage VccQ on power supply node 300 to output node 6, and an n channel MOS transistor 2 rendered conductive in response to an output signal of AND circuit 4 for transmitting voltage VssQ on ground node 302 to output node 6. Each of n channel MOS transistors 1 and 2 forms a drive transistor. The structure of the output circuit of FIG. 61 is similar to a conventional structure except for that the voltage applied to power supply node 300 and ground node 302 are adjusted.

Figure 62:
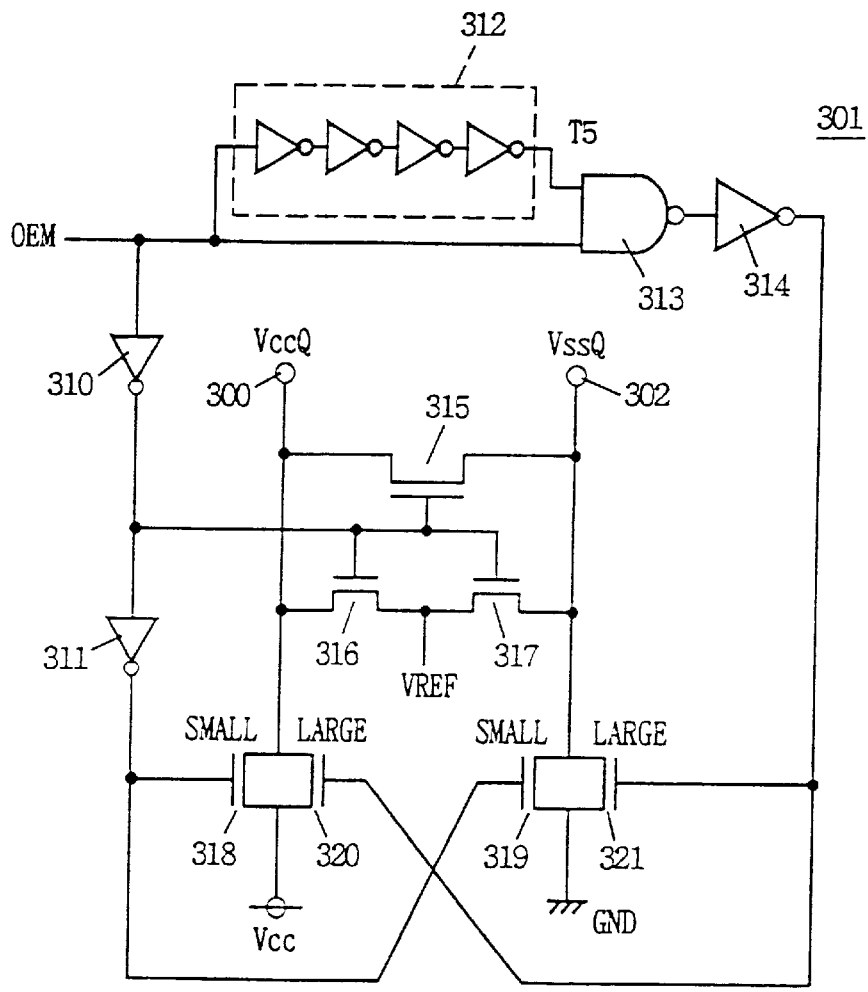
FIG. 62 shows a structure of a voltage adjuster shown in FIG. 60.

FIG. 62 shows a structure of voltage adjuster 301 of FIG. 60. Referring to FIG. 62, voltage adjuster 301 includes inverters 310 and 311 for inverting output permission signal OEM, a delay circuit 312 formed of an even number stages of inverters (four stages in FIG. 62) for delaying output permission signal OEM for a predetermined time T5, a 2-input NAND circuit 313 for receiving an output signal of delay circuit 312 and output permission signal OEM, an inverter 314 for inverting an output signal of NAND circuit 313, an n channel MOS transistor 315 responsive to an output signal of inverter circuit 310 for short-circuiting power supply node 300 and ground node 302, an n channel MOS transistor 316 responsive to an output signal of inverter circuit 310 for transmitting reference voltage VREF to power supply node 300, and an n channel MOS transistor 317 responsive to an output signal of inverter circuit 310 for transmitting reference voltage VREF to ground node 302. Reference voltage VREF takes an intermediate voltage level between power supply voltage Vcc and ground voltage GND. When output node 6 (refer to FIG. 60) is precharged to the level of an intermediate voltage, reference voltage VREF may be set to the intermediate voltage level to which output node 6 is precharged.

Voltage adjuster 301 further includes an n channel MOS transistor 318 responsive to an output signal of inverter 311 for supplying current from the supply node of power supply voltage Vcc to power supply node 300 with a first current driving capability, an n channel MOS transistor 320 responsive to an output signal of inverter circuit 314 for supplying current from the supply node of power supply voltage Vcc to lower supply node 300 with a current driving capability greater than the first current driving capability, an n channel MOS transistor 319 responsive to an output signal of inverter circuit 311 for discharging current from ground node 302 to the supply node of a ground voltage with a third current driving capability, and an n channel MOS transistor 321 responsive to an output signal of inverter circuit 314 for discharging current from ground node 302 to the supply node of ground voltage GND with a fourth current driving capability greater than the third current driving capability. The first and third current driving capability may be equal to each other. Also the second and fourth current driving capability may be equal to each other. The magnitude of the current driving capability of MOS transistors 3180–321 is realized by setting the W/L ratio (channel width/channel length) of the transistor to an appropriate value. The current driving capability is increased as coefficient β (a constant proportional to W/L) is greater.

According to the structure of FIG. 62, power supply voltage apply circuit 304a includes MOS transistor 318. Power supply voltage apply circuit 304b includes MOS transistor 320. Ground voltage apply circuit 306a includes MOS transistor 319. Ground voltage apply circuit 306b includes MOS transistor 321. Delay circuit 312, NAND circuit 313 and inverter circuit 314 form a rise delay circuit.

Figure 63:
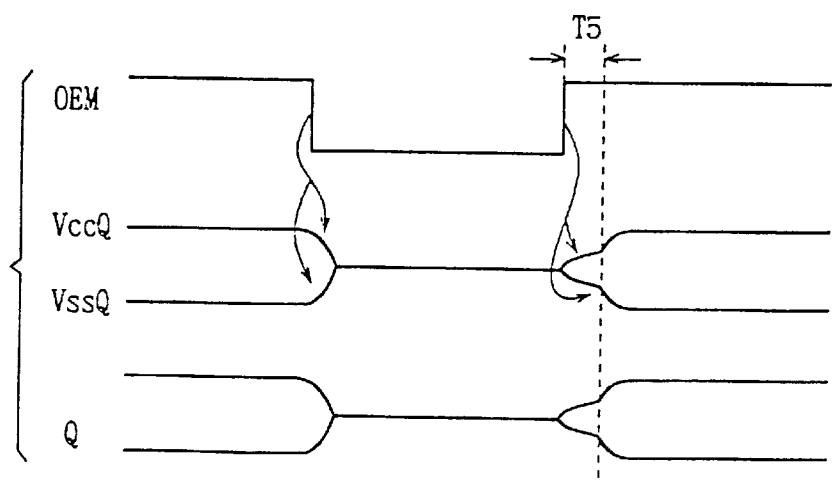
FIG. 63 is a signal waveform diagram representing an operation of the voltage adjuster of FIG. 62.

The operation of the circuits shown in FIGS. 61 and 62 will be described with reference to the operation waveform diagram of FIG. 63.

When output permission signal OEM falls from an H level to an L level, output circuit 926 is rendered inactive, whereby a cycle of reading out output data Q is completed. FIG. 63 shows an example where output signal Q is precharged to the level of an intermediate voltage at inactivation of output circuit 926. A structure is employed where output circuit 926 is maintained at an output high impedance state when inactive.

In response to the fall of output permission signal OEM to an L level, the output signal of inverter circuit 310 is pulled up to an H level, and MOS transistor 315–317 are turned on. Power supply node 300 and ground node 302 are precharged to the level of reference voltage VREF of the intermediate voltage level. Also, the output signal of inverter circuit 311 is driven to an L level, and MOS transistors 318 and 319 are turned off. Similarly, the output signal of NAND circuit 313 is driven to an H level, whereby the output signal of inverter circuit 314 is pulled down to an L level. MOS transistors 320 and 321 are turned off. According to a series of these operations, nodes 300 and 302 are precharged to the level of reference voltage VREF.

At the next data readout operation, output permission signal OEM is pulled up to an H level. The output signal of inverter circuit 310 is driven to an L level, whereby MOS transistors 315–317 are turned off. Then, the output signal of inverter circuit 311 is driven to an H level, and MOS transistors 318 and 319 having small current driving capabilities are turned on. As a result, power supply node 300 is gradually increased from the level of reference voltage VREF by MOS transistor 318 of a low current driving capability. Similarly, ground node 302 is gradually discharged towards the level of ground voltage by MOS transistor 319 of a small current driving capability. The voltage level is gradually lowered from the intermediate level of reference voltage VREF. According to the logic level of internal data signal ZDD, one of MOS transistors 1 and 2 shown in FIG. 62 is turned on. MOS transistor 1 or 2 turned on transmits the voltage on the corresponding reference power supply node (power supply node or ground node) to output node 6 (conducts a current flow between a corresponding reference power supply node and output node 6). By first turning on MOS transistors 318 and 319 having low current driving capabilities to gradually increase the potential of nodes 300 and 302, the voltage on nodes 300 and 302 are transmitted to output node 6 which is driven gently from the level of the intermediate voltage.

When the voltage level of output node 6 arrives at a voltage level where ringing is not generated, the voltage level of nodes 300 and 302 are varied rapidly. No ringing is generated even when the voltage level o output signal Q is increased suddenly. More specifically, after output permission signal OEM is pulled up to an H level and the voltage level of nodes 300 and 302 are driven sufficiently, the output signal of delay circuit 312 is pulled up to an H level and the output signal of NAND circuit 313 is pulled down to an L level, whereby the output signal of inverter circuit 314 is driven to an H level. MOS transistors 320 and 321 having great current driving capabilities are turned on. As a result, the voltage level of nodes 300 and 302 changes at high speed to arrive at respective levels of power supply voltage Vcc and ground voltage GND. Thus, the voltage level of output node 6 is driven to the level of power supply voltage Vcc or ground voltage GND via drive transistor 1 or 2, whereby an output signal can be generated speedily and stably with no generation of ringing.

Modification 1

Figure 64:
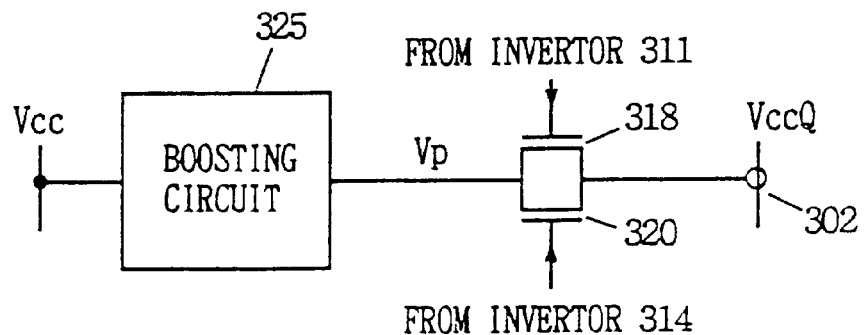
FIG. 64 shows a first modification of the sixth embodiment of the present invention.

FIG. 64 shows a structure of the components of the first modification of the sixth embodiment of the present invention. According to the structure of FIG. 64, a boosted voltage is supplied from boosting circuit 325 to MOS transistors 318 and 320 shown in FIG. 62. Boosting circuit 325 boosts power supply voltage Vcc or external power supply voltage ext Vcc to generate high voltage Vp higher than external power supply voltage ext Vcc. Power supply voltage VccQ applied to power supply node 302 can be set to a level sufficiently higher than that of internal power supply voltage Vcc. In this case, a signal of an H level having a sufficient voltage level can be output with a margin even when internal power supply voltage Vcc is lowered due to power consumption. Thus, even in the case where the difference between VOH (high level voltage of output signal) and VOL (low level voltage of output signal) is reduced due to a lower power supply voltage, the loss in output drive transistor 1 can be compensated for to generate an output signal of a sufficiently high voltage level by utilizing boosting circuit 325 shown in FIG. 64. Since the charging operation of power supply node 302 is carried out in two stages, an output signal having a sufficient voltage level stably can be provided at a high speed with no generation of ringing.

Figure 65:
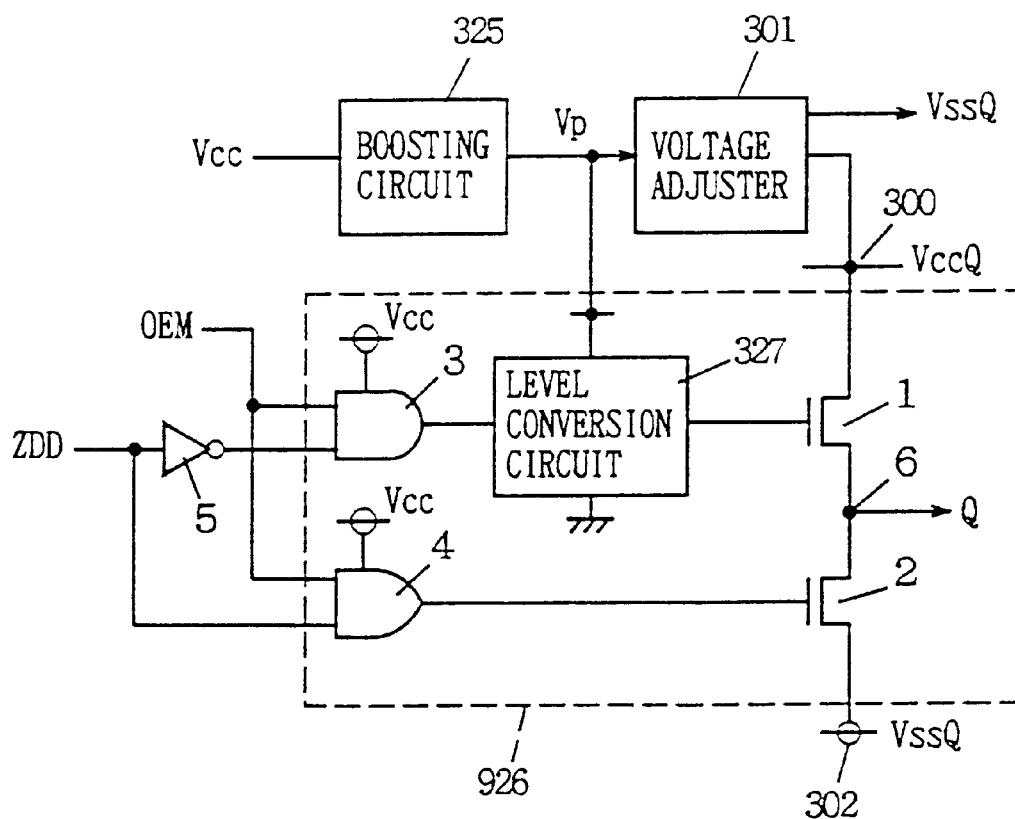
FIG. 65 schematically shows a structure of an output circuit according to the first modification of the sixth embodiment of the present invention.

FIG. 65 shows a structure of an output circuit employing the boosting circuit of FIG. 64. Referring to FIG. 65, output circuit 926 includes a level conversion circuit 327 provided between AND circuit 3 and an output drive transistor 1, operating with high voltage Vp from boosting circuit 325 as one operating power supply voltage for converting the H level of the output signal of AND circuit 3 to the high voltage Vp level. AND circuits 3 and 4 operate with internal power supply voltage Vcc as one operating power supply voltage. As to level conversion circuit 327, a structure can be employed where p channel MOS transistors have their gates and drains cross-coupled and receive high voltage Vp at their sources. An n channel MOS transistor is connected between the drain of each of the p channel MOS transistors and the ground voltage node. By using this level conversion circuit 327, power supply voltage VccQ of high voltage Vp level applied to power supply node 302 can be transmitted onto output node 6.

Voltage adjuster 301 also receives high voltage Vp. This is required to boost the output signals of inverters 311 and 314 to the level of high voltage Vp in the structure shown in FIG. 62. High voltage Vp is applied to inverters 311 and 314, which output a signal of a high voltage Vp level. In this case, a level conversion circuit may be provided at the output portion of inverters 311 and 314. Alternatively, a structure may be provided in which inverters 311 and 314 per se include a level conversion function.

In this case, a structure may be employed in which the voltage applied to power supply node 300 differs from that applied to level conversion circuit 327. More specifically, two types of high voltages Vp may be provided from boosting circuit 312. Level conversion circuit 327 converts the level of the output signal of NAND circuit 3 to the higher of the two high voltages. The H level voltages from inverters 311 and 314 (refer to FIG. 52) are also converted to the level of the higher voltage. In this case, the lower high voltage level can be transmitted to power supply node 300 with no loss of the threshold voltage of the MOS transistor.

The level conversion circuit is not provided at the output portion of AND circuit 4 in the structure of FIG. 64. In discharging output node 6, drive transistor 2 is turned on even when the gate potential thereof attains the level of internal power supply voltage Vcc. The voltage of output node 6 is discharged to the level of the voltage on ground node 302. If the gate potential of drive transistor 2 attains the level of internal power supply voltage Vcc, the conductance is reduced in comparison with the case where high voltage Vp is supplied, so that the discharging rate of output node 6 is reduced. Therefore, a sudden change in current at initiating a discharging operation of output node 6 can be suppressed to prevent ringing in a more reliable manner. Even when the gate voltage level of drive transistor 2 is sufficiently higher than the level of ground node 302 and the voltage VssQ on ground node 302 is discharged towards the level of ground voltage GND at high speed, the voltage level of output node 6 can be discharged to the level of ground voltage GND at high speed according to the high speed discharging.

A structure may be employed where a level conversion circuit is provided between the gate of drive transistor 2 and AND circuit 4 to increase the gate potential of drive transistor 2 to a sufficient high level, and the discharging rate of output node 6 is adjusted only by voltage adjuster 301. In the above-described structure, the voltages on power supply node 300 and ground node 302 (generically referred to as "reference power supply node") are varied in two stages. Alternatively, a structure may be employed where the voltage on the reference power supply node is varied over three or more stages.

In this output circuit, a structure may be combinedly employed using a plurality of drive transistors connected in parallel with delay time variable according to whether an invalid signal is output or not. Furthermore, the structure of output circuit 926 may be applied to all the previous first to fifth embodiments.

By providing a structure according to a sixth embodiment where the voltage on a reference power supply node of an output stage transistor driving an output node according to an internal signal has the changing rate varied in a plurality of steps, the voltage change in output node 6 can be first impelled gently, and then gradually increased. Therefore, a stable output signal can be provided speedily with no ringing.

Embodiment 7

Figure 66:
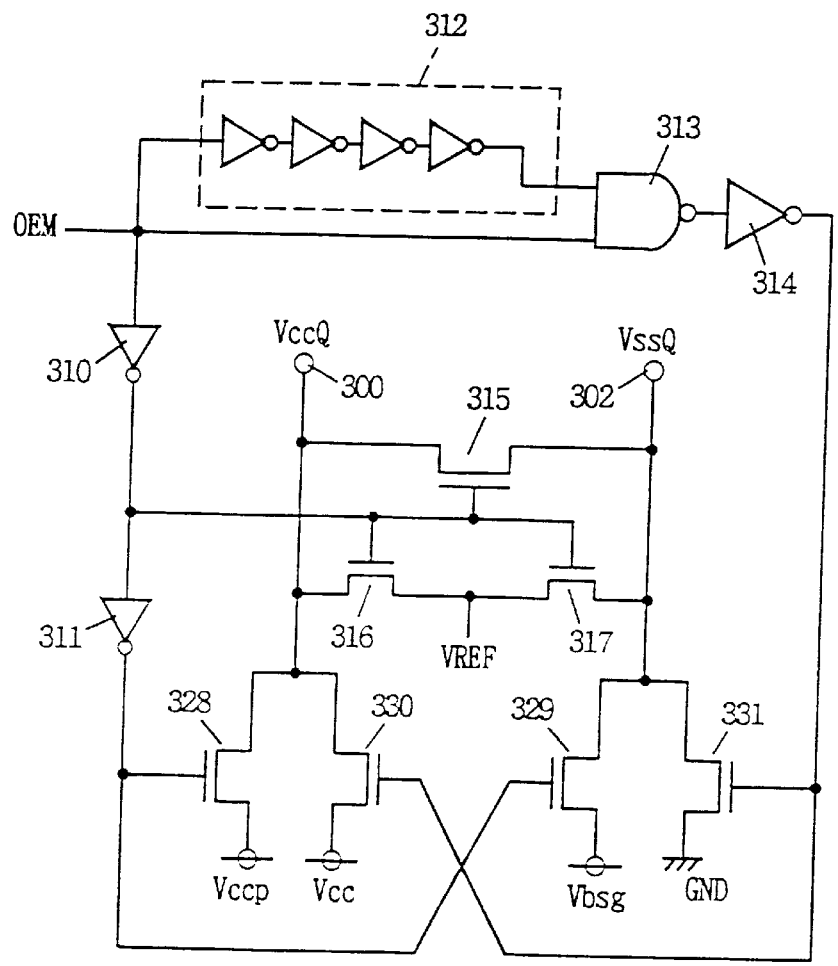
FIG. 66 shows a structure of a voltage adjuster according to an output circuit of a seventh embodiment of the present invention.

FIG. 66 shows a structure of the main part of an output circuit according to a seventh embodiment of the present invention. FIG. 66 shows a structure of a voltage adjustment unit for providing the operating power supply voltages of the output circuit. The structure of the output circuit itself is similar to that shown in FIG. 61.

The voltage adjustment unit of FIG. 66 is different from voltage adjuster 301 shown in FIG. 60 in the structure as set forth in the following. According to the structure of FIG. 66, and n channel MOS transistors 328 responsive to an output signal of inverter circuit 311 transmits a voltage Vccp between reference voltage VREF and power supply voltage Vcc to power supply nodes 300. An n channel MOS transistor 330 provided parallel to MOS transistor 328 responds to an output signal of inverter circuit 314 to transmit power supply voltage Vcc to power supply node 300. An n channel MOS transistor 329 coupled to ground node 302 responds to an output signal of inverter circuit 311 to transmit a voltage Vbsg of a level closer to intermediate reference VREF than to ground voltage GND to ground node 302. An n channel MOS transistor 331 responds to an output signal of inverter circuit 314 to transmit ground voltage GND to ground node 302. The remaining structure is similar to that shown in FIG. 62.

The W/L ratio of the channel width to the channel length of MOS transistors 328 and 330 may be identical. Alternatively, as shown in FIG. 62, the ratio of the channel width to the channel length (or coefficient β) of MOS transistor 328 may be set smaller than that of MOS transistor 330. Also, the W/L of MOS transistor 329 may be set equal to or smaller than that of MOS transistor 331. The operation thereof will be described briefly.

The operation of the output circuit is similar to that shown in FIG. 61. In a standby state, the output signal of inverter circuit 310 attains an H level, and MOS transistors 315, 316, and 317 are turned on. Nodes 300 and 302 are precharged to the level of reference voltage VREF. Here, the output signals of inverter circuits 311 and 314 are both at an L level (output permission signal OEM is at an L level). MOS transistors 328, 330, 321 and 331 are all turned off.

When a data signal is to be read out, output permission signal OEM is pulled up to an H level from an L level, whereby MOS transistors 315–317 are all turned off. First, output signal of inverter circuit 311 is driven to an H level, and MOS transistors 328 and 329 are turned on. By MOS transistors 328, power supply node 300 is charged to the level of voltage Vccp where no ringing is generated. MOS transistors 329 gently discharges ground node 302 towards the level of voltage Vbsg where no ringing is generated. Then, MOS transistors 330 and 331 are turned on by an output signal of inverter circuit 314, whereby power supply node 300 is charged at high speed to the level of power supply voltage Vcc. Ground node 302 is discharged at high speed to the level of ground voltage GND. When an output signal of a high level is provided from the output circuit, the voltage on power supply node 300 is transmitted onto output node 6 via drive transistor 1 (refer to FIG. 61). When the output circuit provides a signal of a low level, the voltage on ground node 302 is transmitted onto output node 6 via drive transistor 2. Therefore, the voltage change in output node 6 is substantially equal to the change of the voltage of power supply node 300 or ground node 302. As a result, output signal Q on output node 6 is driven gently to the level of a voltage where no ringing is generated, and then at high speed to the level of power supply voltage or ground voltage. Thus, a stable output signal can be provided speedily with no ringing.

MOS transistor 329 may have a ratio of the channel width to channel length of W/L (or coefficient β) similar to that of MOS transistor 331. Since the source voltage Vbsg of MOS transistor 329 is higher than the source voltage GND of MOS transistor 331, the gate voltage of MOS transistor 329 becomes lower than that of MOS transistor 331, whereby the conductance of MOS transistor 329 becomes smaller than that of MOS transistor 331. As a result, the current driving capability of MOS transistor 329 is set smaller than the current driving capability of MOS transistor 331.

A p channel MOS transistor may be provided for MOS transistors 318, 320, 328 and 330 for charging power supply node 300 shown in FIGS. 62 and 66. Power supply voltage Vcc can be transmitted to power supply node 300 with no threshold voltage loss. In the structure of FIG. 66, when p channel MOS transistors are used instead of n channel MOS transistors 328 and 330, the ratio of the channel width to the channel length (or coefficient β) of these p channel MOS transistors may be equal. This is because the current driving capability of the p channel MOS transistor receiving voltage Vccp at its source is set smaller than that of the p channel MOS transistor receiving voltage Vcc at its source.

Figure 67A:
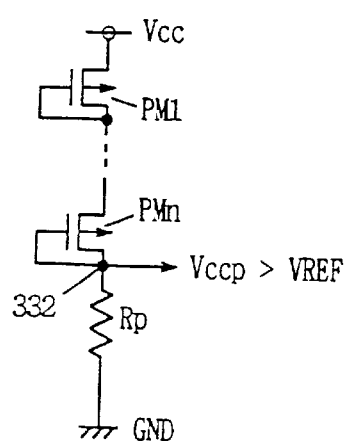
FIGS. 67A and 67B show a structure of an adjusting voltage Vccp generation circuit and a Vbsg generation circuit, respectively, of FIG. 66.
Figure 67B:
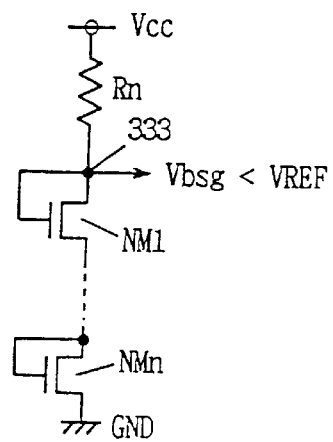

FIGS. 67A and 67B show a structure for generating voltages Vccp and Vbsg, respectively of FIG. 66.

Referring to FIG. 67A, a voltage generation circuit includes diode-connected p channel MOS transistors PM1–PMn connected in series between the supply node of power supply voltage Vcc and node 332, and a resistor Rp connected between node 332 and the supply node of ground voltage GND. Resistor Rp has a resistance value greater than the channel resistance of MOS transistors PM1–PMn. Each of MOS transistors PM1–PMn operates in a diode mode causing a voltage drop by the absolute value of the threshold voltage Vthp. According to the structure shown in FIG. 67A, the voltage of Vcc-n.Vthp is output as voltage Vccp. The number of MOS transistors PM1–PMn are appropriately selected according to the level of voltage Vccp.

Referring to FIG. 67B, a voltage generation unit includes a resistor Rn connected between the supply node of power supply voltage Vcc and node 333, and diode-connected n channel MOS transistors NM1–NMn connected in series between node 333 and the supply node of ground voltage GND. Resistor Rn has a resistance sufficiently greater than the channel resistance of each MOS transistors NM1–NMn. In this case, MOS transistors NM1–NMn each operate in a diode mode causing a voltage drop by the threshold voltage Vthn. According to the structure shown in FIG. 67B, voltage Vbsg appearing on node 33 is n.Vthn (ground voltage GND is 0 V).

Voltage Vccp has a value greater than the reference voltage VREF. Voltage Vbsg has a value smaller than reference voltage VREF.

Various reference voltage generation circuits may be used instead of the structure of the voltage generation circuit shown in FIGS. 67A and 67B.

According to the structure of the seventh embodiment in which the power supply node and the ground node providing a voltage determining the voltage level of the output signal of the output circuit are driven in two steps, and wherein respective currents are supplied in the first step from the supply sources of voltage Vccp lower than the power supply Vcc and voltage Vbsg higher than ground voltage GND towards the power supply node and the ground node, the output node of the output circuit can reliably be driven to a voltage level where no ringing is generated due to generation of these voltages all the power supply and ground nodes stably. Then, the output node can be driven speedily to the level of power supply voltage Vcc or ground voltage GND to provide a stable output signal with no ringing.

Since a voltage level of no ringing can be set by voltages Vccp and Vbsg according to the structure of the seventh embodiment, it can be reliably prevented that the output node is charged or discharged at high speed when the voltage level of the output node has not yet changed sufficiently. Thus, generation of ringing can be reliably suppressed.

Embodiment 8

Figure 68:
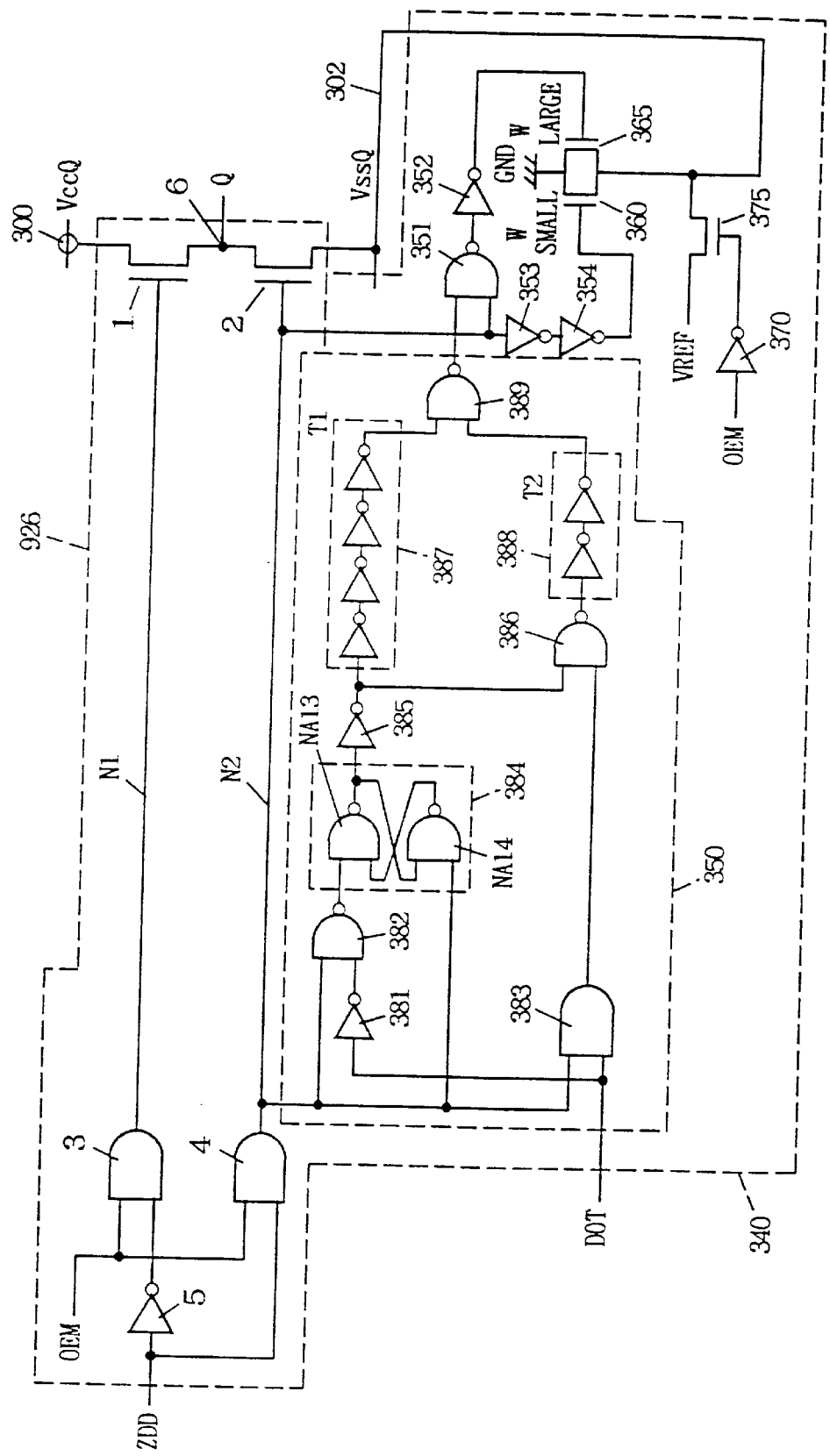
FIG. 68 shows a structure of an output circuit according to an eighth embodiment of the present invention.

Referring to FIG. 68, similar to the previous embodiment, an output circuit 926 of the eighth embodiment of the present invention includes an inverter circuit 5 for inverting internal data signal ZDD, an AND circuit 3 for receiving output permission signal OEM and an output signal of inverter circuit 5, an AND circuit 4 for receiving output permission signal OEM and internal data signal ZDD, a drive transistor 1 responsive to an output signal of AND circuit 3 for driving output node 6 to the level of voltage VccQ on power supply node 300, and an output drive transistor 2 responsive to an output signal of AND circuit 4 for discharging output node 6 to the level of voltage VssQ on ground node 302.

Output circuit 926 further includes a voltage adjuster 340 responsive to a signal applied to node N2 from AND circuit 4 to adjust the voltage level on ground node 302. Although only voltage adjuster 340 for adjusting voltage VssQ on ground node 302 is shown in FIG. 68 for the sake of simplification, a voltage adjuster for adjusting voltage VccQ on power supply node 300 according to the voltage level on node N1 is also provided. The circuit for adjusting voltage VccQ on power supply node 300 according to the signal on node N1 is similar in configuration to that of voltage adjuster 340.

Voltage adjuster 340 includes a driving circuit 350 for determining the absence/presence of an invalid data output in response to output designating signal DOT and an internal signal on node N2 to adjust the delay time according to the determination result for providing an activation signal at an elapse of a predetermined adjusted delay time, a 2-input NAND circuit 351 for receiving an output signal of driving circuit 350 and an internal signal on node N2, an inverter circuit 352 for inverting the output signal of NAND circuit 351, an inverter circuit 353 for inverting a signal on node N2, an inverter circuit 354 for inverting an output signal of inverter circuit 353, an n channel MOS transistor 360 having a relatively small current driving capability and rendered conductive in response to an output signal of inverter circuit 354 for discharging ground node 302 towards the level of ground voltage GND, and an n channel MOS transistor 365 having a relatively large current driving capability and rendered conductive in response to an output signal from inverter circuit 352 for discharging ground node 302 to the level of ground voltage GND. Inverter circuits 353 and 354 form a buffer circuit.

Voltage adjuster 340 further includes an inverter circuit 370 for inverting output permission signal OEM, and an n channel MOS transistor 375 responsive to an output signal of inverter circuit 370 for transmitting reference voltage VREF to ground node 302. MOS transistor 375 is rendered conductive when output circuit 926 is inactive at an L period of output permission signal OEM, to precharge ground node 302 to the level of reference voltage VREF.

Driving circuit 350 includes an inverter circuit 381 for inverting output designating signal DOT, a 2-input NAND circuit 382 for receiving an internal signal on node N2 and an output signal of inverter circuit 381, a 2-input AND circuit 383 for receiving an internal signal on node N2 and output designating signal DOT, and a flipflop 384 including cross-coupled NAND circuits NA23 and NA14 set in response to an output signal of NAND circuit 382 and reset in response to an internal signal on internal node N2, an inverter circuit 385 for receiving an output signal of NAND circuit NA13 in flipflop 384, a delay circuit 387 for delaying an output signal of inverter circuit 385 for a predetermined time T1, a 2-input NAND circuit 386 for receiving an output signal of inverter circuit 385 and an output signal of AND circuit 383, a delay circuit 388 for delaying an output signal of NAND circuit 386 for a predetermined time period T2, and a 2-input NAND circuit 389 for receiving output signals of delay circuits 387 and 388.

Flipflop 384 includes a function of determining whether a valid data signal (a signal of an H level) is output or not on internal node N2 when output designating signal DOT attains an active state of an H level. The delay time T1 of delay circuit 387 is set longer than delay time T2 of delay circuit 388.

The structure of driving circuit 350 is substantially similar to the control circuit adjusting the conducting timing of the drive transistor 2 shown in FIG. 16. The operation will now be described.

Figure 69:
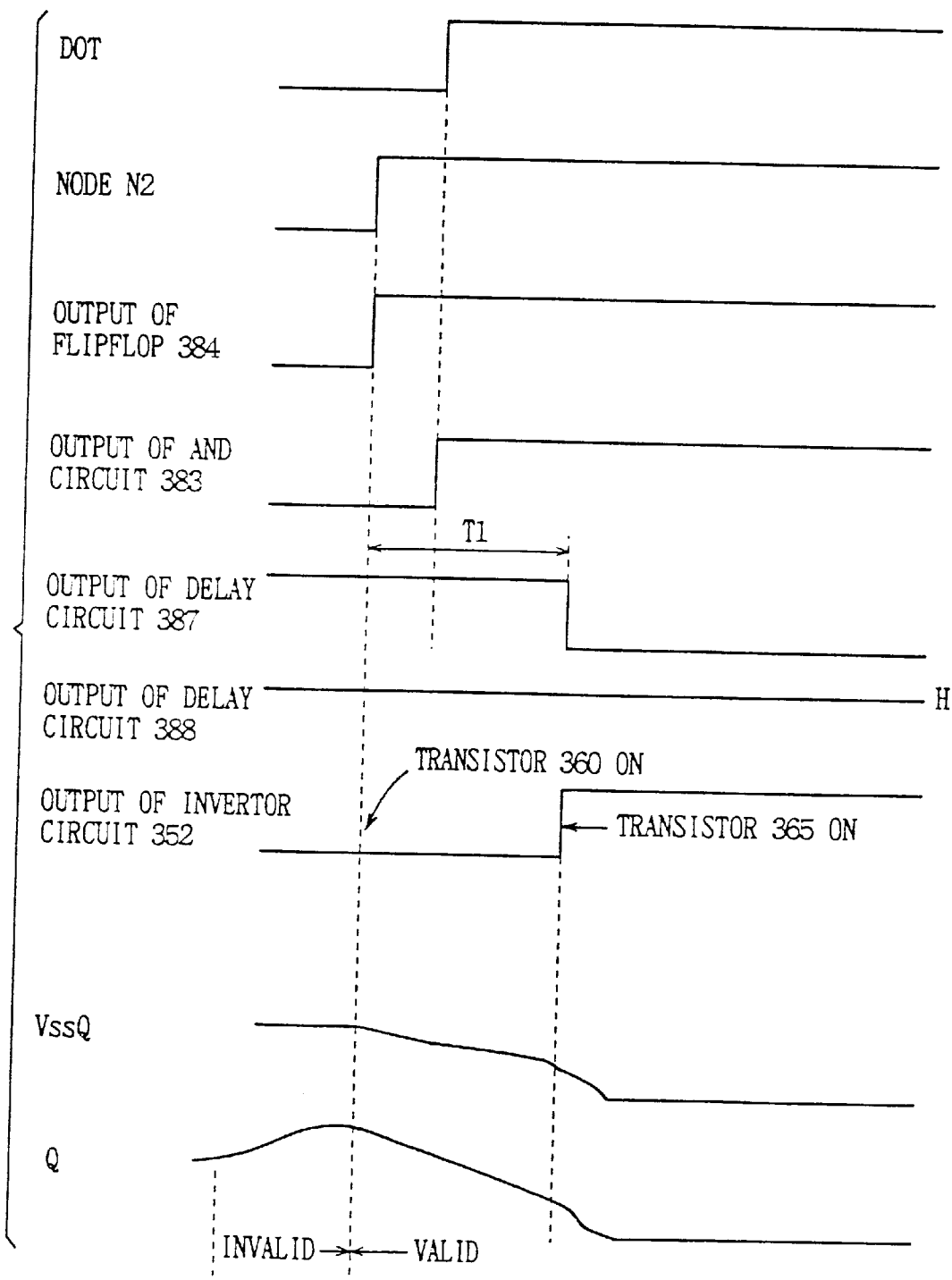
FIGS. 69 and 70 are signal waveform diagrams representing an operation of the output circuit of FIG. 68.

A case where there is no invalid output will be described with reference to the waveform diagram of FIG. 69. When the internal signal on internal node N2 is driven to an L or H level, the output signal of inverter circuits 353 and 354 is pulled up to an H level, whereby MOS transistor 360 is turned on. By this small current driving capability thereof, voltage VssQ on ground node 302 is discharged from the level of intermediate voltage VREF to ground voltage GND. Output permission signal OEM is already pulled to an H level, whereby MOS transistors 345 is turned off. Ground node 302 is isolated from the supply source of internal voltage VREF. In contrast, drive transistor 2 is turned on in response to an internal signal on internal node N2, whereby output node 6 is discharged to the level of voltage VssQ on ground node 302. The signal on node N2 is an invalid signal since output designating signal DOT is not pulled up to an H level yet. Therefore, the output signal is an invalid signal until node N2 is driven to an H level. Output node 6 is charged by power supply node 300 via drive transistor 1. Flipflop 384 is kept reset, and provides an output signal of an L level. When output designating signal DOT is pulled up to an H level from an L level, the output signal of NAND circuit 382 is driven to an L level, whereby flipflop 384 is set. In response, the output signal of inverter circuit 385 is pulled down to an L level. Although the output signal of AND circuit 383 is pulled up to an H level simultaneously, the output signal of inverter circuit 385 attains an L level, so that the output signal of NAND circuit 386 maintains an H level. Therefore, the output signal of delay circuit 388 maintains an H level.

At an elapse of a predetermined time T1 from the fall of the output signal of inverter circuits 385 to an L level, the output signal of delay circuit 387 is driven to an L level and the output signal of NAND circuit 389 is driven to an H level. Here, the internal signal on node N2 is already driven to an H level. The input signal of NAND circuit 351 is also driven to an H level. The output signal of NAND circuit 351 is pulled down to an L level from the H level, whereby the output signal of inverter circuit 352 is pulled up to an H level from an L level. As a result, MOS transistor 365 of a great current driving capability which was OFF is turned on, whereby ground node 302 is rapidly lowered to the level of ground voltage GND. As a result, output signal Q on output node 6 is driven to the level of ground voltage GND via drive transistor 2. MOS transistor 365 is turned on at an elapse of a delay time T1 from the rise of output designating signal DOT to an H level. By lengthening this delay time T1, output signal Q raised by an invalid data output is gently reduced to the voltage level where no ringing is generated. Then, the output node can be lowered to the level of ground voltage GND speedily, whereby a stable output signal is provided with no ringing.

Figure 70:
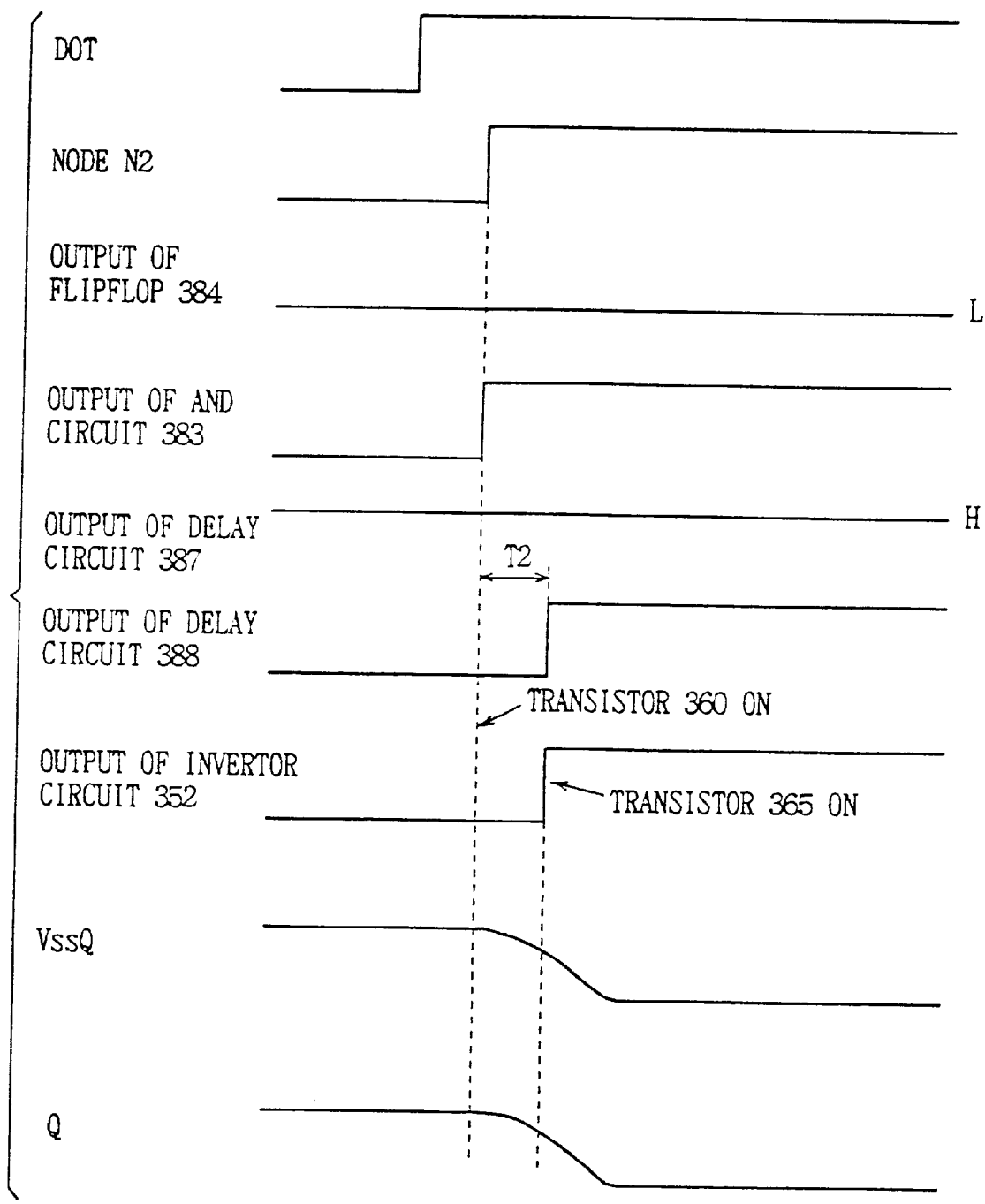

An operation of the case where an invalid signal is not output will be described with reference to the operation waveform diagram of FIG. 70. The internal signal on internal node N2 is pulled up to an H level following the rise of output designating signal DOT to an H level. When the internal signal of node N2 is driven to an H level together with output designating signal DOT, the output signal of AND circuit 383 is pulled up to an H level. When the internal signal of internal node N2 is at an L level, the output signal of NAND circuit 382 attains an H level independent of the state of output designating signal DOT. Therefore, flipflop 384 maintains a reset state, so that an output signal thereof maintains an L level. Accordingly, the output signal of inverter circuit 385 maintains an H level. Therefore, when the output signal of AND circuit 383 is pulled to an H level, the output signal of NAND circuit 386 is pulled down to an L level. At an elapse of a predetermined time T2, the output signal of delay circuit 388 is pulled down to an L level. As a result, the output signal of NAND circuit 389 is pulled up to an H level from an L level.

In response to an internal signal driven to an H level on internal node N2, MOS transistor 360 is turned on by inverter circuits 353 and 354. MOS transistor 375 is already turned off, and voltage VssQ on ground node 302 is discharged to the level of ground voltage GND via MOS transistor 360 to be lowered gently. As a result, drive transistor 2 discharges output signal Q on output node 6 according to voltage VssQ on ground node 302. Therefore, the potential change of output signal Q on output node 6 is gentle, and no ringing is generated on output node 6. At an elapse of a delay time T2 from the rise of the internal signal of internal node N2 to an H level, the output signal of NAND circuit 351 is driven to an L level and the output signal of inverter circuit 352 is driven to an H level, whereby MOS transistor 365 of a great current driving capability is turned on. As a result, voltage VssQ on ground node 302 lowered to a voltage level where no ringing is generated is discharged speedily to the level of ground voltage GND by MOS transistor 365 of a great current driving capability. Drive transistor 2 discharges the voltage on output node 6 to the level of the voltage on ground node 302. In this case, although output signal Q on output node 6 is lowered speedily, a stable output signal with no ringing is provided from output node 6 since it is already lowered to a voltage level where no ringing will be generated.

By adjusting the timing at which drive transistor 365 driving ground node 302 attains on-state according to absence/presence of an invalid signal output, the voltage on output node 6 can be reliably discharged to the level where no ringing is generated and then to the ground voltage level. Therefore, a stable output signal with no ringing can be generated regardless of absence/presence of an invalid signal.

In the structure shown in FIG. 68, MOS transistor 360 may be connected to receive a voltage Vbsg higher than the ground voltage level GND as shown in FIG. 66. As to output circuit 926, a structure where the on-timing of an output node driving transistor having a great current driving capability is changed in response to absence/presence of an invalid output may be provided as shown in the previous FIGS. 23, 25, 27, 29 and 31.

As to the structure of driving circuit 350 in the voltage adjuster shown in FIG. 68, a structure where the on-timing of MOS transistor 360 is differentiated according to absence/presence of an invalid signal output may be employed. The structure shown in FIGS. 23, 25, 27, 29 and 31 may be applied to this control circuit.

According to the structure of the eighth embodiment of the present invention, a plurality of transistors having different current driving capabilities are provided with respect to a reference power supply node of the output circuit, and the on-timing of a transistor of a great current driving capability is differentiated according to absence/presence of an invalid output. Therefore, an output signal of no ringing can be output at high speed regardless of absence/presence of an invalid output.

Embodiment 9

Figure 71:
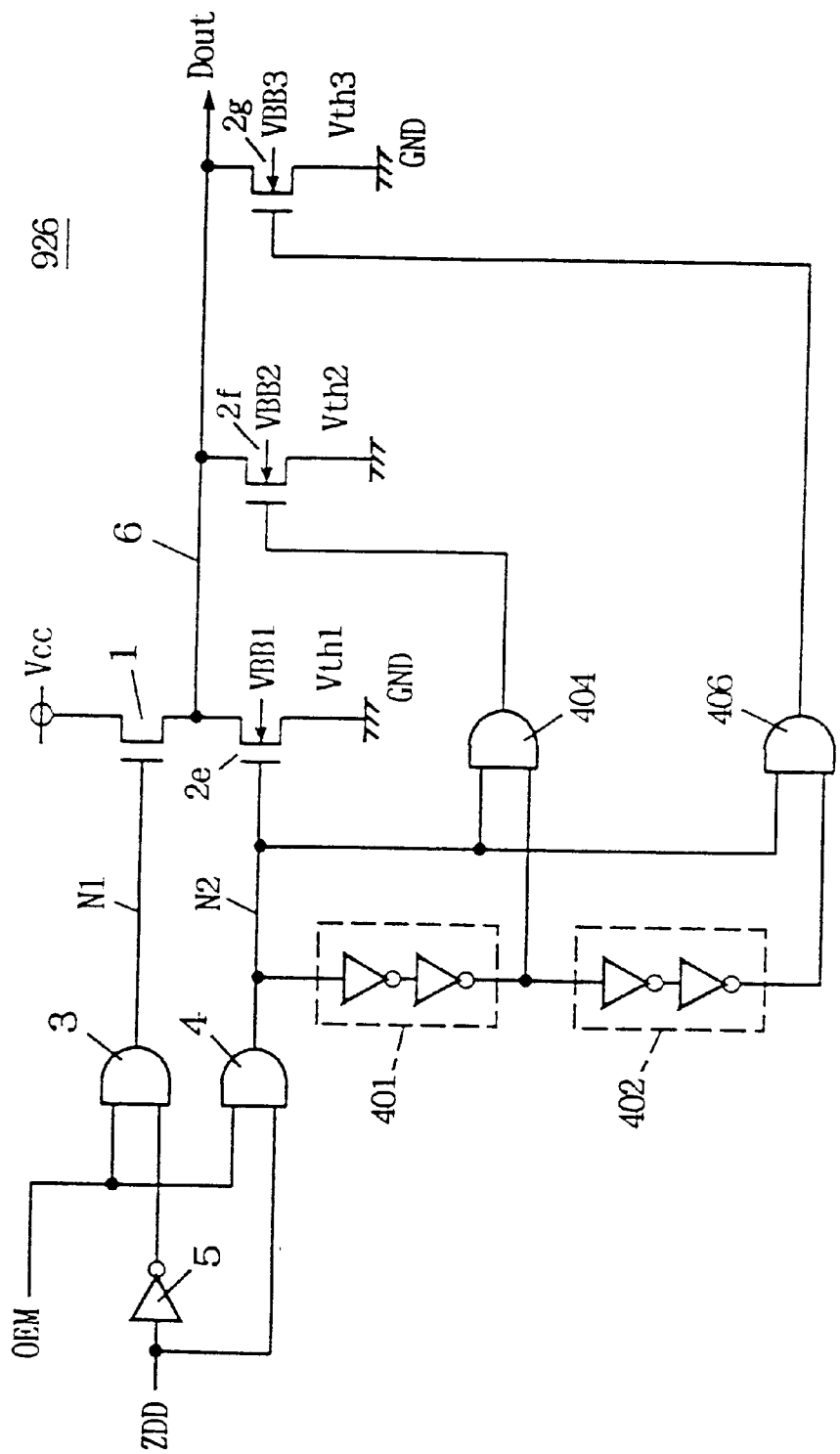
FIG. 71 shows a structure of an output circuit according to a ninth embodiment of the present invention.

Referring to FIG. 71, an output circuit 926 of the ninth embodiment includes a delay circuit 401 for delaying a signal on internal node N2 for a predetermined time, a delay circuit 402 for delaying an output signal of delay circuit 401 for a further predetermined time, a NAND circuit 404 for receiving a signal on internal node N2 and an output signal on delay circuit 401, a 2-input AND circuit 706 for receiving an internal signal on internal node N2 and an output signal of delay circuit 402, a drive transistor 2e formed of an n channel MOS transistor rendered conductive in response to the internal signal of internal node N2 for discharging output node 6 to the level of ground voltage GND, a drive transistor 2f formed of an n channel MOS transistor rendered conductive in response to an output signal of AND circuit 404 for driving output node 6 to the level of ground voltage GND, and a drive transistor 2g formed of an n channel MOS transistor rendered conductive in response to an output signal of AND circuit 406.

Similar to the previous embodiments, output circuit 926 further includes an inverter circuit 5 for inverting internal data signal ZDD, an AND circuit 3 for receiving output permission signal OEM and an output signal of inverter circuit 5, a drive transistor 1 formed of an n channel MOS transistor rendered conductive in response to an output signal of AND circuit 3 for charging output node 6 to the level of power supply voltage Vcc, and an AND circuit 4 responsive to output permission signal OEM and internal data signal ZDD for turning on drive transistor 2e. Drive transistors 2e, 2f and 2g have threshold voltages Vth1, Vth2, and Vth3, respectively, and receive bias voltages VBB1, VBB2, and VBB3, respectively, to their well regions (or substrate regions).

Threshold voltages Vth1, Vth2 and Vth3 satisfy the relationship of:

$$Vth1 > Vth2 > Vth3 > 0$$

Substrate bias voltages VBB1, VBB2 and VBB3 satisfy the relationship of:

$$VBB1 < VBB2 < VBB3 < 0$$

With an increase of the threshold voltage of the n channel MOS transistor, the gate potential is effectively lowered when the same gate voltage is applied, whereby the conductance is reduced. Therefore, when the same voltage of H level is applied to drive transistors 2e, 2f and 2g, the conductance is increased in the order of drive transistors 2e, 2f and 2g. Similarly, as the absolute value of the substrate bias voltage is increased, the absolute value of the threshold voltage of the MOS transistor is increased. Similarly, due to this substrate bias voltage, the substrate bias effect is reduced to increase the conductance in the order of drive transistors 2e, 2f and 2g. It is assumed here that drive transistors 2e, 2f and 2g have the same size.

In operation, when the internal signal on internal node N2 is pulled up to an H level, drive transistor 2e is turned on, whereby output node 6 is discharged to the level of ground voltage GND. Drive transistor 2e has the threshold voltage Vth1 set to a maximum value and the substrate bias voltage set to the minimum value to increase substrate bias effect. Therefore, output node 6 is discharged to the level of ground voltage GND with a relatively small current driving capability. Then, when the output signal of delay circuit 401 is pulled up to an H level, drive transistor 2f is turned on. Drive transistor 2f has a threshold voltage Vth2 and a substrate bias voltage VBB2 of a middle level, so that output node 6 is discharged to the level of ground potential GND with a relatively great current capability. Then, when the output signal of delay circuit 402 is pulled up to an H level, the output signal of AND circuit 406 is driven to an H level, whereby drive transistor 2g is turned on. Drive transistor 2g has a substrate bias set to the minimum value and threshold voltage VTH3 set to the minimum value. Therefore, output node 6 is discharged to the level of ground voltage GND with a great current driving capability. As a result, the voltage of output node 6 lowered by drive transistors 2e and 2f to the voltage level where no ringing is generated is further discharged at high speed to the level of ground voltage GND via drive transistor 2g.

By differentiating the level of substrate bias voltage VBB (VBB1–VBB3) and threshold voltage Vth (Vth1–Vth3) to differ the current driving capability of each drive transistor, output node 6 is discharged in a relatively mild manner at the initial stage, and then to the level of ground voltage GND at high speed using a drive transistor of a great current driving capability when the voltage level is reduced to a level where no ringing is generated. Thus, a stable output signal can be provided speedily with no ringing.

Modification 1

Figure 72:
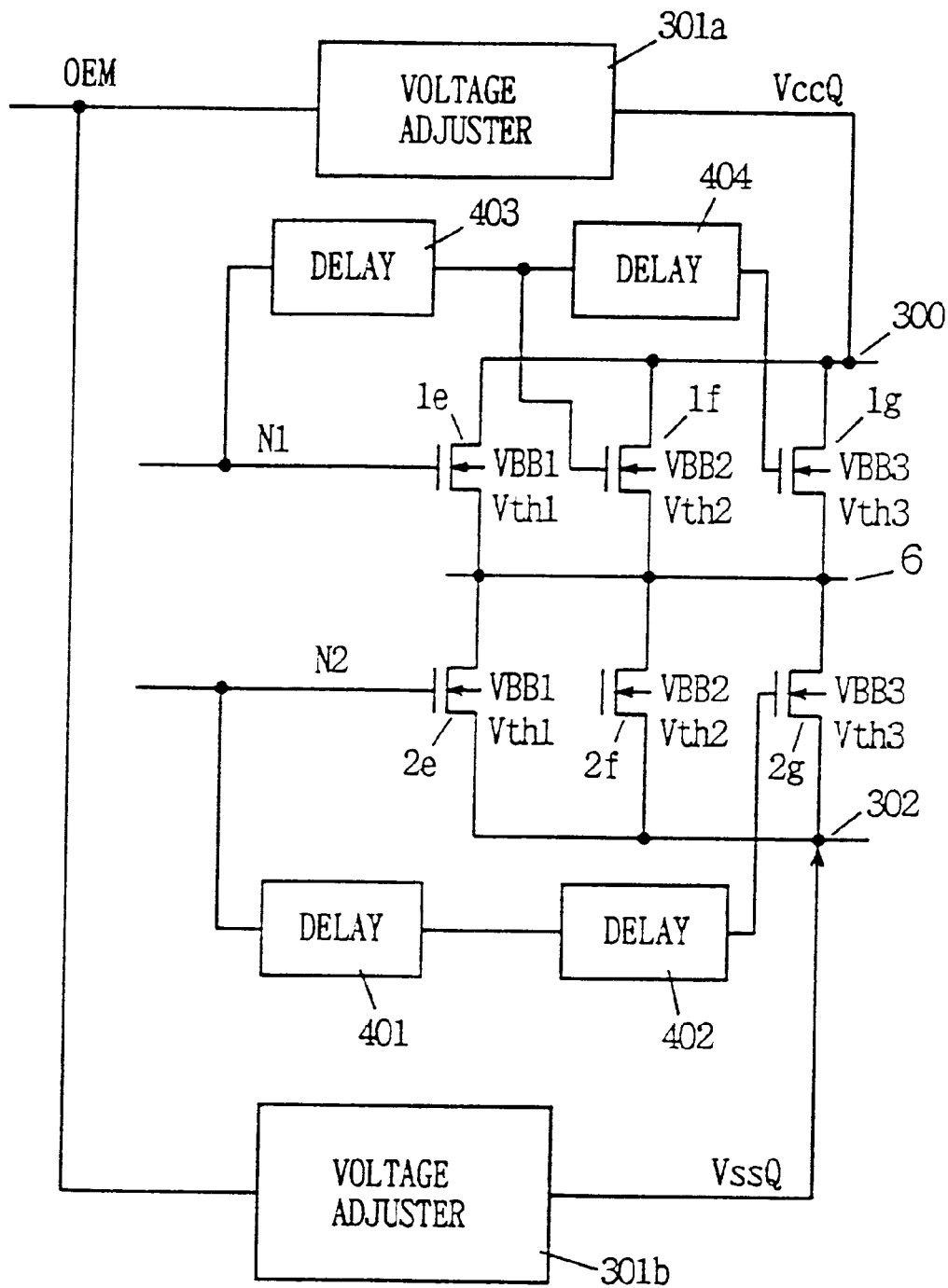
FIG. 72 shows a modification of the ninth embodiment of the present invention.

Referring to FIG. 72 showing a modification of the output circuit of the ninth embodiment, voltage VssQ from voltage adjuster 301b is applied to ground node 302 forming the common source of drive transistors 2e, 2f and 2g discharging output node 6. Drive transistors 2e, 2f and 2g and delay circuits 401 and 402 are similar to those shown in FIG. 71. Corresponding portions have the same reference characters allotted. Voltage adjuster 301b responds to output permission signal OEM to convert the level of output voltage VssQ from the level of reference voltage VREF to the level of ground voltage GND. The structure of this voltage adjuster is similar to that shown in FIGS. 62 and 66.

Referring to FIG. 72, the output circuit further includes drive transistors 1e, 1f and 1g each formed of an n channel MOS transistor provided in parallel between power supply node 300 and output node 6. Drive transistor 1e conducts in response to a signal on internal node N1. Drive transistor if conducts in response to an output signal of delay circuit 403 delaying a signal on internal node N1 for a predetermined time period. Drive transistor 1g conducts in response to an output signal of delay circuit 404 which further delays the output signal of delay circuit 403. Drive transistors 1, 1f, and 1g have different threshold voltages and different substrates bias voltages. In FIG. 72, drive transistors 1e, 1f and 1g are shown to have threshold voltages and bias voltages of a level identical to those of drive transistors 2e, 2f and 2g for discharging output node 6. However, the present invention is not limited to such values, and may be set to an arbitrary value as long as a drive transistor that is precedingly turned on has a greater threshold voltage and a deeper substrate bias. Delay circuits 403 and 404 have a delay time similar to those of delay circuits 401 and 402, respectively.

Voltage VccQ from voltage adjuster 301a is applied to power supply node 300. Voltage adjuster 301a is activated in response to output permission signal OEM to adjust output voltage VccQ from the level of reference voltage VREF. Similar to voltage adjuster 301b, voltage adjuster 301a has a structure shown in FIG. 62 or 66.

In general, a current (drain current) Ids flowing from the drain to the source of an MOS transistor is represented by the following equation:

Saturated Region: $|Vds| \geq |Vgs-Vth|$; $Ids=(Vgs-Vth)^2$

Nonsaturated Region: $|Vds|<|Vgs-Vth|$; $Ids=A\{(Vgs-Vth)\ Vds-(Vds^2/2)\}$, where Vds indicates drain-source voltage, Vgs indicates gate-source voltage, and Vth indicates threshold voltage. Drain current Ids is greatly affected by threshold voltage Vth as gate-source voltage Vgs is lowered in either case of a saturated region or nonsaturated region. More specifically, when power supply voltage Vcc is lowered and the amplitude of the output signal of output node 6 is reduced, the changing rate of the signal on output node 6 can be adjusted sufficiently by threshold voltage Vth. Similarly, the threshold voltage Vth has the relation of:

$$Vth = A + B\ (C + |VBB|)^{1/2}$$

More specifically, threshold voltage Vth has a greater absolute value for a greater absolute value of substrate bias voltage VBB. In the case where the power supply voltage is lowered, the influence of substrate voltage bias VBB is overlaid on threshold voltage, so that the change of the voltage level of output node 6 can be adjusted. The advantages set forth in the following are obtained when the voltage of power supply nodes 300 and ground node 302 are adjusted using voltage adjusters 301a and 301b as shown in FIG. 72.

At the initial stage where output permission signal OEM is activated, voltage VssQ applied to ground node 302 is at a level higher than ground voltage GND. In this case, drive transistors 2e, 2f and 2g have their source potentials increased, which effectively lowers the gate voltages. Specifically, gate voltage Vgs is reduced. In this case, the influence of threshold voltage Vth is increased, as shown in the above equation, whereby the effect of the substrate bias voltage is increased. When the voltage level of output node 6 is reduced to a level where no ringing is generated, the voltage on ground node 302 is also set to the level of ground voltage GND. Therefore, the gate-source voltage Vgs of drive transistors 2e–2g takes a sufficiently great value. In this case, the influence of threshold voltage Vth is relatively low, so that output node 6 can be discharged to the level of ground voltage GND at high speed. Therefore, by varying the voltage on ground node 302 in a step manner, the current driving capability of a drive transistor can be adjusted taking advantage of the substrate bias voltage and threshold voltage effectively.

The same applies to drive transistors 1e, 1f and 1g for charging output node 6. When the voltage on power supply node 300 is relatively low, only drive transistor 1e is turned on. In the drain (conductive region connected to power supply node 300) of drive transistor 1e, a depletion layer is relatively wide since the junction of the impurity region and the substrate region attains a relatively weak reverse bias state. Therefore, the drain electric field is so small that a flow of drain current is suppressed, and the drain current has substrate bias dependency. Therefore, the drain current can be suppressed effectively, so that the current can be supplied from power supply node 300 to output node 6 gently. When voltage VssQ on power supply node 300 takes a sufficiently high value, the junction of the drain region and the substrate region in each of drive transistors 1e–1g attains a sufficiently reversed bias state. The depletion layer is narrow enough, so that a drain current is conducted easily. In this case, the bias voltage dependency is not degraded, and a relatively large drain current can be supplied. In this state, drive transistor 1e is turned on. Therefore, drive transistors 1e–1g can have well adjusted current driving capabilities by adjusting the threshold voltage and the bias voltage to appropriate values. By using a plurality of drive transistors with different substrate bias and threshold voltages in combination with a circuit that adjusts voltages VssQ and VccQ on ground node 302 and power supply node 300, an output circuit can be obtained that effectively suppresses generation of ringing.

In the structure shown in FIGS. 71 and 72, ringing in an output signal can be suppressed more effectively, by combining a structure where the ON-timings of drive transistors 1e and 2e are controlled according to absence/presence of an invalid output.

In accordance with the structure of the ninth embodiment where a plurality of transistors having different substrate bias and threshold voltages are provided in parallel between an output node and a reference power supply node, which are turned on at different timings. These drive transistors have different current driving capabilities, and an output circuit can be obtained that provides a stable output signal speedily while suppressing ringing effectively.

Embodiment 10

Figure 73A:
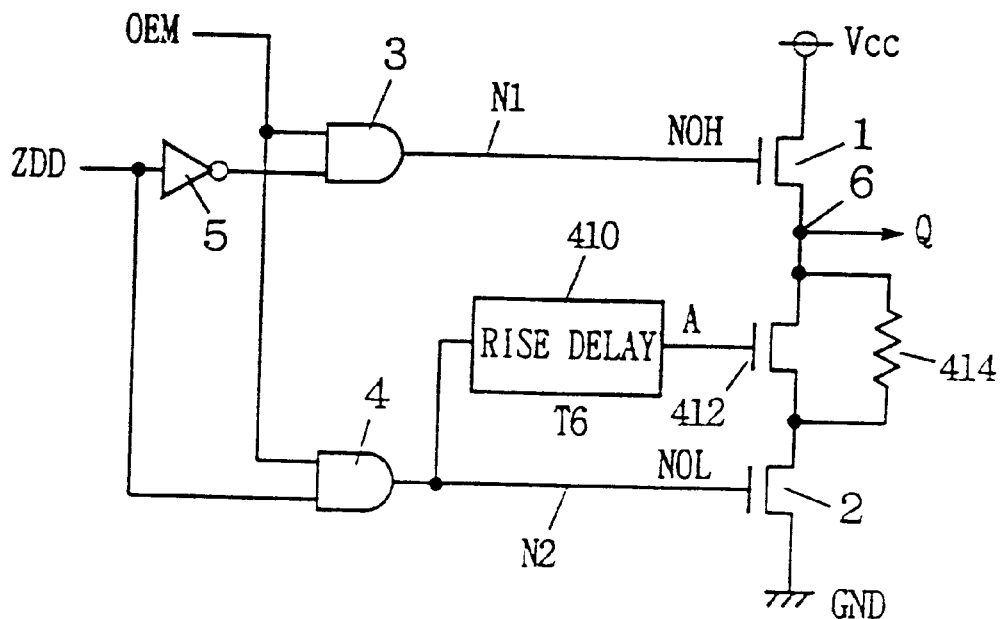
FIGS. 73A and 73B show a structure and operation, respectively, of an output circuit according to a tenth embodiment of the present invention.
Figure 73B:
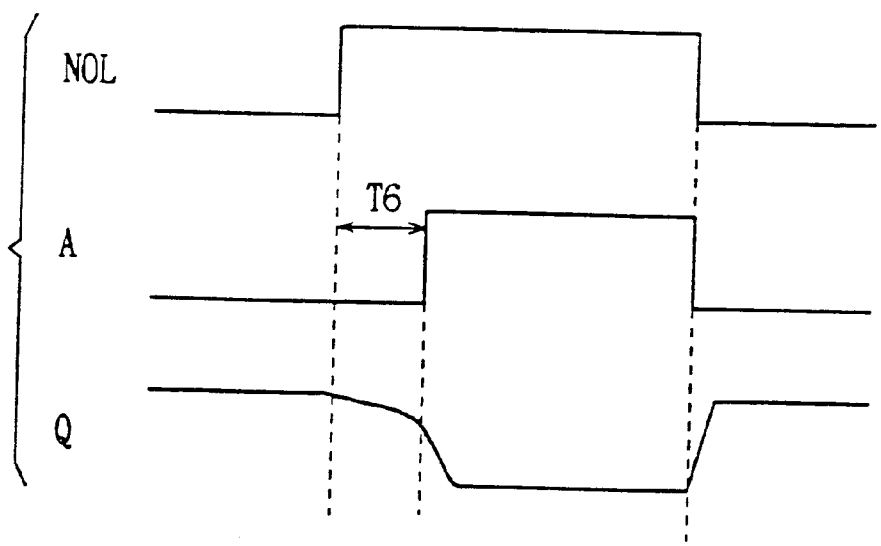

FIGS. 73A and 73B show a structure and operation of an output circuit according to a tenth embodiment of the present invention. In FIG. 73A, an n channel MOS transistor 412 rendered conductive in response to an output signal of a rise delay circuit 410 for delaying a signal on internal node N2 for a predetermined time period, and a resistance element 414 parallel to MOS transistor 412 are provided between output node 6 and drive transistor 2 discharging output node 6. Resistance element 414 has a current limiting function. The remaining structure is similar to that of the previous embodiments. More specifically, the output circuit includes an inverter circuit 5 for inverting internal data signal ZDD, an AND circuit 3 for receiving output permission signal OEM and an output signal of inverter circuit 5, a drive transistor 1 rendered conductive in response to an output signal NOH of AND circuit 3 for driving output node 6 to the level of power supply voltage Vcc, an AND circuit 4 for receiving output permission signal OEM and internal data signal ZDD, and a drive transistor 2 rendered conductive in response to output signal NOL of AND circuit 4. The operation of the output circuit of FIG. 73A will now be described with reference to the operation waveform diagram of FIG. 73B.

When output permission signal OEM attains an L level, output signal NOL of AND circuit 4 attains an L level, and drive transistor 2 is turned off. Also, output signal A of rise delay circuit 410 attains an L level, and MOS transistor 412 is turned off.

When output permission signal OEM and internal data signal ZDD both attain an H level, output signal NOL from AND circuit 4 is driven to an H level, whereby drive transistor 2 is turned on. However, output signal A of rise delay circuit 400 is still at an L level, and MOS transistor 412 is OFF. Under this state, output node 6 is discharged to the level of ground voltage GND via resistance element 414 and drive transistor 2. In this case, output node 6 is discharged in a relatively mild manner by the current limiting function of resistance element 414.

At an elapse of a predetermined time T6 from the rise of output signal NOL of AND circuit 4 to an H level, output signal A of rise delay circuit 410 is pulled up to an H level. As a result, MOS transistor 412 is turned on, so that resistance element 414 is short-circuited. The ON resistance (channel resistance) of MOS transistor 412 is preselected to a sufficiently low value in comparison with the resistance value of resistance element 414. Therefore, output node 6 is discharged at high speed to the level of ground voltage GND via MOS transistor 412 and drive transistor 2. When MOS transistor 412 is turned on, the voltage level of output node 6 is lowered to the level where no ringing is generated. Therefore, an output signal of no ringing is provided at output node 6 even when output node 6 is discharged speedily to the level of ground potential GND.

Delay circuit 410, MOS transistor 412 and resistance element 414 shown in FIG. 73A may be provided for drive transistor 1.

Modification 1

Figure 74A:
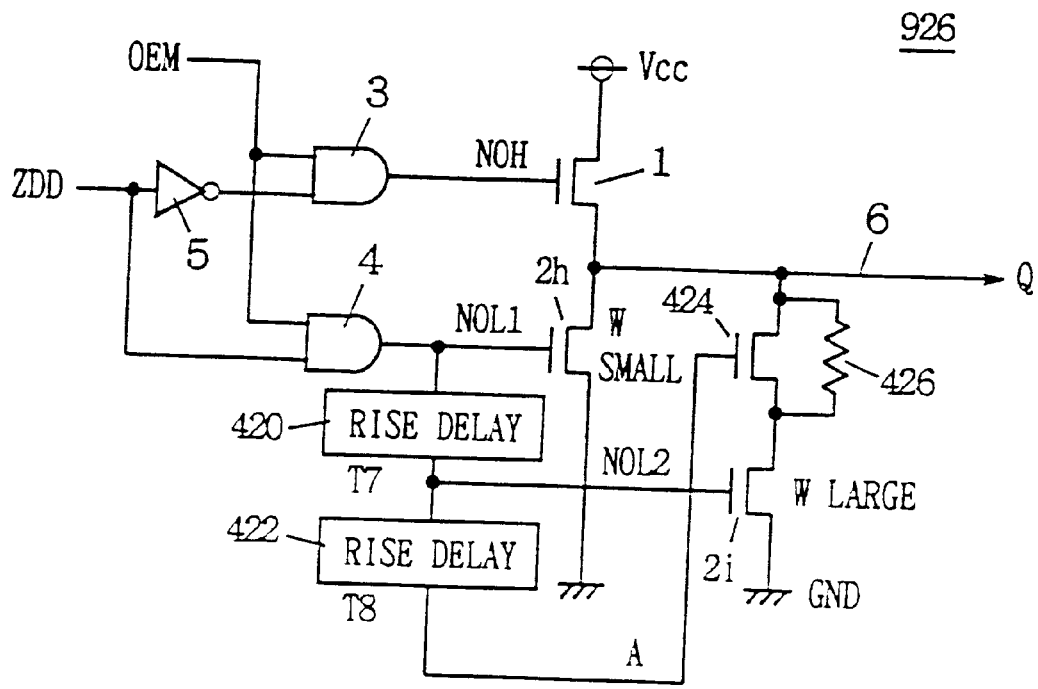
FIGS. 74A and 74B show a structure and an operation, respectively, of a modification of the tenth embodiment of the present invention.
Figure 74B:
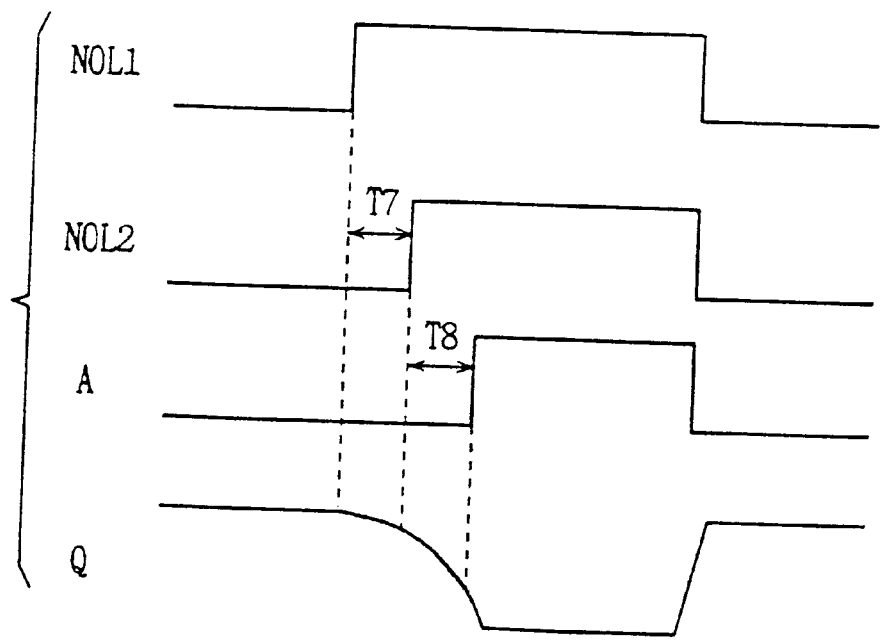

FIGS. 74A and 74B show a structure and operation of a first modification of the output circuit of the tenth embodiment. Referring to FIG. 74A, output circuit 926 includes an inverter circuit 5 for inverting internal data signal ZDD, an AND circuit 3 for receiving an output signal of inverter circuit 5 and an output permission signal OEM, a drive transistor 1 rendered conductive in response to an output signal NOH of AND circuit 3 for driving output node 6 to the level of power supply voltage Vcc, an AND circuit 4 for receiving output permission signal OEM and internal data signal ZDD, and a drive transistor 2h rendered conductive in response to an output signal NOL1 of AND circuit 4 for discharging output node 6 to the level of ground voltage GND.

Output circuit 926 further includes a rise delay circuit 420 for delaying the rise of output signal NOL1 of AND circuit 4 for a predetermined time, a rise delay circuit 422 for delaying the rise of output signal NOL2 of rise delay circuit 420 for a further predetermined time period, an MOS transistor 424 having one end connected to output node 6, and rendered conductive in response to output signal A of rise delay circuit 422, a resistance element 426 connected in parallel to MOS transistor 424, and a drive transistor 2i rendered conductive in response to an output signal NOL2 of rise delay circuit 420 for coupling resistance element 426 to ground voltage GND. The channel width of drive transistor 2h is set smaller than that of drive transistor 2i. The current driving capability of drive transistor 2h is set smaller than that of drive transistor 2i. The channel resistance (ON resistance) of MOS transistor 424 is set sufficiently smaller than the ON resistance of resistance element 426. The operation of the output circuit of the FIG. 74A will be described with reference to the operation waveform diagram of FIG. 74B.

When at least one of output permission signal OEM and internal data signal ZDD is at an L level, output signal NOL1 of AND circuit 4 maintains an L level. Drive transistors 2h and 2i are both turned off, so that output node 6 is not discharged.

When output permission signal OEM and internal data signal ZDD both attain an H level, output signal NOL1 of AND circuit 4 is driven to an H level. In response, drive transistor 2h is turned on. Output node 6 is discharged gently towards the level of ground voltage GND by drive transistor 2h of a relatively low current driving capability. At an elapse of a delay time T7 of rise delay circuit 420 from the rise of signal NOL1 to an H level, output signal NOL2 of rise delay circuit 420 is pulled up to an H level, whereby drive transistor 2i is turned on. Thus, output node 6 is discharged to the level of ground voltage GND via resistance element 426 and drive transistor 2i. According to the current limiting function of resistance element 426, output node 6 is discharged mildly to the level of ground voltage.

Then, at an elapse of delay time T8 of rise delay circuit 422 from the rise of signal NOL2 to an H level, output signal A of rise delay circuit 422 is pulled up to an H level, whereby MOS transistor 424 is turned on. The channel resistance (ON resistance) of MOS transistor 424 is preset sufficiently smaller than the resistance value of resistance element 426. Therefore, output node 6 is discharged at high speed to the level of ground voltage GND by a great current driving capability of drive transistor 2i. Since output node 6 is discharged at high speed to the level of ground voltage after being lowered to the level of voltage where ringing is not generated, an output signal can be generated at high speed with no ringing. The lowering rate of the voltage level of output node 6 is sequentially increased in three stages, and the discharging rate of output node 6 is increased at the time when there is no possibility of ringing. Therefore, an output signal can be generated more speedily with no ringing.

The structure of FIG. 74A can also be applied to a structure where output node 6 is charged to the level of power supply voltage Vcc.

As to the structure of the output circuit shown in FIGS. 73A and 74A, voltage VccQ and VssQ may be applied using a voltage adjuster, instead of power supply voltage Vcc and ground voltage. Furthermore, a structure in which the on timing is differentiated according to absence/presence of an invalid output can be used for drive transistors 1 and 2h.

According to the tenth embodiment of the present invention in which the output node is first driven to the voltage level of the reference power supply node using a resistance element, and then driven speedily to the level of the reference power supply node after the resistance element is shorted, the output node is driven in a more gentle manner by the current limiting function of the resistance element when there is a possibility of ringing, followed by a drive of the output node at high speed at a stage where no ringing is generated. Thus, an output circuit can be obtained providing an output signal speedily and stably with no ringing.

Embodiment 11

Figure 75A:
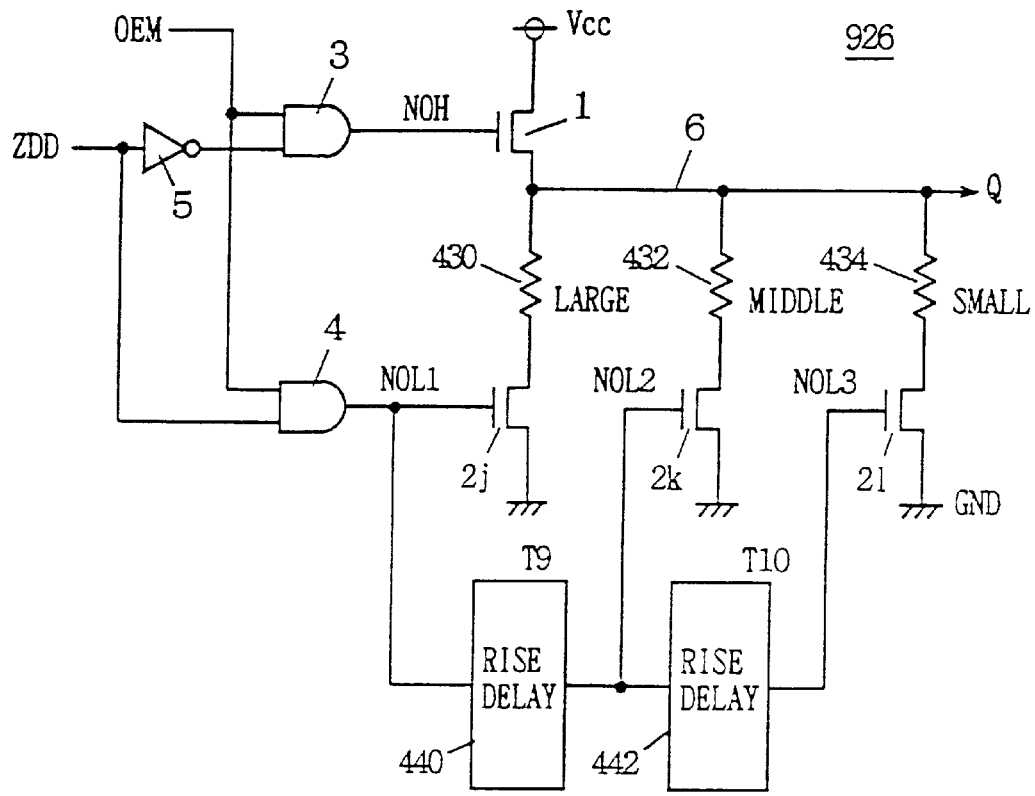
FIGS. 75A and 75B show a structure and operation, respectively, of an output circuit according to an eleventh embodiment of the present invention.

Referring to FIG. 75A, an output circuit 926 includes an inverter circuit 5 for inverting internal data signal ZDD, an AND circuit 3 for receiving output signal of inverter circuit 5 and an output permission signal OEM, a drive transistor 1 rendered conductive in response to an output signal NOH of AND circuit 3 for charging output node 6 to the level of power supply voltage Vcc, and an AND circuit 4 for receiving output permission signal OEM and internal data signal ZDD, similar to the conventional case.

Figure 75B:
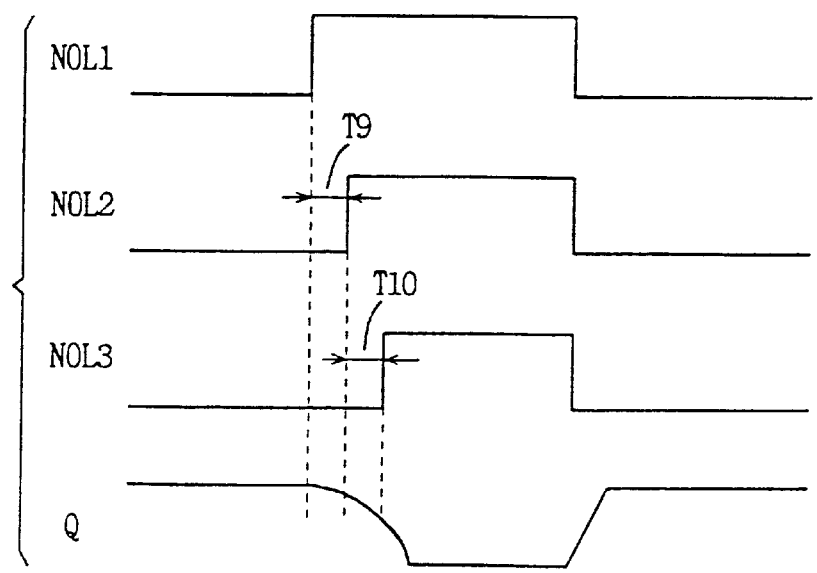

Output circuit 926 further includes resistance elements 430, 432, and 434 coupled in parallel to output node 6 and having different resistance values, a drive transistor 2j responsive to an output signal NOL1 of AND circuit 4 for coupling the other end of resistance element 430 to the node of ground voltage GND, a rise delay circuit 440 for delaying the rise of output signal NOL1 of AND circuit 4 for a predetermined time period T9, a drive transistor 2k rendered conductive in response to an output signal NOL2 of rise delay circuit 440 for coupling the other end of resistance element 432 to ground voltage GND, a rise delay circuit 442 for delaying the rise of output signal NOL2 of rise delay circuit 440 for a predetermined time of T10, and a drive transistor 21 responsive to output signal NOL3 of rise delay circuit 442 for coupling the other end of resistance element 434 to ground voltage GND level. Resistance elements 430, 432 and 434 have a large resistance value in this order. The operation of the output circuit of FIG. 75A will be described with reference to the operation waveform diagram of FIG. 75.

When output permission signal OEM and internal data signal ZDD both attain an H level, output signal NOL1 of AND circuit 4 is pulled up to an H level. In response, drive transistor 2j is turned on. Under this state, output node 6 is discharged to the level of ground voltage GND via resistance element 430 having a large resistance value. Resistance element 430 has the greatest current limiting function (the greatest resistance value). Therefore, the voltage dropping of output node 6 is relatively mild. Then, at an elapse of time period T9, signal NOL2 from rise delay circuit 440 is pulled up to an H level, whereby drive transistor 2k is turned on. Output node 6 is discharged to the level of ground voltage GND via of resistance element 432. Resistance element 432 has a resistance value smaller than that of resistance element 430. Therefore, output node 6 is discharged in potential in a relatively mild manner.

At an elapse of time T10 from the rise of signal NOL2, output signal NOL3 of rise delay circuit 422 is pulled up to an H level, whereby drive transistor 21 is turned on. Resistance element 434 has the smallest resistance value. Therefore, output node 6 is discharged to the level of ground voltage GND at high speed. When drive transistor 21 is turned on, the voltage level of output node 6 is already lowered to the voltage level where ringing is not generated. Therefore, even when output node 6 is discharged by drive transistor 21 at high speed, a stable output signal can be generated where no ringing is generated.

According to the structure shown in FIG. 75A, resistance elements 430, 432 and 434 have different resistance values. Output node 6 is discharged through resistance elements in the order of increasing resistance. This structure is advantageous over the structure in which resistance elements of the same resistance value are provided in parallel to output node 6, as set forth in the following. When resistance elements having the same resistance value are provided in parallel, the combined resistance connected to output node 6 is sequentially reduced. Therefore, output node 6 can be discharged at a sequentially increasing speed. However, there is a possibility that output node 6 is not discharged at high speed even when it arrives at a voltage level where ringing is not generated since the discharge rate is determined by the combined resistance value depending upon the number of resistance elements. By employing a structure of different resistance values, the voltage of output node 6 can be discharged at high speed when it is lowered to a voltage level where ringing is not generated. Thus, an output signal can be generated at a higher speed.

The structure shown in FIG. 75A can be applied to a structure for charging the output node 6.

Furthermore, according to the structure shown in FIG. 75A, a structure differentiating the ON-timing of drive transistors according to absence/presence of an invalid output signal may be used together. Furthermore, a voltage adjuster providing voltages VccQ and VssQ to the power supply node and the ground node may be used.

According to the eleventh embodiment in which a plurality of resistance elements having different resistance values are connected in parallel to an output node so that the output node is charged/discharged sequentially through resistance elements, starting from a resistance element having a greatest resistance value, the output node can be charged/discharged in a relatively mild manner when there is a possibility of generating of ringing, and then speedily driven to the minimum voltage level when arriving at a voltage level where ringing is not generated. Thus, an output circuit can be obtained from which an output signal is generated at high speed with not ringing.

Embodiment 12

Figure 76:
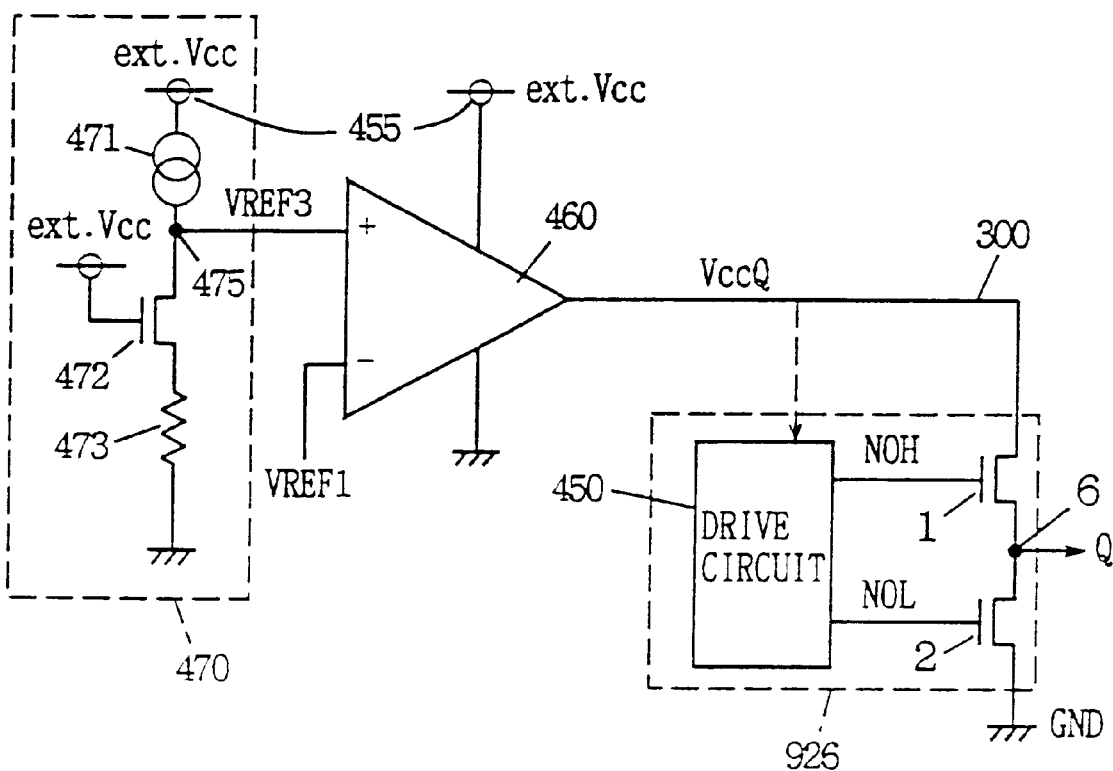
FIG. 76 shows a structure of an output circuit according to a twelfth embodiment of the present invention.

Referring to FIG. 76, an output circuit 926 includes a drive circuit 450 for generating a data signal that is output according to an internal data signal, an output permission signal, and if necessary, an output designating signal DOT, and drive transistors 1 and 2 for providing an output signal Q to output node 6 according to an output signal of drive circuit 450. The structure of output circuit 926 is similar to the previous embodiments or the conventional structure.

Referring to FIG. 76, output circuit 926 further includes a reference voltage generation circuit 470 supplied with a current from external power supply voltage extVcc supply node 455 for generating a reference voltage VREF3 depending upon temperature and external power supply voltage extVcc, and a differential amplifier 460 for amplifying differentially a constant reference voltage VREF1 independent of temperature T and external power supply voltage extVcc and reference voltage VREF3. One operating power supply voltage VccQ for output circuit 926 is applied from differential amplifier 460 to power supply node 300. Differential amplifier 460 operates with external power supply voltage extVcc applied to supply node 455 as one operating power supply voltage. Reference voltage VREF1 is generated using a circuit similar to that shown in FIG. 55B (provided that reference voltage VREF1 is generated from external power supply voltage extVcc).

Figure 77A:
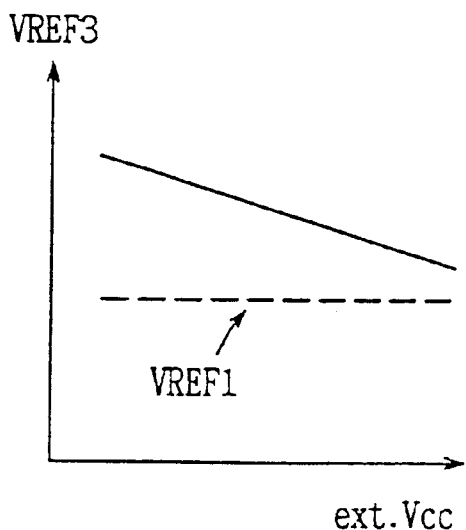
FIGS. 77A and 77B show an external power supply voltage and temperature dependent characteristics, respectively, of a reference voltage VREF3 provided from a reference voltage generation circuit of FIG. 76.
Figure 77B:
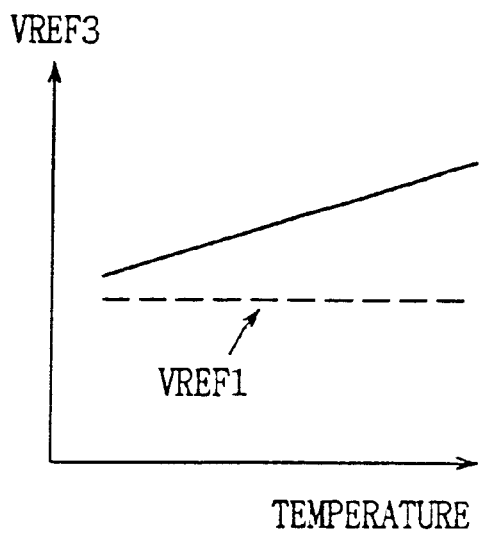

Reference voltage generation circuit 470 includes a constant current source 471 for providing a constant current from supply node 455 to node 475, and a MOS transistor 472 and a resistance element 473 connected in series between node 475 and the ground voltage GND supply node. External power supply voltage extVcc is applied to the gate of MOS transistor 472. The structure of reference voltage generation circuit 470 is similar to that shown in FIG. 56C provided that reference voltage VREF3 is generated from external power supply voltage extVcc. More specifically, resistance element 473 is formed of polysilicon or using a diffused resistor having ions of high concentration implanted, and has a positive temperature coefficient. Resistance value R of resistance element 473 is set slightly greater than the ON resistance of MOS transistor 472. The temperature dependency of resistance value R of resistor 473 is set sufficiently greater than the temperature dependent characteristic of constant current source 271 and the temperature dependent characteristic of ON-resistance of MOS transistor 472. MOS transistor 472 functions as a variable resistance element providing a conductance varied according to external power supply voltage extVcc. The operation of reference voltage generation circuit 470 is similar to the reference voltage generation circuit shown in FIG. 56C. Therefore, details will not be repeated. Reference voltage generation circuit 470 generates reference voltage VREF3 having a negative dependency on external power supply voltage extVcc as shown in FIG. 77A and a positive dependent characteristics with respect to ambient temperature (operating temperature) as shown in FIG. 77B.

Figure 78A:
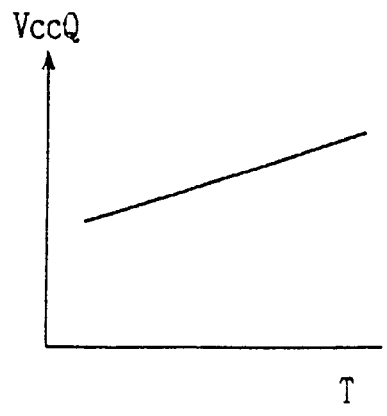
FIGS. 78A and 78B show temperature and external power supply voltage dependent characteristics, respectively, of a power supply voltage VccQ appearing on a reference power supply node of FIG. 76.
Figure 78B:
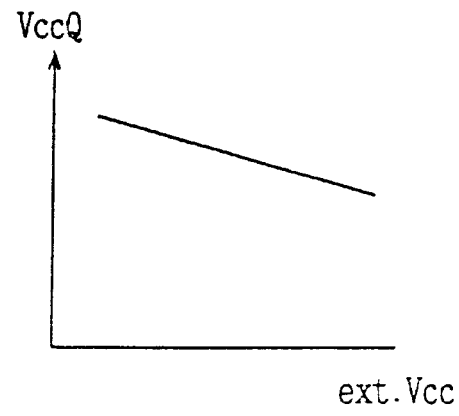

Differential amplifier 460 amplifies the difference of reference voltages VREF3 and VREF1. When the operating temperature (ambient temperature) T rises, reference voltage VREF3 is increased. In response, voltage VccQ provided from differential amplifier 460 is increased. When ambient temperature (operating temperature) T is constant and external power supply voltage extVcc is increased, reference voltage VREF3 is lowered, whereby voltage VccQ provided from differential amplifier 460 is reduced. More specifically, differential amplifier 460 provides to power supply node 300 a voltage VccQ having a positive dependency with respect to the operating temperature (ambient temperature) T as shown in FIG. 78A and a negative dependency with respect to external power supply voltage extVcc as shown in FIG. 78B. The effect of voltage VccQ having such characteristics will be described.

As described with reference to FIGS. 56–59, an MOS transistor is reduced in operating rate due to generation of hot electrons in a channel region upon a higher operating temperature, and increased in operating rate due to increase in the drain current upon a higher gate potential or drain potential (in the case of an n channel MOS transistor). When external power supply voltage extVcc increases, the operating speed of drive transistor 1 is increased since a voltage changing in proportion to external power supply voltage extVcc is applied to power source node 300. In a structure where the potential of output node 6 is precharged to the level of an intermediate potential, the operating speed of drive transistor 2 differs from that of drive transistor 1. Therefore, the time required for providing a signal of an H level differs from the time required for providing a signal of an L level. This means that the operating characteristic of the output circuit is degraded. In this case, increase in the operating speed of drive transistor 1 can be suppressed by reducing voltage VccQ applied to power supply node 300 using differential amplifier 460. Therefore, change in the access time in providing a signal of an H level can be suppressed to maintain the operating characteristic unchangedly. Similarly, when ambient temperature (operating temperature) T is increased, the operating speed of drive transistors 1 and 2 are reduced. In this case, the reduction in operating speed of drive transistor 1 can be compensated for by increasing power supply voltage VccQ on power supply node 300. Therefore, the ascertaining timing of an output signal may be maintained unchangedly.

By providing a structure in which a voltage at the level of VccQ and varying similarly to power supply voltage VccQ is applied to the gates of drive transistors 1 and 2 using a level conversion circuit as shown by the dotted line in the structure of FIG. 76, a stable output circuit can be obtained that can have the output signal ascertaining timing constant independent of external power supply voltage extVcc and ambient temperature (operating temperature) T.

Figure 79:
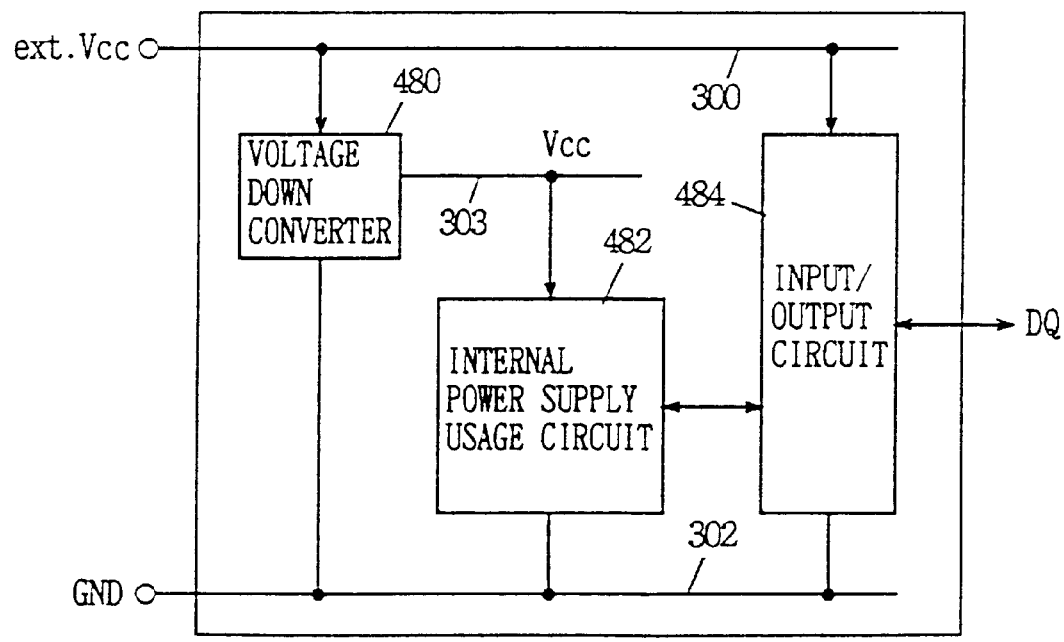
FIG. 79 shows an application of the twelfth embodiment of the present invention.

FIG. 79 schematically shows an entire structure of a semiconductor device to which the present invention is applied. Referring to FIG. 79, a semiconductor device includes a voltagedown converter 480 for generating a constant internal voltage Vcc independent of external power supply voltage extVcc being in a predetermined range, an internal power supply usage circuit 482 operating with internal power supply voltage Vcc applied from voltagedown converter 480 onto an internal power supply line 303 and ground voltage GND applied onto ground line 302 as both operating power supply voltages, and an input/output circuit 484 operating with external power supply voltage extVcc applied to power supply node 300 and ground voltage GND applied to ground node 302 as both operating power supply voltages to establish interface with the outside world. According to the structure shown in FIG. 79, the components in the system external to the device operates with external power supply voltage extVcc as the operating power supply voltage. In this case, input/output circuit 484 uses external power supply voltage extVcc as the operating power supply voltage in order to establish interface with an external device. By applying a structure in FIG. 76 to the output circuit in input/output circuit 484, a stable output signal independent of external power supply voltage extVcc and ambient temperature (operating temperature) can be generated. Furthermore, the signal output timing can be made constant.

It is to be noted that in a structure shown in FIG. 76, power supply voltage VccQ applied to power supply node 300 may be provided to drive circuit 450 as well as drive transistor 1. In output circuit 926, a circuit for converting the level of internal power supply voltage Vcc to the level of external power supply voltage extVcc for provision to the gates of drive transistors 1 and 2 may be provided for drive circuit 450.

According to the twelfth embodiment of the present invention in which a voltage maintaining positive dependency on ambient temperature and negative dependency on an external power supply voltage is transmitted to the power supply node of the output circuit, an output circuit can be provided that compensates for change in the operating characteristics of a drive element due to variation in ambient temperature and external power supply voltage for generating an output signal of no ringing stably at constant timing.

In the output circuit of the present twelfth embodiment, a structure where the output node driving timing is differentiated shown in the previous first to sixth embodiment may be used in combination.

Embodiment 13

Figure 80A:
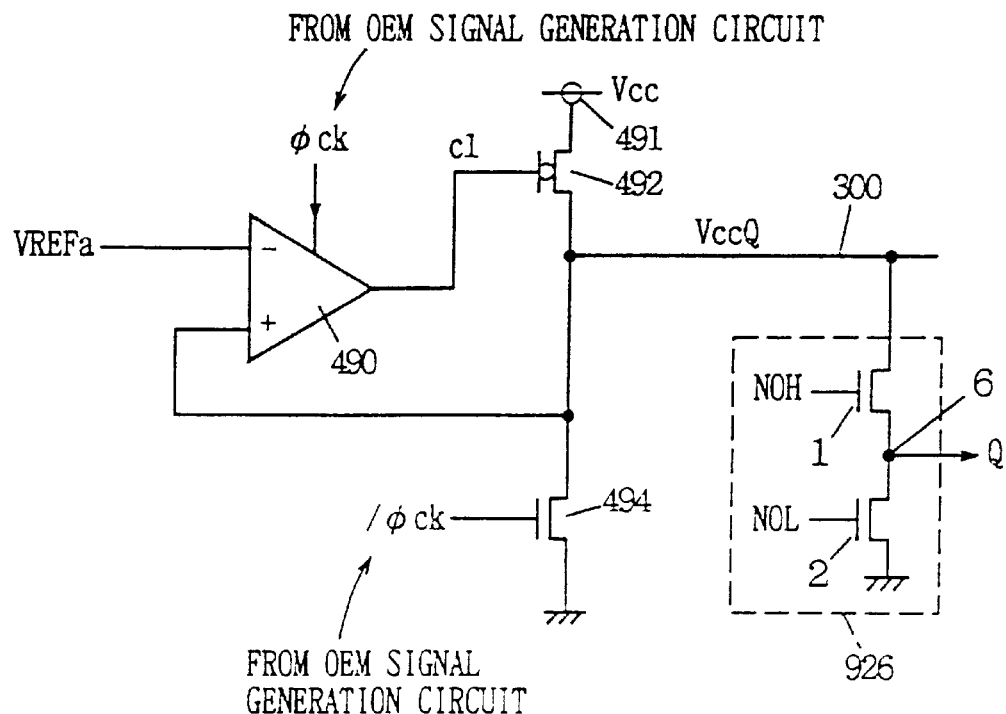
FIGS. 80A and 80B represent a structure and operation, respectively, of an output circuit according to a thirteenth embodiment of the present invention.

Referring to FIG. 80A, in order to provide voltage VccQ onto power supply node 300 in an output circuit 926, output circuit 926 includes a differential amplifier 490 activated in response to a clock signal φCK for amplifying differentially a voltage VccQ on power supply node 300 and reference voltage VREFa, a p channel MOS transistor 492 coupled between a power supply node (the supply node of an internal power supply voltage or an external power supply voltage) and responsive to an output signal C1 of differential amplifier 490 for supplying a current from this power supply voltage supply node 491 to power supply node 300, and a switching transistor 494 formed of an n channel MOS transistor and responsive to a clock signal /φCK for discharging power supply node 300 to the level of ground voltage GND.

Figure 80B:
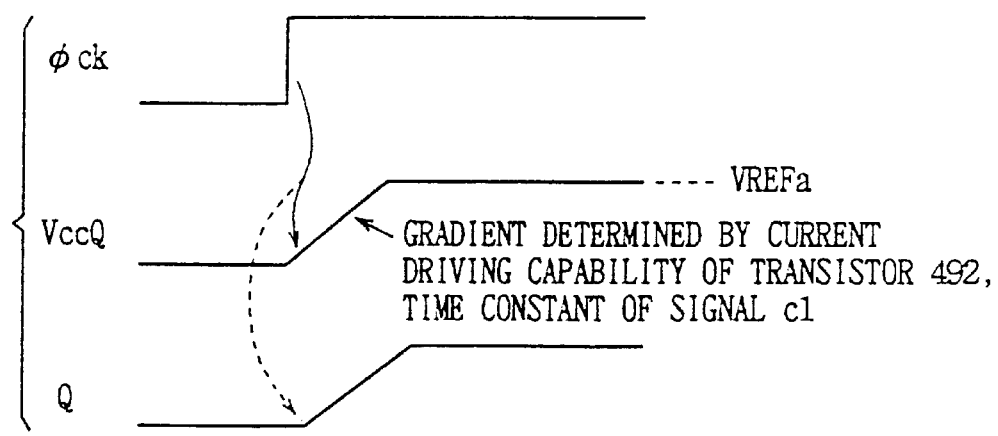

Clock signal φCK is rendered active at the activation of output permission signal OEM, for example, or clock signal φCK is rendered active in response to a signal providing the operation timing of output circuit 926. The operation of the circuit shown in FIG. 80A will be described with reference to the operation waveform diagram of FIG. 80B.

When clock signal φCK is inactive at the state of an L level, differential amplifier 490 is at an inactive state. Output signal C1 is at the level of voltage Vcc applied to power supply voltage supply node 491. Drive transistor 492 is turned on. In contrast, clock signal /φCK is at an H level, and switching transistor 494 is turned on. The voltage VccQ on power supply node 300 is at the level of ground voltage GND. Drive transistors 1 and 2 in output circuit 926 are both turned off, and output node 6 is precharged to the level of an intermediate voltage, or maintained at the potential level of the output signal read out at a preceding cycle (set to an output high impedance state).

When a data signal is newly read out, clock signal φCK attains an H level of activation simultaneous to or earlier than output permission signal OEM, whereby differential amplifier 490 is activated. In contrast, clock signal /φCK is driven to an L level, whereby switching transistor 494 is turned off. When voltage VccQ on power supply node 300 is lower than the level of reference voltage VREFa, output signal C1 from differential amplifier 490 is lowered from the H level (level of voltage Vcc), whereby drive transistor 492 is turned on. A current is supplied to power supply node 300 from power supply voltage supply node 491, whereby voltage VccQ is raised. By setting appropriately the current driving capability of drive transistor 492, voltage VccQ on power supply node 300 is pulled up gently. When voltage VccQ on power supply node 300 becomes higher than reference voltage VREFa, the output signal of differential amplifier 490 is pulled up to an H level, whereby drive transistor 492 is turned off. As a result, voltage VccQ on power supply node 300 is maintained at the voltage level of reference voltage VREFa.

When a signal of an H level is output in output circuit 926, drive transistor 1 is turned on, and a current is supplied from power supply node 300 to output node 6. The change in the voltage level of output node 6 is substantially equal to the change of voltage VccQ on power supply node 300. The changing rate of voltage VccQ on power supply node 300 is determined by the current driving capability of drive transistor 492 and the parasitic capacitance accompanying power supply node 300. The parasitic capacitance in power supply node 300 is inherent to the circuit; and takes substantially a constant value. Therefore, by adjusting the current driving capability of drive transistor 492 to an appropriate value, the changing rate of voltage VccQ can be adjusted appropriately. Therefore, generation of ringing in output signal Q at output node 6 can be suppressed.

By adjusting the changing rate of output signal C1 of differential amplifier 490, the current driving capability of drive transistor 492 can be changed at an appropriate speed. Accordingly, the changing speed of output signal Q of output node 6 can be set such that no ringing is generated.

By setting reference voltage VREFa to a level where no ringing is generated when output node 6 is driven even at high speed, output node 6 arrives at the level of reference voltage VREFa at a relatively high speed. Meanwhile, by employing a structure where the voltage on power supply node 300 is increased to the level of power supply voltage Vcc by a separate circuit, output signal Q can be provided speedily and stably with no ringing.

Reference voltage VREFa takes a level higher than the high level voltage of VOH defined in the specification.

According to the present thirteenth embodiment in which power supply voltage VccQ to the power supply node of output circuit 926 is applied by a differential amplifier activated in response to a signal providing the operating timing of output circuit 926 and a drive transistor responsive to an output signal of the differential amplifier for supplying a current from the power voltage supply node to the power supply node, the output signal appearing on the output node can be varied according to the changing rate of voltage VccQ on power supply node 300. Therefore, a stable output signal can be provided speedily with no ringing.

Embodiment 14

Figure 81:
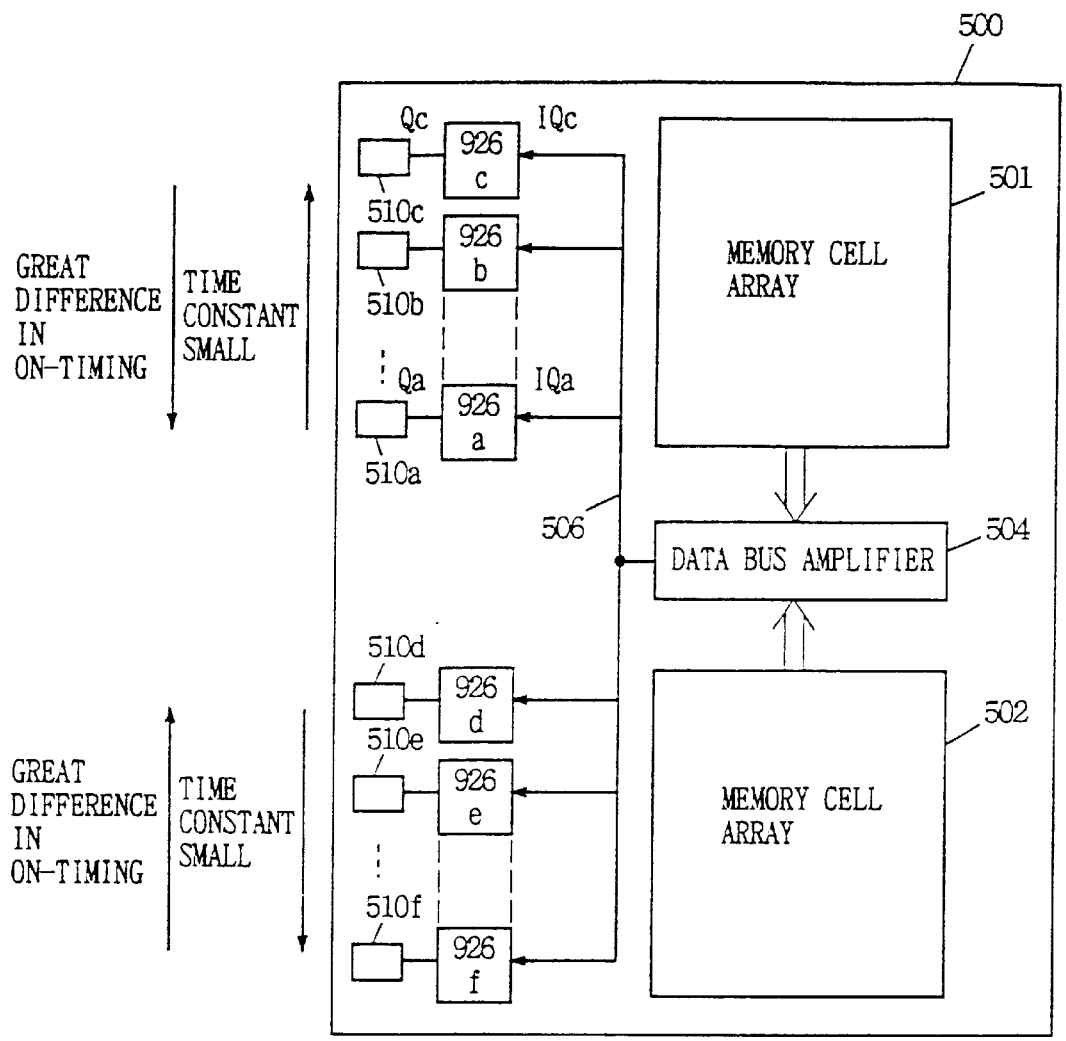
FIG. 81 shows a structure of a semiconductor device of the thirteenth embodiment of the present invention.

FIG. 81 schematically shows the structure of the portion associated with output of a data signal in a semiconductor device according to a fourteenth embodiment. Referring to FIG. 81, a semiconductor device 500 includes memory cell arrays 501 and 502 each including a plurality of memory cells arranged in a matrix, and a data bus amplifier 504 for amplifying data of a selected memory cell in memory cell arrays 501 and 502 for transmitting the amplified data onto an internal data bus 506. A structure may be employed where memory cell arrays 501 and 502 are activated simultaneously and data of selected memory cells in respective memory cell arrays are read out at the same time. Furthermore, a structure may be employed where only one of memory cell arrays 501 and 502 is activated and data is read out from a selected memory cell of the activated memory cell array.

Since a data signal of a plurality of bits is output in semiconductor memory device 500, a plurality of pads 510a–510c and 510d–510f are provided. Output circuits 926a–926c and output circuits 926d–926f are provided corresponding to each of pads 510a–510f between internal data bus 506 and pads 510a–510f. As shown in FIG. 81, internal data bus 506 from data bus amplifier 504 to output circuits 626a–626f differs in length. In FIG. 81, output circuits 926a–926c and output circuits 926–926f are arranged in a symmetrical manner in semiconductor device 500. In this case, the path of internal data bus 506 from data bus amplifier 504 to output circuits 926a, 926d is the shortest, and the path of internal data bus 506 from data bus amplifier 504 to output circuits 926c and 926f is the longest.

Output circuits 926a–926c are reduced in time constant for generating output signal Q as a function of distance from data bus amplifier 504 (as the length of internal data bus 506 is increased), whereby the changing rate of output signal Q is increased. Similarly, output circuits 926d–926f has the time constant of output signal Q reduced as the distance from data bus amplifier 504 is increased.

In the case where a plurality of drive transistors are provided in parallel for driving a plurality of output nodes with different ON-timings of the drive transistors, the difference in the ON-timings of the drive transistors in output circuits 926a is set greater than that of output circuit 926c. Similarly, the time difference in ON-timing of the plurality of drive transistors in output circuit 926d is set greater than that of output circuit 926f. The operation will now be described.

Figure 82A:
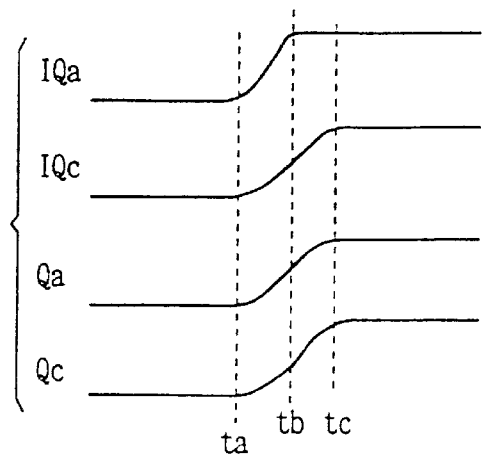
FIGS. 82A and 82B are waveform diagrams representing a signal output operation of the semiconductor device of FIG. 81.

First, the operation in a case where the time constant of an output signal is reduced in proportion to the distance from data bus amplifier 504 will be described with reference to FIG. 82A. FIG. 82A represents the operation in the case where output signals Qa and Qc are driven to an H level from an L level according to internal data signal IQa provided to output circuit 926a and an internal data signal IQc provided to output circuit 926c. Data bus amplifier 504 is activated in response to a preamplifier enable signal not shown, for amplifying the data of a plurality of memory cells selected in memory cell array 501 and/or 502 to transmit the amplified memory cell data of plurality of bits on internal data bus 506. As a result, internal signals IQa and IQc on internal data bus 506 are varied according to the amplified signals. The parasitic capacitance and interconnection resistance is increased in proportion to the length internal data bus 506. Therefore, internal data signal IQa changes relatively faster than internal data signal IQc. FIG. 82A shows the state where internal data signal IQa arrives at an H level of a predetermined voltage level at time tb.

Output circuits 926a–926c and output circuits 926d–926f are activated at the same timing according to output permission signal OEM (not shown). Output circuit 926a has the current driving capability set low, and the time constant of output signal Qa set to a great value. The changing of output signal Qa is relatively mild. In contrast, output circuit 926 has the time constant of output signal Qc set to a low value. More specifically, the current driving capability of output circuit 926c is set relatively high. Therefore, output signal Qc is driven according to internal data signal IQ at a relatively high speed. Since internal data signal IQa changes at high speed and the current driving capability of output circuit 926a is set low, output signal Qa from output circuit 926a changes in a relatively gentle manner. In contrast, output circuit 926c has the current driving capability set high although internal data signal IQc varies in a relatively mild manner. Therefore, the gentle changing of internal data signal IQc is compensated for, so that output signal Qc changes in a relatively mild manner. As a result, the changing rate of output signals Qc and Qa of output circuits 926c and 926a can be made equal, so that an ascertained state of the output signals can be obtained at substantially the same timing.

FIG. 82A shows an example of a state where data output signals Qa and Qc are set at an ascertained state at time tc. The current driving capability of output circuit 926a that receives internal data signal IQa changing speedily is set small. Therefore, generation of ringing is suppressed in output signal Qa even when internal data signal IQa changes at high speed. In output circuit 926c receiving internal data signal IQc changing in a relatively mild manner, the changing rate of internal data signal IQc is relatively show although the current driving capability is set high. By generating a signal Qc with a great driving current capability, the mild change of internal data signal IQc is compensated for to allow generation of output signal Qc speedily. Even when the current driving capability of output circuit 926c is set high, output signal Qc can be generated at high speed with no ringing as long as the change in the output signal level of the internal AND circuit follows the changing rate of internal data signal IQc. By this series of operations, output signals that attain an ascertained state stably at substantially the same timing can be generated to pads 110a–110c and 110d–110f.

Figure 82B:
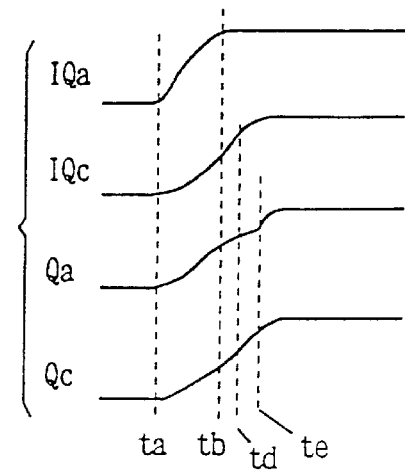

The operation in the case where the output circuit includes two drive transistors which are turned on at different timings will be described with reference to FIG. 82B. FIG. 82B shows the input/output relationship of data of output circuits 926a and 926c. FIG. 82B shows the case where internal data signals IQa and IQc both attain an H level, and output signals Qa and Qc from output circuits 926a and 926c are driven to an H level.

When data bus amplifier 504 is activated so that internal data signals IQa and IQc on internal data bus 506 are changed, output circuits 926a–926c and 926–926f are activated at an elapse of a predetermined time period. Internal data signal IQa for output circuit 926a attains a stable state at time tb. Responsively, output circuit 926a provides output signal Qa with a relatively low driving capability. Therefore, data signal Qa varies in a relatively mild manner (charged by a transistor having a small current driving capability). Then at time tc, the drive transistor of a great current driving capability is turned on in output circuit 926, whereby output signal Qa is charged to the level of a predetermined voltage at high speed. Here, output signal Qa is already raised to a voltage level where no ringing is generated. Therefore, a stable output signal can be provided with no ringing even when internal signal Qa is driven to a predetermined voltage level at high speed. In contrast, internal data signal IQc changes in a relatively mild manner. In this case, output circuit 926c charges output signal Qc with the drive transistor of a small driving capability turned on. At time td, a drive transistor of a great current driving capability in output circuit 926c is turned on, and output signal Qc is charged at high speed. Here, internal data signal IQc varies in a relatively mild manner. Therefore, even when output signal Qc is changed by a great current driving capability by output circuit 926c, the signal voltage level applied to drive transistor 1 has not yet reached a sufficient high voltage level (a predetermined final reaching voltage level) since internal data signal IQc changes mildly. The output node is driven in a relatively mild manner, so that output signal Qc is driven to a high voltage level with no generation of ringing. When internal data signal IQc reaches a predetermined voltage level, output signal Qc rises to a predetermined voltage level at high speed according to internal data signal IQc.

By adjusting the current driving capability of an output circuit according to the distance from data bus amplifier 504 and adjusting the time difference of the ON-timings of a plurality of drive transistors, the timing of the output signals from all the output circuits attaining an ascertained state can be set equal with no ringing, as shown in FIGS. 82A and 82B. Thus, a semiconductor memory device of a short access time can be realized.

FIGS. 82A and 82B show the state where the output circuit is activated simultaneously with the activation of data bus amplifier 504. However, the time difference of the activation timing of data bus amplifier 504 and the activation timings of output circuits 926a–926f can be reduced even in a structure where output circuits 926a–926f are activated (output permission signal OEM is rendered active) after the activation of data bus amplifier 504 followed by ascertation of the internal data of data bus 506. Thus, a semiconductor memory device of a short access time can be realized.

Modification 1

Figure 83:
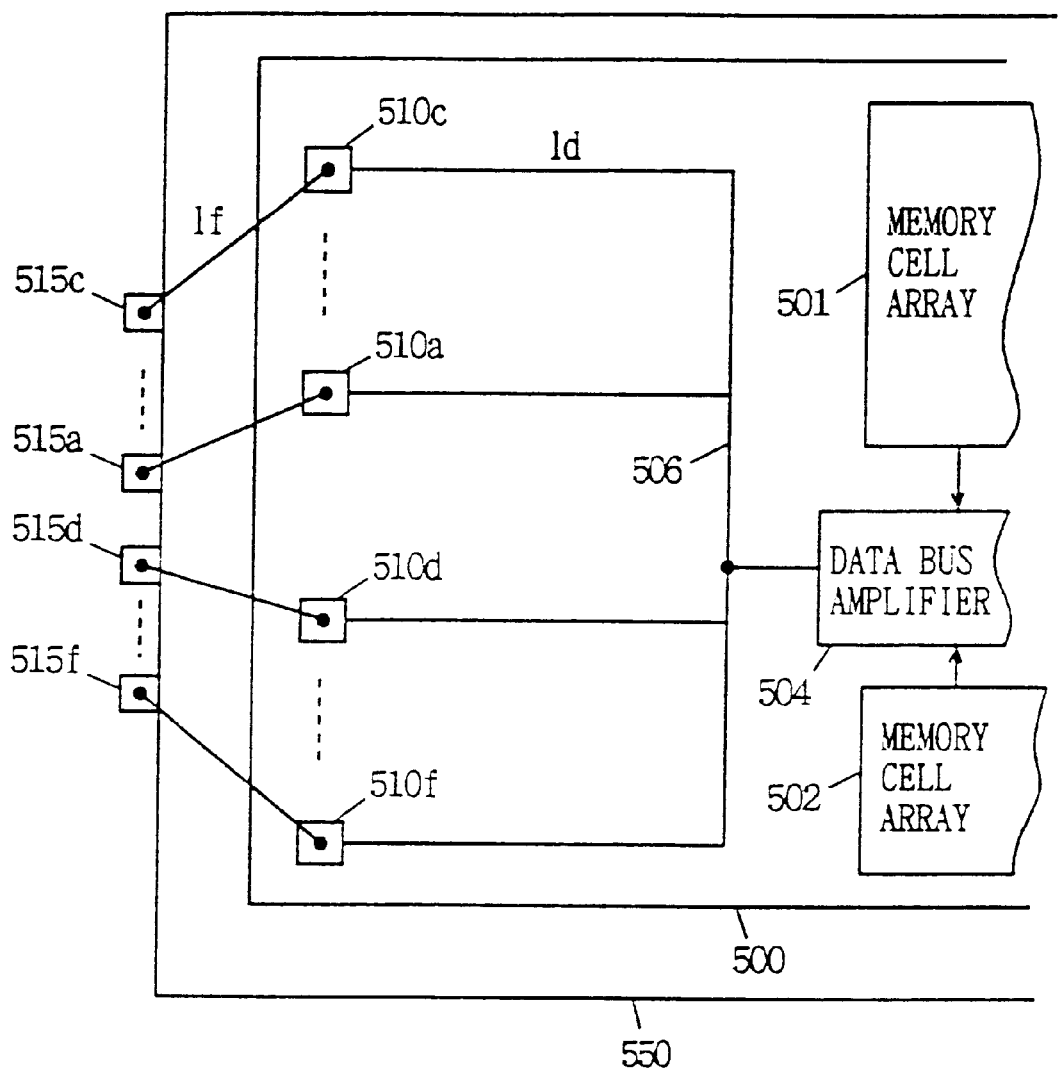
FIG. 83 shows a modification of the thirteenth embodiment of the present invention.

In FIG. 83 showing a structure of a modification of the fourteenth embodiment of the present invention, the semiconductor device 500 is accommodated in a package 550. Package 550 is provided with external lead terminals 515a–515c and 515d–515f. External lead terminals 515a–515f are connected to pads 510a–510c and 510d–510f of semiconductor device 500 via the lead frame and bonding wires. In FIG. 83, pads 510a–510f and external lead terminals 515a–515f are indicated as one straight line together with this bonding wires and lead frame. In a semiconductor device, the length of a lead frame differs according to the configuration of the package. As shown in FIG. 83, the current driving capability of a drive transistor in the output circuit and the time difference in the ON-timings of a plurality of drive transistors are adjusted according to a distance lf between pad 510 (510a–510f) and external lead terminal 515 (515a–515f) and a distance ld (output circuit not shown in FIG. 83) between data bus amplifier 504 and pad 510.

For example, as the sum of the distance ld of internal data bus 506 and total distance lf of the bonding wire and the lead frame is smaller, the time constant of output signal Q provided from the output circuit is increased, so that the changing rate is slowed down (current driving capability of drive transistor is reduced). As the sum of distance ld and distance lf is smaller, the difference in time of the ON-timings of a plurality of drive transistors is increased. If the distance lf of the lead frame and the bonding wire is great, the load to be driven by the output circuit is increased, and the changing rate of the output signal is reduced. Therefore, by increasing the driving capability of the output circuit in proportion to length lf, the large load can be compensated for and the output signal can be varied speedily. According to such a structure, a semiconductor memory device can be obtained that stabilizes the output signal from all output circuits at the same timing with no ringing irrespective of the value of the sum of the distance of the internal data bus and the length of the bonding wire and the lead frame.

When the signal delay in an internal data bus is not so great as the influence of the length of the bonding wire and the lead frame with respect to the input/output characteristics of an output circuit, the driving capability of the output circuit may have the time constant of output signal Q determined according to the value of the length lf of the bonding wire and the lead frame.

According to the fourteenth embodiment of the present invention in which the current driving capability of the drive transistor and the time difference in the ON-timings of a plurality of drive transistors are adjusted according to the input and output load of the output circuit (the length of an internal data bus and an output signal line), a high-speed-operating semiconductor device is provided in which the output signals attain an ascertained state at the same timing in all the output circuits with no ringing.

Embodiment 15

Figure 84:
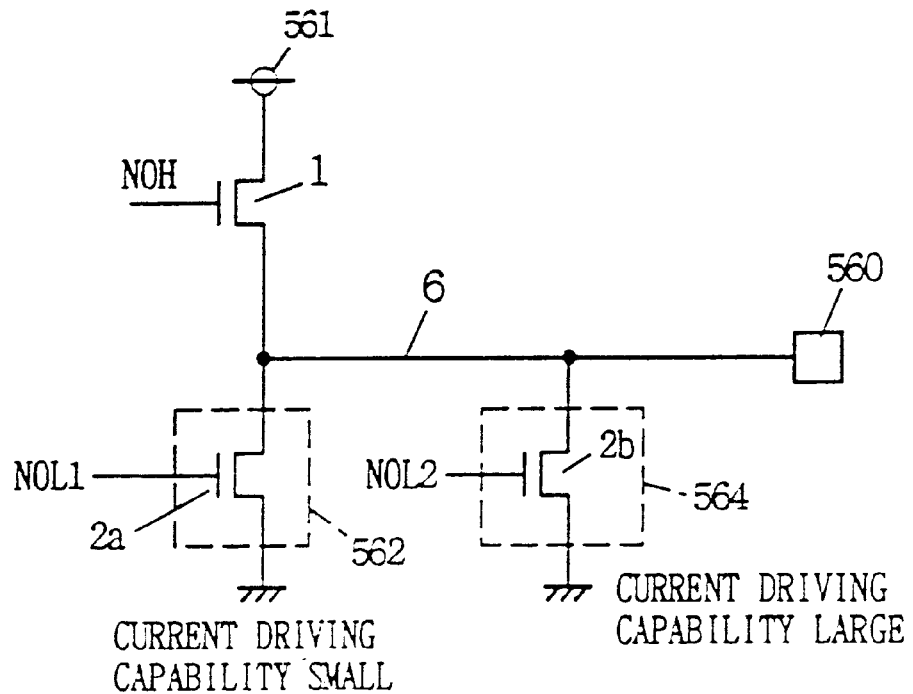
FIGS. 84 and 85 show a structure of an output circuit according to a fourteenth embodiment and a fifteenth embodiment, respectively, of the present invention.

FIG. 84 shows a structure of the portion related to discharging an output node to the level of ground voltage in an output circuit according to a fifteenth embodiment of the present invention. A similar structure may be provided for the portion where output node 6 is charged to the level of the voltage on power supply node 561. Referring to FIG. 84, an output circuit includes a drive element 562 having a small current driving capability and responsive to an internal signal NOL1 for discharging output node 6 to the level of ground voltage GND, and a drive element 564 having a large current driving capability and responsive to a drive signal NOL2 rendered active at the timing later than that of internal signal NOL1 for discharging output node to the level of ground voltage. Output node 6 is connected to pad 560. Drive element 564 of a great current driving capability is located near pad 560. Drive transistors 2a and 2b are representatively shown in FIG. 84 since drive elements 562 and 564 may include a resistance element internally.

Drive transistor 2b of a great current driving capability has a channel width greater than that of drive transistor 2a of a small current driving capability. More specifically, the junction area between the impurity region to which output node 6 is connected and the substrate region is greater in drive transistor 2b than in drive transistor 2a. Similarly, the area of the gate insulating film is greater in drive transistor 2b than in drive transistor 2a. Therefore, drive transistor 2b has smaller drain electric field than drive transistor 2a to implement a greater junction breakdown voltage even when the same drain-gate voltage and drain-source voltage are applied to drive transistors 2a and 2b. This is because drive transistor 2b of a larger gate insulation film in area has an dielectric breakdown voltage greater than that of drive transistor 2a, and the interelectrode electric field of the capacitor is inversely proportional to the capacitor area. When a resistance element is used, the voltage drop of the resistance element of a greater resistance value is increased.

By using the structure shown in FIG. 84, a great noise such as a surge voltage in output pad 560, when generated, can be absorbed by drive transistor 2b having a great junction breakdown voltage or a great dielectric breakdown voltage. Therefore, drive transistor 2a of a small junction breakdown voltage or a small dielectric breakdown voltage can be prevented from receiving excessive noise. Thus, an output circuit superior in immunity to excessive noise can be obtained without any particular protection devices.

In the structure shown in FIG. 84, power supply voltage Vcc may be applied to power supply node 561, and voltage VccQ provided from another power supply circuit as described in the previous embodiment may be applied.

The number of drive elements connected in parallel to this output node may be greater than 2. In this case, the drive element having the greatest current driving capability is positioned closest to output pad 560.

According to the fifteenth embodiment of the present invention in which a drive element having the greatest current driving capability out of a plurality of drive elements with different current driving capabilities is located closest to the output pad, excessive noise such as of surge voltage generated at the output pad can be absorbed by the drive element of the greatest current driving capability. Thus, an output circuit of high reliability superior in noise immunity can be obtained with no particular protection devices.

Embodiment 16

Figure 85:
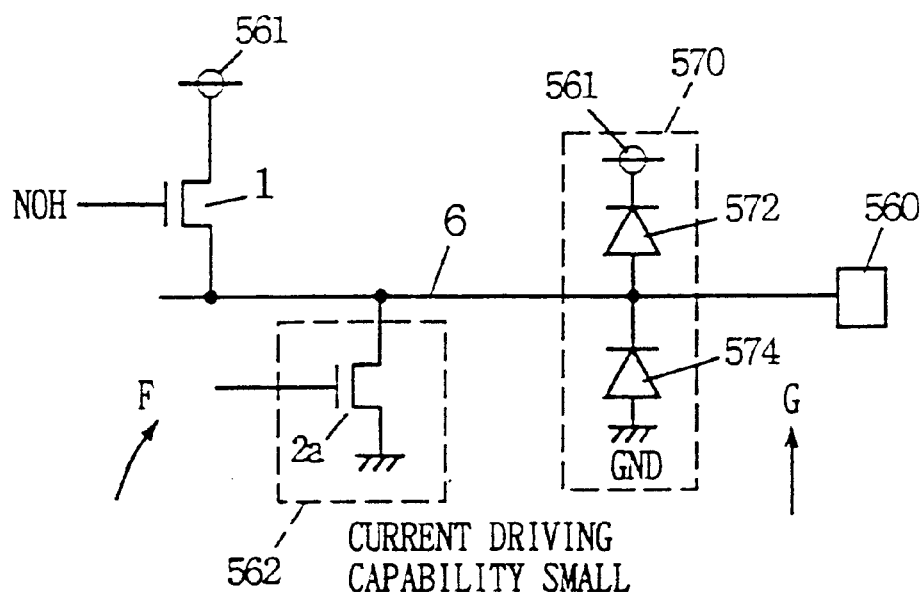

FIG. 85 shows a structure of the portion that discharges output node 6 to the level of ground voltage in an output circuit according to the sixteenth embodiment. A similar structure can be provided to the portion where output node 6 is charged to the level of the voltage on power supply node 561 (transistor 1 is representatively shown). Transistor 1 is shown to be protected by a protection circuit 570.

Referring to FIG. 85, an output circuit includes a plurality of drive elements of different current driving capabilities connected in parallel to output node 6. Drive element 562 of the smallest current driving capability is shown in FIG. 85. Similarly to the previous embodiments, drive element 562 has various applicable structures, and only drive transistor 2a is representatively shown. Output node 6 is connected to output pad 560. Protection circuit 570 is provided at the position of the output node between drive element 562 of a low current driving capability and power supply pad 560. As an example, protection circuit 570 includes a diode 571 having a cathode connected to power supply node 561 and an anode connected to output node 6, and a diode 574 having a cathode connected to output node 6 and an anode connected to receive ground voltage GND. The drive element of a large current driving capability may be provided in either position F or G indicated by the arrows in FIG. 85. Protection circuit 570 is to be provided between a drive element having the possibility of being damaged by excessive noise such as a surge voltage of small current driving capability and output pad 560.

According to the structure shown in FIG. 85, diode 572 conducts when a positive excessive noise is generated at output pad 560. This positive excessive noise is discharged towards power supply node 561, and the excess noise is absorbed. When a negative excessive noise is generated, diode 574 is rendered conductive, whereby the negative excessive voltage is charged towards the level of the ground voltage. As a result, excessive noise such as a positive or negative surge voltage is absorbed by protection circuit 570. Therefore, drive transistor 2a of a small junction breakdown voltage and small dielectric breakdown voltage can be prevented from being damaged by excessive noise. The same applies even if a resistance element is employed in the drive elements.

A structure in which voltage VccQ is applied to power supply node 561 may be combined to the structure of FIG. 85. Although protection circuit 570 is shown being formed of a diode, any structure can be used as long as it has a protection function of absorbing excessive noise such as a surge voltage.

Although output charging transistor 1 is provided at a preceding, or upstream stage of protection circuit 570, it may be provided between protection circuit 570 and pad 560 when transistor 1 has a relatively large current driving capability.

In accordance with the sixteenth embodiment in which a protection circuit is provided between a drive element of a small current driving capability and an output pad to absorb excessive noise, such excessive noise can be absorbed by the protection circuit even when it is generated at the output node via the output pad. The excessive noise will not be transmitted to the drive element having a small current driving capability, so that the drive element of small current driving capability is prevented from being damaged. Thus, an output circuit having superior immunity to excessive noise can be obtained.

The above-described first to sixteenth embodiments of the present invention may be appropriately combined in various modifications.

In the above-described embodiment, the case where inverted data of a memory cell is transmitted to the data output circuitry in the data output structure is described. The present invention is not limited to such embodiments, and the structure of the present invention can be applied in the case where a non-inverted data is transmitted or in the case where a complementary pair of data of inverted data and non-inverted data are transmitted to the data output circuitry by one pair of data lines.

Although a structure is mainly described in which output data of an L level is provided in the above embodiments, the present invention is also applicable to a path where data of an H level is provided.

Although the above-described embodiments are described mainly on one output circuit, the structure of the present invention can be applied for the output circuitry of each bit in a multi-bit parallel output structure. Furthermore, the data output node and the data input node may be shared in common or provided separately.

Although the output circuit is shown being formed only of an n channel MOS transistor in the above embodiments, the present invention is applicable to an output circuit formed of a CMOS circuit in which n and p channel MOS transistors are both used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A data output circuit for providing a signal corresponding in logic level to an internal signal on an internal node to an output node, comprising:

a drive transistor coupled between said output node and an output power supply node and responsive to said internal signal for transmitting a voltage on said output power supply node to said output node, said output power supply node providing the voltage of a logic level of the signal to be provided to said output node, a first current supply element having a first current driving capability, coupled between a voltage supply source and said output power supply node, and rendered conductive in response to an output permission signal providing a timing for outputting the signal to said output node, and a second current supply element having a second current driving capability greater than the first current driving capability, coupled between said voltage supply source and said output power supply node, and responsive to said output permission signal for attaining a conductive state after said first current supply element is rendered conductive.

2. The data output circuit according to claim 1, further comprising precharge means coupled between said output power supply node and a reference node supplying a reference potential intermediate between a voltage of said voltage supply source and a voltage different in logic level from said voltage on said voltage supply source, and responsive to inactivation of said output permission signal for transmitting said reference potential onto said output power supply node.

3. The data output circuit according to claim 1, wherein said voltage supply source is operatively coupled to receive a boosted operating power supply voltage.

4. The data output circuit according to claim 1, wherein said output power supply node supplies a voltage at a first logic level, and said drive transistor drives said output node to said first logic level, and wherein said data output circuit further includes a second drive transistor coupled between said output node and a second output power supply node supplying a voltage at a second logic level different from said first logic level, for driving said output node to said second logic level in response to said internal signal.

5. The data output circuit according to claim 4, further comprising a precharge means coupled between said output power supply node and said second output power supply node, and to receive a reference potential intermediate between the voltages at said first and second logic levels on a reference node, for transmitting the reference potential onto said output and second output power supply nodes in response to inactivation of said first and second drive transistors, a third current supply element coupled between a second voltage supply source supplying a voltage at said second logic level and said second output power supply node and in response to activation of said output permission signal for transmitting said voltage on said second voltage supply source onto said second output power supply node with a third current driving capability, and a fourth current supply element coupled between said second output power supply node and said second voltage supply source and having a fourth current driving capability greater than said third current driving capability, and responsive to said output permission signal for attaining a conductive state after said third current supply element is rendered conductive.

6. The data output circuit according claim 4, further comprising a switching element for electrically connecting the output power supply node with the second output power supply node when made conductive.

7. The data output circuit according to claim 4, further comprising:

a third current supply element coupled between a second voltage supply source supplying a third voltage at said second logic level and said second output power supply node and in response to activation of said output permission signal for transmitting said voltage on said second voltage supply source onto said second output power supply node with a third current driving capability, and a fourth current supply element coupled between said second output power supply node and said second voltage supply source and having a fourth current driving capability greater than said third current driving capability, and responsive to said output permission signal for attaining a conductive state after said third current supply element is rendered conductive.

8. A data output circuit for providing a signal corresponding in logic level to an internal signal on an internal node to an output node, comprising:

a drive transistor coupled between said output node and an output power supply node and responsive to said internal signal for transmitting a voltage on said output power supply node to said output node, said output power supply node providing the voltage of a logic level of the signal to be provided to said output node, a first current supply element coupled between a first voltage supply source and said output power supply node, and rendered conductive in response to an output permission signal providing a timing for outputting the signal to said output node, and a second current supply element coupled between a second voltage supply source and said output power supply node, and responsive to said output permission signal for attaining a conductive state after said first current supply element is rendered conductive, said second voltage supply source supplying a voltage at one of first and second logic levels, and said first voltage supply source supplying a voltage between voltages at said first and second logic levels, and said one of first and second logic levels corresponding to the logic level of the signal to be provided to said output node.

9. The data output circuit according to claim 8, wherein the voltage supplied from said first voltage supply source is at a level between the voltage from said second voltage supply source and a voltage intermediate between voltages at said first and second logic levels.

10. The data output circuit according to claim 8, further comprising precharge means coupled between said output power supply node and a reference node supplying a reference potential intermediate between the voltage on said first voltage supply source and a voltage different in logic level from said voltage on said first voltage supply source, and responsive to inactivation of said output permission signal for transmitting said reference potential onto said output power supply node.

11. The data output circuit according to claim 8, wherein said second voltage supply source is operatively coupled to receive a boosted operating power supply voltage.

12. The data output circuit according to claim 8, wherein said output power supply node supplies a voltage at the first logic level, and said drive transistor drives said output node to said first logic level, and wherein said data output circuit further includes:

a second drive transistor coupled between said output node and a second output power supply node supplying a voltage for driving said output node to said second logic level in response to said internal signal, said second drive transistor made conductive complementarily to said drive transistor, a third current supply element coupled between a third voltage supply source and said second output power supply node and responsive to activation of said output permission signal for transmitting a voltage on said third voltage supply source onto said second output power supply node and a fourth current supply element coupled between said second output power supply node and a fourth voltage supply source and responsive to activation of a delayed output permission signal for transmitting a voltage on said fourth voltage supply source onto said second output power supply node, said fourth voltage supply source supplying a voltage at the second logic level, and said third voltage supply source supplying a voltage intermediate between voltages at said first and second logic levels.

13. The data output circuit according to claim 12, further comprising a precharge means coupled between said output power supply node and said second output power supply node, and to receive a reference potential intermediate between the voltages at said first and second logic levels on a reference node, for transmitting said reference potential onto said output power supply node and said second output power supply node in response to inactivation of said output permission signal.

14. The data output circuit according to claim 13, wherein said reference potential is at a potential level intermediate between the voltages at the first and second logic levels.

15. The data output circuit according to claim 8, wherein said output power supply node supplies a voltage at the first logic level, and said drive transistor drives said output node to said first logic level, and wherein said data output circuit further includes:

a second drive transistor coupled between said output node and a second output power supply node supplying a voltage for driving said output node to said second logic level in response to said internal signal, said second drive transistor being made conductive complementarily to said drive transistor, and a switching element for electrically connecting said output power supply node and said second output power supply node with each other in response to inactivation of the output permission signal.

* * * * *

UNITED STATES PATENT AND TRADEMARK OFFICE
CERTIFICATE OF CORRECTION

PATENT NO. : 5,933,048
DATED : August 3, 1999
INVENTOR(S) : Hideto HIDAKA, et al It is certified that error appears in the above-identified patent and that said Letters Patent is hereby corrected as shown below:

Claim 5, line 15, change "first and second drive transistors" to --drive transistor and said second drive transistor--;

Claim 13, line 6, change "said" to --a--.

Signed and Sealed this

Sixteenth Day of January, 2001

Attest:

Q. TODD DICKINSON

*Attesting Officer*  *Commissioner of Patents and Trademarks*